(12) United States Patent
Lee et al.

(10) Patent No.: US 12,382,824 B2
(45) Date of Patent: Aug. 5, 2025

(54) ORGANIC ELECTROLUMINESCENCE DEVICE AND ORGANOMETALLIC COMPOUND FOR ORGANIC ELECTROLUMINESCENCE DEVICE

(71) Applicant: Samsung Display Co., Ltd., Yongin-si (KR)

(72) Inventors: Eunyoung Lee, Sejong-si (KR); Junghoon Han, Seoul (KR); Soo-Byung Ko, Yongin-si (KR); Sungbum Kim, Yongin-si (KR); Haejin Kim, Hwaseong-si (KR); Mina Jeon, Hwaseong-si (KR); Sujin Shin, Daegu (KR); Eunsoo Ahn, Jinju-si (KR); Jaesung Lee, Hwaseong-si (KR); Hyunjung Lee, Pohang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1228 days.

(21) Appl. No.: 16/998,878

(22) Filed: Aug. 20, 2020

(65) Prior Publication Data
US 2021/0151696 A1    May 20, 2021

(30) Foreign Application Priority Data

Nov. 14, 2019   (KR) .................... 10-2019-0145882

(51) Int. Cl.
| H01L 51/54 | (2006.01) |
| H10K 85/30 | (2023.01) |
| H10K 50/11 | (2023.01) |
| H10K 101/10 | (2023.01) |

(52) U.S. Cl.
CPC ........... H10K 85/346 (2023.02); H10K 50/11 (2023.02); H10K 2101/10 (2023.02)

(58) Field of Classification Search
None
See application file for complete search history.

(56) References Cited

U.S. PATENT DOCUMENTS

| 7,442,797 B2 | 10/2008 | Itoh et al. |
| 8,092,925 B2 | 1/2012 | Igarashi et al. |
| 8,871,361 B2 | 10/2014 | Xia et al. |
| 9,318,725 B2 | 4/2016 | Li |
| 9,673,409 B2 | 6/2017 | Li et al. |
| 10,128,448 B2 | 11/2018 | Metz et al. |
| 10,135,008 B2 | 11/2018 | Lin et al. |
| 11,925,104 B2 | 3/2024 | Ko et al. |
| 2008/0036373 A1 | 2/2008 | Itoh et al. |
| 2012/0205554 A1 | 8/2012 | Hollis et al. |
| 2012/0223634 A1 | 9/2012 | Xia et al. |
| 2013/0168656 A1 | 7/2013 | Tsai et al. |
| 2014/0364605 A1 | 12/2014 | Li et al. |
| 2014/0371825 A1 | 12/2014 | Anemian et al. |
| 2015/0105556 A1 | 4/2015 | Li et al. |
| 2016/0028028 A1 | 1/2016 | Li et al. |
| 2018/0053904 A1 | 2/2018 | Li et al. |
| 2019/0019964 A1 | 1/2019 | Jeon et al. |
| 2019/0036042 A1 | 1/2019 | Kim et al. |
| 2019/0058136 A1* | 2/2019 | Macinnis ............ C07F 15/0033 |
| 2019/0119312 A1 | 5/2019 | Chen et al. |
| 2019/0280222 A1 | 9/2019 | Kim et al. |
| 2019/0288223 A1 | 9/2019 | Sim et al. |
| 2020/0194694 A1 | 6/2020 | Han et al. |

FOREIGN PATENT DOCUMENTS

| CN | 104693243 A | 6/2015 |
| CN | 105073763 A | 11/2015 |
| CN | 105367605 A | 3/2016 |
| CN | 107474074 A | 12/2017 |
| CN | 110272456 A | 9/2019 |
| CN | 111326667 A | 6/2020 |
| EP | 3 431 482 A1 | 1/2019 |
| EP | 3 539 972 A1 | 9/2019 |
| JP | 2006-256999 A | 9/2006 |
| JP | 2009-272339 A | 11/2009 |
| JP | 2019-23186 A | 2/2019 |

(Continued)

OTHER PUBLICATIONS

Urinda et al. J. Phys. Chem. A 2018, 122, 7532-7539. (Year: 2018).*
Ung et al. Chem. Eur. J. 2011, 17, 8269-8272. (Year: 2011).*
Vivancos, et al. Chem. Rev. 2018, 118, 9493-9586. (Year: 2018).*
Wu, et al., "Forward molecular design for highly efficient OLED emitters: A theoretical analysis of photophysical properties of platinum(II) complexes with N-heterocyclic carbene ligands", *Dalton Trans.*, 2011, vol. 40, pp. 4480-4488.
Yang, et al., "Electro- and spectroelectrochemistry of platinum(II) bipyridine complexes and related species", *Journal of Organometallic Chemistry*, vol. 525 (1996) pp. 1-8.
Braterman, et al., "Electrochemistry and Spectroelectrochemistry (EPR, UV-Vis-Near-IR) of Platinum (II) 2,2'-Bipyridine and Ring-Metalated Bipyridine Complexes: $Pt^{II}(L-)$ and $Pt^I(L-)$ but Not $Pt^I(L)$", *Inorg. Chem.* 1992, vol. 31, pp. 5084-5088.

(Continued)

*Primary Examiner* — Andrew K Bohaty
(74) *Attorney, Agent, or Firm* — Womble Bond Dickinson (US) LLP

(57) ABSTRACT

An organic electroluminescence device includes an organometallic compound represented by Formula 1 in an emission layer to achieve high efficiency, low driving voltage, high luminance, and long life:

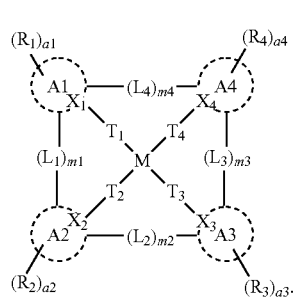

Formula 1

10 Claims, 2 Drawing Sheets

(56) References Cited

FOREIGN PATENT DOCUMENTS

| | | |
|---|---|---|
| JP | 2019-161230 A | 9/2019 |
| KR | 10-2014-0144152 A | 12/2014 |
| KR | 10-2015-0043225 A | 4/2015 |
| KR | 10-2015-0082101 A | 7/2015 |
| KR | 10-2016-0012941 A | 2/2016 |
| KR | 10-1939815 B1 | 1/2019 |

OTHER PUBLICATIONS

Braterman, et al., "Spectroelectrochemical studies of bipyridyl and ring-metallated bipyridyl complexes; evidence for mononuclear Pt(I) derivatives", *Inorganica Chimica Acta*, vol. 189 (1991) pp. 7-9.

\* cited by examiner

ORGANIC ELECTROLUMINESCENCE DEVICE AND ORGANOMETALLIC COMPOUND FOR ORGANIC ELECTROLUMINESCENCE DEVICE

CROSS-REFERENCE TO RELATED APPLICATION

This patent application claims priority to and the benefit of Korean Patent Application No. 10-2019-0145882, filed on Nov. 14, 2019, the entire content of which is hereby incorporated by reference.

BACKGROUND

One or more aspects of embodiments of the present disclosure relate to an organic electroluminescence device and an organometallic compound used therein.

Organic electroluminescence devices are being actively developed for image display apparatuses (e.g., organic electroluminescence displays). An organic electroluminescence device is a so-called self-luminescent display apparatus, in which holes and electrons respectively injected from a first electrode and a second electrode recombine in an emission layer to produce excitons, and a luminescent material (which may be an organic compound) included in the emission layer utilizes the excitons to emit light.

An example organic electroluminescence device includes a first electrode, a hole transport layer disposed on the first electrode, an emission layer disposed on the hole transport layer, an electron transport layer disposed on the emission layer, and a second electrode disposed on the electron transport layer. Holes may be injected from the first electrode, and the injected holes may move through the hole transport layer to be injected into the emission layer. Meanwhile, electrons may be injected from the second electrode, and the injected electrons may move through the electron transport layer to be injected into the emission layer. The holes and electrons injected into the emission layer may recombine to form excitons in the emission layer. The organic electroluminescence device may emit light when these excitons fall back (e.g., transition) to the ground state.

In the application of an organic electroluminescence device to a display device, there is a demand for an organic electroluminescence device having a long life, and thus there is an ongoing demand for development of materials for an organic electroluminescence device capable of stably attaining such a feature.

SUMMARY

One or more aspects of embodiments of the present disclosure are directed toward an organic electroluminescence device having high efficiency, low driving voltage, high luminance, and/or long life (long lifespan) characteristics, and an organometallic compound used therein.

One or more example embodiments of the present disclosure provide an organic electroluminescence device including a first electrode, a hole transport region, an emission layer, an electron transport region, and a second electrode. The hole transport region may be disposed on the first electrode. The emission layer may be disposed on the hole transport region. The electron transport region may be disposed on the emission layer. The second electrode may be disposed on the electron transport region. The emission layer may include an organometallic compound. The organometallic compound may include a metal atom, and four ligands binding to the metal atom. At least one of the four ligands may be a substituted or unsubstituted mesoionic carbene (MIC) group having 1 to 20 ring-forming carbon atoms.

The four ligands may each independently be a substituted or unsubstituted mesoionic carbene group having 1 to 20 ring-forming carbon atoms, a substituted or unsubstituted aryl group having 6 to 30 ring-forming carbon atoms, or a substituted or unsubstituted heteroaryl group having 2 to 30 ring-forming carbon atoms.

Each of the four ligands may be a tetradentate ligand linked with at least one of adjacent ligands by a linking group.

The metal atom may be a platinum (Pt) atom.

The mesoionic carbene group may be derived from at least one selected from a substituted or unsubstituted imidazole precursor, a substituted or unsubstituted triazole precursor, a substituted or unsubstituted tetrazole precursor, a substituted or unsubstituted pyridine precursor, and a substituted or unsubstituted pyrazoline precursor. The emission layer may include a host and a dopant. The dopant may include the organometallic compound.

The emission layer may be to emit green light having a center wavelength of about 500 nm to about 600 nm. The emission layer may be to emit green light through phosphorescence.

The organometallic compound may be represented by Formula 1:

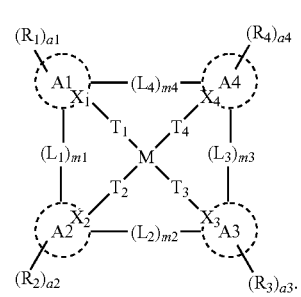

Formula 1

In Formula 1, $A_1$ to $A_4$ may each independently be a substituted or unsubstituted mesoionic carbene group having 1 to 20 ring-forming carbon atoms, a substituted or unsubstituted aryl group having 6 to 30 ring-forming carbon atoms, or a substituted or unsubstituted heteroaryl group having 2 to 30 ring-forming carbon atoms. At least one of $A_1$ to $A_4$ may be the mesoionic carbene group. $X_1$ to $X_4$ may each independently be a carbon atom or a nitrogen atom. $R_1$ to $R_4$ may each independently be a hydrogen atom, a deuterium atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring. $a1$ to $a4$ may each independently be an integer of 0 to 4.

$L_1$ to $L_4$ may each independently be a direct linkage,

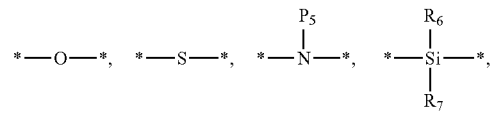

-continued

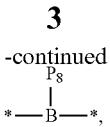

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms. $R_5$ to $R_8$ may each independently be a substituted or unsubstituted alkyl group having 1 to 20 carbon atoms, a substituted or unsubstituted aryl group having 6 to 30 ring-forming carbon atoms or a substituted or unsubstituted heteroaryl group having 2 to 30 ring-forming carbon atoms, and/or bonded to an adjacent group to form a ring. m1 to m4 may each independently be 0 or 1. $T_1$ to $T_4$ may each independently be a direct linkage, an oxygen (O) atom, or a sulfur (S) atom. M may be platinum (Pt), palladium (Pd), copper (Cu), silver (Ag), gold (Au), rhodium (Rh), iridium (Ir), ruthenium (Ru), osmium (Os), titanium (Ti)), Zirconium (Zr), hafnium (Hf), europium (Eu), terbium (Tb), or thulium (Tm).

In some embodiments, the organometallic compound represented by Formula 1 may be represented by Formula 2.

Formula 2

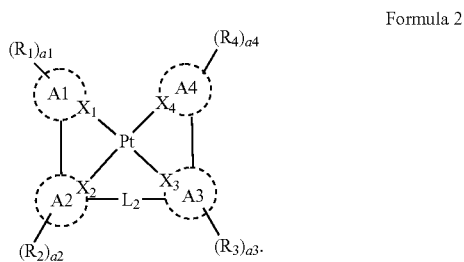

In Formula 2, A1 to A4, $X_1$ to $X_4$, $R_1$ to $R_4$, a1 to a4, and $L_2$ may each independently be the same as defined in connection with Formula 1.

At least one of A1 and A4 may be a mesoionic carbene group represented by any one of 1-1 to 1-6:

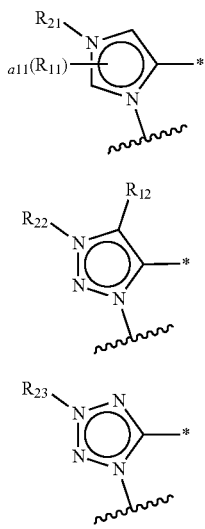

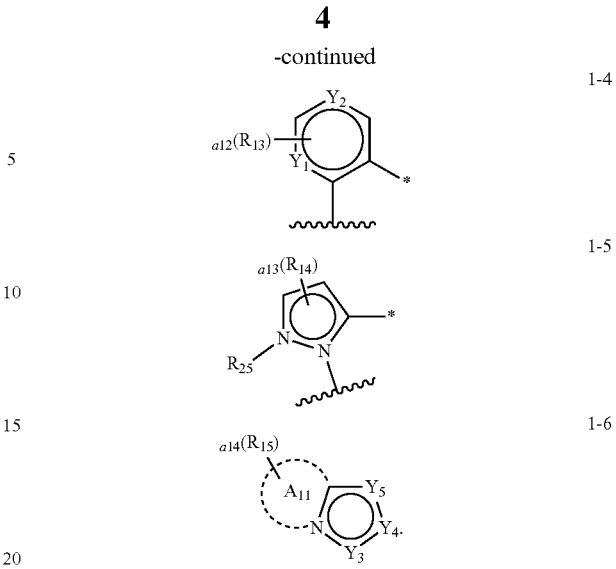

In 1-1 to 1-6,
One of $Y_1$ and $Y_2$ may be CH and the other may be $NR_{24}$.

may be a connection point to any one of $L_1$ to $L_4$, or a position of binding to a neighboring ligand. —* may be a position of binding to M. A11 may be a substituted or unsubstituted aryl group having 6 to 30 ring-forming carbon atoms or a substituted or unsubstituted heteroaryl group having 2 to 30 ring-forming carbon atoms. Any one of $Y_3$ and $Y_4$ may be

and the other may be C—*. $Y_5$ may be $NR_{26}$ or

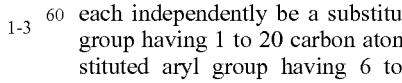

$R_{11}$ to $R_{15}$ may each independently be a hydrogen atom, a deuterium atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring. $R_{21}$ to $R_{26}$ may each independently be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. a11 to a13 may each independently be an integer of 0 to 2.

The mesoionic carbene group represented by 1-6 may be represented by 1-6-1:

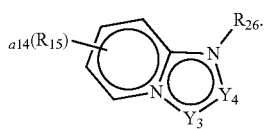

1-6-1

In Formula 1-6-1, $Y_3$, $Y_4$, $R_{15}$, $R_{26}$, and a14 may each independently be the same as defined in connection with 1-6.

At least one of A1 and A4 may be represented by any one of 1-1 to 1-6, and the remaining ligands of A1 and A4 that are not represented by 1-1 to 1-6 among A1 and A4, (for example, A2 and A3) may each independently be represented by any one of 2-1 to 2-4:

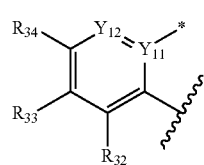

2-1

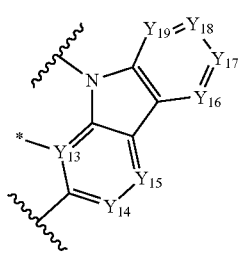

2-2

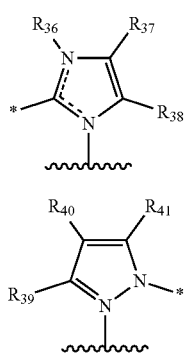

2-3

2-4

In 2-1 to 2-4, $Y_{11}$ may be a carbon atom or a nitrogen atom. $Y_{12}$ may be $CR_{31}$ or

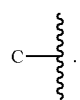

$Y_{13}$ to $Y_{19}$ may each independently be $CR_{35}$ or a nitrogen atom. $R_{31}$ to $R_{41}$ may each independently be a hydrogen atom, a deuterium atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring.

The organometallic compound represented by Formula 1 may be represented by at least one of Formulae 3-1 to 3-7:

Formula 3-1

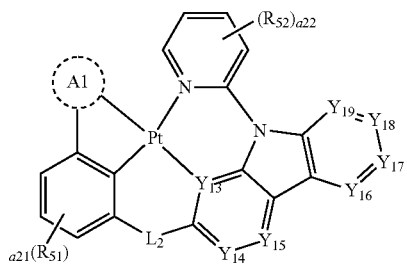

Formula 3-2

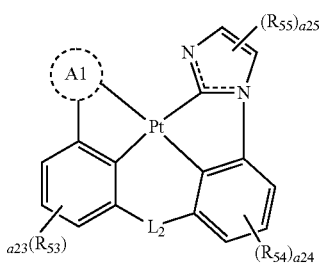

Formula 3-3

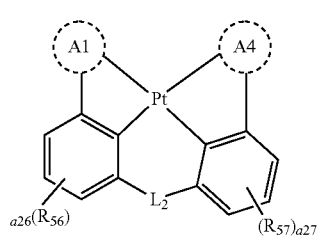

Formula 3-4

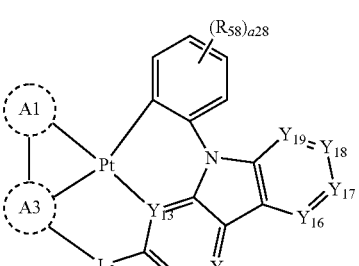

Formula 3-5

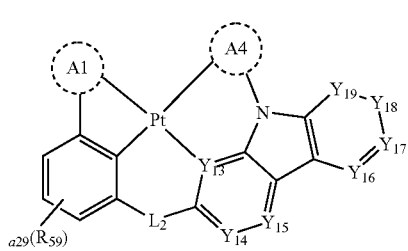

Formula 3-6

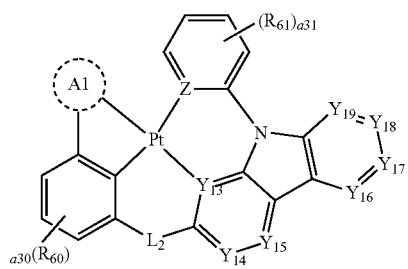

Formula 3-7

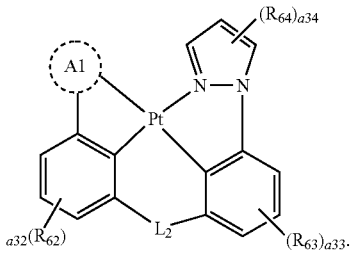

In Formulae 3-1 and 3-2, A1 may be represented by any one of 1-1 to 1-5. In Formulae 3-3 and 3-5, at least one of A1 and A4 may be represented by any one of 1-1 to 1-5. In Formula 3-4, at least one of A1 and A3 may be represented by any one of 1-1 to 1-5. In Formulae 3-6 and 3-7, A1 may be represented by 1-6.

In Formulae 3-1 to 3-6, $R_{51}$ to $R_{64}$ may each independently be a hydrogen atom, a deuterium atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring. Z may be a carbon atom or a nitrogen atom. a21, a23, a24, a26, a27, a29, a30, a32, a33, and a34 may each independently be an integer of 0 to 3. a22, a28, and a31 may each independently be an integer of 0 to 4. a25 may be an integer of 0 to 2. $Y_{13}$ to $Y_{19}$ and $L_2$ may be each independently the same as defined in connection with 2-2.

The emission layer may include at least one of the compounds represented by Compound Group 1 and Compound Group 2.

One or more example embodiments of the present disclosure provide the organometallic compound described above.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
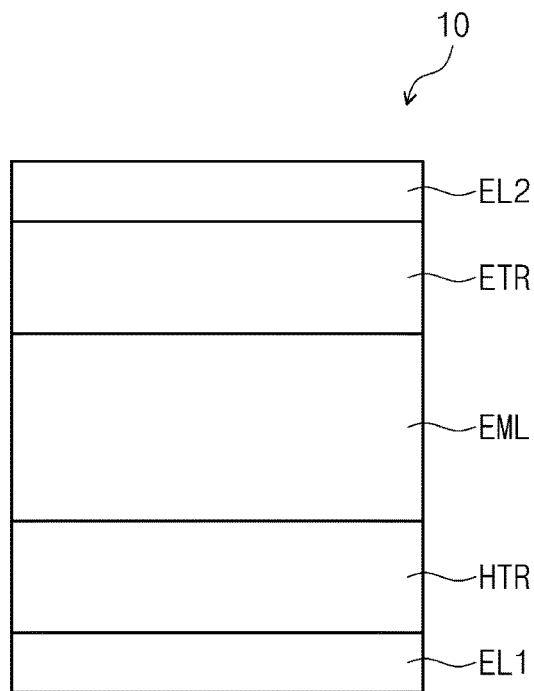
FIG. 1 is a schematic cross-sectional view illustrating an organic electroluminescence device according to an embodiment of the present disclosure.

The present disclosure may have various modifications and may be embodied in different forms, and example embodiments will be explained in detail with reference to the accompany drawings. The present disclosure may, however, be embodied in different forms and should not be construed as limited to the embodiments set forth herein. Rather, all modifications, equivalents, and substituents which are included in the spirit and technical scope of the present disclosure should be included in the present disclosure.

In the drawings, like reference numerals refer to like elements throughout, and duplicative descriptions thereof may not be provided. The dimensions of structures may be exaggerated for clarity of illustration. It will be understood that although the terms first, second, etc. may be used herein to describe various elements, these elements should not be limited by these terms. These terms are only used to distinguish one element from another element. For example, a first element could be alternatively termed a second element without departing from the teachings of the present disclosure. Similarly, a second element could be alternatively termed a first element. As used herein, the singular forms are intended to include the plural forms as well, unless the context clearly indicates otherwise.

It will be further understood that the terms "includes," "including," "comprises," and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

In the present disclosure, when a layer, a film, a region, a plate, etc. is referred to as being "on" or "above" another part, it can be "directly on" the other part, or intervening layers may also be present. In contrast, it will be understood that when a layer, a film, a region, a plate, etc. is referred to as being "under" or "beneath" another part, it can be "directly under", and one or more intervening layers may also be present. In addition, it will also be understood that when a plate is referred to as being disposed "above" another part, it can be disposed above or beneath another part.

As used herein, the singular forms "a," "an," and "the" are intended to include the plural forms as well, unless the context clearly indicates otherwise. As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items. Further, the use of "may" when describing embodiments of the present disclosure refers to "one or more embodiments of the present disclosure".

In the description, the term "substituted or unsubstituted" may indicate that e.g., a group or position, is either unsubstituted or substituted with at least one substituent selected from the group consisting of a deuterium atom, a halogen atom, a cyano group, a nitro group, an amino group, a silyl group, oxy group, thio group, sulfinyl group, sulfonyl group, carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents may be further substituted or unsubstituted. For example, a biphenyl group may be interpreted as an aryl group or as a phenyl group substituted with a phenyl group.

In the description, the term "bonded to an adjacent group to form a ring" may indicate that the element is bonded to an adjacent group to form a substituted or unsubstituted hydrocarbon ring, or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The hydrocarbon ring and heterocycle may each independently be monocyclic or polycyclic.

In some embodiments, the rings formed by being bonded to each other may be connected to another ring to form a spiro structure.

In the description, the term "an adjacent group" may refer to a substituent on the same atom or point, a substituent on an atom that is directly connected to the base atom or point, or a substituent sterically positioned (e.g., within intramolecular bonding distance) to the corresponding substituent. For example, two methyl groups in 1,2-dimethylbenzene may be interpreted as mutually "adjacent groups" and two ethyl groups in 1,1-diethylcyclopentane may be interpreted as mutually "adjacent groups".

In the description, non-limiting examples of the halogen atom include a fluorine atom, a chlorine atom, a bromine atom, and an iodine atom.

In the description, the term "alkyl group" may refer to a linear, branched or cyclic alkyl group. The number of carbon atoms in the alkyl group may be 1 to 50, 1 to 30, 1 to 20, 1 to 10, or 1 to 6. Non-limiting examples of the alkyl group include methyl group, ethyl group, n-propyl group, isopropyl group, n-butyl group, s-butyl group, t-butyl group, i-butyl group, 2-ethylbutyl group, 3,3-dimethylbutyl group, n-pentyl group, i-pentyl group, neopentyl group, t-pentyl group, cyclopentyl group, 1-methylpentyl group, 3-methylpentyl group, 2-ethylpentyl group, 4-methyl-2-pentyl group, n-hexyl group, 1-methylhexyl group, 2-ethylhexyl group, 2-butylhexyl group, cyclohexyl group, 4-methylcyclohexyl group, 4-t-butylcyclohexyl group, n-heptyl group, 1-methylheptyl group, 2,2-dimethylheptyl group, 2-ethylheptyl group, 2-butylheptyl group, n-octyl group, t-octyl group, 2-ethyloctyl group, 2-butyloctyl group, 2-hexyloctyl group, 3,7-dimethyloctyl group, cyclooctyl group, n-nonyl group, n-decyl group, adamantyl group, 2-ethyldecyl group, 2-butyldecyl group, 2-hexyldecyl group, 2-octyldecyl group, n-undecyl group, n-dodecyl group, 2-ethyldodecyl group, 2-butyldodecyl group, 2-hexyldocecyl group, 2-octyldodecyl group, n-tridecyl group, n-tetradecyl group, n-pentadecyl group, n-hexadecyl group, 2-ethylhexadecyl group, 2-butylhexadecyl group, 2-hexylhexadecyl group, 2-octylhexadecyl group, n-heptadecyl group, n-octadecyl group, n-nonadecyl group, n-eicosyl group, 2-ethyleicosyl group, 2-butyleicosyl group, 2-hexyleicosyl group, 2-octyleicosyl group, n-henicosyl group, n-docosyl group, n-tricosyl group, n-tetracosyl group, n-pentacosyl group, n-hexacosyl group, n-heptacosyl group, n-octacosyl group, n-nonacosyl group, n-triacontyl group, etc.

In the description, the term "hydrocarbon ring" may refer to any functional group or substituent derived from an aliphatic hydrocarbon ring. The hydrocarbon ring group may be a saturated hydrocarbon ring group having 5 to 20 ring-forming carbon atoms.

In the description, the term "aryl group" may refer to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Non-limiting examples of the aryl group include a phenyl group, a naphthyl group, a fluorenyl group, an anthracenyl group, a phenanthryl group, a biphenyl group, a terphenyl group, a quaterphenyl group, a quinqphenyl group, a sexiphenyl group, a triphenylenyl group, a pyrenyl group, a benzofluoranthenyl group, a chrysenyl group, etc.

In the description, the term "heteroaryl group" may refer to a functional group or substituent derived from a ring including one or more boron (B), oxygen (O), nitrogen (N), phosphorus (P), silicon (Si), or sulfur (S) atoms as heteroatoms. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Non-limiting examples of the heteroaryl group include a thiophene group, a furan group, a pyrrole group, an imidazole group, a thiazole group, an oxazole group, an oxadiazole group, a triazole group, a pyridine group, a bipyridine group, a pyrimidine group, a triazine group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, an isooxazole group, an oxadiazole group, a thiadiazole group, a phenothiazine group, a dibenzosilole group, a dibenzofuran group, an aromatic heterocyclic carbenyl group, etc. In some embodiments, the aromatic heterocyclic carbenyl group may be an aromatic N-heterocyclic carbenyl group. The N-heterocyclic carbenyl group may be, for example, an imidazole-2-ylidenyl group.

In the description, the term "arylene group" may have the same description as the aryl group, except that the arylene group may be a divalent group. The term "heteroarylene group" may have the same description as the heteroaryl group, except that the heteroarylene group may be a divalent group.

In the description, a term "silyl group" may be an alkyl silyl group or an aryl silyl group. Non-limiting examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc.

In the description, the term "thio group" may refer to an alkyl thio group and an aryl thio group.

In the description, the term "oxy group" may refer to an alkoxy group or an aryl oxy group. The alkoxy group may include a linear, branched or cyclic alkyl chain. The number of carbon atoms in the alkoxy group may be, for example, 1 to 20, or 1 to 10, but is not particularly limited thereto. Non-limiting examples of the oxy group include methoxy, ethoxy, n-propoxy, isopropoxy, butoxy, pentyloxy, hexyloxy, octyloxy, nonyloxy, decyloxy, benzyloxy, etc.

In the description, the term "boron group" may refer to an alkyl boron group or an aryl boron group. Non-limiting examples of the boron group include a trimethylboron group, a triethylboron group, a t-butyldimethylboron group, a triphenylboron group, a diphenylboron group, a phenylboron group, etc.

In the description, the term "alkenyl group" may refer to a linear or branched chain. The number of carbon atoms is not specifically limited, and may be 2 to 30, 2 to 20, or 2 to 10. Non-limiting examples of the alkenyl group include a vinyl group, a 1-butenyl group, a 1-pentenyl group, a 1,3-butadienyl aryl group, a styrenyl group, a styryl vinyl group, etc.

In the description, the number of carbon atoms in an amine group is not particularly limited, and may be 1 to 30. The term "amine group" may refer to an alkyl amine group or an aryl amine group. Non-limiting examples of the amine group include a methylamine group, a dimethylamine group, a phenylamine group, a diphenylamine group, a naphthylamine group, a 9-methyl-anthracenylamine group, a triphenylamine group, etc.

In the description, examples of the alkyl group within the alkylthio group, the alkyl sulfoxy group, the alkylaryl group, the alkylamino group, the alkyl boron group, the alkyl silyl group, and the alkyl amine group may be the same as the alkyl group described above.

In the description, examples of the aryl group within the aryloxy group, arylthio group, aryl sulfoxy group, arylamino group, aryl boron group, aryl silyl group, and aryl amine group may be the same as the aryl group described above.

In the description, the term "direct linkage or bond" may refer to a single linkage or bond.

FIG. 1 is a schematic cross-sectional view illustrating an organic electroluminescence device according to an embodiment of the present disclosure. An organic electroluminescence device 10 according to an embodiment may include a first electrode EL1, a hole transport region HTR, an emission layer EML, an electron transport region ETR, and a second electrode EL2 that are sequentially stacked.

Figure 2:
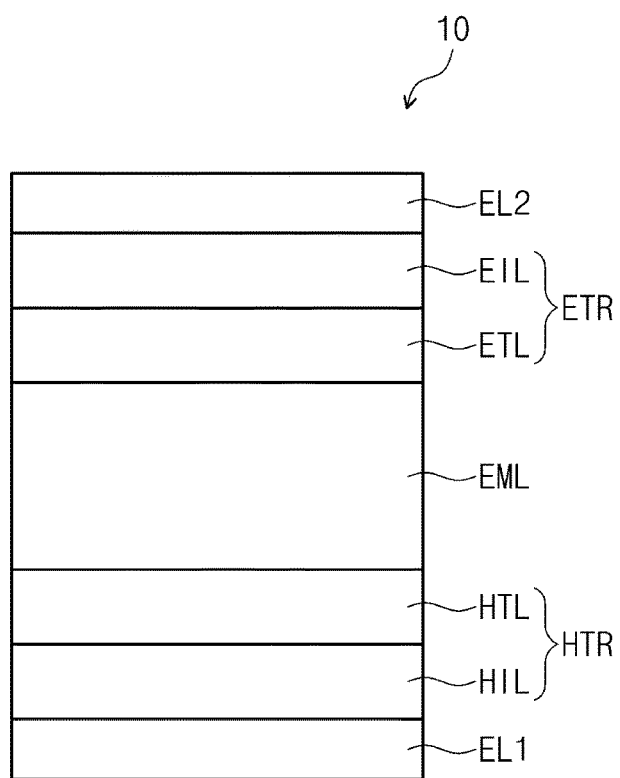
FIG. 2 is a schematic cross-sectional view illustrating an organic electroluminescence device according to an embodiment of the present disclosure.
Figure 3:
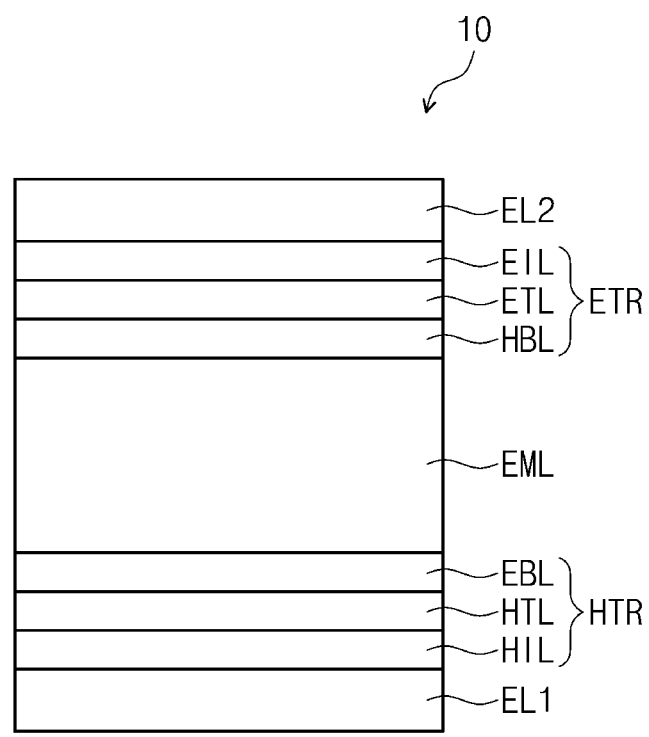
FIG. 3 is a schematic cross-sectional view illustrating an organic electroluminescence device according to an embodiment of the present disclosure.

Compared to FIG. 1, FIG. 2 illustrates a cross-sectional view of an organic electroluminescence device 10 of an embodiment, in which the hole transport region HTR includes a hole injection layer HIL and a hole transport layer HTL, and the electron transport region ETR includes an electron injection layer EIL and an electron transport layer ETL. Compared to FIG. 1, FIG. 3 illustrates a cross-sectional view of an organic electroluminescence device 10 of an embodiment, in which the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL.

At least one of the hole transport region HTR, the emission layer EML, or the electron transport region ETR may include an organometallic compound of an embodiment. The organometallic compound of an embodiment will be described later in more detail.

The first electrode EL1 may have conductivity (e.g., may be conductive). The first electrode EL1 may be formed of a metal alloy or a conductive compound. The first electrode EL1 may be an anode. In some embodiments, the first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide (such as indium tin oxide (ITO), indium zinc oxide (IZO), zinc oxide (ZnO), and/or indium tin zinc oxide (ITZO)). When the first electrode EU is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), a compound thereof, or a mixture thereof (for example, a mixture of Ag and Mg). In some embodiments, the first electrode EL1 may have a multilayer structure including a reflective film or a transflective film, and a transparent conductive film formed of indium tin oxide (ITO), indium zinc oxide (IZO), zinc oxide (ZnO), or indium tin zinc oxide (ITZO), etc. For example, the first electrode EL1 may have a three-layer structure of ITO/Ag/ITO, but is not limited thereto. The thickness of the first electrode EU may be about 1,000 Å to about 10,000 Å, for example, about 1,000 Å to about 3,000 Å.

The hole transport region HTR is disposed on the first electrode EL1. The hole transport region HTR may include at least one of a hole injection layer HIL, a hole transport layer HTL, a hole buffer layer, or an electron blocking layer EBL.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of a hole injection layer HIL or a hole transport layer HTL, and may have a single layer structure formed of a hole injection material or a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, but an embodiment is not limited thereto.

The hole transport region HTR may be formed using various methods (such as a vacuum deposition method, a spin coating method, a cast method, a Langmuir-Blodgett (LB) method, an inkjet printing method, a laser printing method, and/or a laser induced thermal imaging (LITI) method).

The hole injection layer HIL may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4', 4"-tris(N,N-diphenylamino)triphenylamine (TDATA), 4,4', 4"-tris{N,-(2-naphthyl)-N-phenylamino)-triphenylamine (2-TNATA), poly(3,4-ethylene dioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may further include, for example, carbazole derivatives (such as N-phenyl carbazole and/or polyvinyl carbazole), fluorene derivatives, N,N'-bis (3-methylphenyl)-N,N'-diphenyl-[1,1-biphenyl]-4,4'-diamine (TPD), triphenylamine derivatives (such as 4,4',4"-tris(N-carbazolyl)triphenylamine (TCTA)), N,N'-di (naphthalene-1-yl)-N,N'-diphenyl-benzidine (NPB), 4,4'-cyclohexylidene bis[N, N-bis(4-methylphenyl) benzenamine] (TAPC), 4,4'-bis[N, N'-(3-tolyl)amino]-3,3'-dimethylbiphenyl (HMTPD), 1,3-bis(N-carbazolyl)benzene (mCP), etc.

The thickness of the hole transport region HTR may be about 100 Å to about 10,000 Å, for example, about 100 Å to about 5,000 Å. The thickness of the hole injection region HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL, and the electron blocking layer EBL satisfy the above-described ranges, satisfactory hole transport properties may be achieved without a substantial increase in driving voltage.

The hole transport region HTR may further include, in addition to the above-described materials, a charge generating material to increase conductivity. The charge generating material may be dispersed substantially uniformly or non-uniformly in the hole transport region HTR. The charge generating material may be, for example, a p-dopant. The p-dopant may be a quinone derivative, metal oxide, or cyano group-containing compound, but is not limited thereto. Non-limiting examples of the p-dopant include quinone derivatives (such as tetracyanoquinodimethane (TCNQ) and/or 2,3,5,6-tetrafluoro-7,7,8,8-tetracyanoquinodimethane (F4-TCNQ)), metal oxides (such as tungsten oxide and/or molybdenum oxide), etc.

As described above, the hole transport region HTR may further include at least one of a hole buffer layer or an electron blocking layer EBL in addition to the hole injection layer HIL and the hole transport layer HTL. The hole buffer layer may compensate for a resonance distance according to the wavelength of light emitted from an emission layer EML, and may increase light emission efficiency. Materials that may be included in the hole transport region HTR may be used as materials included in the hole buffer layer. The electron blocking layer EBL may prevent or reduce electrons from being injected from the electron transport region ETR to the hole transport region HTR.

The emission layer EML is disposed on the hole transport region HTR. The thickness of the emission layer EML may be, for example, about 100 Å to about 1000 Å or about 100 Å to about 300 Å. The emission layer EML may have a single layer formed of a single material, a single layer formed of a plurality of different materials, or a multilayer structure having a plurality of layers formed of a plurality of different materials.

The emission layer EML may include an organometallic compound of an embodiment.

The organometallic compound of an embodiment may include a metal atom and a ligand binding to the metal atom. For example, the organometallic compound may include a metal atom and four ligands binding to the metal atom. For example, the metal atoms and ligands may bind to each other via coordinate bonds. At least one of the four ligands may include a mesoionic carbene group. The mesoionic carbene group may be a substituted or unsubstituted mesoionic carbene group having 1 to 20 ring-forming carbon atoms.

The metal atom may be platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm). For example, the metal atom may be a platinum (Pt) atom.

The mesoionic carbene group may be an aromatic mesoionic carbene group. The aromatic mesoionic carbene group may be derived from a nitrogen-containing heterocyclic group. For example, the mesoionic carbene group may be derived from at least one of a substituted or unsubstituted imidazole precursor, a substituted or unsubstituted triazole precursor, a substituted or unsubstituted tetrazole precursor, a substituted or unsubstituted pyridine precursor, or a substituted or unsubstituted pyrazoline precursor. For example, the mesoionic carbene group may be an imidazolin-4-ylidene derivatives, 1,2,3-triazolylidene derivatives, tetrazol-5-ylidene derivatives, pyridin-3-ylidene derivatives, pyrazolin-5-ylidene derivatives, imidazo [1,2-a]pyridin-2-ylidene or imidazo [1,2-a] pyridin-3-ylidene derivatives. In some embodiments, the mesoionic carbene group may be a substituted or unsubstituted imidazolin-4-ylidene group, a substituted or unsubstituted 1,2,3-triazolylidene group, a substituted or unsubstituted tetrazol-5-ylidene group, a substituted or unsubstituted group pyridin-3-ylidene group, a substituted or unsubstituted pyrazolin-5-ylidene group, an imidazo [1,2-a] pyridin-2-ylidene group, or an imidazo [1,2-a] pyridin-3-ylidene group. The substituted pyrazolin-5-ylidene group may be a substituted benzopyrazolin-5-ylidene group.

The four ligands may each independently be a mesoionic carbene group, an aryl group, or a heteroaryl group. The mesoionic carbene group may be a substituted or unsubstituted mesoionic carbene group having 1 to 20 ring-forming carbon atoms; the aryl group may be a substituted or unsubstituted aryl group having 6 to 30 ring-forming carbon atoms; and the heteroaryl group may be a substituted or unsubstituted heteroaryl group having 2 to 30 ring-forming carbon atoms.

Each of the four ligands may be or form part of a tetradentate ligand by linking with at least one of the adjacent ligands via a linking group. For example, the four ligands may be one tetradentate ligand linked to each other. For example, the first ligand and the second ligand may be connected via a linking group, the second ligand and the third ligand may be connected via a linking group, and the third ligand and the fourth ligand may be connected via a linking group. The linking group may be a direct linkage or a divalent linking group.

The organometallic compound of an embodiment may be represented by Formula 1.

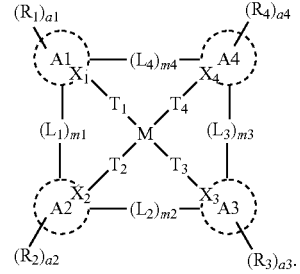

Formula 1

In Formula 1, A1 to A4 represent four ligands. A1 to A4 may each independently be a mesoionic carbene group, an aryl group, or a heteroaryl group. The mesoionic carbene group may be a substituted or unsubstituted mesoionic carbene group having 1 to 20 ring-forming carbon atoms. The aryl group may be a substituted or unsubstituted aryl group having 6 to 30 ring-forming carbon atoms. The heteroaryl group may be a substituted or unsubstituted heteroaryl group having 2 to 30 ring-forming carbon atoms. At least one of A1 to A4 may be a mesoionic carbene group.

The aryl group may be, for example, a substituted or unsubstituted phenyl group. The heteroaryl group may be, for example, a substituted or unsubstituted pyridine group, a substituted or unsubstituted carbazole group, or a substituted or unsubstituted heterocyclic carbene group. The heterocyclic carbene group may be a normal (e.g., standard or canonical) N-heterocyclic carbene group. For example, the heterocyclic carbene group may be a substituted or unsubstituted imidazolin-2-ylidene group.

$X_1$ to $X_4$ may each independently be a carbon atom or a nitrogen atom.

$R_1$ to $R_4$ may each independently be a hydrogen atom, a deuterium atom, a cyano group, an alkyl group, an aryl group, or a heteroaryl group, and/or bonded to an adjacent group to form a ring. The alkyl group may be a substituted or unsubstituted alkyl group having 1 to 20 carbon atoms. The aryl group may be a substituted or unsubstituted aryl group having 6 to 30 ring-forming carbon atoms. The heteroaryl group may be a substituted or unsubstituted heteroaryl group having 2 to 30 ring-forming carbon atoms.

For example, the alkyl group may be a methyl group or a t-butyl group. The aryl group may be a substituted or unsubstituted phenyl group. $R_1$ to $R_4$ may bind to an adjacent group to form a substituted or unsubstituted phenyl group or a substituted or unsubstituted pyrazine group.

a1 to a4 may each independently be an integer of 0 to 4. When a1 is an integer of 2 or more, a plurality of $R_1$'s may be the same as or different from each other. The same description of a1 may also be applied to a2 to a4.

$L_1$ to $L_4$ may each independently be a direct linkage,

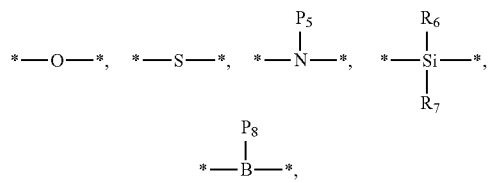

a divalent alkyl group, a arylene group, or a heteroarylene group. The divalent alkyl group may be a substituted or unsubstituted alkyl group having 1 to 20 carbon atoms. The arylene group may be a substituted or unsubstituted arylene group having 6 to 30 ring-forming carbon atoms. The heteroarylene group may be a substituted or unsubstituted heteroarylene group having 2 to 30 ring-forming carbon atoms.

For example, $L_1$ and $L_3$ may each be a direct linkage and $L_2$ may be any one of

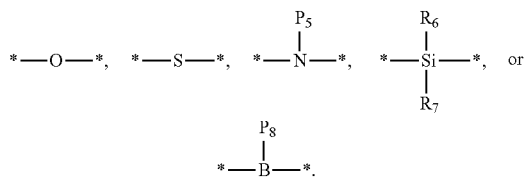

In the description, "—•" refers to a position to be connected. For example, in $L_1$ to $L_4$, "—•" may refer to positions connected to A1 to A4.

$R_5$ to $R_8$ may each independently be a hydrogen atom, a deuterium atom, an alkyl group, an aryl group, or a heteroaryl group, and/or bonded to an adjacent group to form a ring. The alkyl group may be a substituted or unsubstituted alkyl group having 1 to 20 carbon atoms. The aryl group may be a substituted or unsubstituted aryl group having 6 to 30 ring-forming carbon atoms. The heteroaryl group may be a substituted or unsubstituted heteroaryl group having 2 to 30 ring-forming carbon atoms. For example, $R_5$ to $R_8$ may be a methyl group or a substituted or unsubstituted phenyl group. For example, $R_6$ and $R_7$ may bind to each other to form a ring. For example, $R_6$ and $R_7$ may bind to each other to form a dibenzosilyl group:

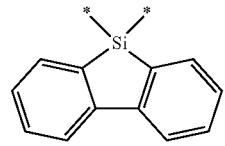

m1 to m4 may each independently be 0 or 1. For example, m1 to m3 may be 1 and m4 may be 0.

$T_1$ to $T_4$ may each independently be a direct linkage, an oxygen atom, or a sulfur atom. For example, all of $T_1$ to $T_4$ may be a direct linkage.

M may be platinum (Pt), palladium (Pd), copper (Cu), silver (Ag), gold (Au), rhodium (Rh), iridium (Ir), ruthenium (Ru), osmium (Os), titanium (Ti)), Zirconium (Zr), hafnium (Hf), europium (Eu), terbium (Tb), or thulium (Tm). For example, M may be a platinum (Pt) atom, a palladium (Pd) atom, a rhodium (Rh) atom, or an osmium (Os) atom.

Formula 1 may be represented by Formula 2:

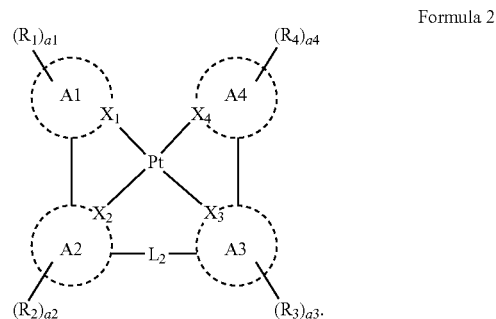

Formula 2

Formula 2 is an embodiment of Formula 1 in which $L_1$, $L_3$, $L_4$, m1 to m4, $T_1$ to $T_4$, and M are specified. In Formula 2, $A_1$ to $A_4$, $X_1$ to $X_4$, $R_1$ to $R_4$, a1 to a4, and $L_2$ may each independently be the same as defined in Formula 1.

At least one of A1 and A4 may be a mesoionic carbene group represented by any one of 1-1 to 1-6:

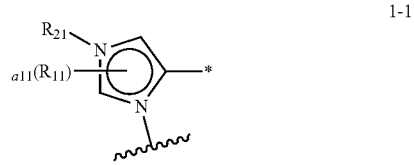

1-1

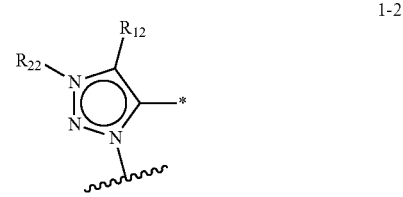

1-2

1-3

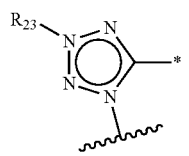

1-4

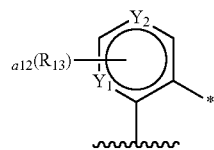

1-5

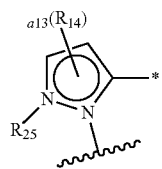

1-6

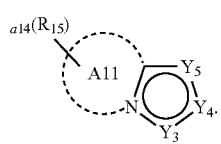

In 1-1 to 1-6, one of $Y_1$ and $Y_2$ may be CH and the other may be $NR_{24}$.

may be any one of $L_1$ to $L_4$, or a position of binding to a neighboring ligand. —* may be a position of binding to a metal atom, M. Hereinafter, unless stated otherwise,

refers to a position linked with a ligand or $L_1$ to $L_4$, and —* is a position linked with a metal atom. A11 may be a substituted or unsubstituted aryl group having 6 to 30 ring-forming carbon atoms or a substituted or unsubstituted heteroaryl group having 2 to 30 ring-forming carbon atoms. Either of $Y_3$ and $Y_4$ may be

and the other may be C—* ... $Y_5$ may be $NR_{26}$ or

$R_{11}$ to $R_{15}$ may each independently be a hydrogen atom, a deuterium atom, a cyano group, an alkyl group, an aryl group, or a heteroaryl group, and/or bonded to an adjacent group to form a ring. The alkyl group may be a substituted or unsubstituted alkyl group having 1 to 20 carbon atoms. The aryl group may be a substituted or unsubstituted aryl group having 6 to 30 ring-forming carbon atoms. The heteroaryl group may be a substituted or unsubstituted heteroaryl group having 2 to 30 ring-forming carbon atoms. For example, $R_{11}$ to $R_{15}$ may each independently be a hydrogen atom, an unsubstituted methyl group, an unsubstituted isopropyl group, an unsubstituted t-butyl group, a $CD_3$ group (trideuterated methyl group), or a substituted or unsubstituted phenyl group. When $R_{11}$ to $R_{15}$ bind to an adjacent group to form a ring, a substituted or unsubstituted phenyl group may be formed.

a11 to a13 may each independently be an integer of 0 to 3. a14 may be an integer of 0 to 4.

When a11 is an integer of 2 or more, a plurality of $R_{11}$'s may be the same as or different from each other. The same description of all may also be applied to a12 to a14.

$R_{21}$ to $R_{26}$ may each independently be an alkyl group, an aryl group, or a heteroaryl group. The alkyl group may be a substituted or unsubstituted alkyl group having 1 to 20 carbon atoms. The aryl group may be a substituted or unsubstituted aryl group having 6 to 30 ring-forming carbon atoms. The heteroaryl group may be a substituted or unsubstituted heteroaryl group having 2 to 30 ring-forming carbon atoms. For example, $R_{21}$ to $R_{26}$ may each independently be an unsubstituted methyl group or a substituted or unsubstituted phenyl group.

For example, one or two selected from A1 and A4 may be a mesoionic carbene group represented by any one of 1-1 to 1-6. When both A1 and A4 are mesoionic carbene groups (e.g., simultaneously), A1 and A4 may be the same as or different from each other. For example, A1 and A4 may each independently be a mesoionic carbene group represented by any one of 1-1 to 1-6, and any one of A1 and A4 may be a mesoionic carbene group represented by any one of 1-1 to 1-6.

In an embodiment, 1-5 may be represented by 1-5-1.

1-5-1

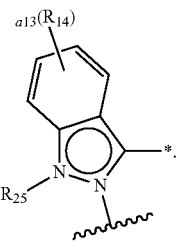

In 1-5-1, $R_{14}$ and a13 may each independently be the same as defined in 1-5.

In some embodiments, 1-6 may be represented by 1-6-1.

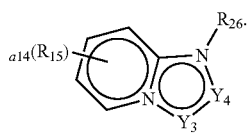

1-6-1

In 1-6-1, $Y_3$, $Y_4$, $R_{15}$, $R_{26}$, and a14 may each independently be the same as defined in 1-6. At least one of A1 and A4 may be represented by any one of 1-1 to 1-6, and the remaining ligand that is not represented by 1-1 to 1-6 may be represented by any one of 2-1 to 2-4. A2 and A3 may each independently be represented by any one of 2-1 to 2-4:

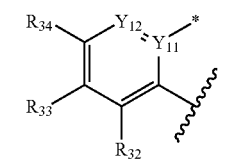

2-1

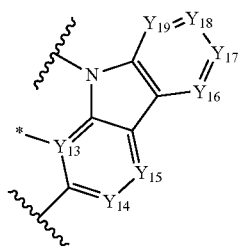

2-2

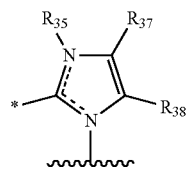

2-3

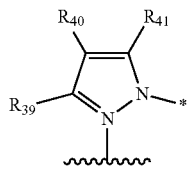

2-4

In 2-1 to 2-4, $Y_{11}$ may be a carbon atom or a nitrogen atom. $Y_{12}$ may be $CR_{31}$ or

$Y_{13}$ to $Y_{19}$ may each independently be $CR_{35}$ or a nitrogen atom. For example, $R_{31}$ to $R_{41}$ may each independently be a hydrogen atom, a deuterium atom, an alkyl group, an aryl group, or a heteroaryl group, and/or bonded to an adjacent group to form a ring. The alkyl group may be a substituted or unsubstituted alkyl group having 1 to 20 carbon atoms. The aryl group may be a substituted or unsubstituted aryl group having 6 to 30 ring-forming carbon atoms. The heteroaryl group may be a substituted or unsubstituted heteroaryl group having 2 to 30 ring-forming carbon atoms. For example, $R_{31}$ to $R_{41}$ may each independently be a hydrogen atom, an unsubstituted methyl group, an unsubstituted t-butyl group or a substituted or unsubstituted phenyl group, and/or bonded to an adjacent group to form a substituted or unsubstituted benzene ring or a substituted or unsubstituted pyrazine ring.

For example, Formula 1 may be represented by at least one of Formulae 3-1 to 3-5:

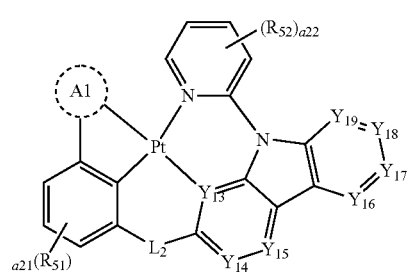

Formula 3-1

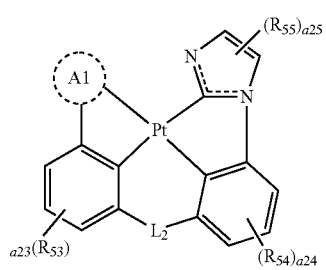

Formula 3-2

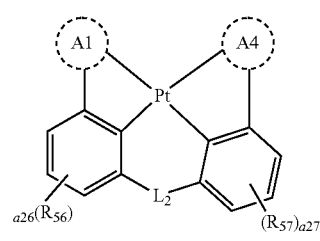

Formula 3-3

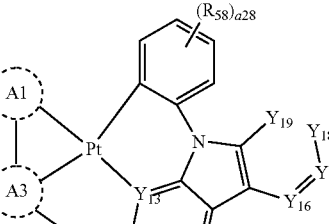

Formula 3-4

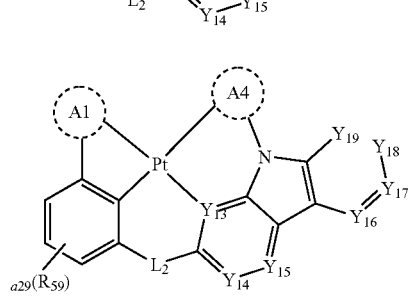

Formula 3-5

Formula 3-6

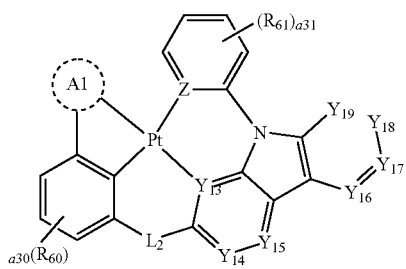

Formula 3-7

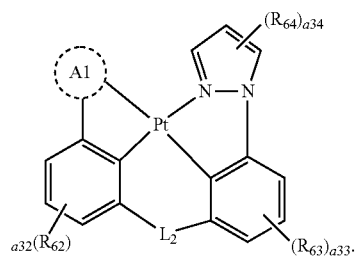

Formula 3-6-1

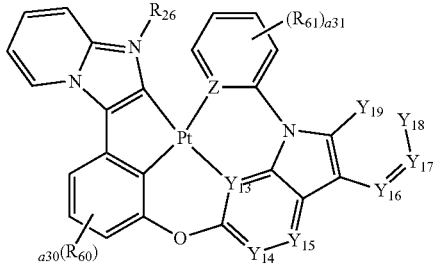

Formula 3-6-2

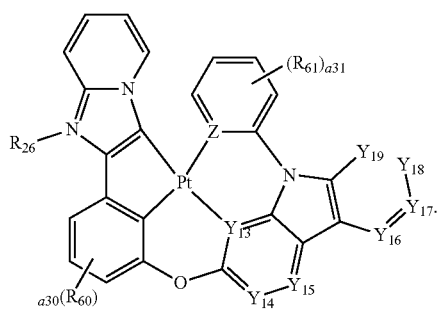

In Formulae 3-1 and 3-2, A1 may be represented by any one of 1-1 to 1-5.

In Formulae 3-3 and 3-5, at least one of A1 and A4 may be represented by any one of 1-1 to 1-5.

In Formula 3-4, at least one of A1 and A3 may be represented by any one of 1-1 to 1-5.

In Formulae 3-6 and 3-7, A1 may be represented by 1-6.

In Formulae 3-1 to 3-6, $R_{51}$ to $R_{64}$ may each independently be a hydrogen atom, a deuterium atom, a cyano group, an alkyl group, an aryl group, or a heteroaryl group, and/or bonded to an adjacent group to form a ring. The alkyl group may be a substituted or unsubstituted alkyl group having 1 to 20 carbon atoms. The aryl group may be a substituted or unsubstituted aryl group having 6 to 30 ring-forming carbon atoms. The heteroaryl group may be a substituted or unsubstituted heteroaryl group having 2 to 30 ring-forming carbon atoms.

Z may be a carbon atom or a nitrogen atom.

a21, a23, a24, a26, a27, a29, a30, a32, a33, and a34 may each independently be an integer of 0 to 3. a22, a28, and a31 may each independently be an integer of 0 to 4. a25 may be an integer of 0 to 2. $Y_{13}$ to $Y_{19}$ and $L_2$ may each independently be the same as defined in connection with 2-2.

When there are a plurality of $R_{51}$'s, the plurality of $R_{51}$'s may be the same as or different from each other. Similar explanations may be applied to $R_{52}$ to $R_{64}$.

When a25 is 2, two $R_{55}$'s may bind to each other to form a benzene ring.

In Formulae 3-1 and 3-3, A1 may be any one of 1-1 to 1-3 and 1-5.

In Formula 3-2, A1 may be any one of 1-1 to 1-5.

In Formula 3-3, A4 may be any one of 1-1 to 1-3. A1 and A4 may be the same as or different from each other.

In Formula 3-3, A1 may be 1-5. A4 may be 2-1.

In Formula 3-4, A1 may be any one of 2-1 to 2-4, and A3 may be 1-4. For example, A1 may be any one of 2-3 to 2-4.

In Formula 3-5, A1 may be any one of 2-1 to 2-4, and A4 may be 1-4. For example, A4 may be any one of 2-3 and 2-4.

In Formulae 3-6 and 3-7, A1 may be 1-6.

Formula 3-6 may be represented by at least one of Formulae 3-6-1 and 3-6-2.

Formulae 3-6-1 and 3-6-2 are embodiments of Formula 3-6 in which A1 is specified. In Formulae 3-6-1 and 3-6-2, $R_{26}$ may be the same as defined in connection with 1-6. $Y_{13}$ to $Y_{19}$, $R_{26}$, $R_{60}$, $R_{61}$, a30, and a31 may each independently be the same as defined in connection with Formula 3-6.

Formula 3-7 may be represented by at least one of Formulae 3-7-1 and 3-7-2.

Formula 3-7-1

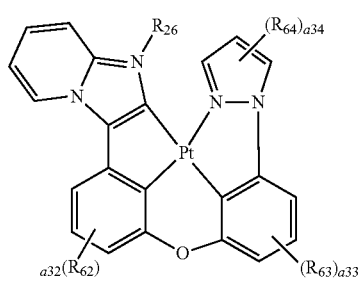

Formula 3-7-2

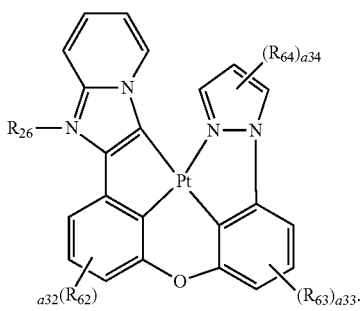

Formulae 3-7-1 and 3-7-2 are embodiments of Formula 3-7 in which A1 is specified. In Formulae 3-7-1 and 3-7-2, $R_{26}$ may be the same as defined in connection with 1-6. $R_{26}$, $R_{62}$ to $R_{64}$, and a32 to a34 may each independently be the same as defined in connection with Formula 3-7.

The organometallic compound of an embodiment may be any one of the compounds represented by Compound Group 1 and Compound Group 2:

Compound Group 1
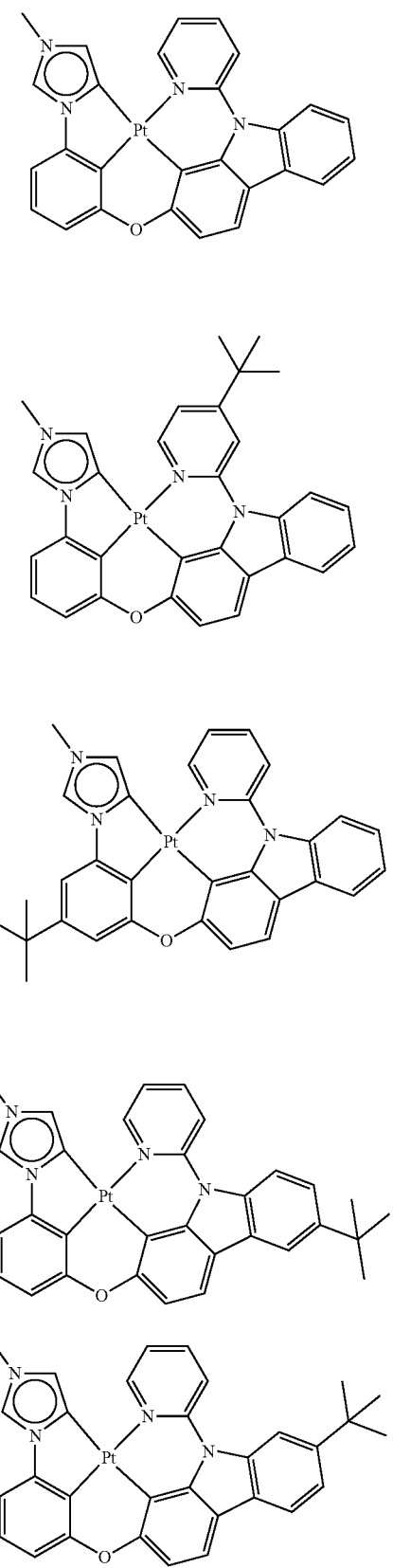
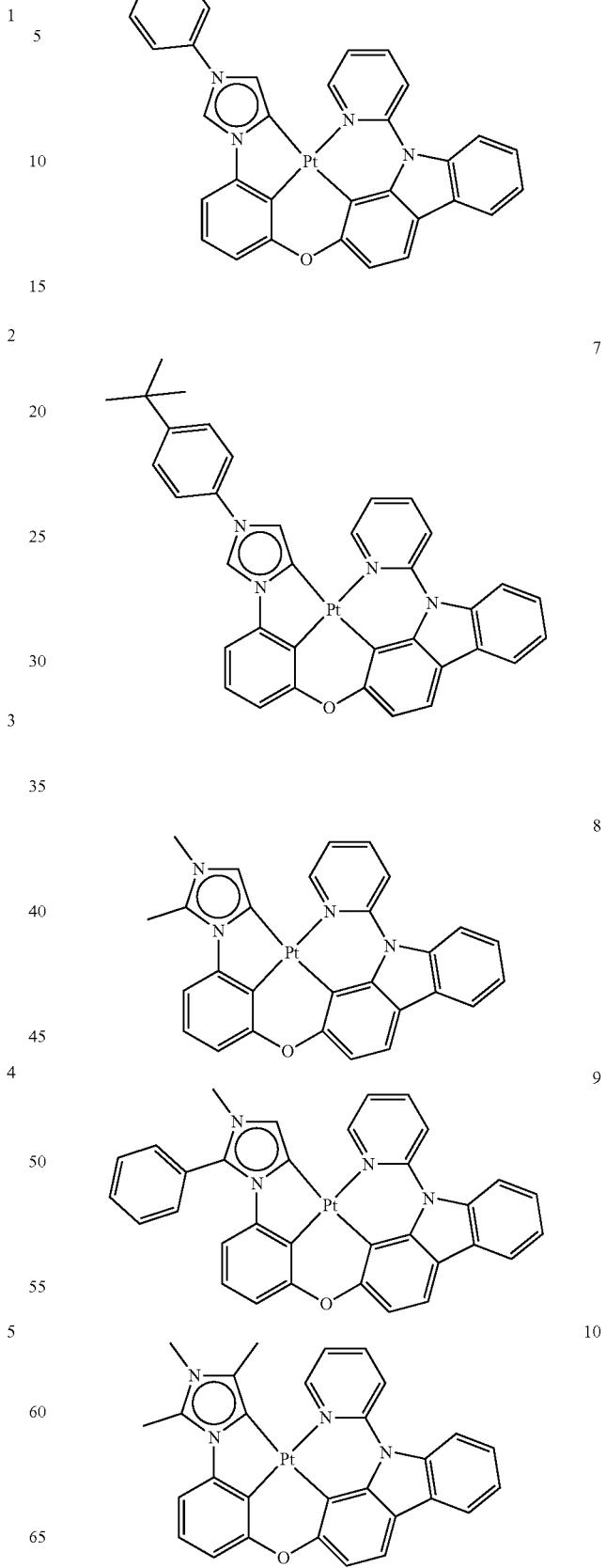

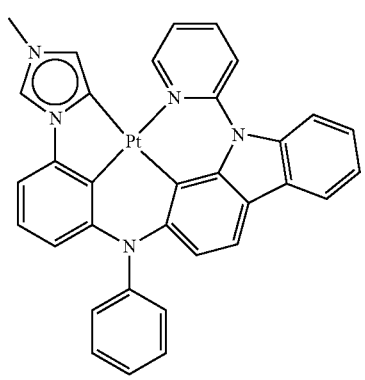
11
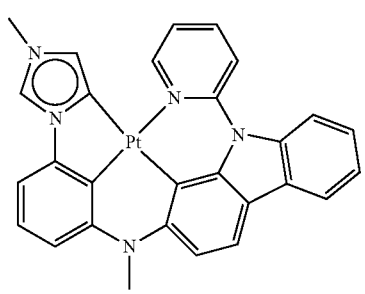
12
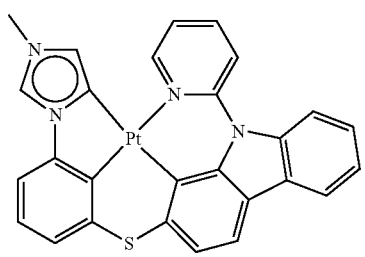
13
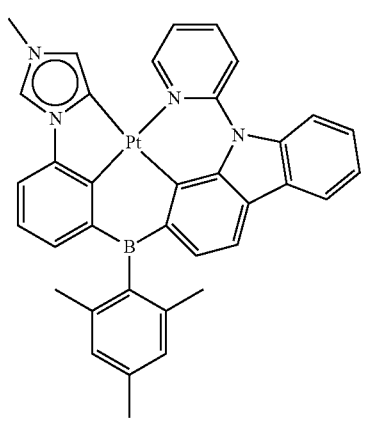
14
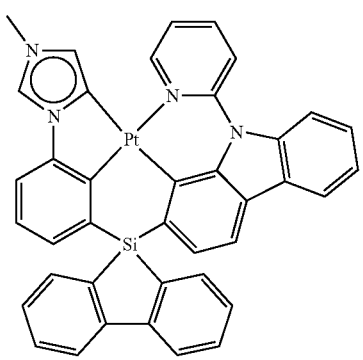
15
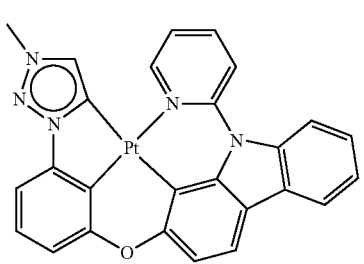
16
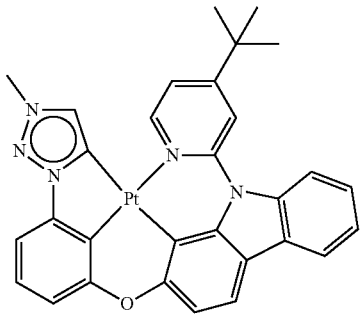
17
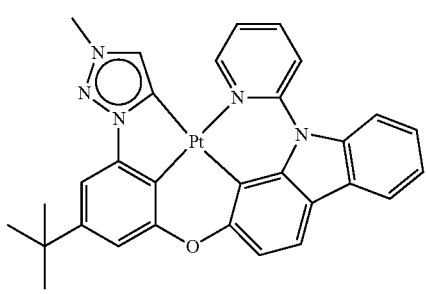
18
19

20
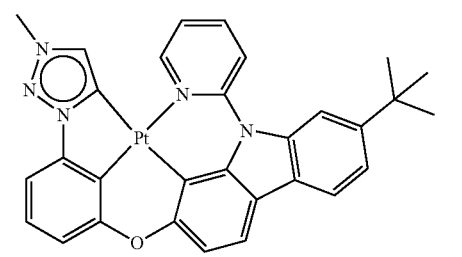
21
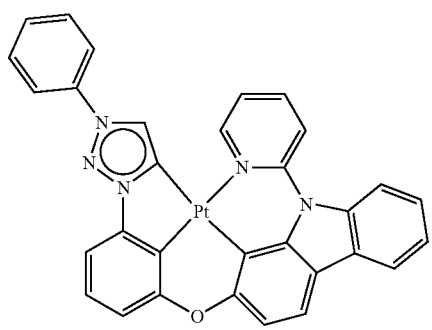
22
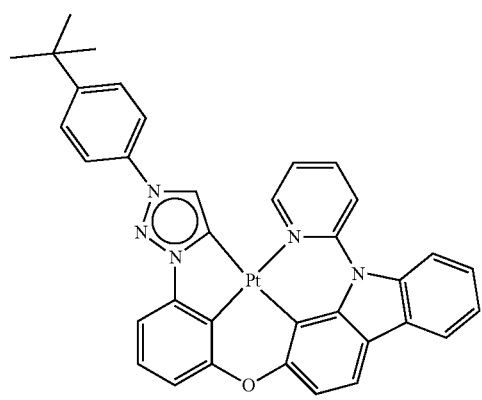
23
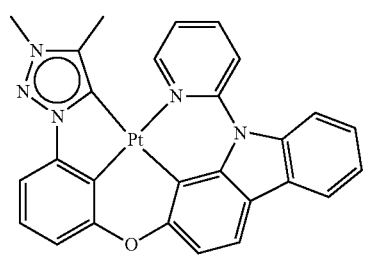
24
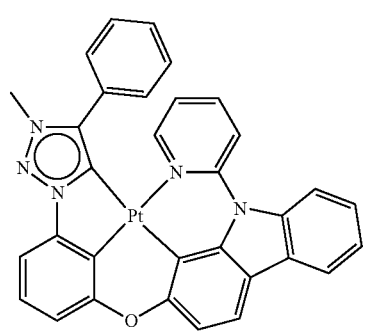
25
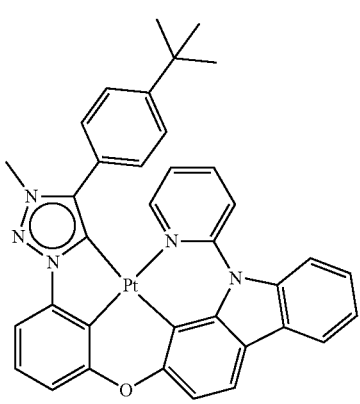
26
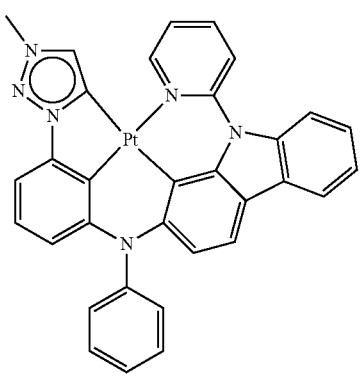
27
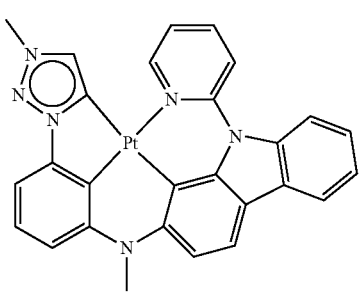
28
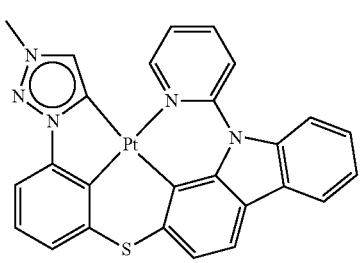

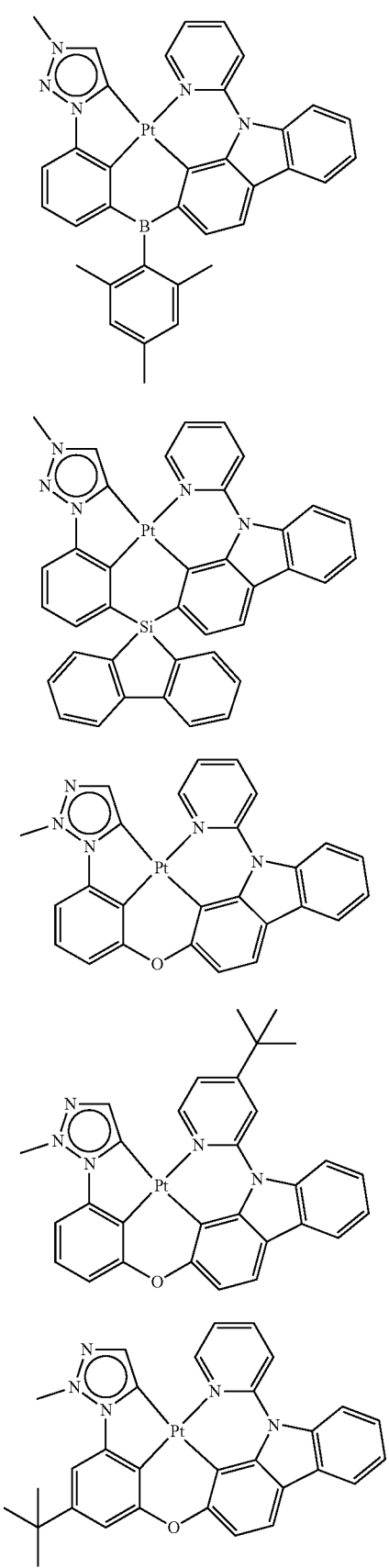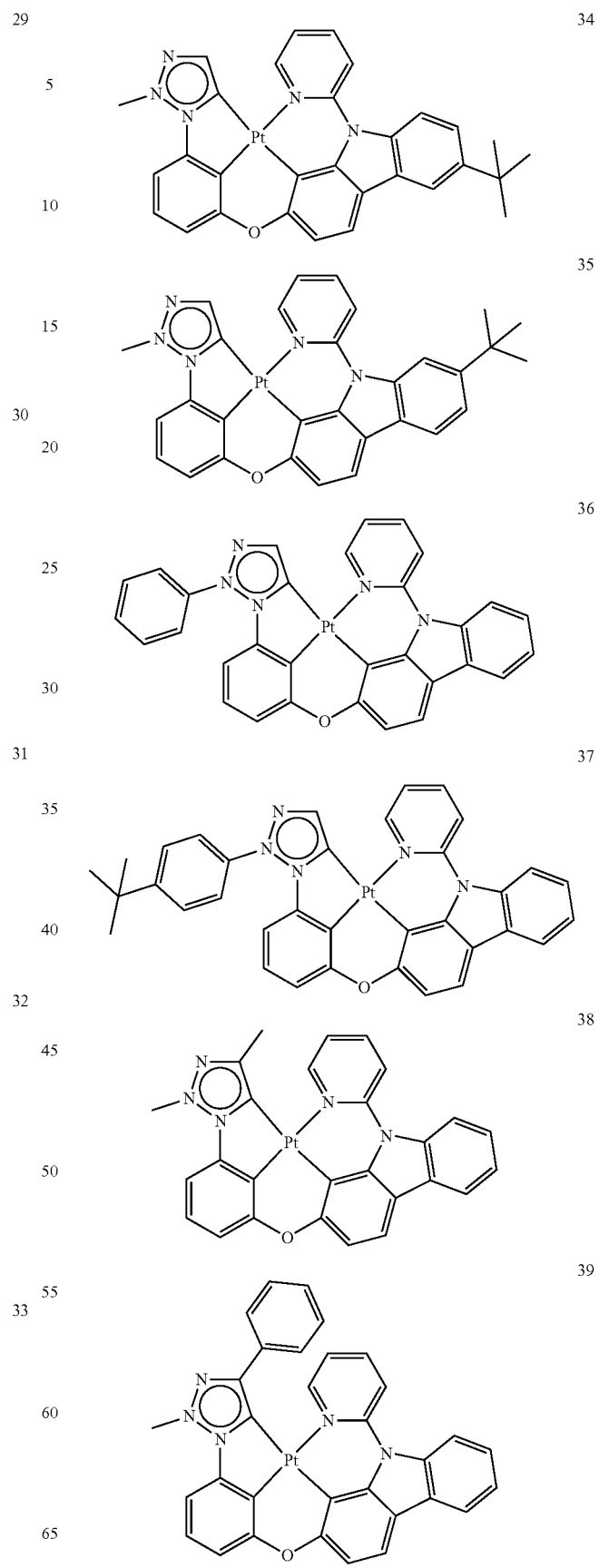

40
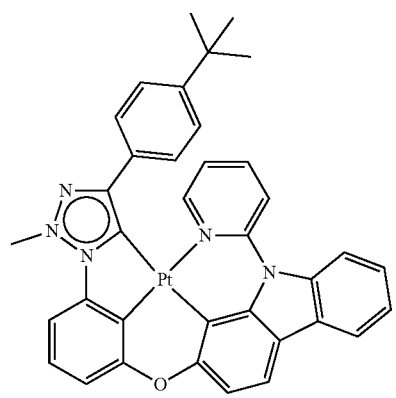
41
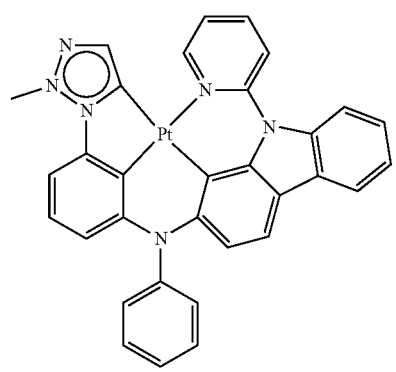
42
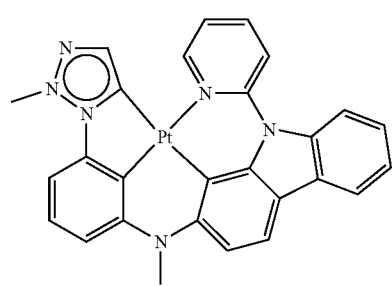
43
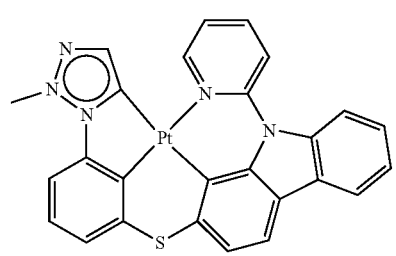
44
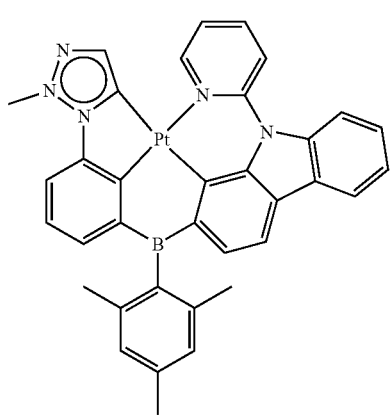
45
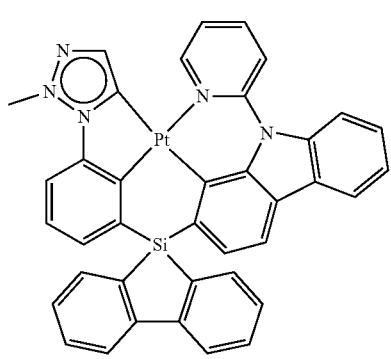
46
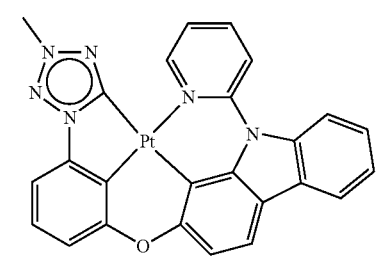
47
48
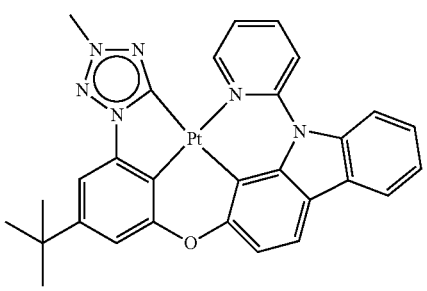

49
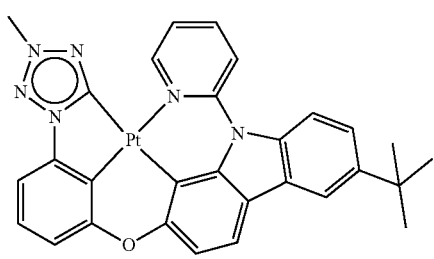
50
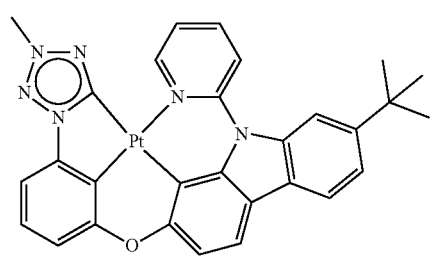
51
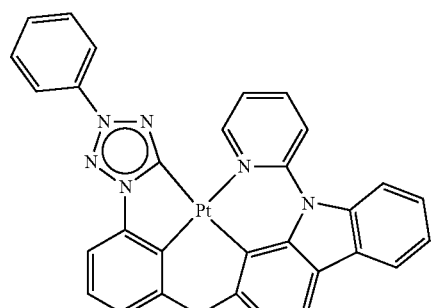
52
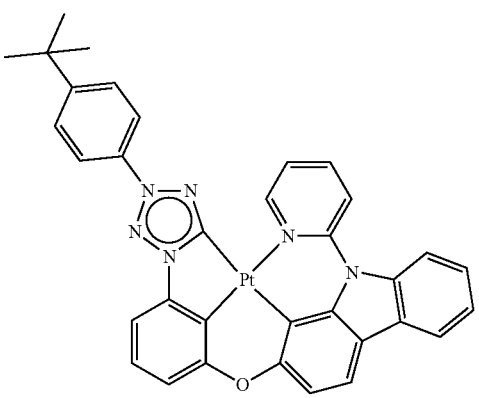
53
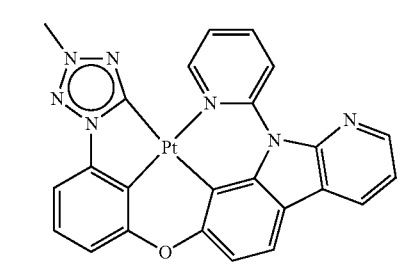
54
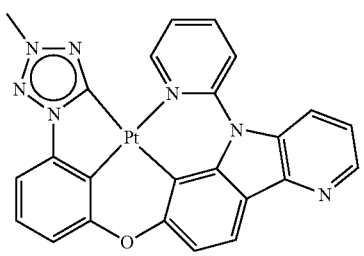
55
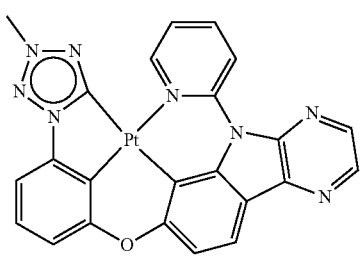
56
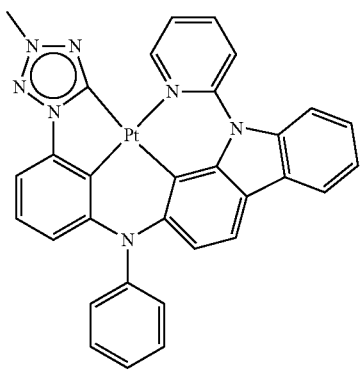
57
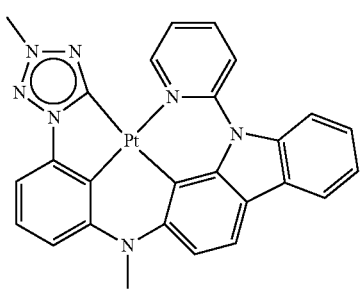
58
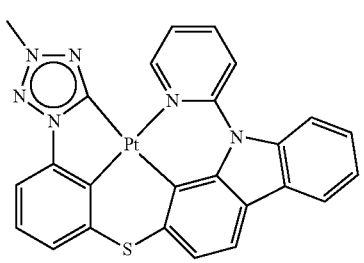

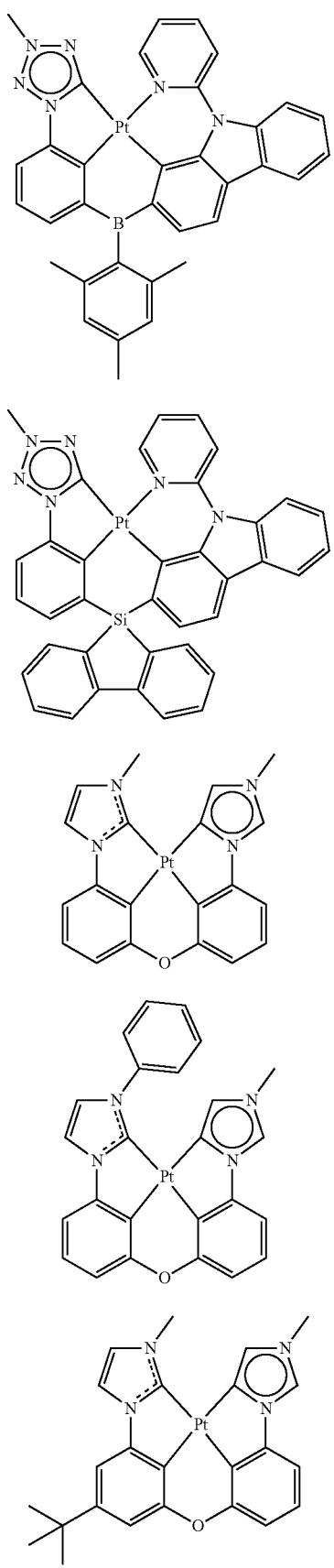
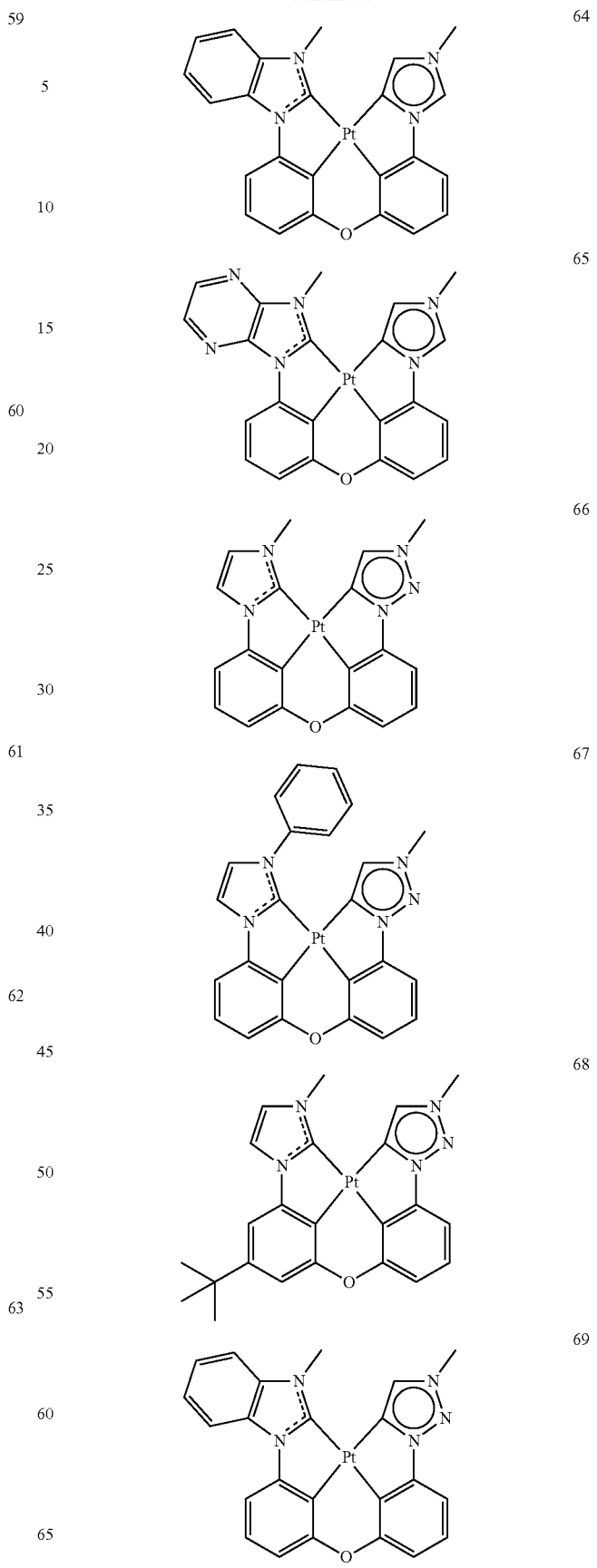

-continued
70
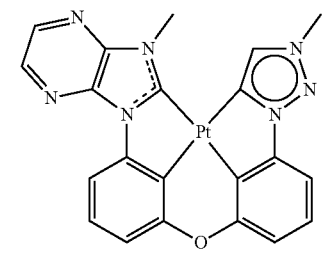
71
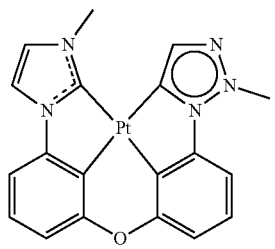
72
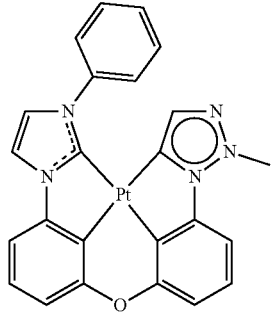
73
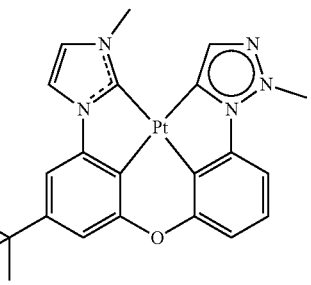
74
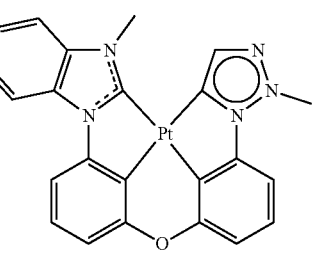
75
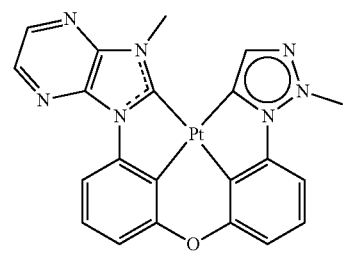
-continued
76
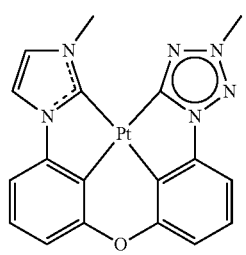
77
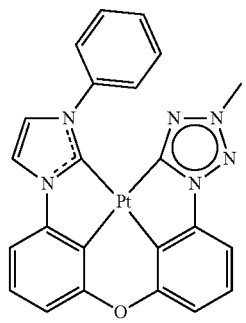
78
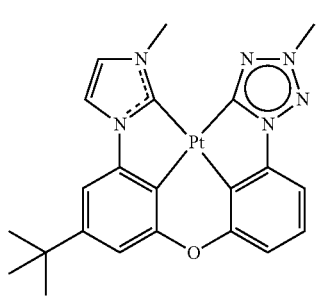
79
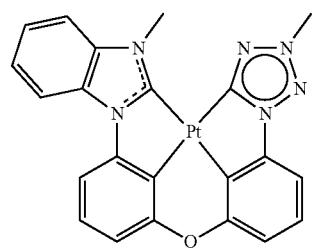
80
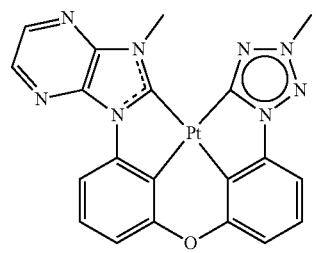
81
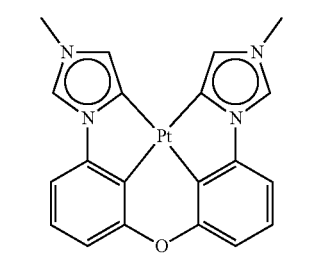

82
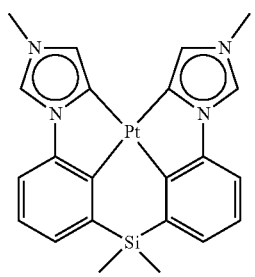
83
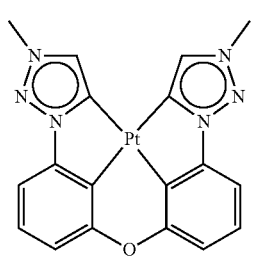
84
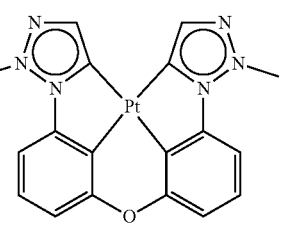
85
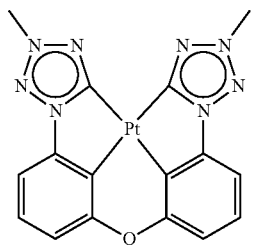
86
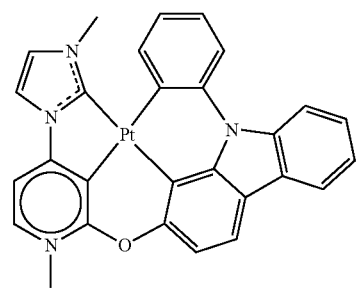
87
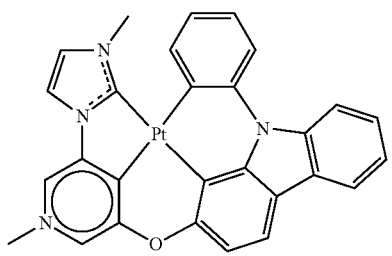
88
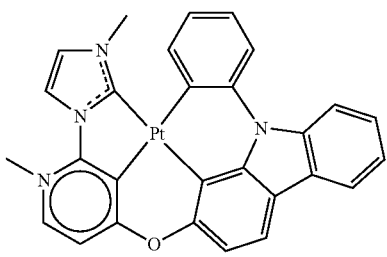
89
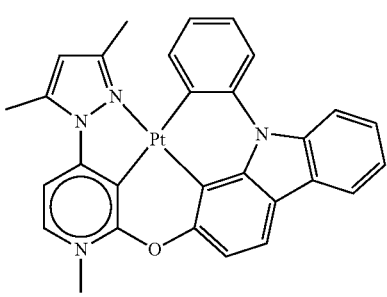
90
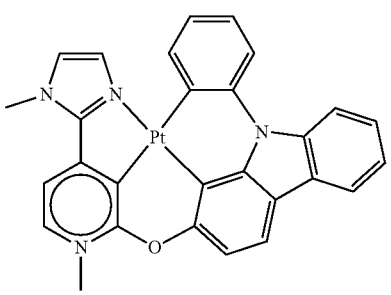
91
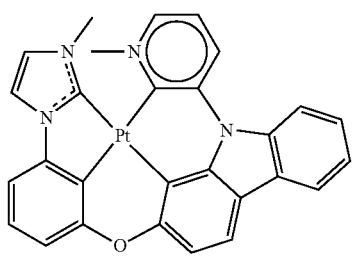
92
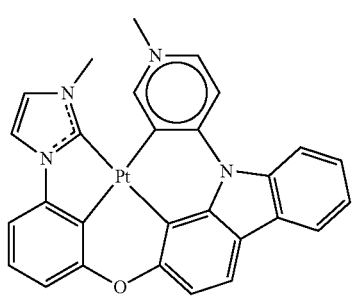

93
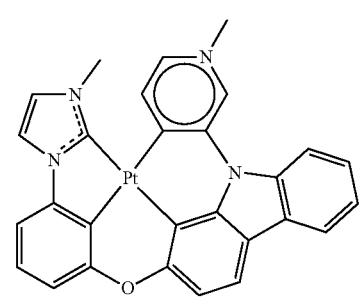
94
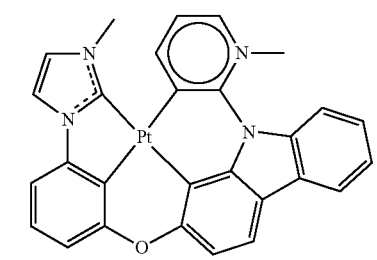
95
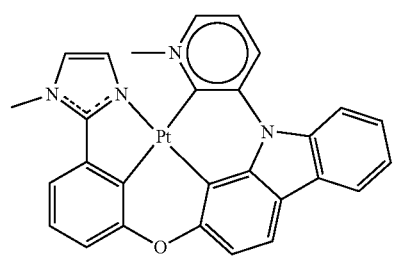
96
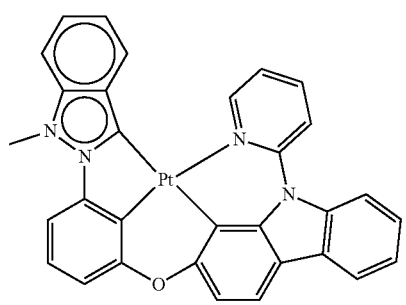
97
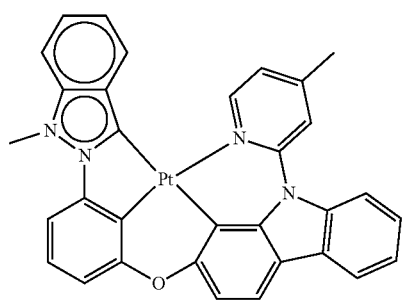
98
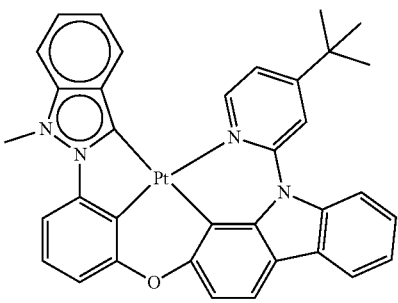
99
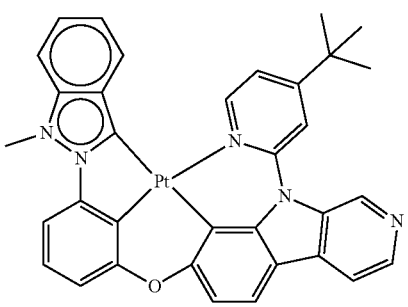
100
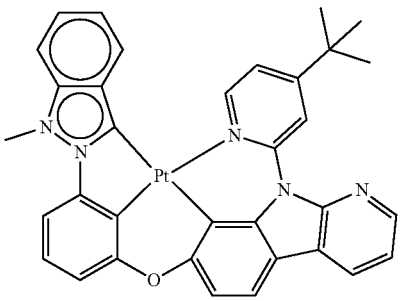
101
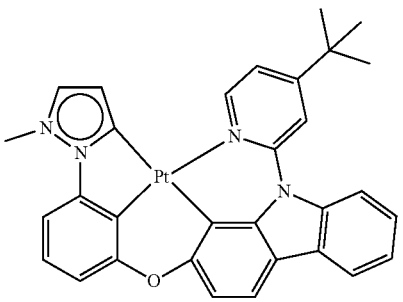
102

103
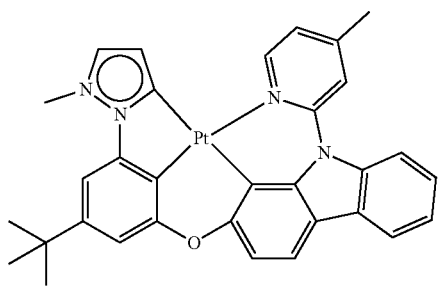
104
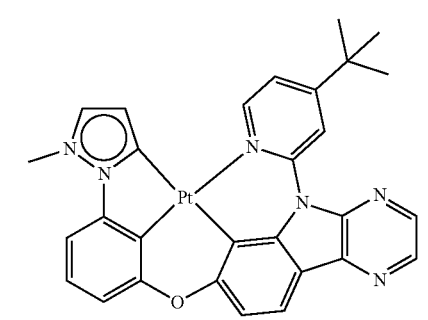
105
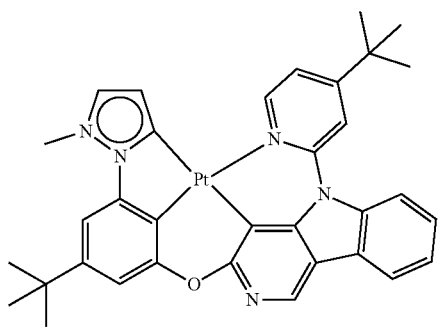
106
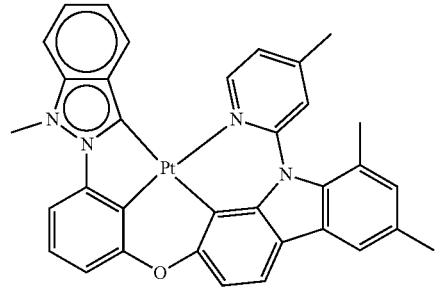
107
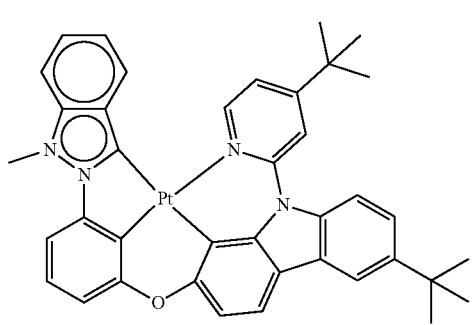
108
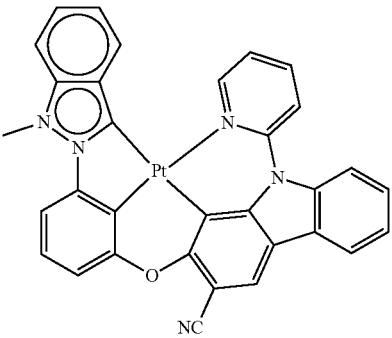
109
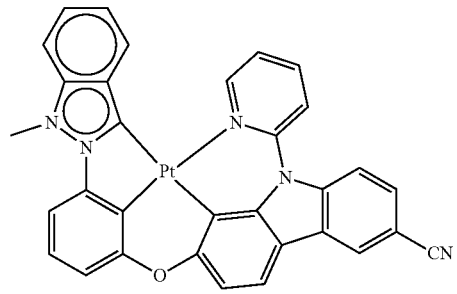
110
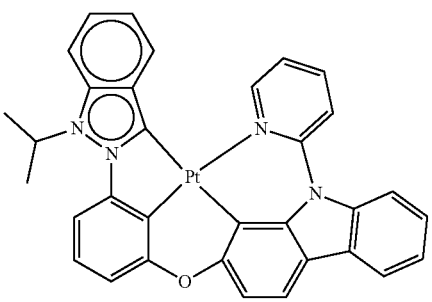
111
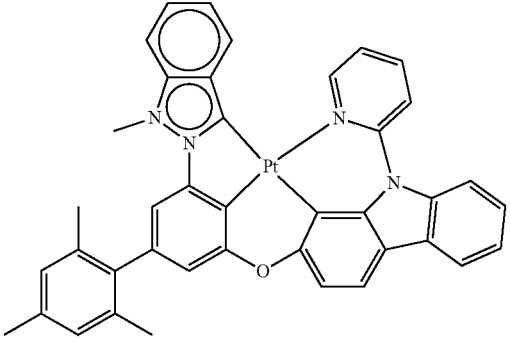
112
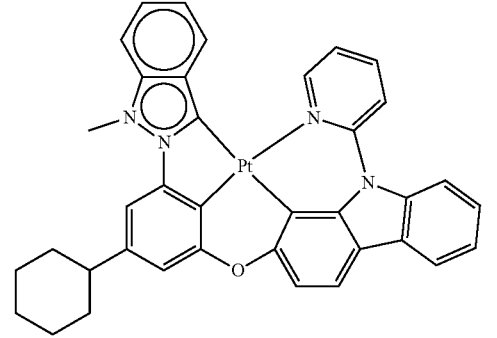

113
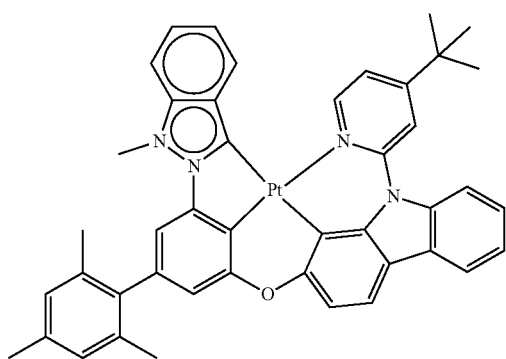
114
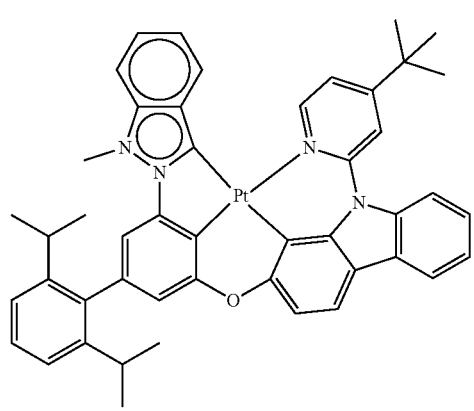
115
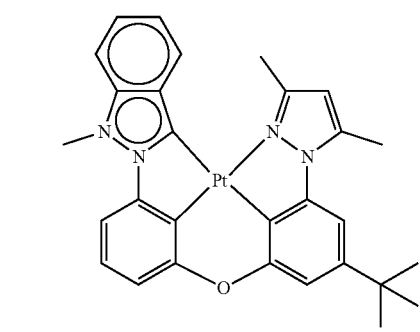
116
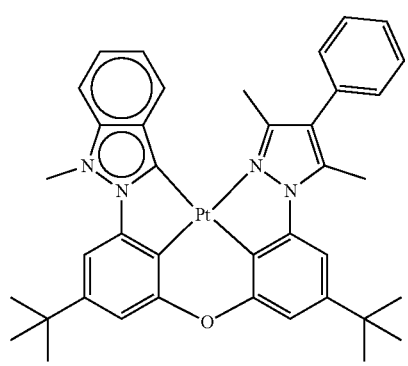
117
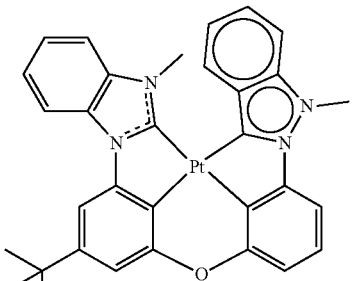
118
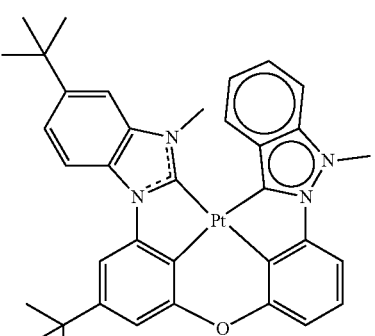
119
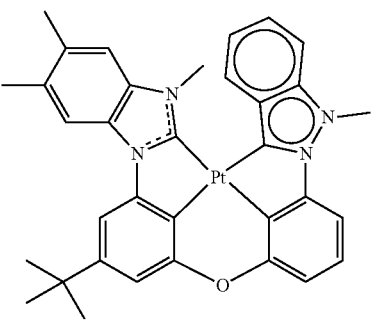
120
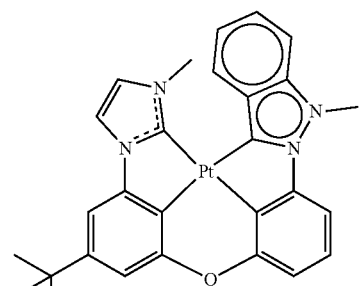
Compound Group 2
1-1
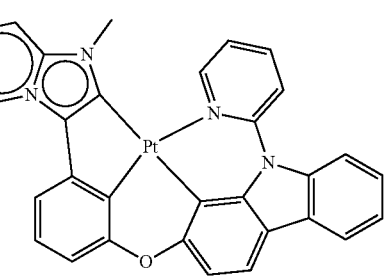

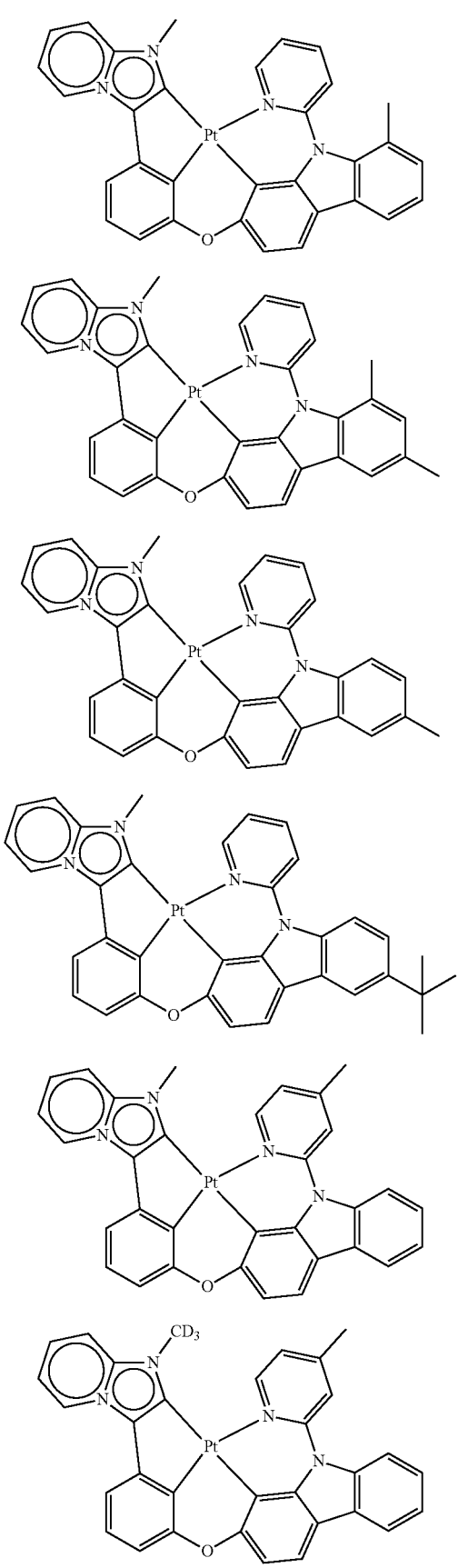
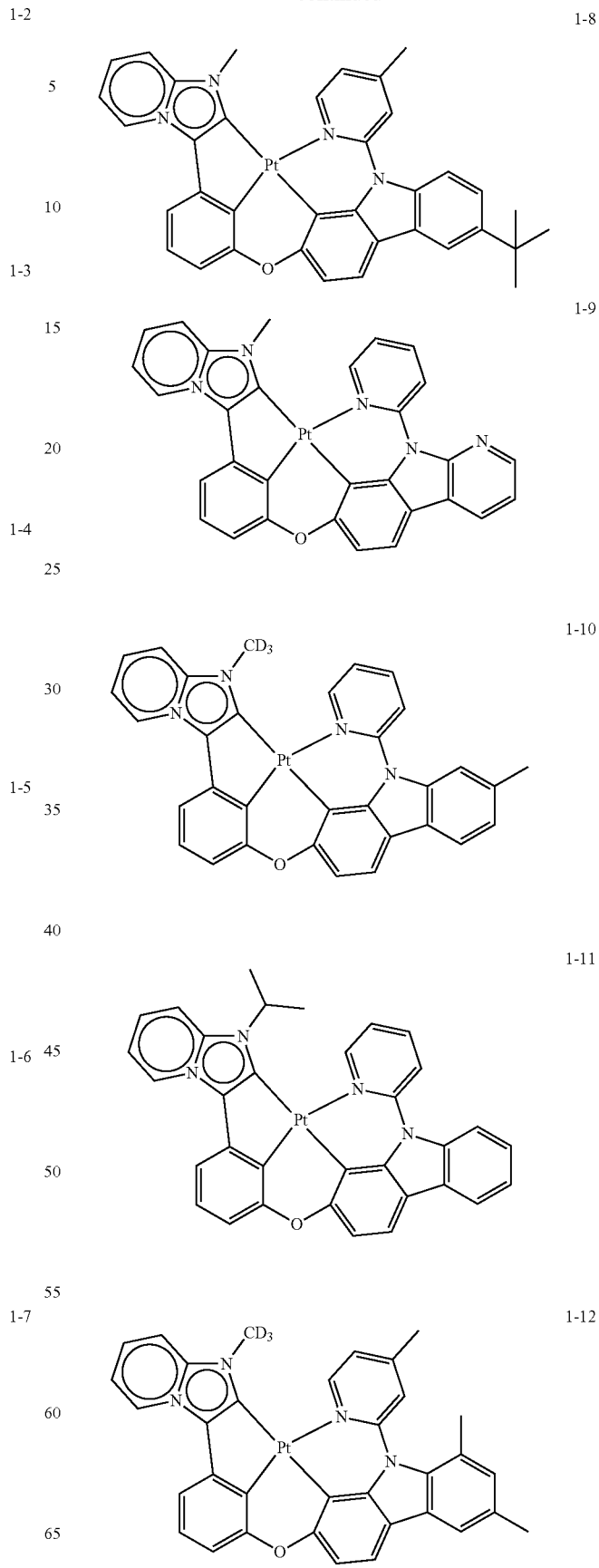

1-13
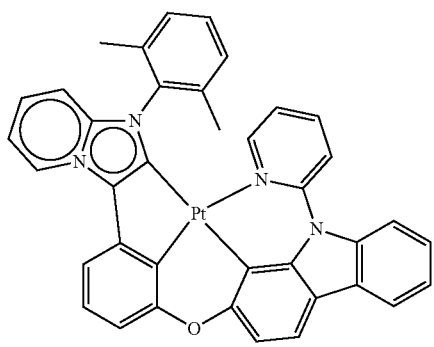
1-14
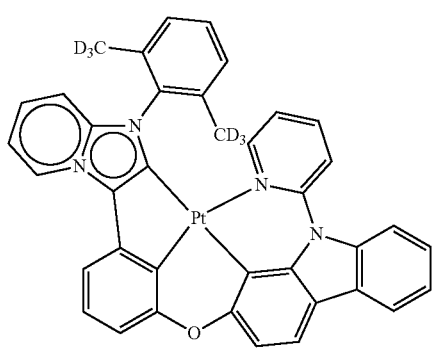
1-15
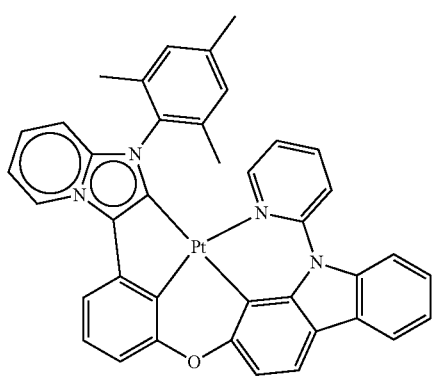
1-16
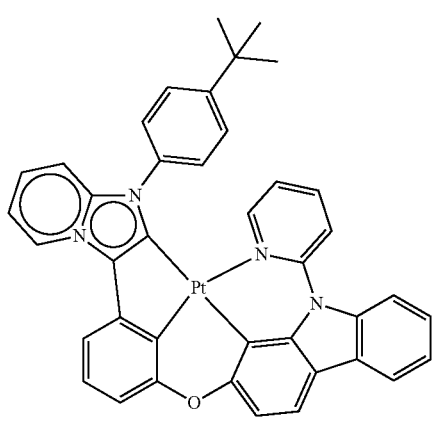
1-17
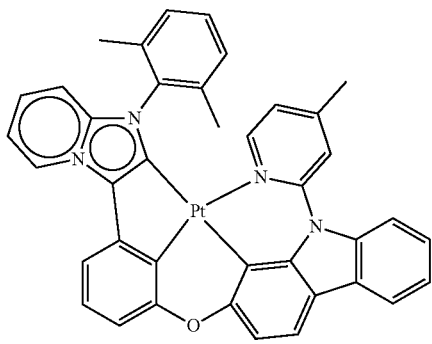
1-18
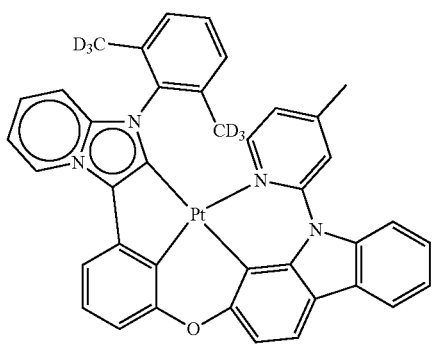
1-19
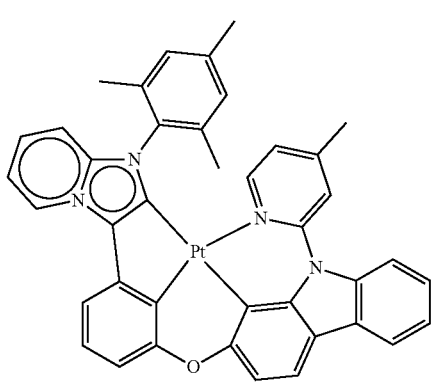
1-20
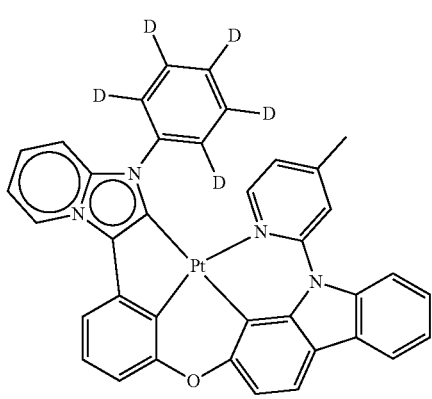

1-21
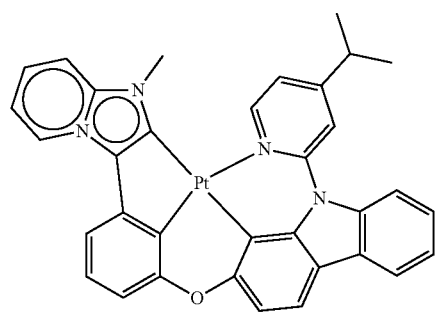
1-22
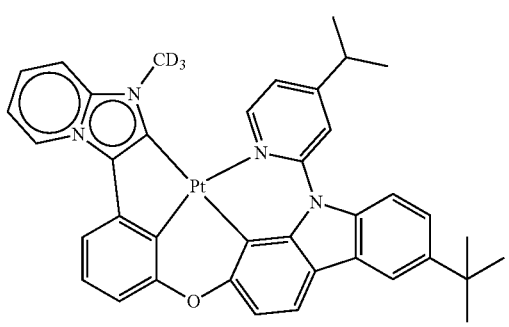
1-23
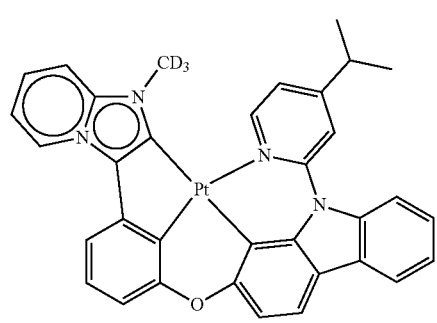
1-24
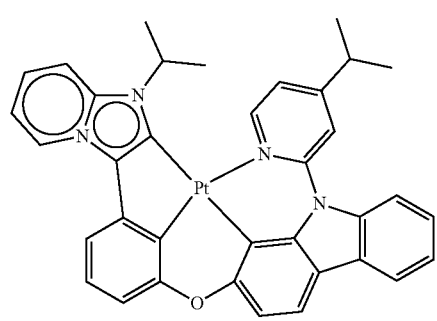
1-25
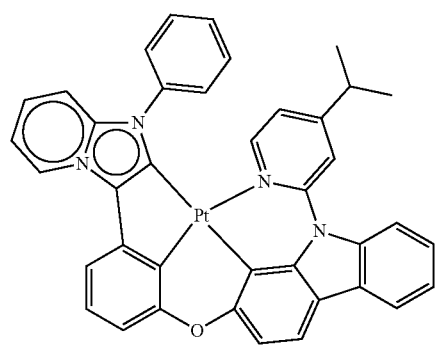
1-26
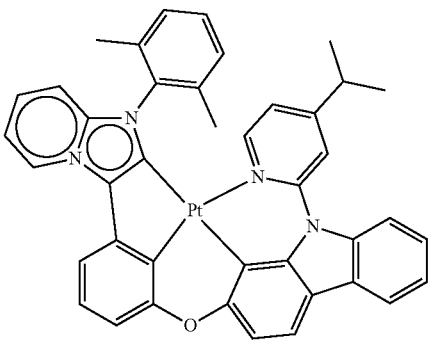
1-27
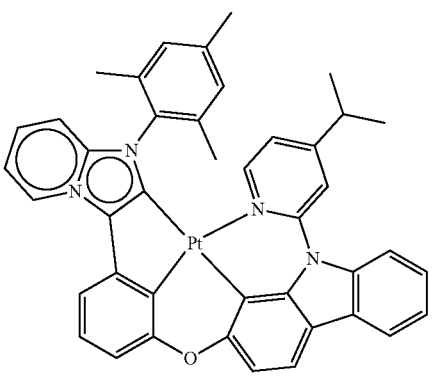
1-28
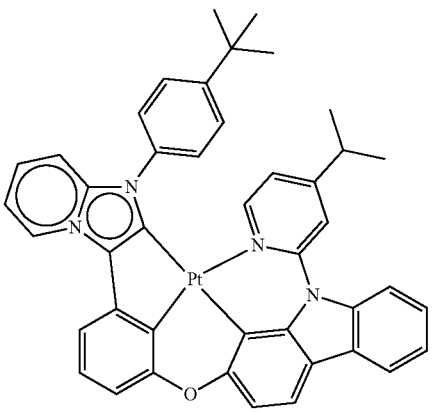
1-29
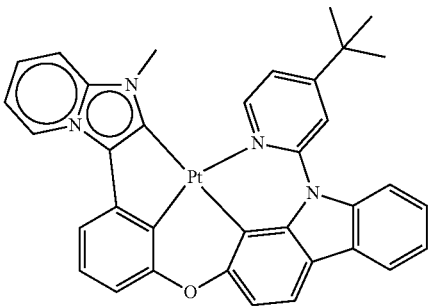

1-30
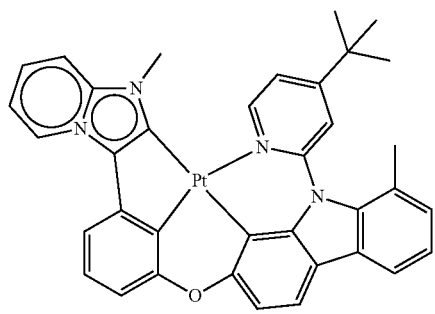
1-31
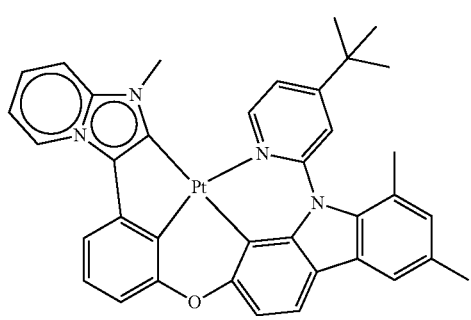
1-32
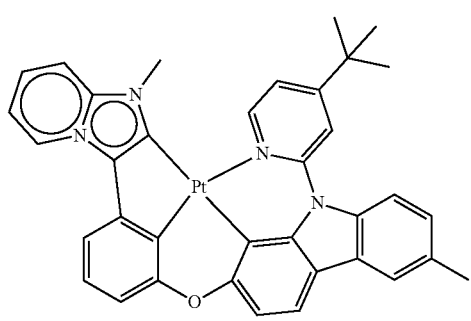
1-33
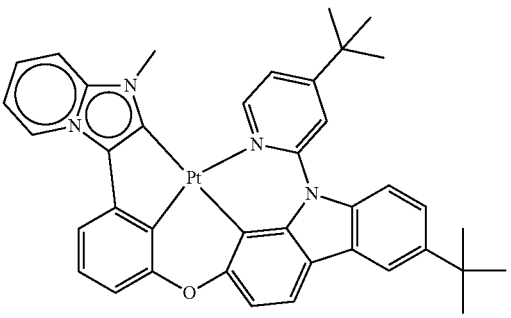
1-34
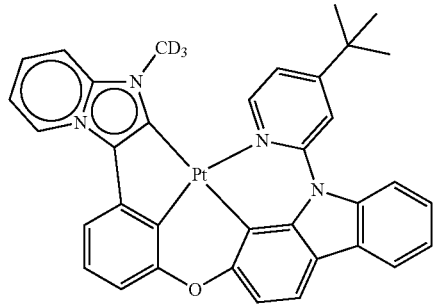
1-35
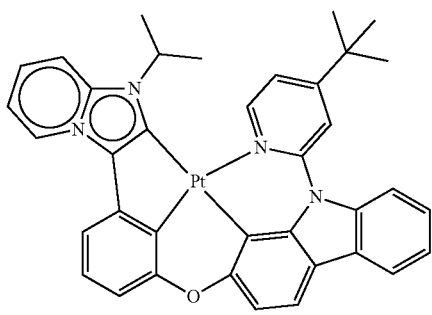
1-36
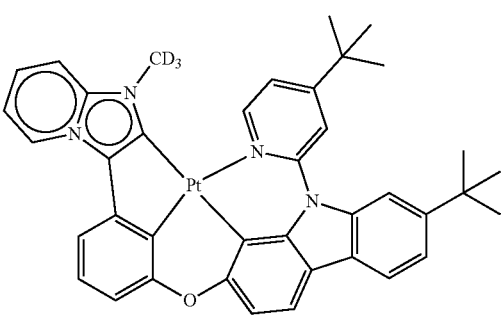
1-37
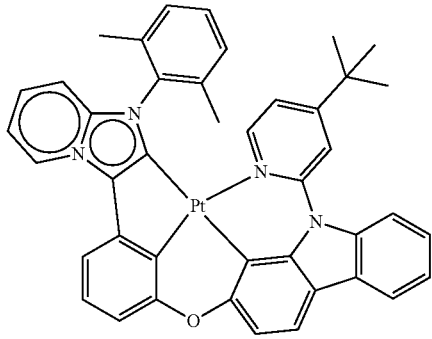
1-38
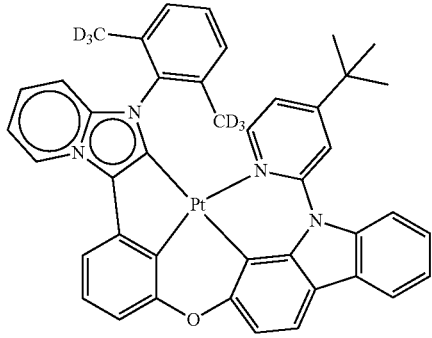

-continued
1-39
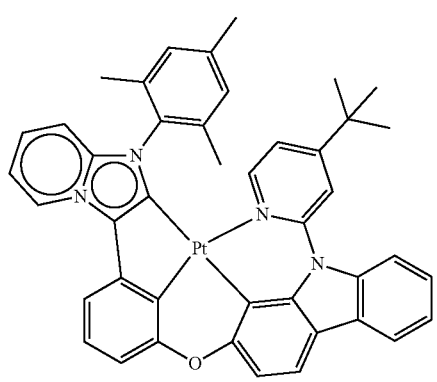
1-40
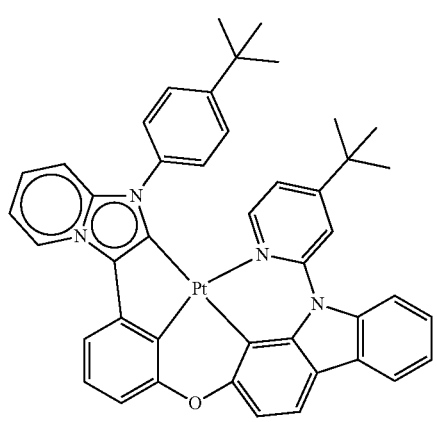
1-41
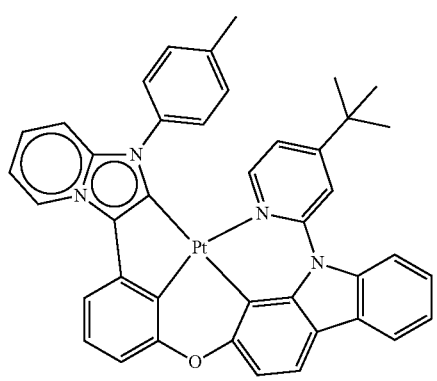
1-42
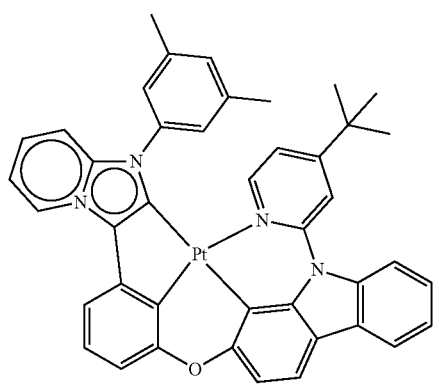
-continued
1-43
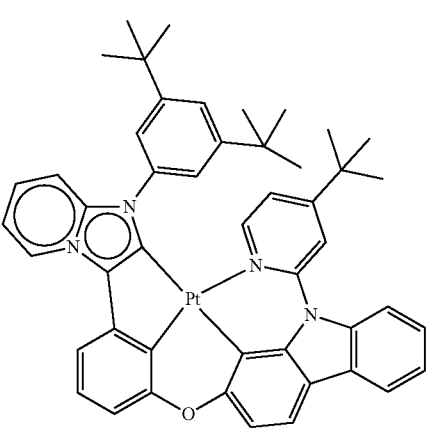
1-44
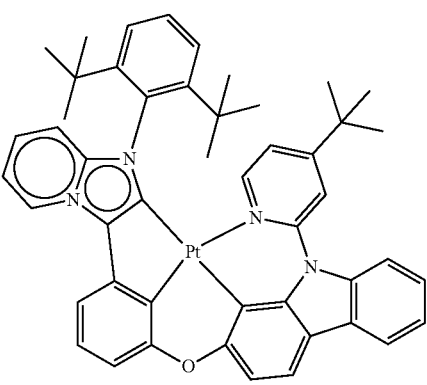
1-45
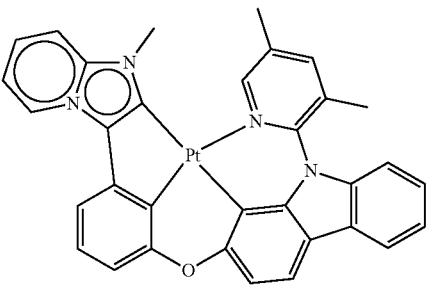
1-46
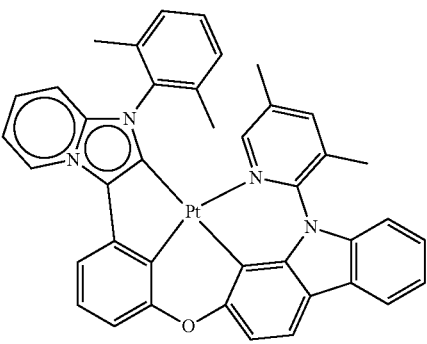

-continued
1-47
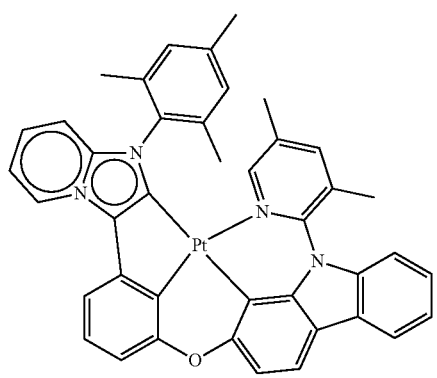
1-48
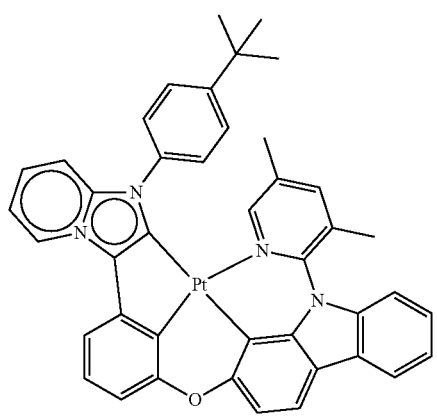
1-49
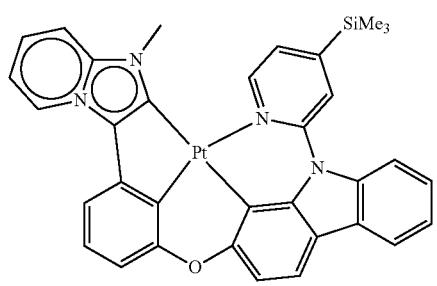
1-50
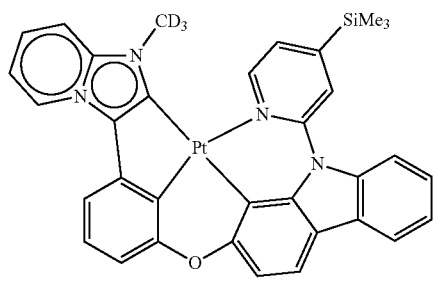
1-51
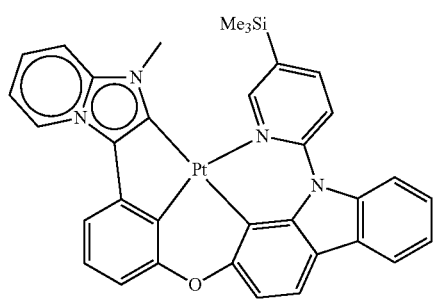
-continued
1-52
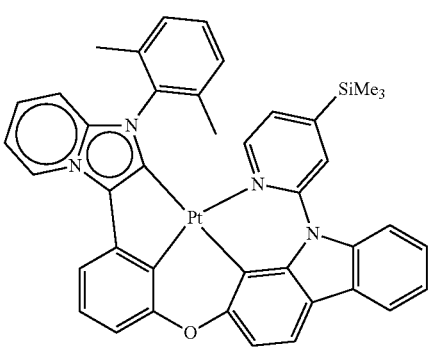
1-53
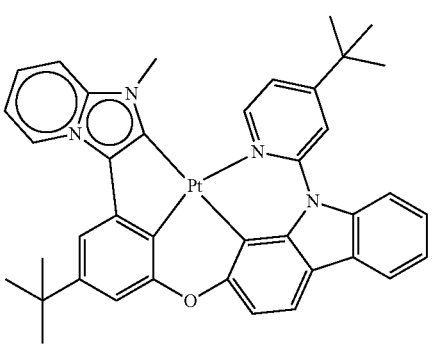
1-54
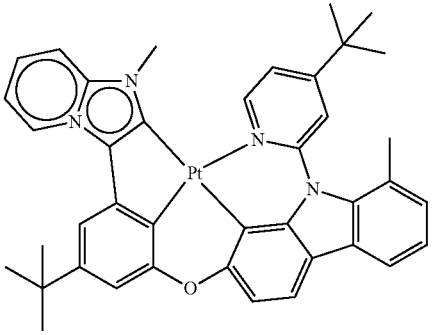
1-55
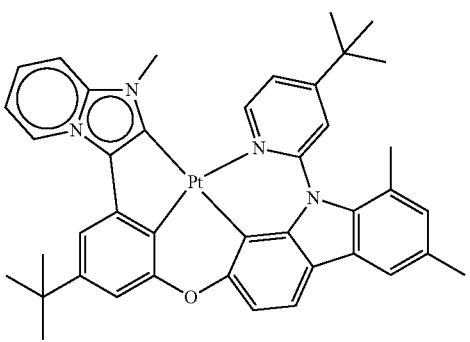

1-56
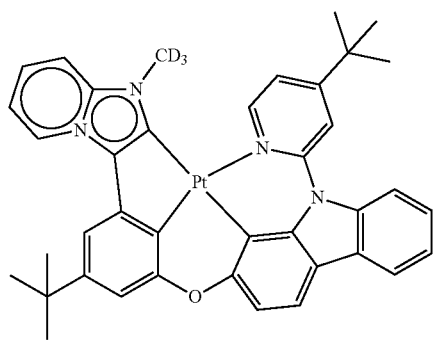
1-57
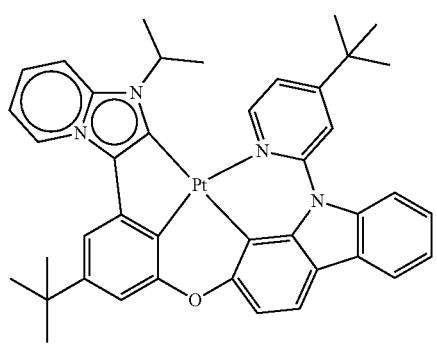
1-58
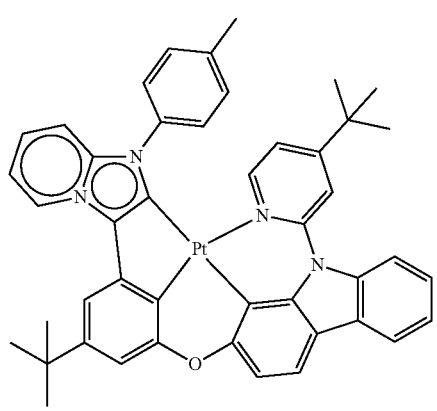
1-59
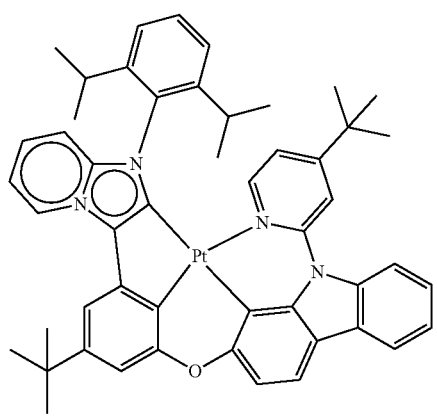
1-60
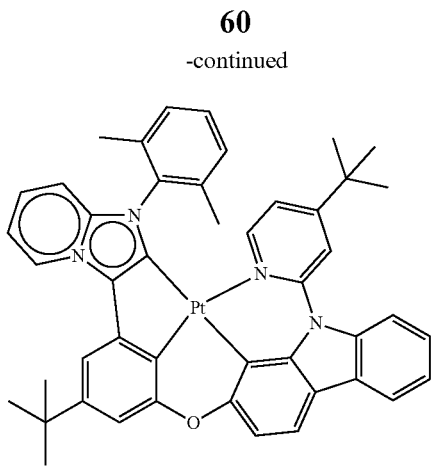
1-61
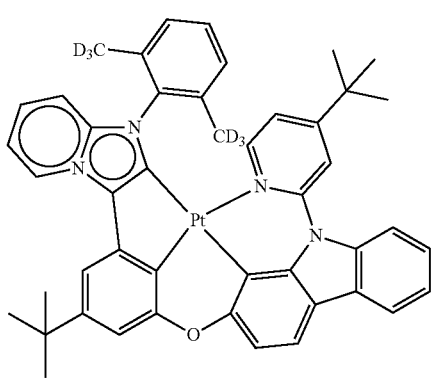
1-62
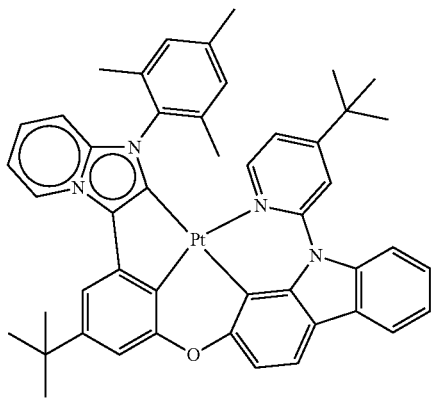
1-63
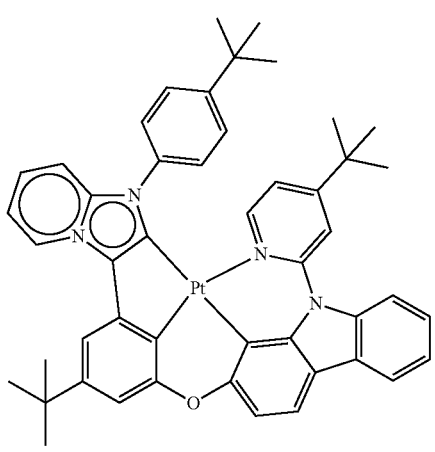

-continued
1-64
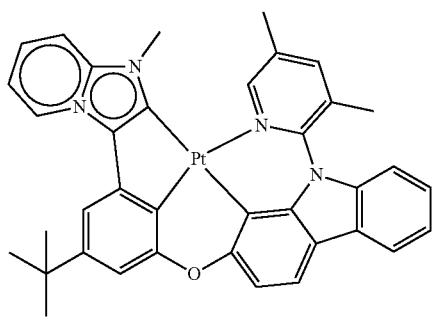
1-65
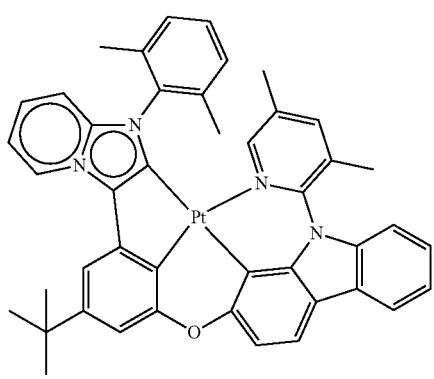
1-66
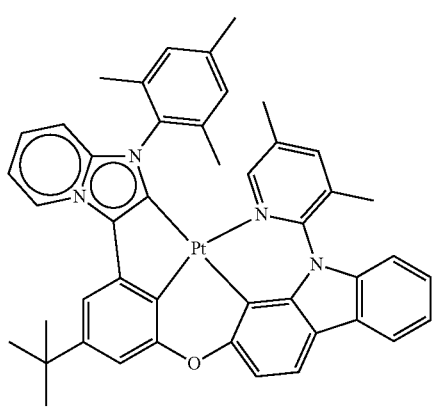
1-67
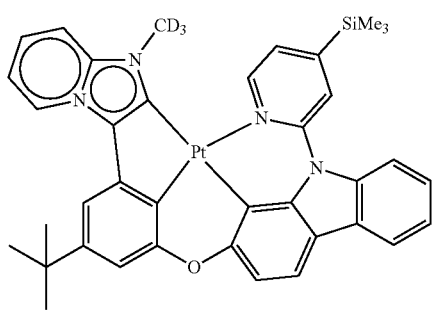
-continued
1-68
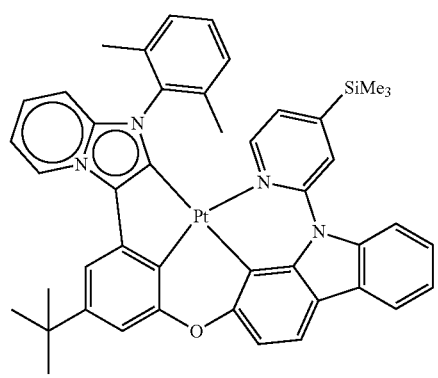
1-69
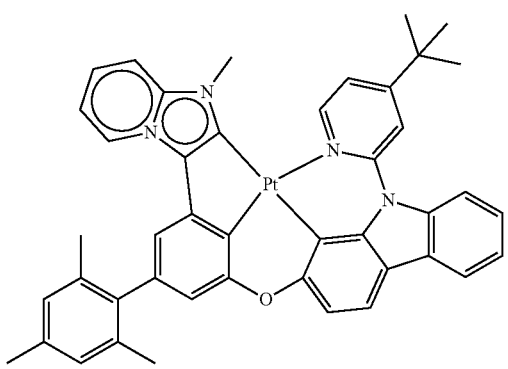
1-70
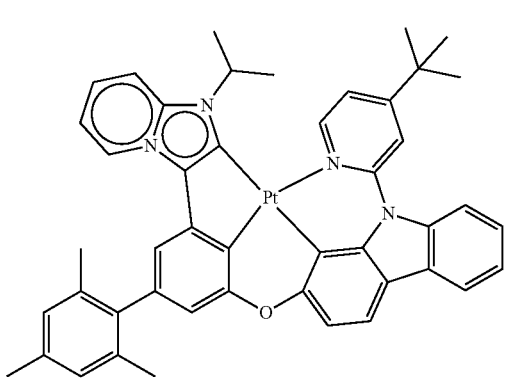
1-71
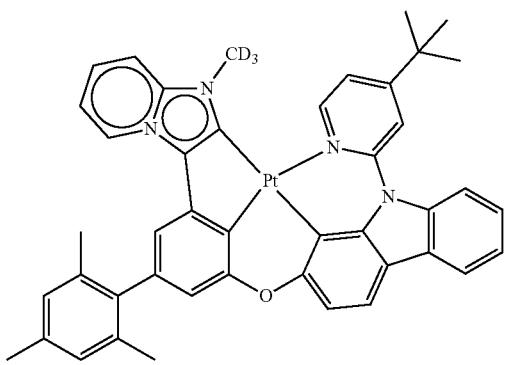

1-72
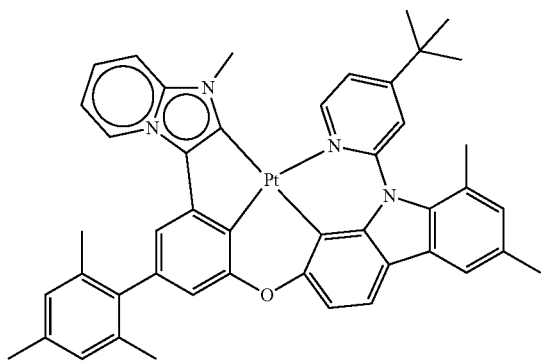
1-73
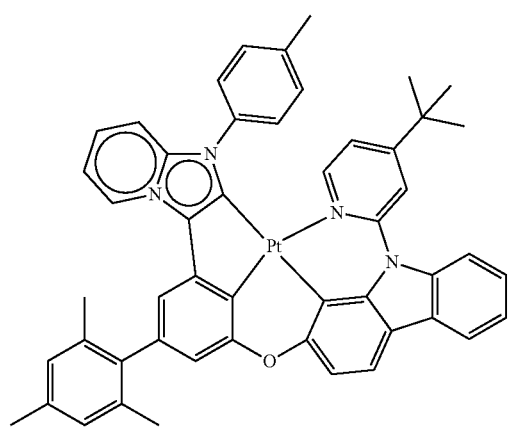
1-74
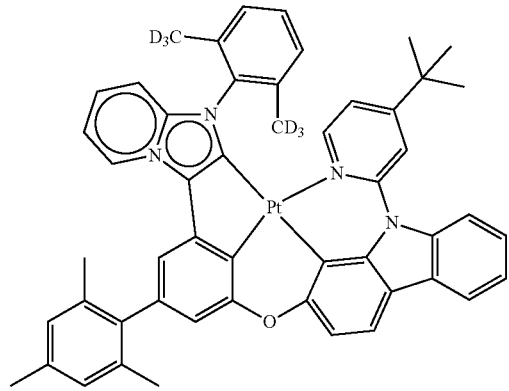
1-75
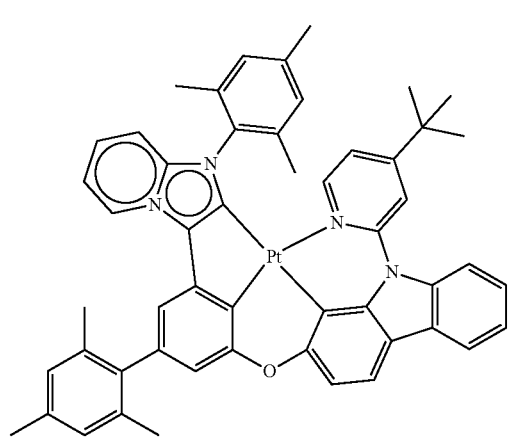
1-76
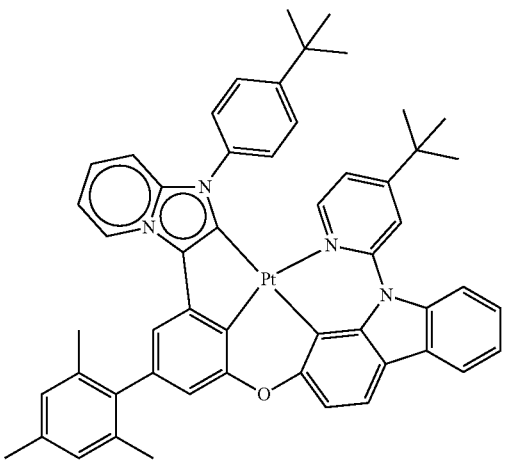
77
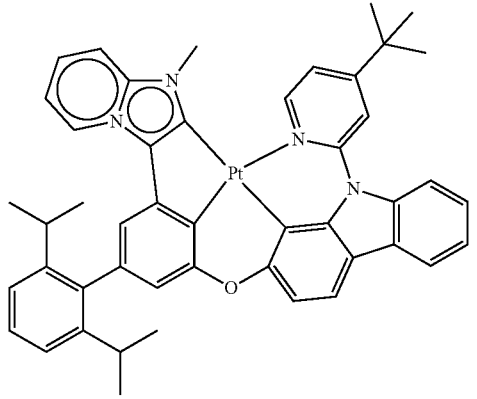
78
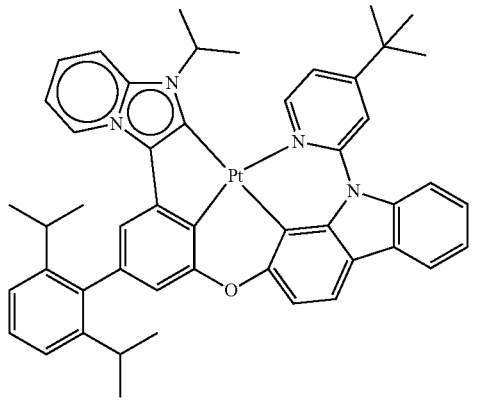

1-79
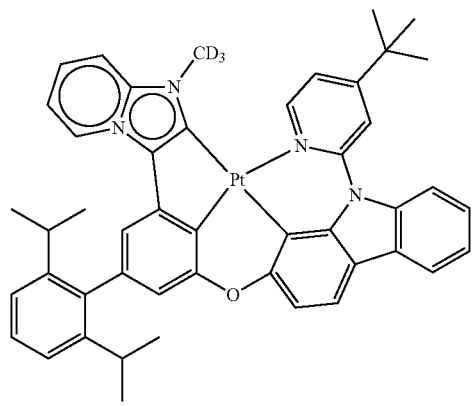
1-80
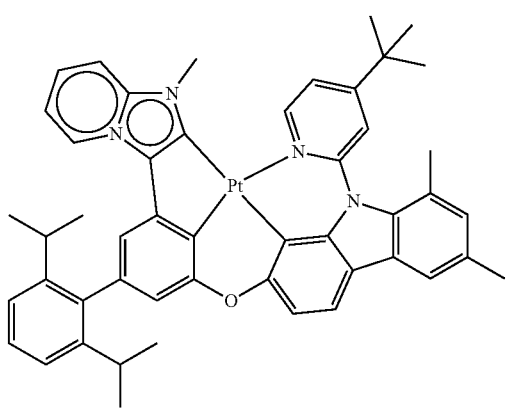
1-81
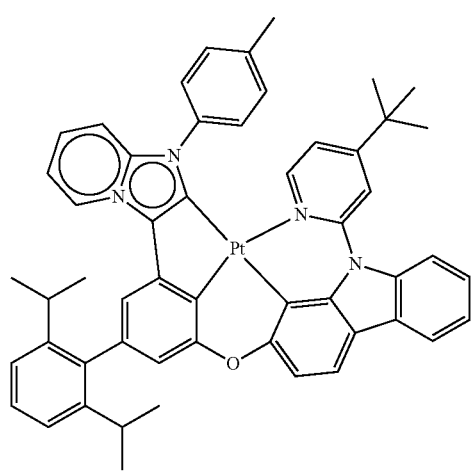
1-82
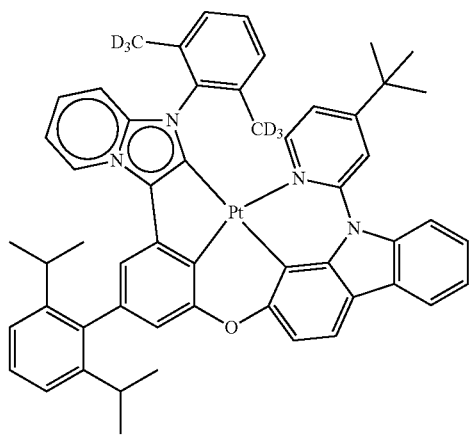
1-83
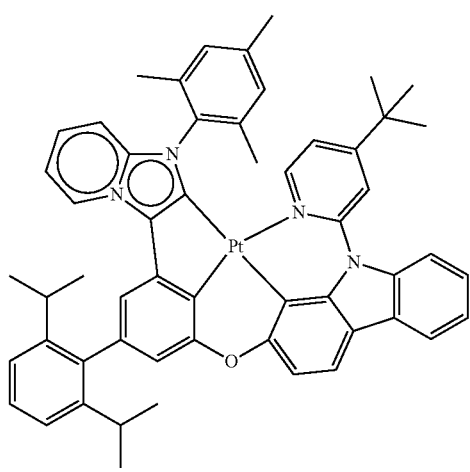
1-84
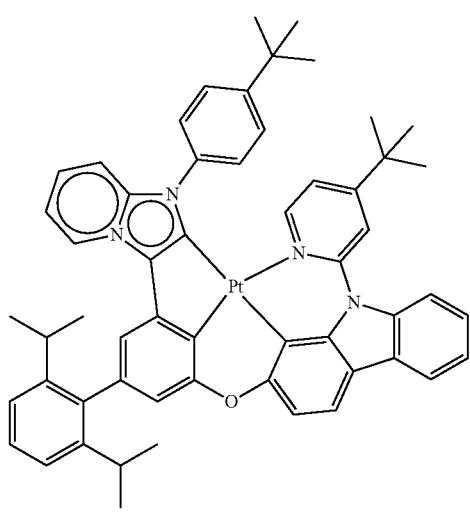

1-85
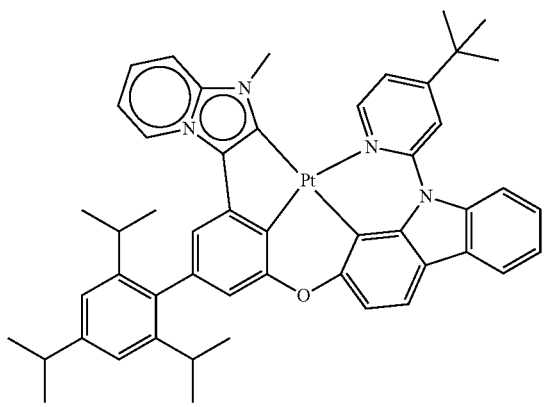
1-86
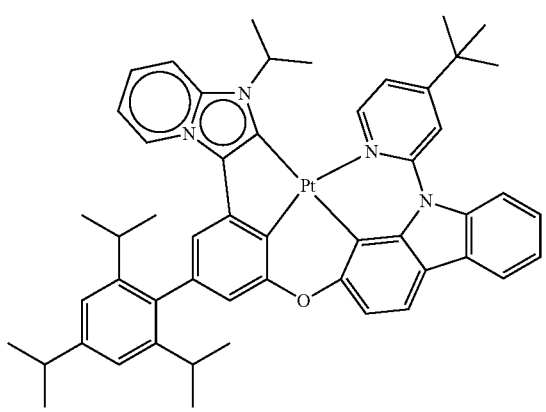
1-87
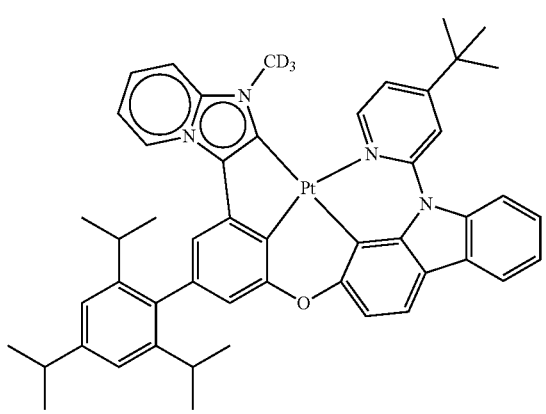
1-88
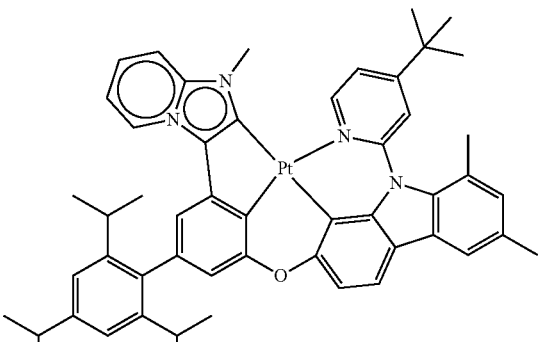
1-89
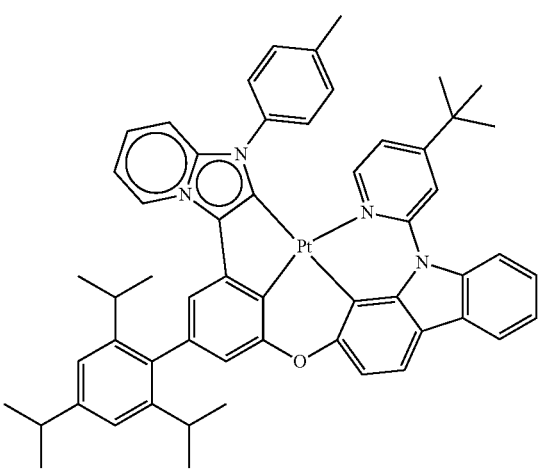
1-90
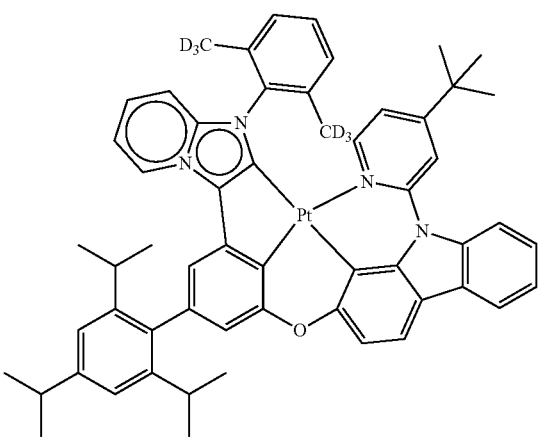

1-91
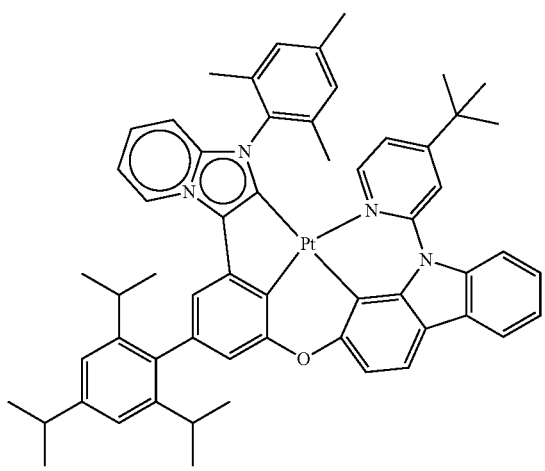
1-92
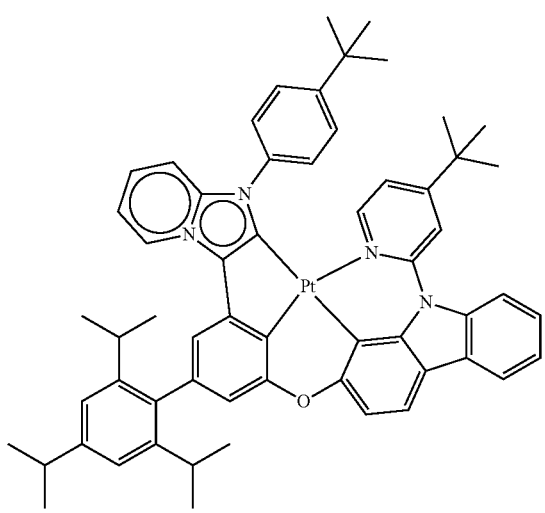
1-93
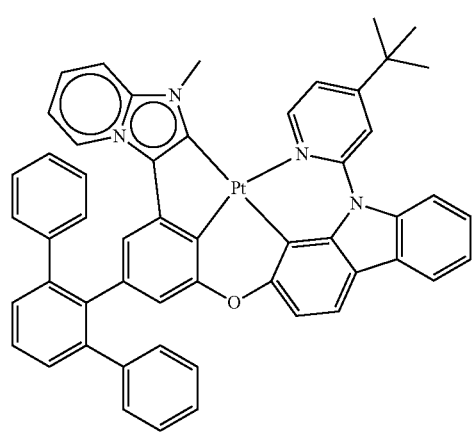
1-94
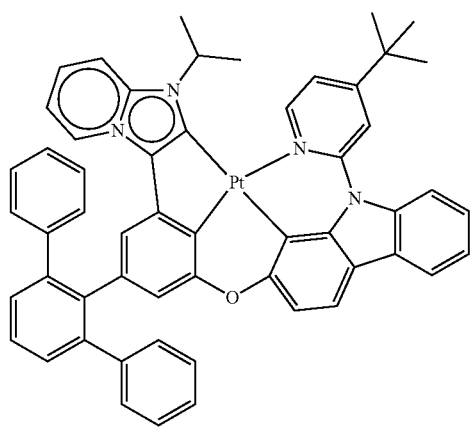
1-95
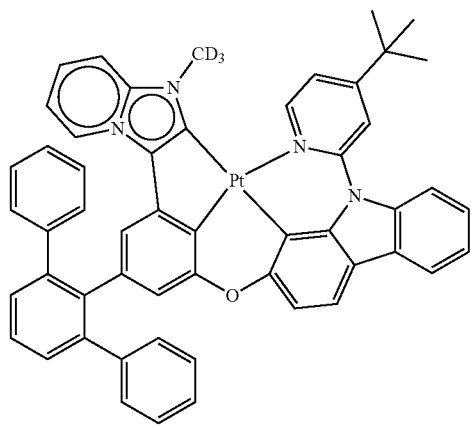
1-96
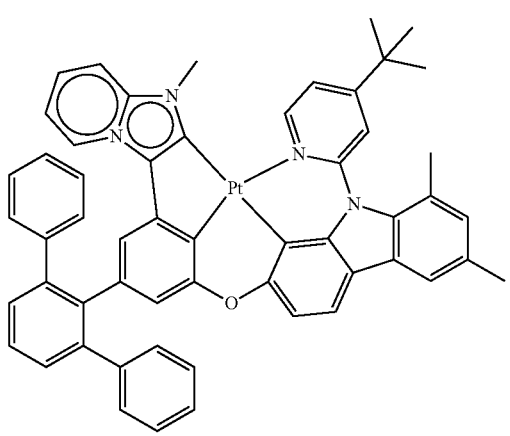

1-97
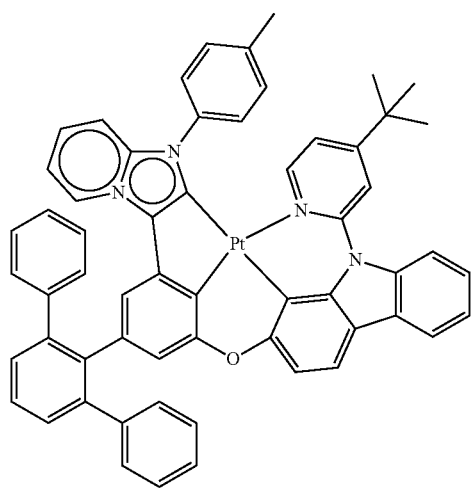
1-98
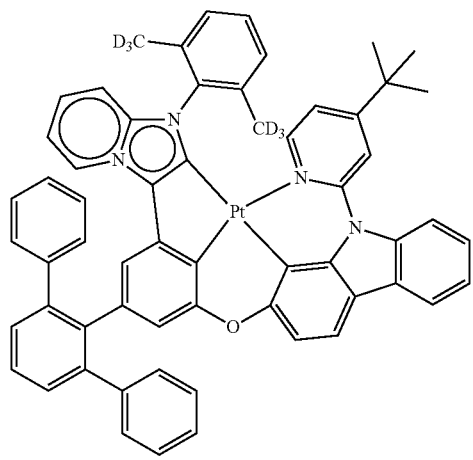
1-99
1-100
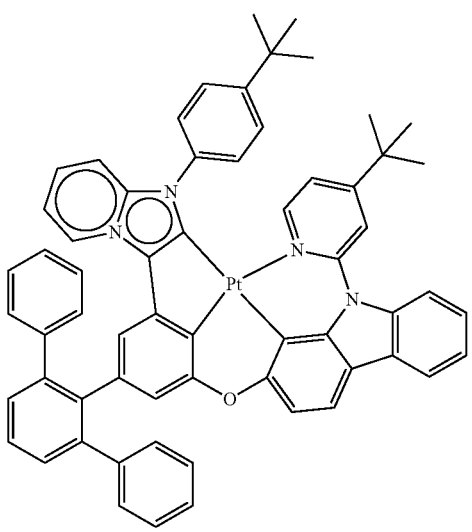
1-101
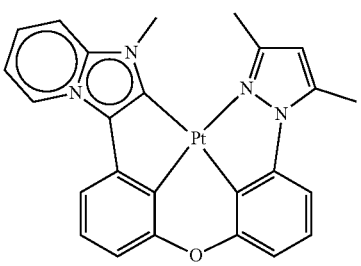
1-102
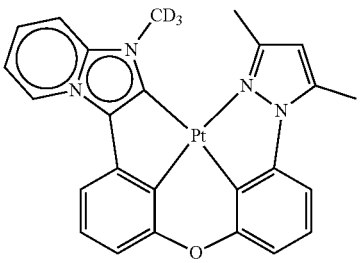
1-103
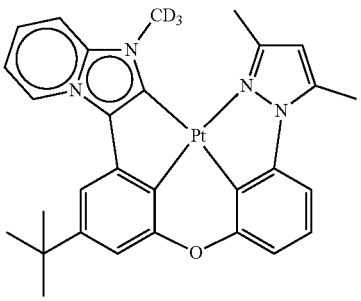

1-104
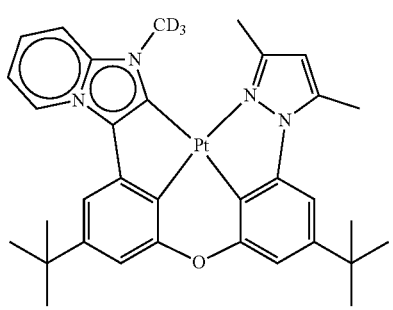
1-105
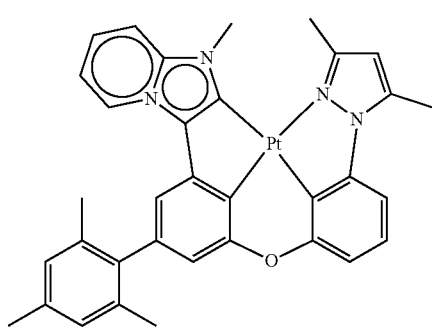
1-106
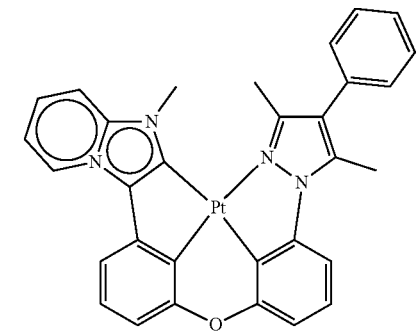
1-107
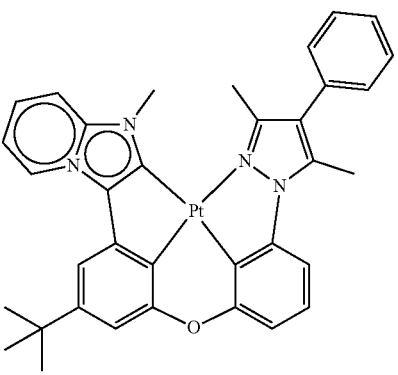
1-108
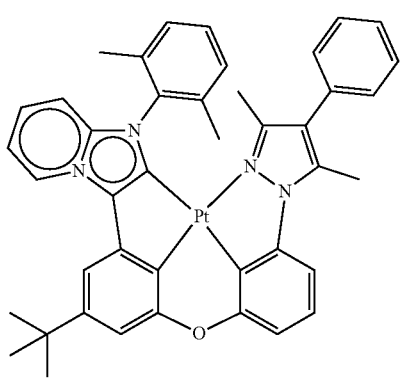
1-109
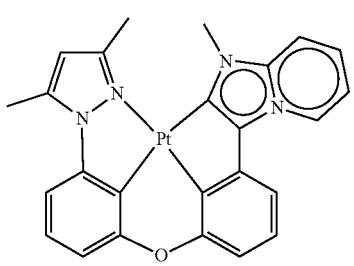
1-110
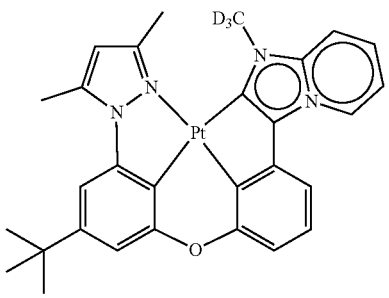
1-111
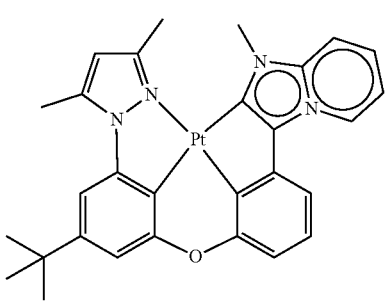
1-112
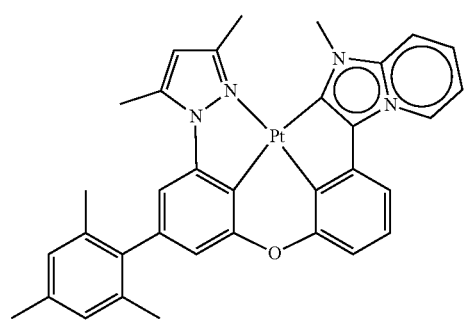

1-113 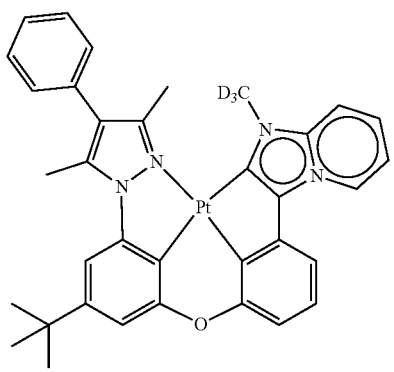
1-114 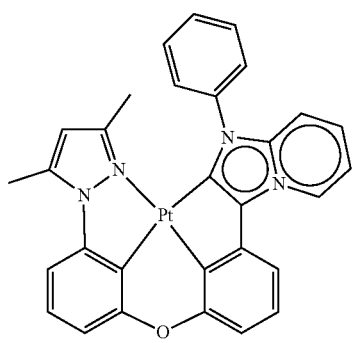
1-115 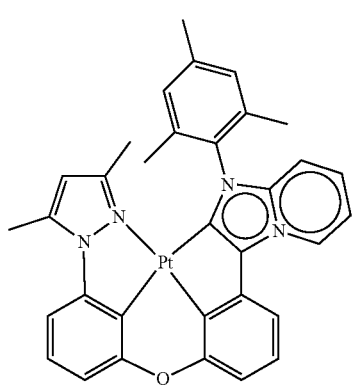
1-116 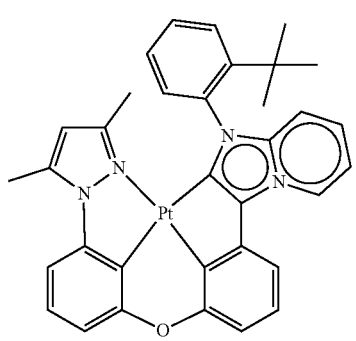
1-117 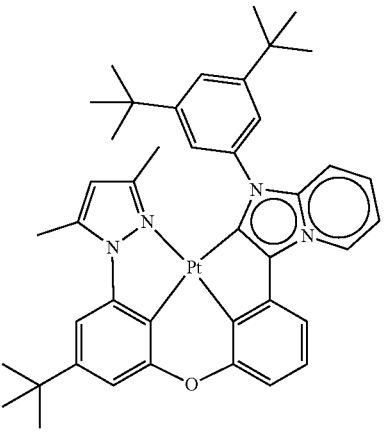
1-118 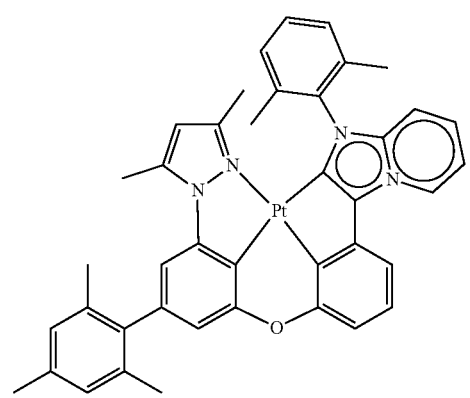
1-119 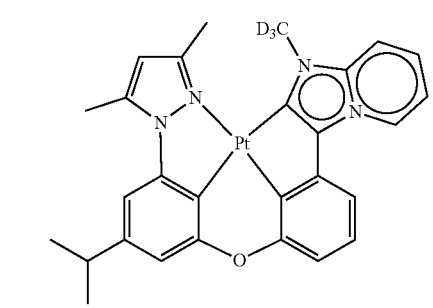
1-120 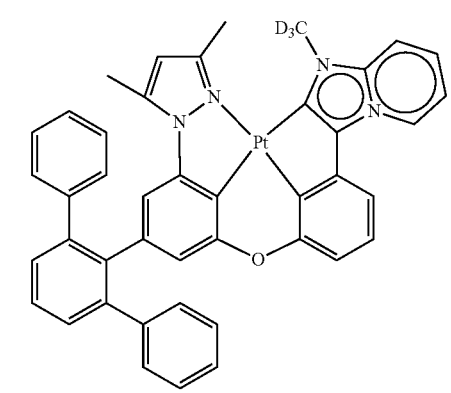

1-121
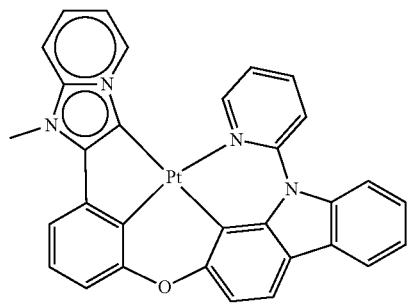
1-122
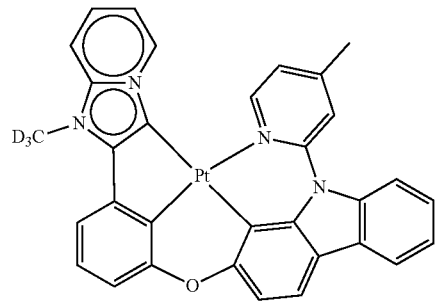
1-123
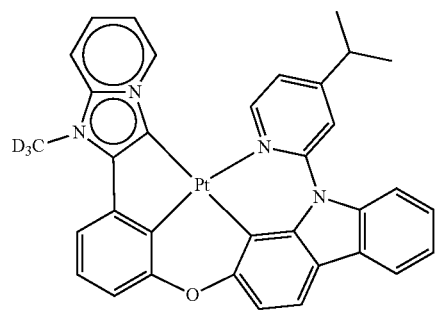
1-124
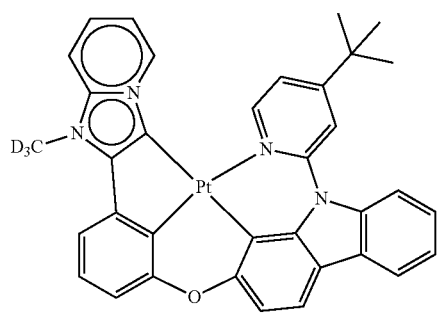
1-125
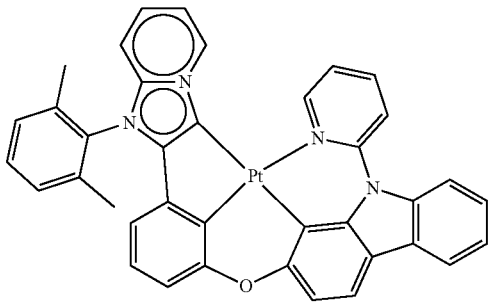
1-126
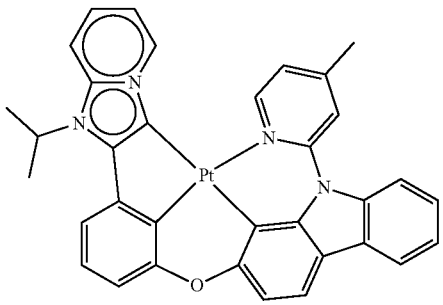
1-127
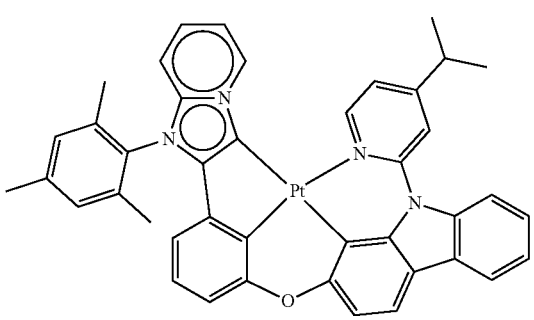
1-128
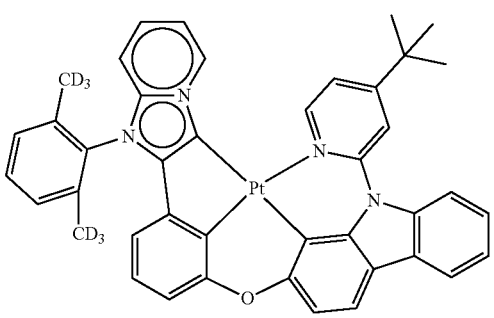
1-129
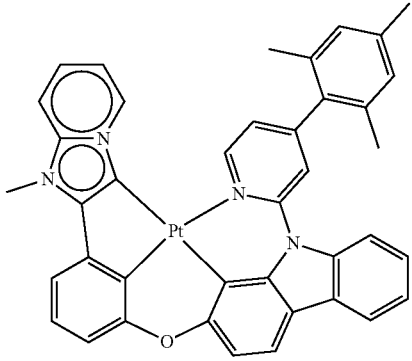

-continued
1-130
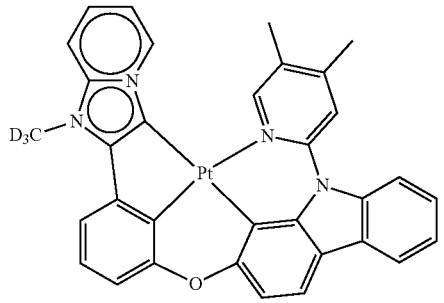
1-131
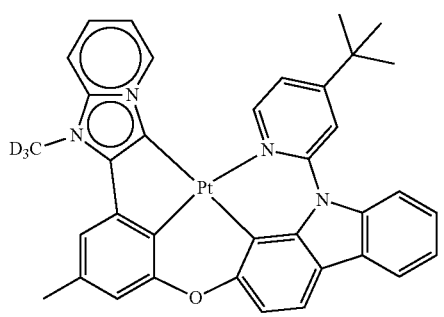
1-132
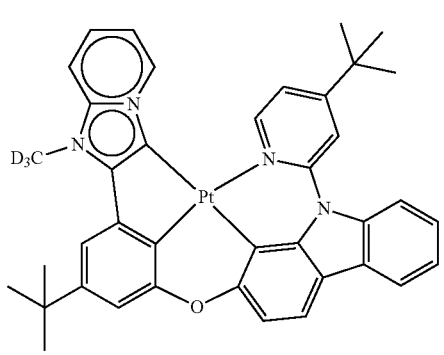
1-133
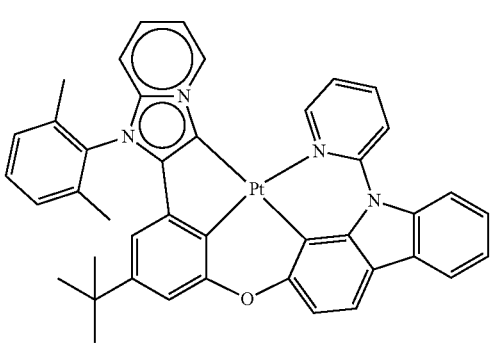
1-134
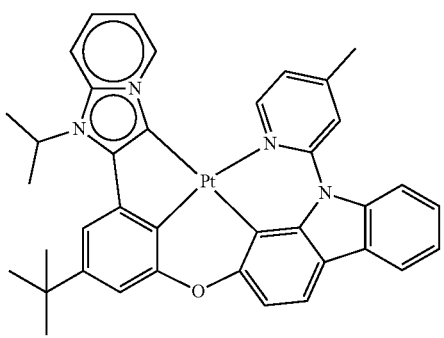
-continued
1-135
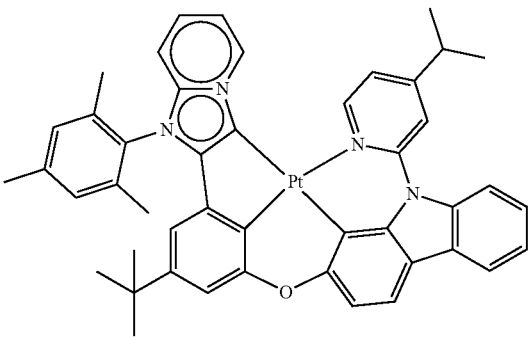
1-137
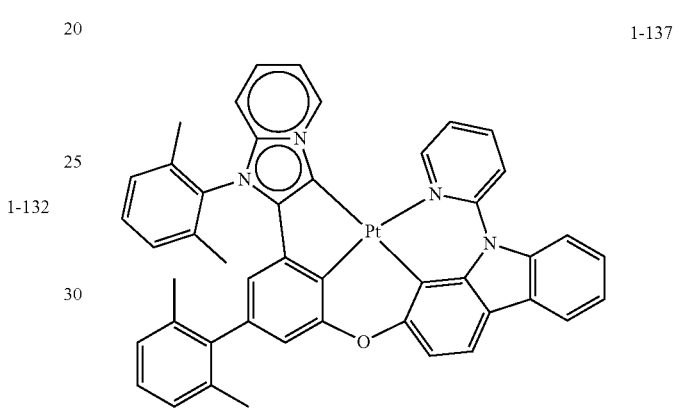
1-138
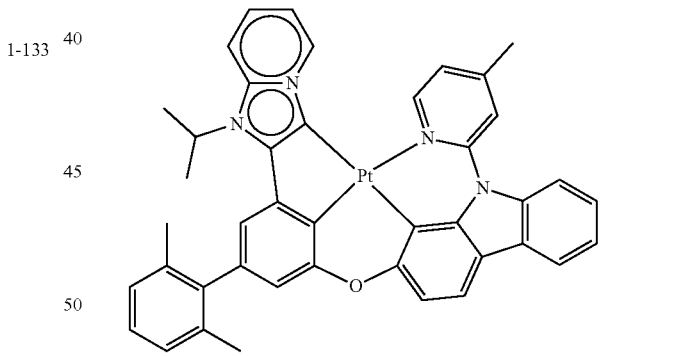
1-136
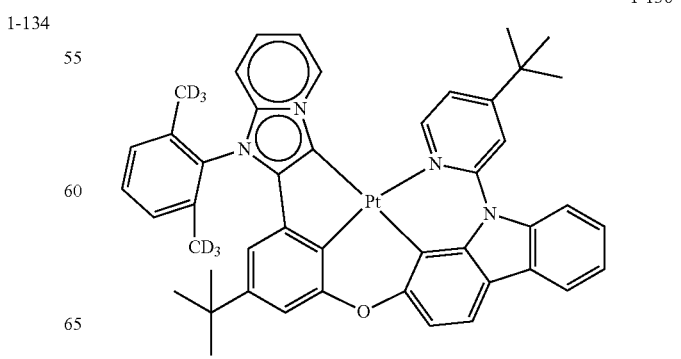

1-139
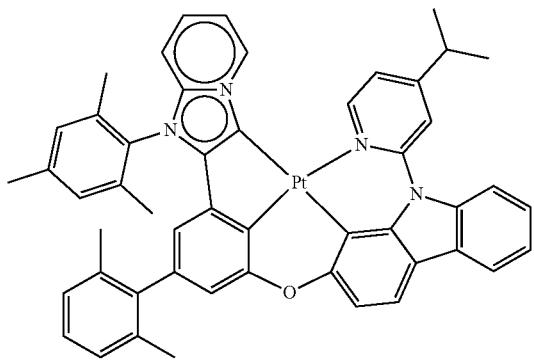
1-140
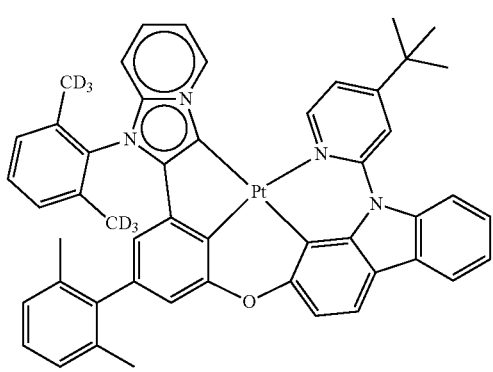
1-141
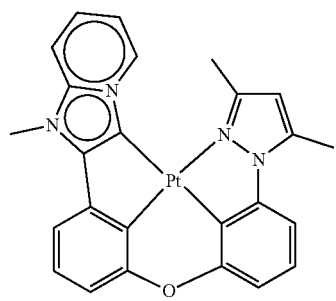
1-142
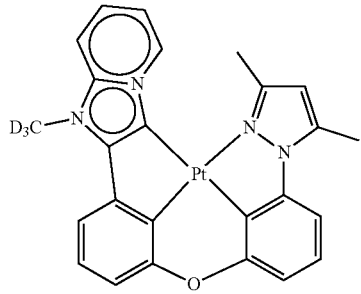
1-143
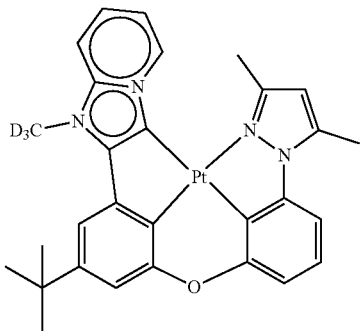
1-144
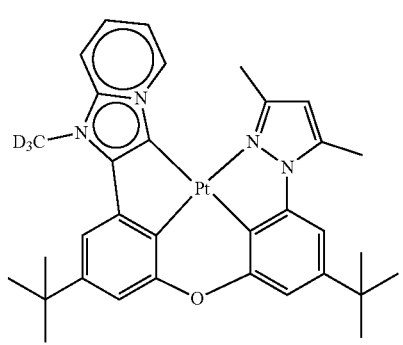
1-145
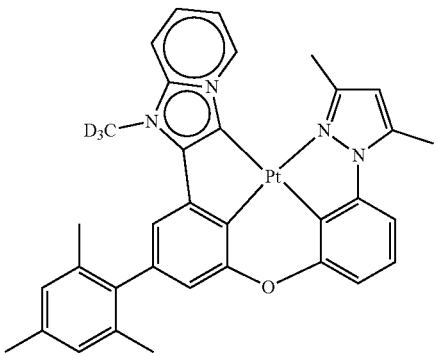
1-146
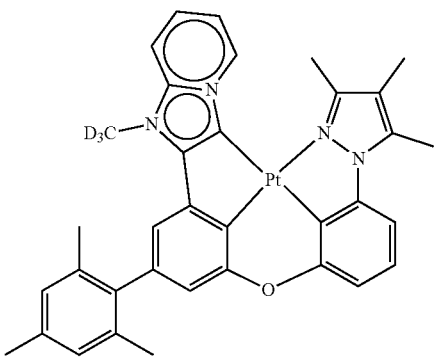

1-147
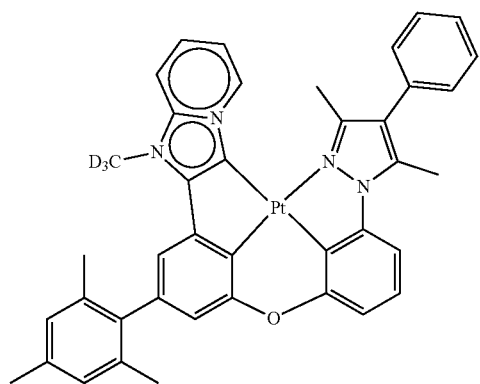
1-148
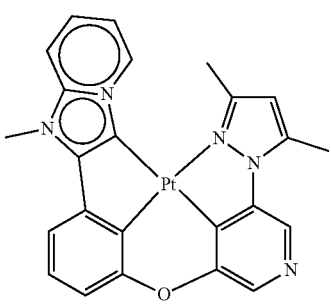
1-149
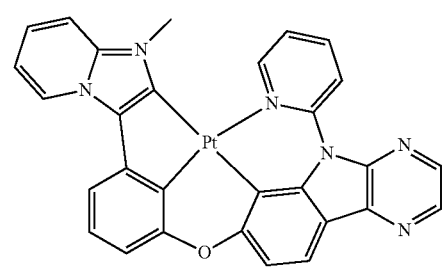
1-150
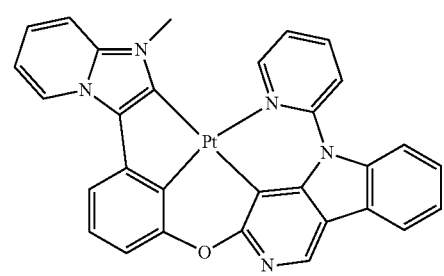
1-151
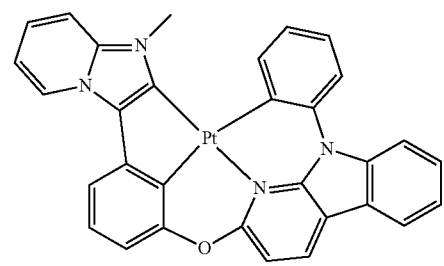
1-152
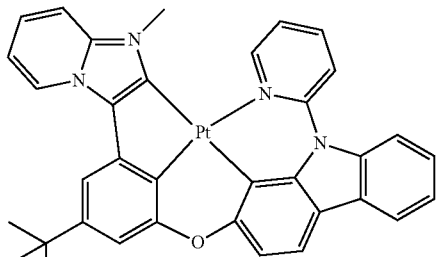
1-153
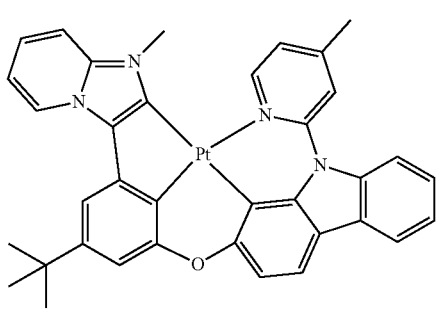
1-154
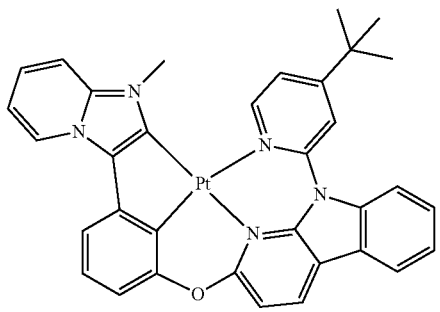
1-155
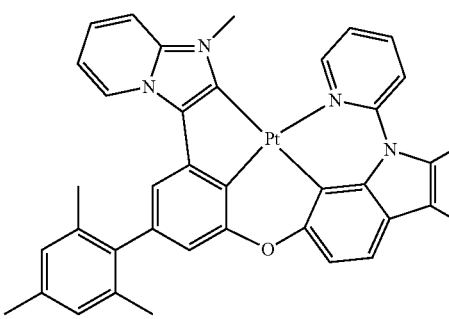
1-156
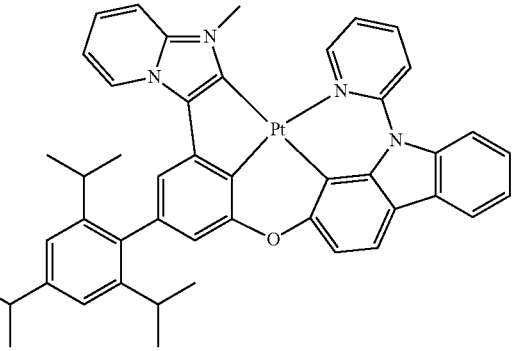

1-157

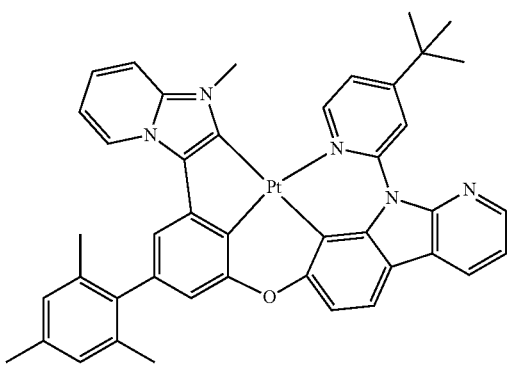

1-158

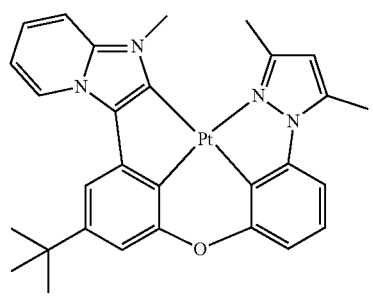

1-159

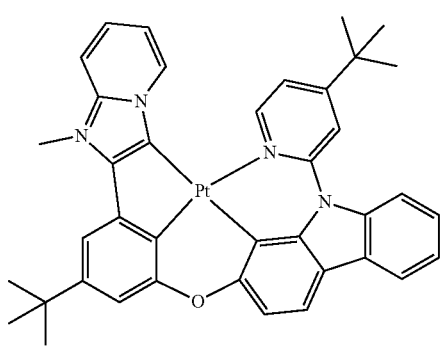

1-160

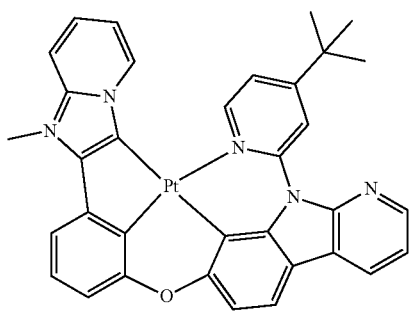

1-161

In the organic electroluminescence device 10 of an embodiment illustrated in FIGS. 1 to 3, the emission layer EML may include a host and a dopant, and the emission layer EML may include an organometallic compound of an embodiment as a dopant material.

The emission layer EML may include the organometallic compound of an embodiment as a dopant material to emit green light. For example, the emission layer EML may be to emit green light having a center wavelength of about 500 nm to about 600 nm through phosphorescence.

In the organic electroluminescence device 10 of an embodiment, the emission layer EML may further include an anthracene derivative, a pyrene derivative, a fluoranthene derivative, a chrysene derivative, a dihydrobenzanthracene derivative, or a triphenylene derivative. For example, the emission layer EML may further include an anthracene derivative or a pyrene derivative.

The emission layer EML may include a general material available in the art as a host material. For example, the emission layer EML may include at least one of bis[2-(diphenylphosphino)phenyl]ether oxide (DPEPO), 4,4'-bis (N-carbazolyl)-1,1'-biphenyl (CBP), 1,3-bis(carbazolyl-9-yl)benzene (mCP), tris(4-carbazol-9-ylphenyl)amine (TCTA), or 1,3,5-tris (1-phenyl-1H-benzo [d] imidazol-2-yl) benzene (TPBi), but is not limited thereto. For example, the host material may be or include tris(8-hydroxyquinolino) aluminum (Alq$_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris (carbazol-9-yl) triphenylamine (TCTA), 1,3,5-tris(N-phenylbenzimidazole-2-yl)benzene (TPBi), 2-tert-butyl-9,10-di(naphth-2-yl) anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), etc.

In an embodiment, the emission layer EML may further include any suitable dopant material. For example the dopant may be or include a styryl derivative (e.g., 1,4-bis[2-(3-N-ethylcarbazolyl)vinyl]benzene (BCzVB), 4-(di-p-tolylamino)-4"-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and derivatives thereof (e.g., 2,5,8,11-tetra-t-butylperylene (TBP)), pyrene and derivatives thereof (e.g., 1,1-dipyrene, 1,4-dipyrenylbenzene, and/or 1,4-bis(N,N-diphenylamino)pyrene), etc. In some embodiments, the emission layer EML may further include a thermally activated delayed fluorescence dopant.

In the organic electroluminescence device 10 of an embodiment illustrated in FIGS. 1 to 3, the electron transport region ETR is disposed on the emission layer EML. The electron transport region ETR may include at least one of a hole blocking layer HBL, an electron transport layer ETL, or an electron injection layer EIL, but is not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, and may have a single layer structure formed of an electron injection material or an electron transport material. In addition, the electron transport region ETR may have a single layer structure formed of a plurality of different materials, or may have a structure in which an electron transport layer ETL/electron injection layer EIL and a hole blocking layer HBL/electron transport layer ETL/electron injection layer EIL are stacked in order from the emission layer EML, but is not limited thereto. The thickness of the electron transport region ETR may be, for example, about 100 Å to about 1,500 Å.

The electron transport region ETR may be formed using any suitable method, such as a vacuum deposition method, a spin coating method, a cast method, a Langmuir-Blodgett (LB) method, an inkjet printing method, a laser printing method, a laser induced thermal imaging (LITI) method, etc.

When the electron transport region ETR includes the electron transport layer ETL, the electron transport layer ETL may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazole-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinato-N1,O8)-(1,1'-biphenyl-4-olato)aluminum (BAlq), beryllium bis(benzoquinolin-10-olate ($Bebq_2$), 9,10-di(naphthalene-2-yl)anthracene (ADN), or a mixture thereof. The thickness of the electron transport layer ETL may be about 100 Å to about 1,000 Å and may be, for example, about 150 Å to about 500 Å. When the thickness of the electron transport layer ETL satisfies the above-described range, satisfactory electron transport properties may be obtained without a substantial increase in driving voltage.

When the electron transport region ETR includes the electron injection layer EIL, the electron transport region ETR may be a halogenated metal (such as LiF, NaCl, CsF, RbCl, and/or RbI), a lanthanide metal (such as ytterbium (Yb)), a metal oxide (such as $Li_2O$, and/or BaO), or 8-hydroxyl lithium quinolate (LiQ), but is not limited thereto. The electron injection layer EIL may also be formed of a mixture material of an electron transport material and an insulating organo-metal salt. The organo-metal salt may be a material having an energy band gap of about 4 eV or more. For example, the organo-metal salt may include, for example, metal acetates, metal benzoates, metal acetoacetates, metal acetylacetonates, and/or metal stearates. The thickness of the electron injection layers EIL may be about 1 Å to about 100 Å, and about 3 Å to about 90 Å. When the thickness of the electron injection layers EIL satisfies the above-described range, satisfactory electron injection properties may be obtained without a substantial increase in driving voltage.

The electron transport region ETR may include a hole blocking layer HBL as described above. The hole blocking layer HBL may include, for example, at least one of 2,9-dimethyl-4,7-diphenyl-1,10-phenanthroline (BCP) and 4,7-diphenyl-1,10-phenanthroline (Bphen), but is not limited thereto. The thickness of the hole blocking layer HBL is not particularly limited, but may be, for example, about 10 Å to about 300 Å.

The second electrode EL2 is disposed on the electron transport region ETR. The second electrode EL2 may be a common electrode or a cathode. The second electrode EL2 may be a transmissive electrode, a transflective electrode, or a reflective electrode. When the second electrode EL2 is a transmissive electrode, the second electrode EL2 may include a transparent metal oxide, for example, indium tin oxide (ITO), indium zinc oxide (IZO), zinc oxide (ZnO), or indium tin zinc oxide (ITZO).

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). In some embodiments, the second electrode EL2 may have a multilayer structure including a reflective film or a transflective film formed of the above-described materials, and a transparent conductive film formed of indium tin oxide (ITO), indium zinc oxide (IZO), zinc oxide (ZnO), or indium tin zinc oxide (ITZO). The thickness of the second electrode EL1 may be about 1000 Å to about 10000 Å, for example, about 1500 Å to about 5000 Å.

In some embodiments, the second electrode EL2 may be connected with an auxiliary electrode. When the second electrode EL2 is connected with the auxiliary electrode, the resistance of the second electrode EL2 may decrease.

In some embodiments, the organic electroluminescence device 10 according to an embodiment may further include a capping layer CPL on the second electrode EL2. The capping layer CPL may include, for example, α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol-9-yl)triphenylamine (TCTA), N, N'-bis(naphthalen-1-yl), etc.

The organometallic compound of the above-described embodiment may be included as a material for an organic electroluminescence device 10 in an organic layer other than the emission layer EML. The organic electroluminescence device 10 according to an embodiment of the present disclosure may include the above-described organometallic compound in at least one organic layer disposed between the first electrode EU and the second electrode EL2, or in a capping layer disposed on the second electrode EL2.

In the organic electroluminescence device 10, when a voltage is applied across the first electrode EU and the second electrode EL2, holes injected from the first electrode EL1 may move through the hole transport region HTR to the emission layer EML, and electrons injected from the second electrode EL2 may move through the electron transport region ETR to the emission layer EML. The electrons and holes may recombine in the emission layer EML to form excitons, and these excitons may transition from an excited state to the ground state to emit light.

Hereinafter, with reference to Examples and Comparative Examples, an organometallic compound according to an embodiment of this present disclosure and an organic electroluminescence device of an embodiment including the organometallic compound according to an embodiment will be described in more detail. The Examples shown below are illustrated only for the understanding of this present disclosure, and the scope of the present disclosure is not limited thereto.

The organometallic compound according to an embodiment of the present disclosure may be synthesized, for example, as follows. However, the synthesis process of the organometallic compound according to an embodiment of the present disclosure is not limited thereto.

1-1. Synthesis of Compound 1

An organometallic Compound 9 of an embodiment of the present disclosure may be synthesized, for example, by Reaction Formula 1:

Synthesis of Intermediate 9-1

2-phenyl-1H-imidazole (7.2 g, 50 mmol), 3-bromoanisole (14.0 g, 75 mmol), potassium phosphate tribasic (23 g, 100 mmol), CuI (1.83 g, 10 mmol), and picolinic acid (1.17 g, 10 mmol) were placed in a reaction vessel and suspended in dimethyl sulfoxide (100 mL). The reaction mixture was warmed and stirred at 160° C. for 24 hours. After completing the reaction, the mixture was cooled to room temperature, and extracted using ethyl acetate after adding distilled water (300 mL). The extracted organic layer was washed with saturated sodium chloride aqueous solution and dried over sodium sulfate. The residue after removal of the solvent was separated using column chromatography to obtain a target compound (10.5 g, 42 mmol).

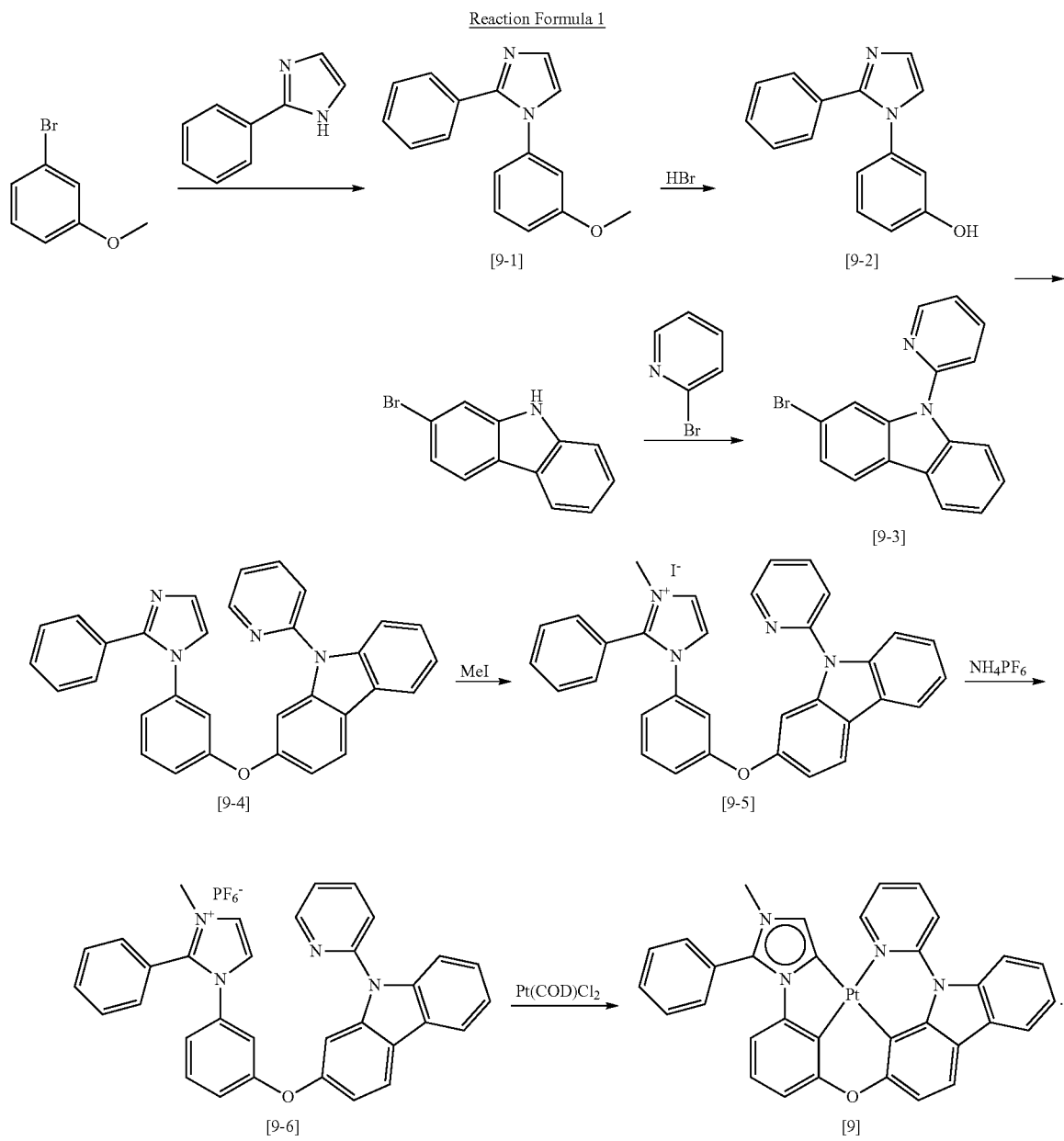

Synthesis of Intermediate 9-2

Intermediate 9-1 (10.5 g, 42 mmol) was suspended in a solution of excess bromic acid (HBr). The reaction mixture was warmed and stirred at 110° C. for 24 hours. After completing the reaction, the mixture was cooled to room temperature and neutralized by adding an appropriate or suitable amount of sodium bicarbonate. Distilled water (300 mL) was added and extraction was conducted using ethyl acetate. The extracted organic layer was washed with saturated sodium chloride aqueous solution and dried over sodium sulfate. The residue after removal of the solvent was separated using column chromatography to obtain a target compound (8.5 g, 36 mmol).

Synthesis of Intermediate 9-3

2-bromocarbazole (14.8 g, 60 mmol), 2-bromopyridine (14.2 g, 90 mmol), potassium phosphate tribasic (27.6 g, 120 mmol), CuI (2.2 g, 12 mmol), and picolinic acid (1.4 g, 12 mmol) were placed in a reaction vessel and suspended in dimethyl sulfoxide (120 mL). The reaction mixture was warmed and stirred at 160° C. for 24 hours. After completing the reaction, the mixture was cooled to room temperature and extracted using ethyl acetate after adding distilled water (300 mL). The extracted organic layer was washed with saturated sodium chloride aqueous solution and dried with sodium sulfate. The residue after removal of the solvent was separated using column chromatography to obtain a target compound (15.5 g, 48 mmol).

Synthesis of Intermediate 9-4

Intermediate 9-2 (8.5 g, 36 mmol), Intermediate 9-3 (15.5 g. 48 mmol), potassium phosphate tribasic (16.6 g, 72 mmol), CuI (1.3 g, 7.2 mmol), and picolinic acid (0.8 g, 7.2 mmol) were placed in a reaction vessel and suspended in dimethyl sulfoxide (100 mL). The reaction mixture was warmed and stirred at 160° C. for 72 hours. After completing the reaction, the mixture was cooled to room temperature, and extracted using ethyl acetate after adding distilled water (300 mL). The extracted organic layer was washed with saturated sodium chloride aqueous solution and dried over sodium sulfate. The residue after removal of the solvent was separated using column chromatography to obtain a target compound (13.1 g, 27 mmol).

Synthesis of Intermediate 9-5

Intermediate 9-4 (13.1 g, 27 mmol) was suspended in excess methyl iodide. The reaction mixture was warmed and stirred at 110° C. for 24 hours. After completing the reaction, the mixture was cooled to room temperature, and the resulting solid was filtered and washed with ether. The washed solid was separated using column chromatography to obtain a target compound (10.7 g, 17 mmol).

Synthesis of Intermediate 9-6

Intermediate 9-5 (10.7 g, 17 mmol) and ammonium hexafluorophosphate (8.3 g, 51 mmol) were placed in a reaction vessel and suspended in a mixed solution of methyl alcohol (150 mL) and water (150 mL). The reaction mixture was stirred at room temperature for 24 hours. After completing the reaction, the resulting solid was filtered and washed with ether. The washed solid was dried to obtain a target compound (9.0 g, 14 mmol).

Synthesis of Compound 9

Intermediate 9-6 (9.0 g, 14 mmol), dichloro(1,5-cyclooctadiene) platinum (5.8 g, 15.4 mmol), and sodium acetate (3.4 g, 42 mmol) were suspended in dioxane (220 mL). The reaction mixture was warmed and stirred at 110° C. for 72 hours. After completing the reaction, the mixture was cooled to room temperature, and extracted using ethyl acetate after adding distilled water (100 mL). The extracted organic layer was washed with saturated sodium chloride aqueous solution and dried over sodium sulfate. The residue after removal of the solvent was separated using column chromatography to obtain a target compound (0.9 g, 1.3 mmol).

1-2. Synthesis of Compound 16

Reaction Formula 2

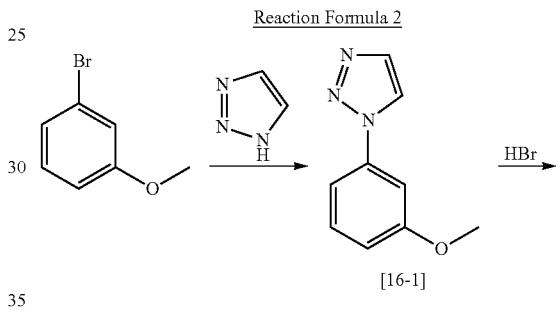

[16-1]

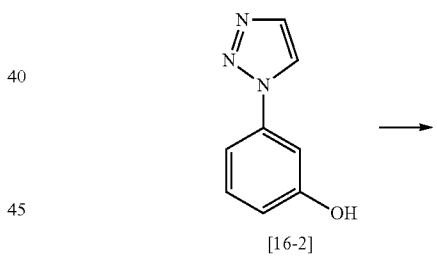

[16-2]

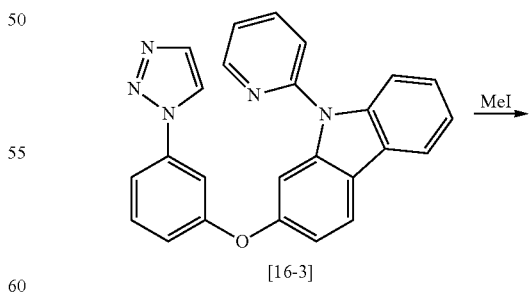

[16-3]

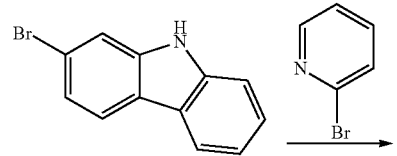

1-3. Synthesis of Compound 46
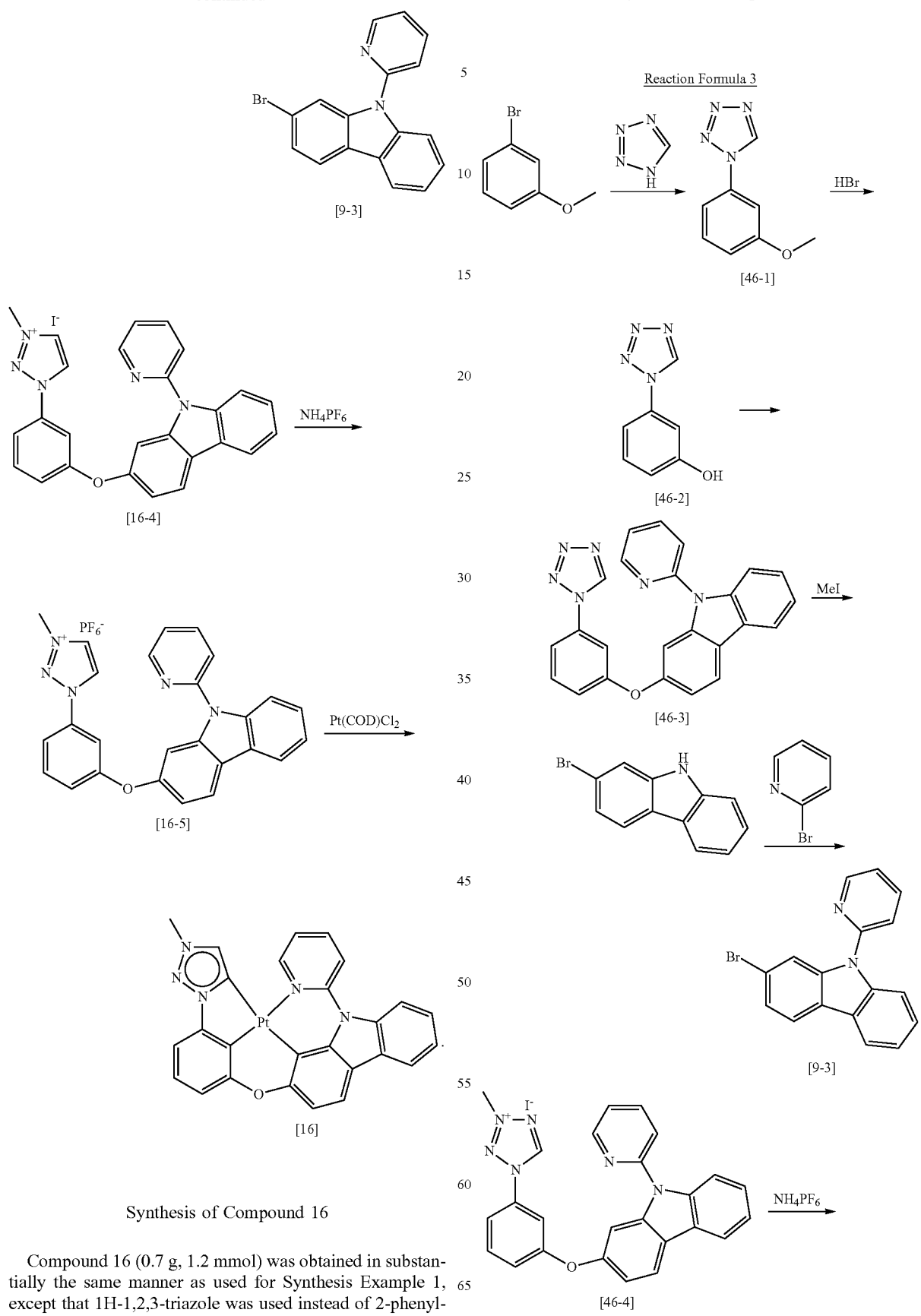
Synthesis of Compound 16
Compound 16 (0.7 g, 1.2 mmol) was obtained in substantially the same manner as used for Synthesis Example 1, except that 1H-1,2,3-triazole was used instead of 2-phenyl-1H-imidazole.

-continued

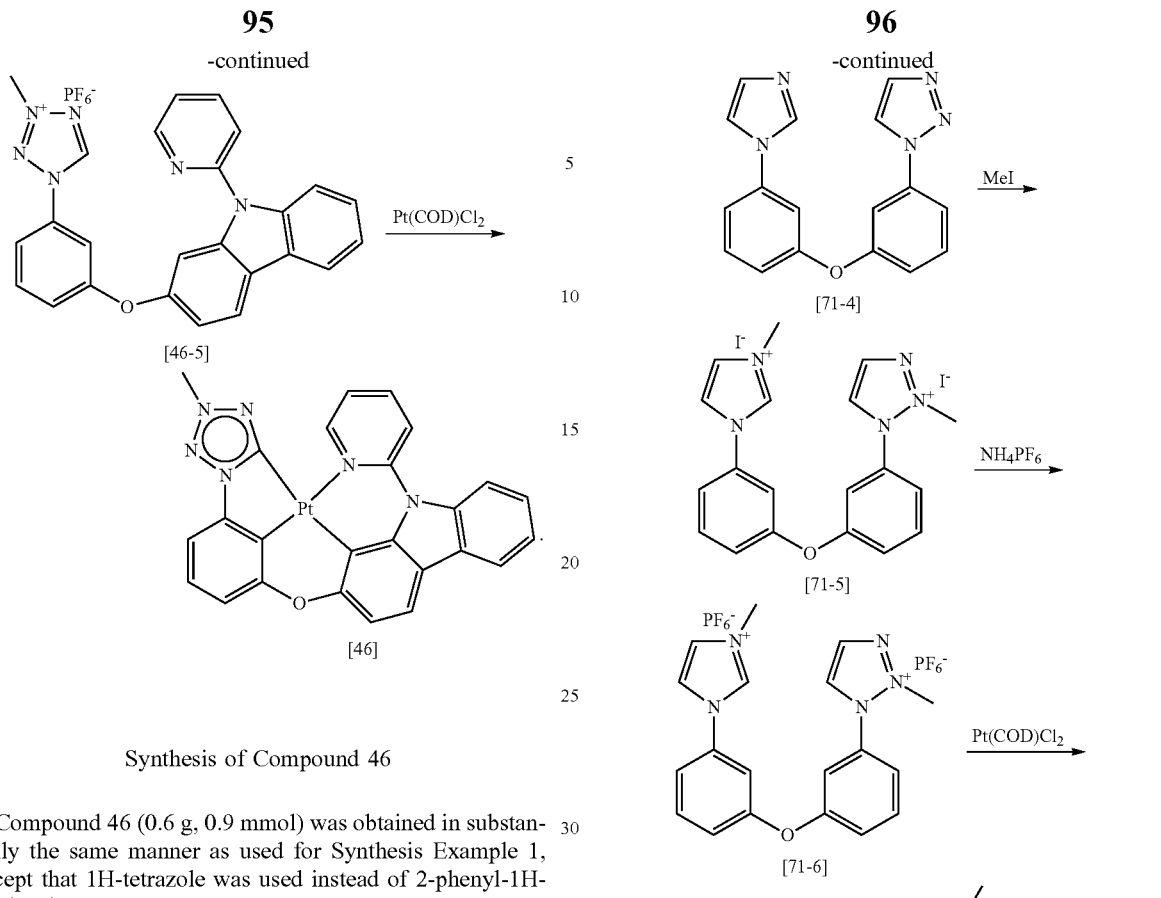

Synthesis of Compound 46

Compound 46 (0.6 g, 0.9 mmol) was obtained in substantially the same manner as used for Synthesis Example 1, except that 1H-tetrazole was used instead of 2-phenyl-1H-imidazole.

1-4. Synthesis of Compound 71

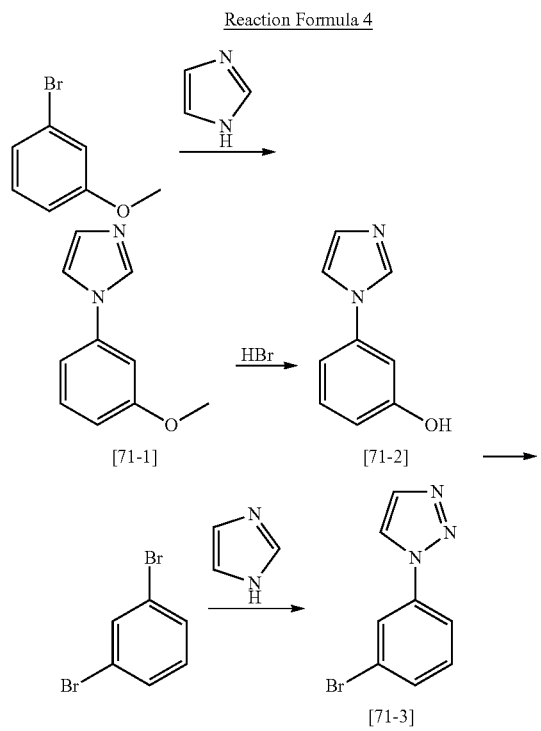

Synthesis of Intermediate 71-1

Imidazole (3.4 g, 50 mmol), 3-bromoanisole (14.0 g, 75 mmol), potassium phosphate tribasic (23 g, 100 mmol), CuI (1.83 g, 10 mmol), and picolinic acid (1.17 g, 10 mmol) were placed in a reaction vessel and suspended in dimethyl sulfoxide (100 mL). The reaction mixture was warmed and stirred at 160° C. for 24 hours. After completing the reaction, the mixture was cooled to room temperature and extracted using ethyl acetate after adding distilled water (100 mL). The extracted organic layer was washed with saturated sodium chloride aqueous solution and dried over sodium sulfate. The residue after removal of the solvent was separated using column chromatography to obtain a target compound (7.8 g, 45 mmol).

Synthesis of Intermediate 71-2

Intermediate 71-1 (7.8 g, 45 mmol) was suspended in a solution of excess bromic acid (HBr). The reaction mixture was warmed and stirred at 110° C. for 24 hours. After completing the reaction, the mixture was cooled to room temperature and neutralized by adding an appropriate or suitable amount of sodium bicarbonate. Distilled water (300 mL) was added and extraction was conducted using ethyl acetate. The extracted organic layer was washed with saturated sodium chloride aqueous solution and dried over sodium sulfate. The residue after removal of the solvent was separated using column chromatography to obtain a target compound (6.2 g, 39 mmol).

Synthesis of Intermediate 71-3

1H-1,2,3-triazole (3.5 g, 50 mmol), 1,3-dibromobenzene (17.7 g, 75 mmol), potassium phosphate tribasic (23 g, 100 mmol), CuI (1.83 g, 10 mmol), and picolinic acid (1.17 g, 10 mmol) were placed in a reaction vessel and suspended in dimethyl sulfoxide (100 mL). The reaction mixture was warmed and stirred at 160° C. for 24 hours. After completing the reaction, the mixture was cooled to room temperature and extracted using ethyl acetate after adding distilled water (300 mL). The extracted organic layer was washed with saturated sodium chloride aqueous solution and dried over sodium sulfate. The residue after removal of the solvent was separated using column chromatography to obtain a target compound (9.9 g, 44 mmol).

Synthesis of Intermediate 71-4

Intermediate 71-2 (6.2 g, 39 mmol), Intermediate 71-3 (9.9 g, 44 mmol), potassium phosphate tribasic (18.0 g, 78 mmol), CuI (1.4 g, 7.8 mmol), and picolinic acid (0.9 g, 7.8 mmol) were placed in a reaction vessel and suspended in dimethyl sulfoxide (100 mL). The reaction mixture was warmed and stirred at 160° C. for 72 hours. After completing the reaction, the mixture was cooled to room temperature and extracted using ethyl acetate after adding distilled water (300 mL). The extracted organic layer was washed with saturated sodium chloride aqueous solution and dried over sodium sulfate. The residue after removal of the solvent was separated using column chromatography to obtain a target compound (9.3 g, 31 mmol).

Synthesis of Intermediate 71-5

Intermediate 71-4 (9.3 g, 31 mmol) was suspended in excess methyl iodide. The reaction mixture was warmed and stirred at 110° C. for 24 hours. After completing the reaction, the mixture was cooled to room temperature and the resulting solid was filtered and washed with ether. The washed solid was separated using recrystallization to obtain a target compound (10.9 g, 19 mmol).

Synthesis of Intermediate 71-6

Intermediate 71-5 (10.9 g, 19 mmol) and ammonium hexafluorophosphate (12.4 g, 76 mmol) were placed in a reaction vessel and suspended in a mixed solution of methyl alcohol (200 mL) and water (200 mL). The reaction mixture was stirred at room temperature for 24 hours. After completing the reaction, the generated solid was filtered and washed with ether. The washed solid was dried to obtain a target compound (8.2 g, 13 mmol).

Synthesis of Compound 71

Intermediate 71-6 (8.2 g, 13 mmol), dichloro(1,5-cyclooctadiene) platinum (5.4 g, 14.3 mmol), and sodium acetate (6.3 g, 78 mmol) were suspended in dioxane (200 mL). The reaction mixture was warmed and stirred at 110° C. for 72 hours. After completing the reaction, the mixture was cooled to room temperature and extracted using ethyl acetate after adding distilled water (100 mL). The extracted organic layer was washed with saturated sodium chloride aqueous solution and dried over sodium sulfate. The residue after removal of the solvent was separated using column chromatography to obtain a target compound (0.4 g, 0.7 mmol).

1-5. Synthesis of Compound 87

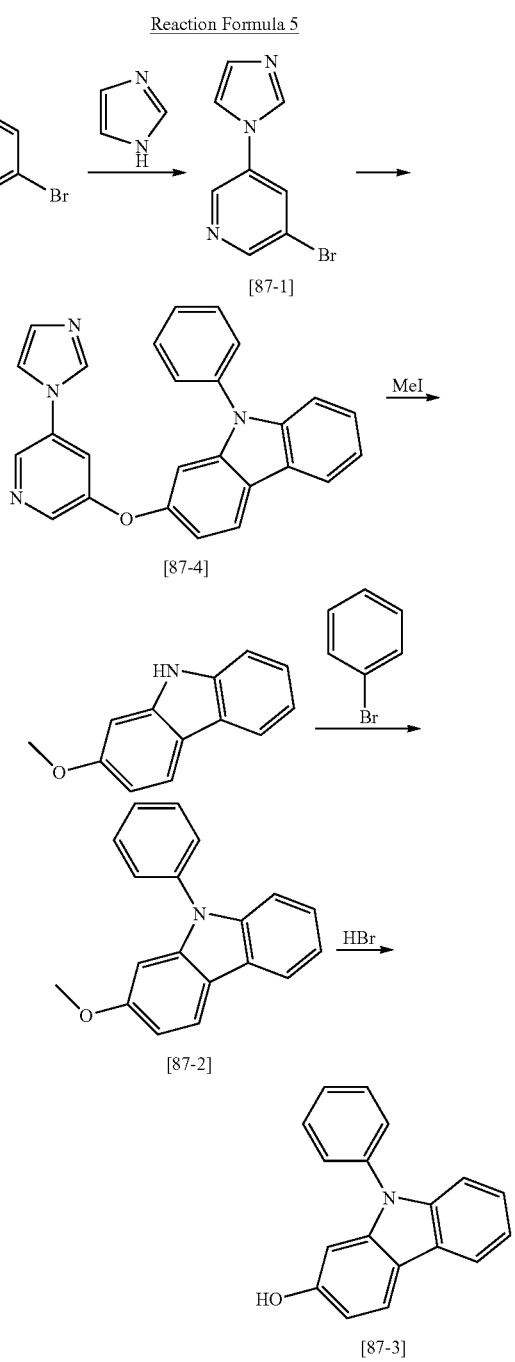

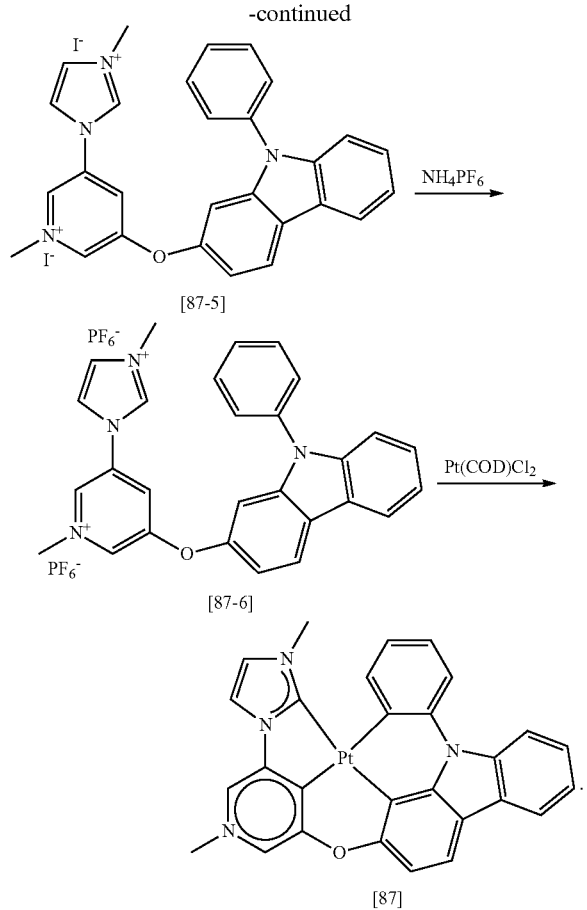

[87-5]

[87-6]

[87]

Synthesis of Intermediate 87-1

Imidazole (3.4 g, 50 mmol), 3,5-dibromopyridine (17.8 g, 75 mmol), potassium phosphate tribasic (23 g, 100 mmol), CuI (1.83 g, 10 mmol), and picolinic acid (1.17 g, 10 mmol) were placed in a reaction vessel and suspended in dimethyl sulfoxide (100 mL). The reaction mixture was warmed and stirred at 160° C. for 24 hours. After completing the reaction, the mixture was cooled to room temperature and extracted using ethyl acetate after adding distilled water (300 mL). The extracted organic layer was washed with saturated sodium chloride aqueous solution and dried over sodium sulfate. The residue after removal of the solvent was separated using column chromatography to obtain a target compound (9.6 g, 43 mmol).

Synthesis of Intermediate 87-2

2-methoxycarbazole (9.9 g, 50 mmol), bromobenzene (11.8 g, 75 mmol), potassium phosphate tribasic (23 g, 100 mmol), CuI (1.83 g, 10 mmol), and picolinic acid (1.17 g, 10 mmol) were placed in a reaction vessel and suspended in dimethyl sulfoxide (100 mL). The reaction mixture was warmed and stirred at 160° C. for 24 hours. After completing the reaction, the mixture was cooled to room temperature and extracted using ethyl acetate after adding distilled water (300 mL). The extracted organic layer was washed with saturated sodium chloride aqueous solution and dried over sodium sulfate. The residue after removal of the solvent was separated using column chromatography to obtain a target compound (12.3 g, 45 mmol).

Synthesis of Intermediate 87-3

Intermediate 87-3 (12.3 g, 45 mmol) was suspended in a solution of excess bromic acid (HBr). The reaction mixture was warmed and stirred at 110° C. for 24 hours. After completing the reaction, the mixture was cooled to room temperature and neutralized by adding an appropriate or suitable amount of sodium bicarbonate. Distilled water (300 mL) was added and extraction was conducted using ethyl acetate. The extracted organic layer was washed with saturated sodium chloride aqueous solution and dried over sodium sulfate. The residue after removal of the solvent was separated using column chromatography to obtain a target compound (9.1 g, 35 mmol).

Synthesis of Intermediate 87-4

Intermediate 87-1 (9.6 g, 43 mmol), Intermediate 87-3 (9.1 g, 35 mmol), potassium phosphate tribasic (16.2 g, 70 mmol), CuI (1.3 g, 7.0 mmol), and picolinic acid (0.8 g, 7.0 mmol) were placed in a reaction vessel and suspended in dimethyl sulfoxide (100 mL). The reaction mixture was warmed and stirred at 160° C. for 72 hours. After completing the reaction, the mixture was cooled to room temperature and extracted using ethyl acetate after adding distilled water (300 mL). The extracted organic layer was washed with saturated sodium chloride aqueous solution and dried over sodium sulfate. The residue after removal of the solvent was separated using column chromatography to obtain a target compound (10.5 g, 26 mmol).

Synthesis of Intermediate 87-5

Intermediate 87-4 (10.5 g, 26 mmol) was suspended in excess methyl iodide. The reaction mixture was warmed and stirred at 110° C. for 24 hours. After completing the reaction, the mixture was cooled to room temperature, and the resulting solid was filtered and washed with ether. The washed solid was separated using recrystallization to obtain a target compound (9.6 g, 14 mmol).

Synthesis of Intermediate 87-6

Intermediate 87-5 (9.6 g, 14 mmol) and ammonium hexafluorophosphate (9.1 g, 56 mmol) were placed in a reaction vessel and suspended in a mixed solution of methyl alcohol (120 mL) and water (120 mL). The reaction mixture was stirred at room temperature for 24 hours. After completing the reaction, the resulting solid was filtered and washed with ether. The washed solid was dried to obtain a target compound (6.5 g, 9 mmol).

Synthesis of Compound 87

Intermediate 87-6 (6.5 g, 9 mmol), dichloro(1,5-cyclooctadiene) platinum (3.7 g, 9.9 mmol), and sodium acetate (4.4 g, 54 mmol) were suspended in dioxane (140 mL). The reaction mixture was warmed and stirred at 110° C. for 72 hours. After completing the reaction, the mixture was cooled to room temperature and extracted using ethyl acetate after adding distilled water (100 mL). The extracted organic layer was washed with saturated sodium chloride aqueous solution and dried over sodium sulfate. The residue after

1-6. Synthesis of Compound 96

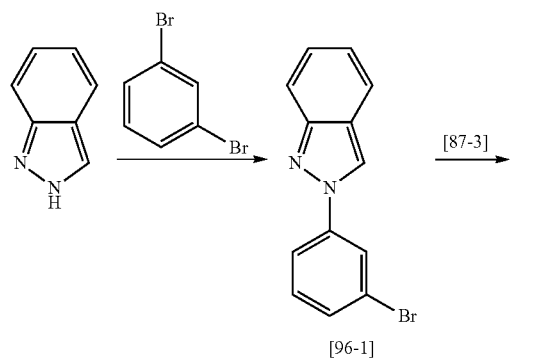

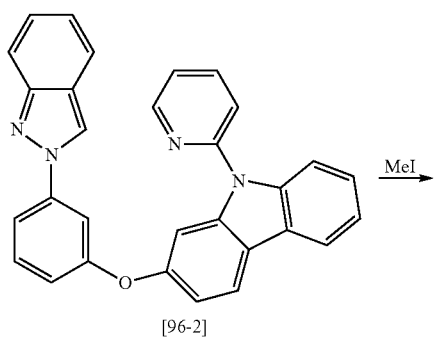

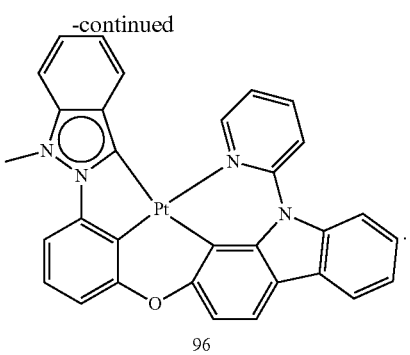

Synthesis of Intermediate 96-1

2H-indazole (5.9 g, 50 mmol), 1,3-dibromobenzene (17.7 g, 75 mmol), potassium phosphate tribasic (23 g, 100 mmol), CuI (1.83 g, 10 mmol), and picolinic acid (1.17 g, 10 mmol) were placed in a reaction vessel and suspended in dimethyl sulfoxide (100 mL). The reaction mixture was warmed and stirred at 160° C. for 24 hours. After completing the reaction, the mixture was cooled to room temperature and extracted using ethyl acetate after adding distilled water (300 mL). The extracted organic layer was washed with saturated sodium chloride aqueous solution and dried over sodium sulfate. The residue after removal of the solvent was separated using column chromatography to obtain Intermediate 96-1 (yield: 69%).

Synthesis of Intermediate 96-2

Intermediate 96-1 (11.7 g, 43 mmol), Intermediate 87-3 (9.1 g, 35 mmol), potassium phosphate tribasic (16.2 g, 70 mmol), CuI (1.3 g, 7.0 mmol), and picolinic acid (0.8 g, 7.0 mmol) were placed in a reaction vessel and suspended in dimethyl sulfoxide (100 mL). The reaction mixture was warmed and stirred at 160° C. for 72 hours. After completing the reaction, the mixture was cooled to room temperature and extracted using ethyl acetate after adding distilled water (300 mL). The extracted organic layer was washed with saturated sodium chloride aqueous solution and dried over sodium sulfate. The residue after removal of the solvent was separated using column chromatography to obtain Intermediate 96-2 (yield: 55%).

Synthesis of Intermediate 96-3

Intermediate 96-2 (9.0 g, 20 mmol) was suspended in excess methyl iodide. The reaction mixture was warmed and stirred at 110° C. for 24 hours. After completing the reaction, the mixture was cooled to room temperature, and the resulting solid was filtered and washed with ether. The washed solid was separated using recrystallization to obtain Intermediate 96-3 (yield: 55%).

Synthesis of Intermediate 96-4

Intermediate 96-3 (8.3 g, 14 mmol) and ammonium hexafluorophosphate (9.1 g, 56 mmol) were placed in a reaction vessel and suspended in a mixed solution of methyl alcohol (120 mL) and water (120 mL). The reaction mixture was stirred at room temperature for 24 hours. After completing the reaction, the resulting solid was filtered and washed with ether. The washed solid was dried to obtain Intermediate 96-3 (yield: 90%).

Synthesis of Compound 96

Intermediate 96-4 (5.5 g, 9 mmol), dichloro(1,5-cyclooctadiene) platinum (3.7 g, 9.9 mmol), and sodium acetate (4.4 g, 54 mmol) were suspended in dioxane (140 mL). The reaction mixture was warmed and stirred at 110° C. for 72 hours. After completing the reaction, the mixture was cooled to room temperature and extracted using ethyl acetate after adding distilled water (100 mL). The extracted organic layer was washed with saturated sodium chloride aqueous solution and dried over sodium sulfate. The residue after removal of the solvent was separated using column chromatography to obtain Compound 96 (yield: 35%).

1-7. Synthesis of Compound 98

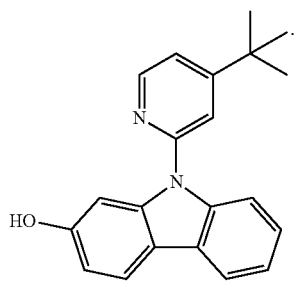 [SMILES: CC(C)(C)c1ccnc(-n2c3ccccc3c3ccc(O)cc32)c1]

Compound 98 was obtained in substantially the same manner as used for Synthesis Example 96, except that Intermediate 53-B was used instead of Intermediate 87-3. (yield: 48%)

1-8. Synthesis of Compound 113

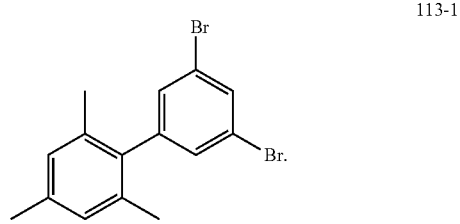 [SMILES: Cc1cc(C)c(-c2cc(Br)cc(Br)c2)c(C)c1]

Compound 113 was obtained in substantially the same manner as used for Synthesis Example 98, except that Intermediate 113-1 was used instead of 1,3-dibromobenzene. (yield: 41%)

$^1$H NMR and MS-FAB of the Compounds synthesized through the above-described Synthesis Examples are shown in Table 1:

TABLE 1

| No. of Compound | $^1$H NMR (CDCl$_3$, 400 MHz) | MS/FAB found | calc. |
|---|---|---|---|
| 9 | 8.74 (m, 1H), 8.40 (m, 1H), 8.27-8.26 (m, 2H), 8.20-8.15 (m, 2H), 8.01 (m, 1H), 7.57-7.49 (m, 5H), 7.32-7.29 (m, 3H), 7.20-7.18 (m, 2H), 6.99-6.79 (m, 2H), 3.72 (s, 3H) | 685.1443 | 685.1441 |
| 16 | 8.75 (m, 1H), 8.40-8.25 (m, 2H), 8.18-8.16 (m, 2H), 8.01 (m, 1H), 7.56-7.51 (m, 2H), 7.34-7.19 (m, 4H), 6.99 (m, 1H), 6.70 (m, 1H), 3.78 (s, 3H) | 610.1085 | 610.1081 |
| 46 | 8.73 (m, 1H), 8.40 (m, 1H), 8.20-8.14 (m, 2H), 8.00 (m, 1H), 7.59-7.49 (m, 2H), 7.34-7.19 (m, 4H), 6.89-6.71 (m, 2H), 3.67 (s, 3H) | 611.1029 | 611.1033 |
| 71 | 8.77 (m, 1H), 8.32 (m, 1H), 7.32-7.29(m, 2H), 7.05-6.95 (m, 2H), 6.55-6.45 (m, 3H), 3.67 (s, 3H), 3.64 (s, 3H) | 524.0927 | 524.0924 |
| 87 | 8.65 (m, 1H), 8.26-8.18 (m, 2H), 8.03-7.94 (m, 2H), 7.74-7.46 (m, 5H), 7.30-7.19 (m, 2H), 6.49-6.44 (m, 2H), 4.28 (s, 3H), 3.65 (s, 3H) | 623.1283 | 623.1285 |
| 96 | 8.73 (m, 1H), 8.39-8.32 (m, 2H), 8.19 (m, 1H), 7.92-7.55 (m, 5H), 7.33-7.15 (m, 6H), 7.00 (d, 1H), 6.69 (d, 1H), 3.95 (s, 3H) | 659.1284 | 659.1285 |
| 98 | 8.74 (d, 1H), 8.39 (d, 1H), 8.32-8.30 (m, 2H), 7.92 (d, 1H), 7.65-7.40 (m, 5H), 7.33-7.17 (m, 4H), 7.01 (m, 1H), 6.68 (dd, 1H), 3.96 (s, 3H), 1.33 (s, 9H) | 715.1913 | 715.1911 |
| 113 | 8.73 (d, 1H), 8.38 (d, 1H), 8.35-8.32 (m, 1H), 8.19-8.16 (m, 1H), 7.92 (d, 1H), 7.65-7.40 (m, 6H), 7.33-7.17 (m, 5H), 6.68 (dd, 1H), 3.96 (s, 3H), 2.93 (s, 6H), 2.48 (s, 3H), 1.33 (s, 9H) | 833.2692 | 833.2693 |

1-A. Synthesis of Compound 1-1

An organometallic compound 1-1 of an embodiment of the present disclosure may be synthesized by, for example, Reaction Formula 1:

Reaction Formula 1

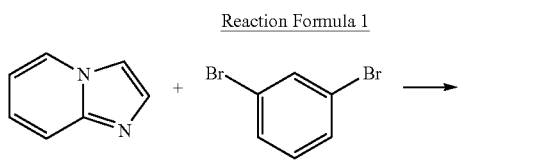

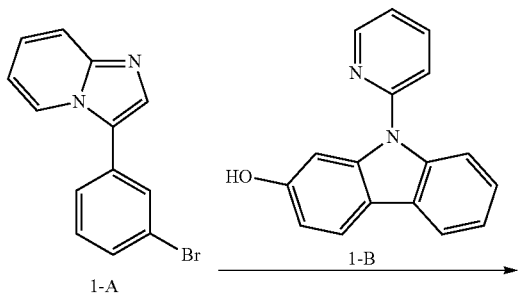

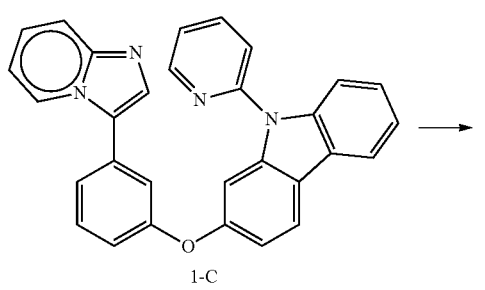

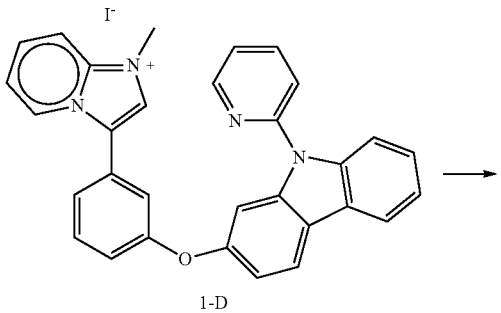

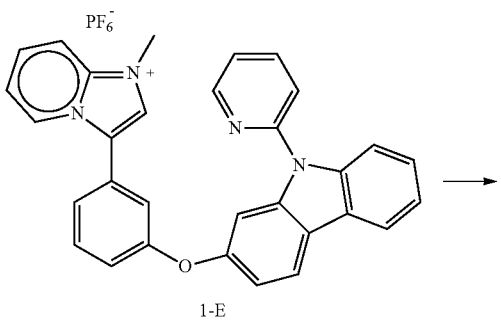

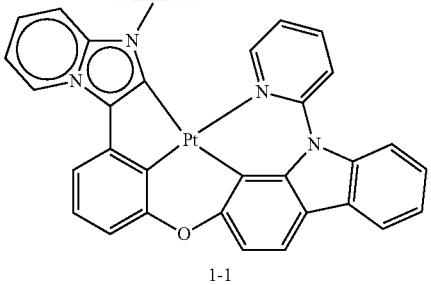

1-1

Synthesis of Intermediate 1-A

Imidazo[1,2-a]pyridine (1.89 g, 16.0 mmol), 1,3-dibromobenzene (3.77 g, 16.0 mmol), palladium acetate (0.18 g, 0.8 mmol), and potassium acetate (3.14 g, 32.0 mmol) were suspended in dimethylacetamide solvent (60 mL), heated at 140° C., and stirred for one day. The reaction mixture was extracted using methylene chloride and distilled water. The organic layer was washed three times with distilled water, dried over magnesium sulfate, filtered and concentrated under reduced pressure. The concentrate was purified by column chromatography to obtain Intermediate 1-A (yield: 68%).

Synthesis of Intermediate 1-C

Synthesized Intermediate 1-A and Intermediate 1-B (1.0 equiv), (0.1 equiv), potassium phosphate (2.0 equiv), and L-proline (0.1 equiv) were suspended in dimethyl formamide solvent (100 mL), heated at 160° C., and stirred for 12 hours. After completing the reaction, the solvent was removed under reduced pressure, and extracted using methylene chloride and distilled water. The organic layer was washed three times with distilled water, dried over magnesium sulfate, filtered, and concentrated under reduced pressure. The concentrate was purified by column chromatography to obtain Intermediate 1-C (yield: 76%).

Synthesis of Intermediate 1-D

Intermediate 1-C was dissolved in toluene, heated at 110° C. and stirred for 12 hours after adding methyl iodide (1.2 equiv). After completing the reaction, the solvent was removed under reduced pressure, and the concentrate was purified by column chromatography to obtain Intermediate 1-D (yield: 88%).

Synthesis of Intermediate 1-E

Intermediate 1-D was dissolved in a mixed solvent of methanol and distilled water in a ratio of 4:1 and ammonium hexafluorophosphate (1.05 equiv) was added. The resulting solid was stirred at room temperature for 12 hours. Filtration and washing with distilled water and diethyl ether were conducted to obtain Intermediate 1-E (yield: 90%).

Synthesis of Compound 1-1

The synthesized Intermediate 1-E, sodium acetate (3.0 equiv), and Pt (COD)Cl$_2$ (1.05 equiv) were suspended in 1,4-dioxane solvent. The reaction mixture was heated at 120° C. and stirred for 36 hours. After completing the reaction, the solvent was removed under reduced pressure. Compound 1-1 was obtained by column chromatography purification (yield: 40%).

1-B. Synthesis of Compound 1-53

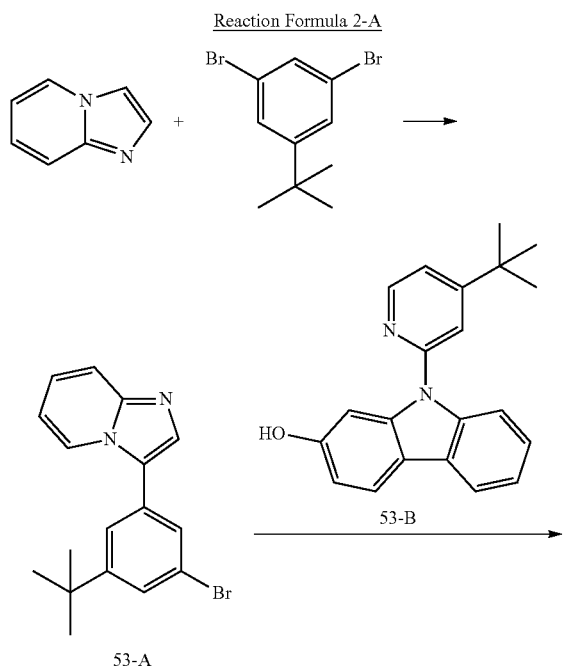

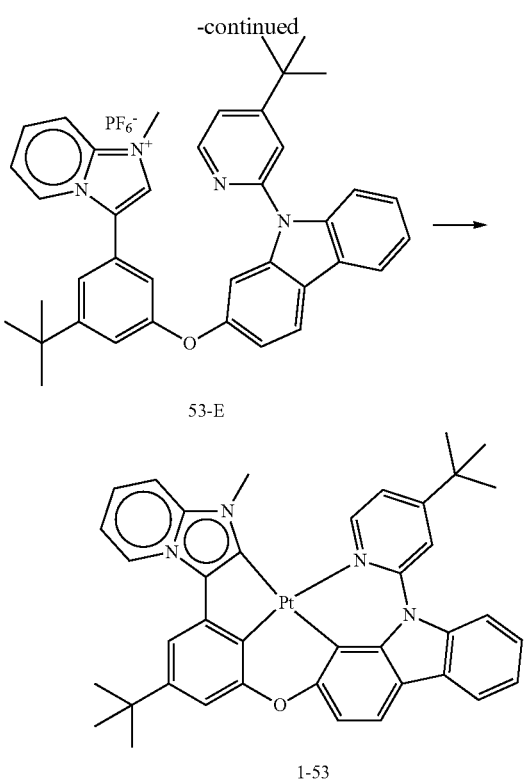

Synthesis of Intermediate 53-A

Intermediate 53-A was obtained in substantially the same manner as used for synthesis of Intermediate 1-A, except that 1,3-dibromo-5-(t-butyl)benzene was used instead of 1,3-dibromobenzene. (yield: 69%)

Synthesis of Intermediate 53-C

Intermediate 53-C was obtained in substantially the same manner as used for synthesis of Intermediate 1-C, except that Intermediate 53-B was used instead of Intermediate 1-B. (yield: 66%)

Synthesis of Intermediate 53-D

Intermediate 53-D was obtained in substantially the same manner as used for synthesis of Intermediate 1-D, except that Intermediate 53-C was used instead of Intermediate 1-C. (yield: 83%)

Synthesis of Intermediate 53-E

Intermediate 53-E was obtained in substantially the same manner as used for synthesis of Intermediate 1-E, except that Intermediate 53-D was used instead of Intermediate 1-D. (yield: 95%)

Synthesis of Compound 1-53

Compound 1-53 was obtained in substantially the same manner as used for Synthesis Example 1, except that Intermediate 53-E was used instead of Intermediate 1-E. (yield: 45%) 1-D. Synthesis of Compound 1-87

1-87

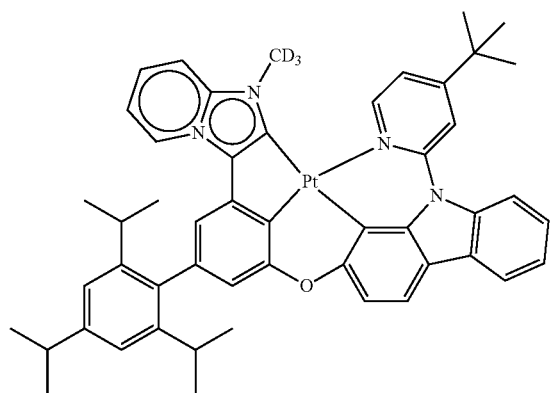

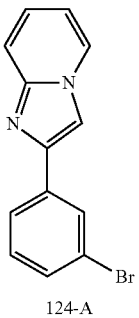

124-A

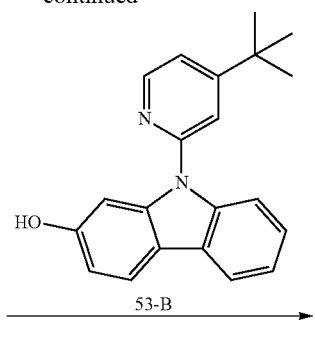

53-B →

Compound 1-87 was obtained in substantially the same manner as used for Synthesis Example 1-53, except that 3',5'-dibromo-2,4,6-triisopropyl-1,1'-diphenyl was used instead of 1,3-dibromo-5-(t-butyl)-benzene, and deuterium-substituted methyl iodide was used instead of methyl iodide.

1-E. Synthesis of Compound 1-111

1-111

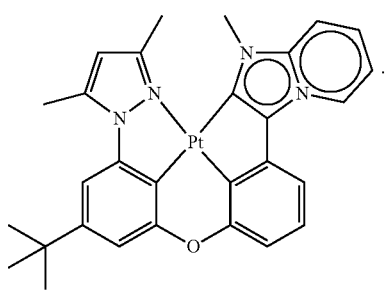

Compound 1-111 was obtained in the substantially same manner as used for Synthesis Example 1-1, except that 3-(t-butyl)-5-(3,5-dimethyl-1-H-pyrazol-1-yl)phenol was used instead of Intermediate 1-B.

1-F. Synthesis of Compound 1-124

Reaction Formula 3-A

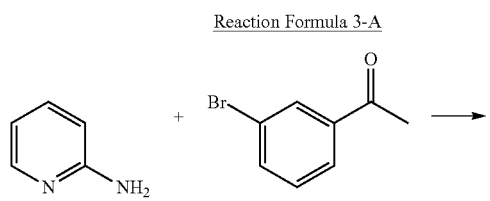

124-C

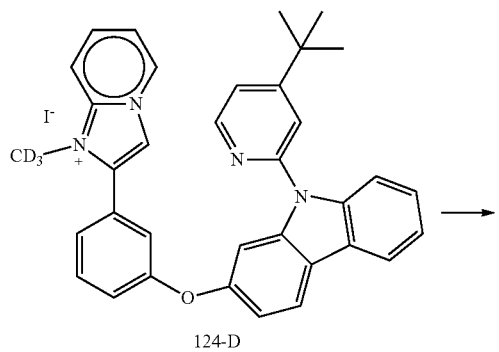

124-D

124-E

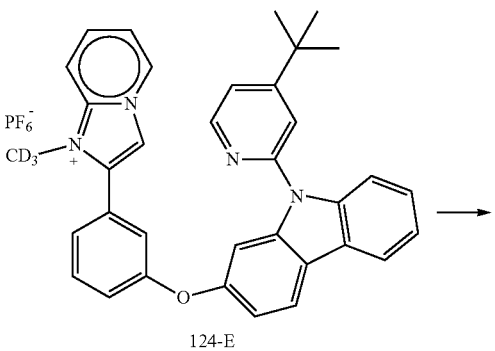

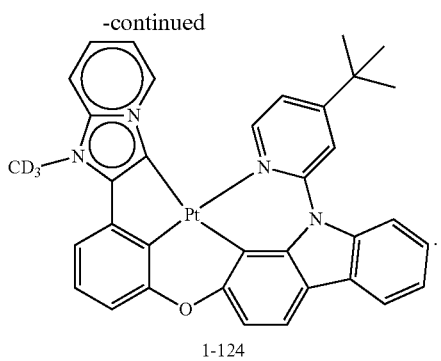

1-124

Synthesis of Intermediate 124-A 2-aminopyridine (1.13 g, 12.0 mmol), 1-(3-bromophenyl)ethane-1-one (1.99 g, 10.0 mmol), and copper iodide (2.0 mmol) were suspended in 1,4-dioxane solvent (30 mL), heated at 100° C., and stirred for 14 hours. The reaction mixture was concentrated under reduced pressure. The concentrate was purified by column chromatography to obtain Intermediate 1-A. (yield: 68%)

Synthesis of Intermediate 124-C

Intermediate 124-C was obtained in substantially the same manner as used for Intermediate 53-C of Synthesis Example 1-53, except that Intermediate 124-A was used instead of Intermediate 53-A. (yield: 62%)

Synthesis of Intermediate 124-D

Intermediate 124-D was obtained in substantially the same manner as used for Intermediate 53-D of Synthesis Example 1-53, except that Intermediate 124-C was used instead of Intermediate 53-C. (yield: 81%)

Synthesis of Intermediate 124-E

Intermediate 124-E was obtained in substantially the same manner as used for Intermediate 53-E of Synthesis Example 1-53, except that Intermediate 124-D was used instead of Intermediate 53-D. (yield: 92%)

Synthesis of Compound 1-124

Compound 1-124 was obtained in the same manner as used for Synthesis Example 1-53, except that Intermediate 124-E was used instead of Intermediate 53-E. (yield: 41%)

1-G. Synthesis of Compound 1-148

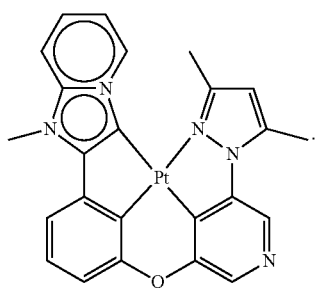

1-148

Compound 1-148 was obtained in substantially the same manner as used for Synthesis Example 1-124, except that 5-(3,5-dimethyl)-1H-pyrazol-1-yl)pyridin-3-ol was used instead of Intermediate 53-B.

2. Manufacture and Evaluation of Organic Electroluminescence Devices Including Organometallic Compounds

2-1. Example of Organic Electroluminescence Devices Including Organometallic Compounds Example Compounds 9, 16, 46, 71, 87, 96, 98, 113, 1-1, 1-53, 1-87, 1-110, 1-124, 1-148, and Comparative Compounds C1 to C5 were used as an emission layer EML dopant material, respectively, to manufacture the organic electroluminescence devices of Examples 1 to 14 and Comparative Examples 1 to 5. Comparative Compound C1 is Ir(PPy)$_3$, which is a green phosphorescent dopant, Comparative Compound C2 is a green phosphorescent dopant that does not include a carbene group, and Comparative Compounds C3 to C5 are green phosphorescent dopants that do not include a mesoionic carbene group.

Example Compounds

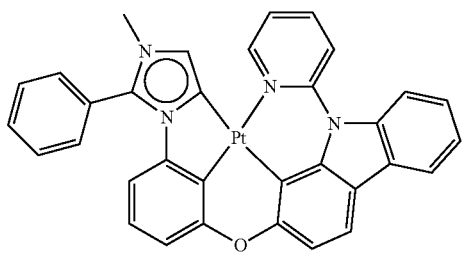

9

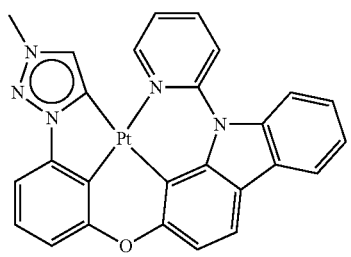

16

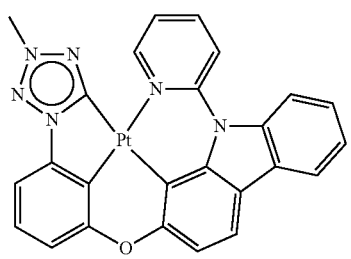

46

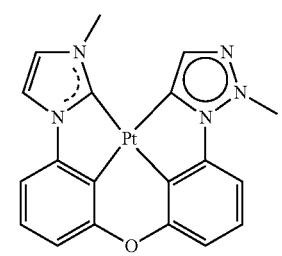

71

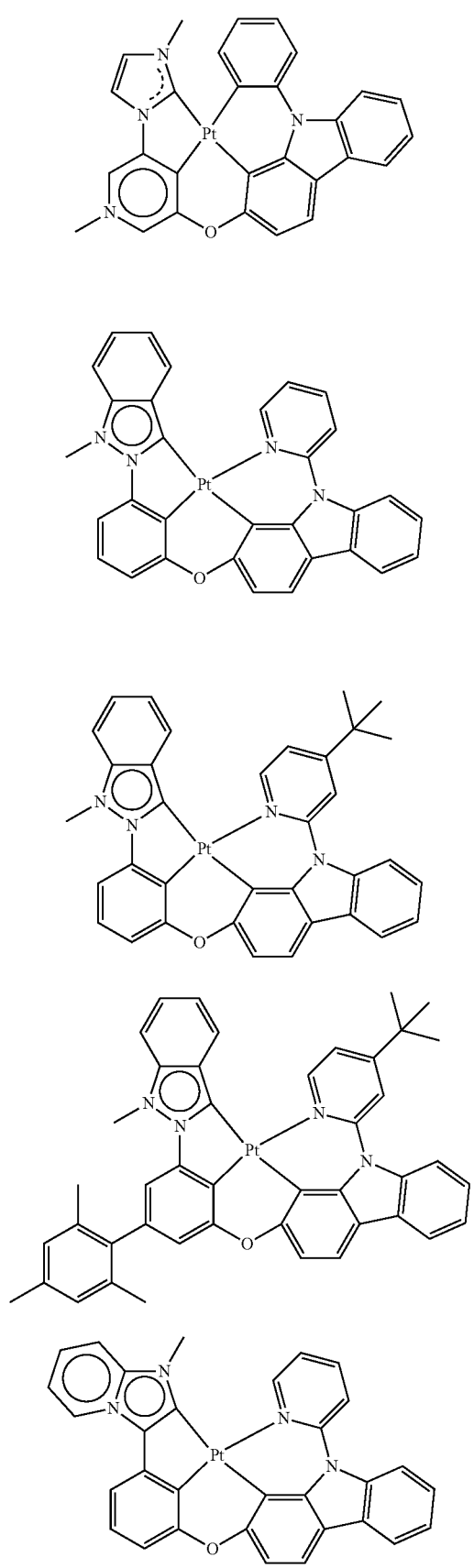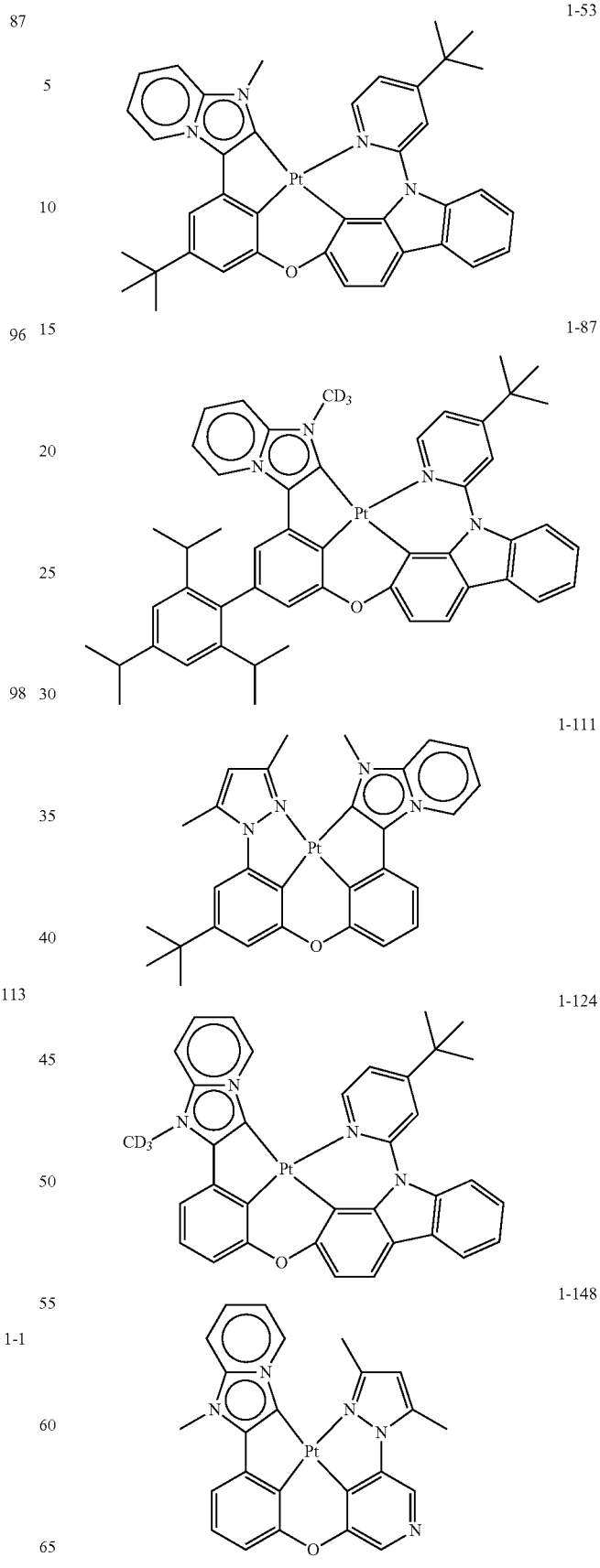

Comparative Example Compounds

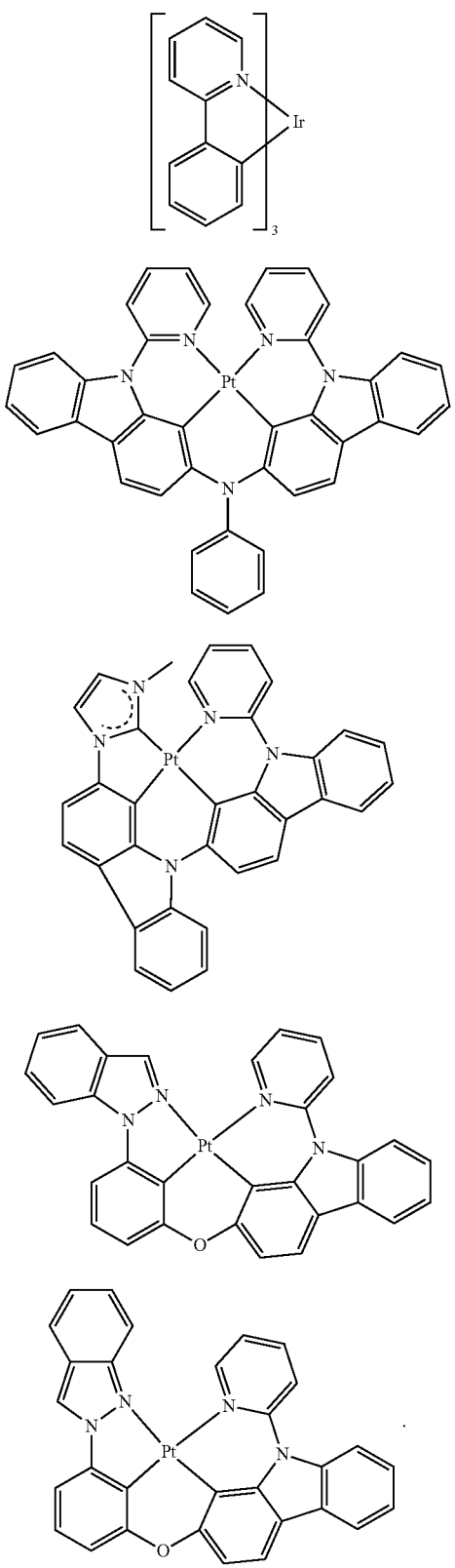

Manufacture of Organic Electroluminescence Devices

To manufacture the organic electroluminescence devices of Examples 1 to 14 and Comparative Examples 1 to 5, ITO (Corning) glass substrate was cut into about 50 mm×50 mm×0.7 mm in size, subjected to ultrasonic cleaning using isopropyl alcohol and distilled water for 5 minutes each and ultraviolet irradiation for about 30 minutes, and then exposed to ozone for cleaning to form a first electrode EL1 having a thickness of about 1200 Å. A hole injection layer HIL having a thickness of about 600 Å was formed of 2-TNATA, and a hole transport layer HTL having a thickness of about 300 Å was formed of NPB. Thereafter, a 300 Å thick emission layer EML having 10% doped Example Compounds or Comparative Compounds was formed of mCBP, a 50 Å thick hole blocking layer HBL was formed of diphenyl [4-(triphenylsilyl) phenyl] phosphine oxide (TSPO1), and a 300 Å thick electron transport layer ETL was formed of $Alq_3$. Then, an electron injection layer EIL having a thickness of 10 Å was formed of LiF and a second electrode EL2 having a thickness of 3000 Å was formed of Al. Each layer was formed by vacuum evaporation.

Characteristic Evaluation of Organic Electroluminescence Devices

The characteristic evaluation of the manufactured organic electroluminescence devices was performed using a luminance alignment measuring apparatus. The driving voltage, luminance, efficiency, emission wavelength, and lifetime ($T_{80}$) were measured for each of the organic electroluminescence devices according to the Examples and Comparative Examples. Table 2 shows the driving voltage (V), current efficiency (cd/A) and luminance (cd/m²) at a current density of 50 mA/cm² for the manufactured organic electroluminescence devices. In addition, device life (Tao), which is the time taken for the luminance to decrease to 80% level at the luminance 1000 nit, is shown. The device life ($T_{80}$) was measured by continuous drive at a current density of 40 mA/cm². In addition, the luminance spectrum of Examples and Comparative Examples was measured using a spectroradiometer. The emission peak, which is the maximum emission wavelength, was measured from the measured luminance spectrum.

TABLE 2

| Device | Driving voltage (V) | Luminance (cd/m2) | Current efficiency, (cd/A) | Emission wavelength (nm) | Lifetime ($T_{80}$) |
|---|---|---|---|---|---|
| Example 1 | 5.14 | 4225 | 8.26 | 545 | 411 |
| Example 2 | 5.25 | 4134 | 7.95 | 534 | 385 |
| Example 3 | 5.34 | 4012 | 7.85 | 525 | 344 |
| Example 4 | 5.45 | 4122 | 8.25 | 514 | 355 |
| Example 5 | 6.01 | 4001 | 7.77 | 555 | 345 |
| Example 6 | 5.35 | 4025 | 8.05 | 533 | 325 |
| Example 7 | 5.19 | 4065 | 8.13 | 525 | 344 |
| Example 8 | 5.15 | 4085 | 8.17 | 526 | 340 |
| Example 9 | 5.13 | 4075 | 8.15 | 531 | 392 |
| Example 10 | 5.18 | 4530 | 8.85 | 529 | 462 |
| Example 11 | 5.12 | 4710 | 8.96 | 528 | 458 |
| Example 12 | 5.05 | 4050 | 7.98 | 549 | 387 |
| Example 13 | 5.30 | 4415 | 8.35 | 538 | 430 |
| Example 14 | 5.01 | 4650 | 8.54 | 532 | 371 |
| Comparative Example 1 | 6.74 | 3870 | 7.74 | 516 | 278 |
| Comparative Example 2 | 6.68 | 3790 | 7.58 | 515 | 194 |
| Comparative Example 3 | 6.72 | 3535 | 7.07 | 537 | 307 |
| Comparative Example 4 | 6.20 | 3985 | 8.02 | 553 | 306 |
| Comparative Example 5 | 6.33 | 3840 | 7.89 | 551 | 320 |

Referring to the results of Table 2, it is seen that when an organometallic compound according to an embodiment of the present disclosure was applied to an organic electroluminescent device 10 as an emission layer EML material to emit green light, high efficiency, high luminance, low driving voltage, and long lifetime of the device were achieved.

Referring to the results of Examples 1 to 14 and Comparative Examples 1 to 5, the Examples including an organometallic compound of an embodiment having a mesoionic carbene in an emission layer achieved high efficiency, high luminance, low driving voltage, and long lifetime when compared to the Comparative Examples including an organometallic compound without a mesoionic carbene.

Referring to Comparative Example 1, it is seen that the Examples have superior effects compared to the device using Ir(PPy)$_3$, which is a green phosphorescent dopant material.

Referring to Comparative Example 2, it is seen that the Examples have superior effects compared to the device of Comparative Example 2, which used an organometallic compound including a metal atom bound to four non-mesoionic carbene ligands as an emission layer material.

Referring to Comparative Examples 3 to 5, it is seen that the Examples have superior effects compared to the device of Comparative Example 3, which used an organometallic compound including a metal atom bound to four ligands, one of which is a normal carbene but not a mesoionic carbene.

Figure 4:
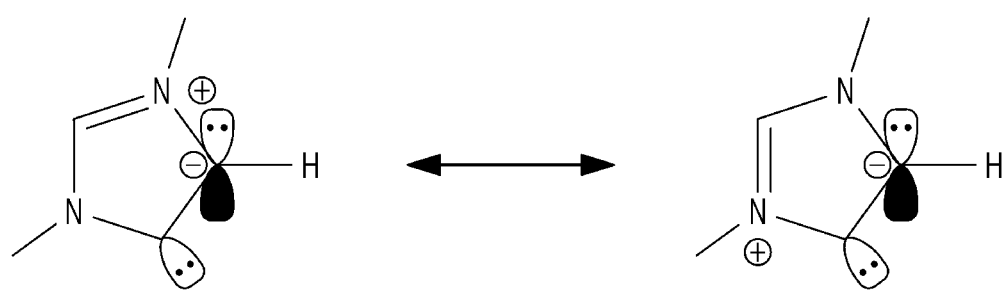
FIG. 4 is a resonance structure diagram showing an imidazolin-4-ylidene as an example of mesoionic carbene

FIG. 4 is a resonance structure diagram showing an imidazolin-4-ylidene as an example of mesoionic carbene. The mesoionic carbene has localized electrons in the molecule when compared to normal carbene (e.g., the electron lone pair of the mesoionic carbene is less delocalized than in a normal carbene). Accordingly, the mesoionic carbene is relatively unstable compared to a normal carbene, in which the electrons are more delocalized and therefore provide a more stable structure.

Therefore, the carbene group of the mesoionic carbene has a stronger a (sigma) donor characteristic than the carbene group of the normal carbene, such that the unshared electron pair of the carbene group binds more strongly to a metal atom. Accordingly, an organometallic compound of an embodiment may have a stronger bond (e.g., metal-ligand bond) than Comparative Compounds C3 to C5 including normal carbene, and thus is resistant to moisture and air and is not easily oxidized. Therefore, the organometallic compound of an embodiment may be used as an emission layer material of an organic electroluminescence device having a long lifespan. In addition, d-d*transitions of the metal atom of the organometallic compound may be reduced due to the strong bonding properties, and the organic electroluminescence device including the organometallic compound of an embodiment may achieve low driving voltage, high luminance, and/or high efficiency.

An organometallic compound of an embodiment includes a metal atom, and four ligands binding to the metal atom, where at least one of the four ligands includes a mesoionic carbene group. Thus, the organometallic compound of an embodiment has strong bonding properties between the mesoionic carbene ligand and the metal atom. Therefore, the organometallic compound of an embodiment may be applied to an emission layer of an organic electroluminescence device to achieve high efficiency, low driving voltage, high luminance, and/or long lifespan.

An organic electroluminescence device according to an embodiment of the present disclosure may achieve high efficiency, low driving voltage, high luminance, and/or long life.

An organometallic compound according to an embodiment of the present disclosure may be used in an organic electroluminescence device to achieve high efficiency, low driving voltage, high luminance, and/or long life.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although example embodiments of the present disclosure have been described, it is understood that the present disclosure should not be limited to these example embodiments, but various changes and modifications can be made by one ordinary skilled in the art within the spirit and scope of the present disclosure, as set forth in the following claims and their equivalents.

What is claimed is:

1. An organic electroluminescence device, comprising:
a first electrode;
a hole transport region on the first electrode;
an emission layer on the hole transport region;
an electron transport region on the emission layer; and
a second electrode on the electron transport region,
wherein the emission layer comprises an organometallic compound represented by Formula 2:

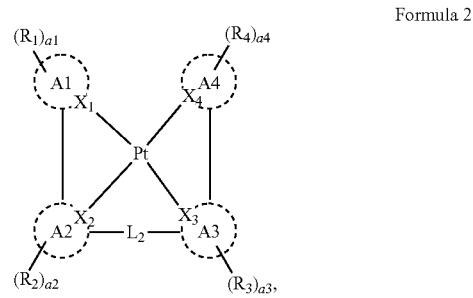

Formula 2 wherein in Formula 2,
$X_1$ to $X_4$ are each independently a carbon atom or a nitrogen atom,
$R_1$ to $R_4$ are each independently a hydrogen atom, a deuterium atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring,
a1 to a4 are each independently an integer of 0 to 4,
L$_2$ is a direct linkage,

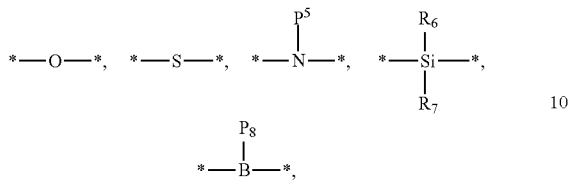

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, R$_5$ to R$_8$ are each independently a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring forming carbon atoms, and/or bonded to an adjacent group to form a ring, at least one selected from among A1 and A4 is a mesoionic carbene group represented by any one of 1-1 to 1-6, and A2, A3, and any remaining ligand selected from among A1 and A4 are each independently represented by any one of 2-1 to 2-4:

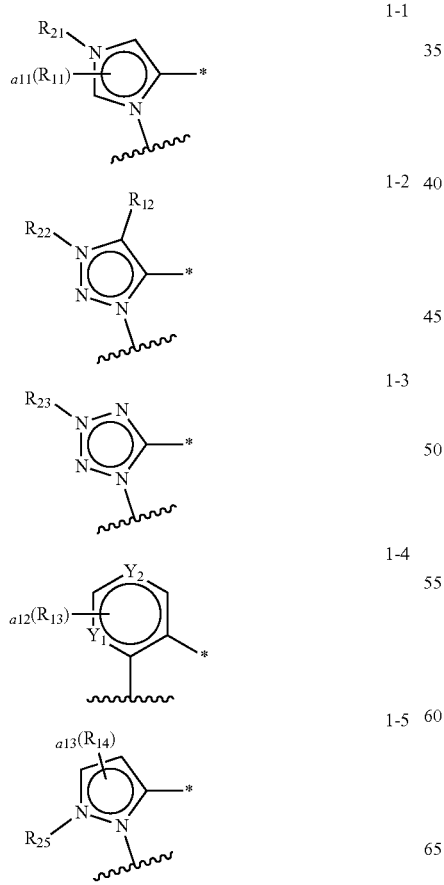

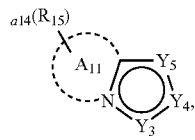

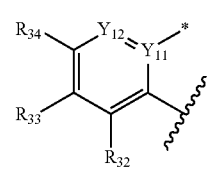

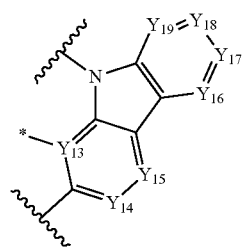

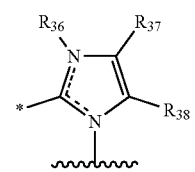

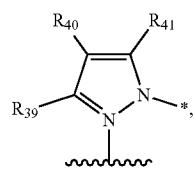

wherein in 1-1 to 1-6,
any one selected from among Y$_1$ and Y$_2$ is CH and an other one selected from among Y$_1$ and Y$_2$ is NR$_{24}$,

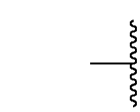

is a position of binding to a neighboring ligand or a position of binding to L$_2$, -* is a position of binding to Pt, A11 is a substituted or unsubstituted aryl group having 6 to 30 ring-forming carbon atoms or a substituted or unsubstituted heteroaryl group having 2 to 30 ring-forming carbon atoms, any one selected from among Y$_3$ and Y$_4$ is

and an other one selected from among Y$_3$ and Y$_4$ is C-*

$Y_5$ is $NR_{26}$ or

$R_{11}$ to $R_{15}$ are each independently a hydrogen atom, a deuterium atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, $R_{21}$ to $R_{26}$ are each independently a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, a11 to a13 are each independently an integer of 0 to 2, and a14 is an integer of 0 to 4:

wherein in 2-1 to 2-4, $Y_{11}$ is a carbon atom or a nitrogen atom, $Y_{12}$ is $CR_{31}$ or

$Y_{13}$ to $Y_{19}$ are each independently $CR_{35}$ or a nitrogen atom, and $R_{31}$ to $R_{41}$ are each independently a hydrogen atom, a deuterium atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, and wherein:

when A1 is the mesoionic carbene group represented by 1-1, A2 is a group represented by 2-1 in which $Y_{11}$ is the carbon atom and $Y_{12}$ is

A3 is represented by 2-1 in which $Y_{11}$ is the carbon atom and $Y_{12}$ is

or is represented by 2-2 in which $Y_{13}$ to $Y_{19}$ are each independently $CR_{35}$, A4 is represented by 2-1 in which $Y_{11}$ is the nitrogen atom and $Y_{12}$ is $CR_{31}$ or is represented by 2-4, then a11 of 1-1 is 0, and when A4 is the mesoionic carbene group represented by 1-1, A3 is a group represented by 2-1 in which $Y_{11}$ is the carbon atom and $Y_{12}$ is

A2 is represented by 2-1 in which $Y_{11}$ is the carbon atom and $Y_{12}$ is

or is represented by 2-2 in which $Y_{13}$ to $Y_{19}$ are each independently $CR_{35}$, A1 is represented by 2-1 in which $Y_{11}$ is the nitrogen atom and $Y_{12}$ is $CR_{31}$ or is represented by 2-4, then a11 of 1-1 is 0.

2. The organic electroluminescence device of claim 1, wherein:

the emission layer comprises a host and a dopant, and the dopant comprises the organometallic compound.

3. The organic electroluminescence device of claim 1, wherein the emission layer is to emit green light having a center wavelength of 500 nm to 600 nm through phosphorescence.

4. The organic electroluminescence device of claim 1, wherein 1-6 is represented by 1-6-1:

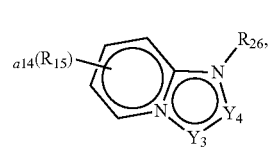

1-6-1 wherein in Formula 1-6-1, $Y_3$, $Y_4$, $R_{15}$, $R_{26}$, and a14 are each independently the same as defined in connection with 1-6.

5. The organic electroluminescence device of claim 1, wherein the organometallic compound represented by Formula 2 is represented by at least one of Formulae 3-1 to 3-7:

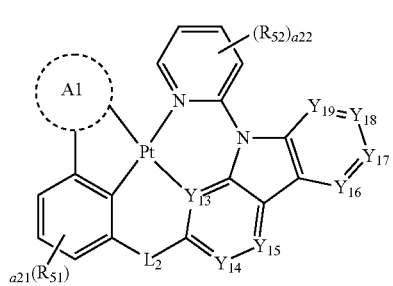

Formula 3-1

Formula 3-2
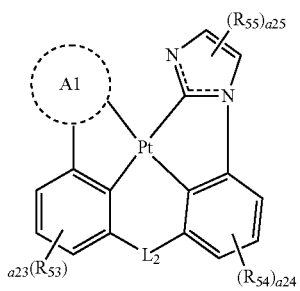

Formula 3-3
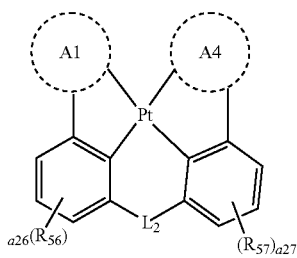

Formula 3-4
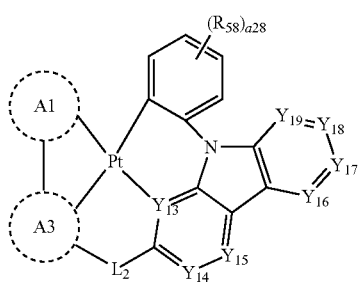

Formula 3-5
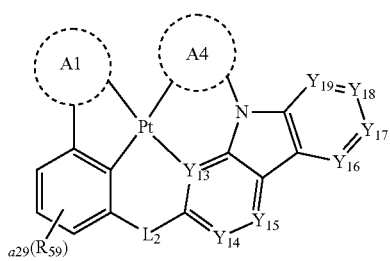

Formula 3-6
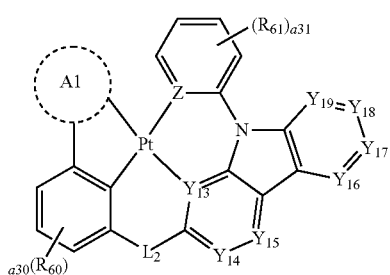

Formula 3-7
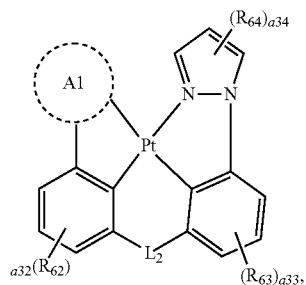

wherein in Formulae 3-1 and 3-2, A1 is represented by any one of 1-1 to 1-5,
in Formulae 3-3 and 3-5, at least one selected from among A1 and A4 is represented by any one of 1-1 to 1-5,
in Formula 3-4, A1 is represented by any one of 1-1 to 1-5,
in Formulae 3-6 and 3-7, A1 is represented by 1-6,
in Formulae 3-1 to 3-6, $R_{51}$ to $R_{64}$ are each independently a hydrogen atom, a deuterium atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring,
Z is a carbon atom or a nitrogen atom,
a21, a23, a24, a26, a27, a29, a30, a32, a33, and a34 are each independently an integer of 0 to 3,
a22, a28, and a31 are each independently an integer of 0 to 4,
a25 is an integer of 0 to 2, and
$Y_{13}$ to $Y_{19}$, and $L_2$ are each independently the same as defined in connection with 2-2, and
wherein:
in Formula 3-1, when A1 is represented by 1-1, $Y_{13}$ to $Y_{19}$ are each independently $CR_{35}$, then a11 of 1-1 is 0,
in Formula 3-3, when one selected from among A1 and A4 is represented by 1-1, an other one selected from among A1 and A4 is represented by 2-1 in which $Y_{11}$ is the nitrogen atom and $Y_{12}$ is $CR_{31}$ or is represented by 2-4, then a11 of 1-1 is 0, and
in Formula 3-5, when one selected from among A1 and A4 is represented by 1-1, an other one selected from among A1 and A4 is represented by 2-1 in which $Y_{11}$ is the nitrogen atom and $Y_{12}$ is $CR_{31}$ or is represented by 2-4, then a11 of 1-1 is 0.

6. The organic electroluminescence device of claim 1, wherein the emission layer comprises at least one of the compounds represented by Compound Group 1 and Compound Group 2:

Compound Group 1

1
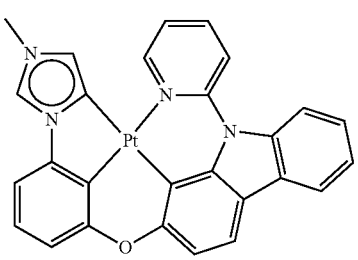

-continued
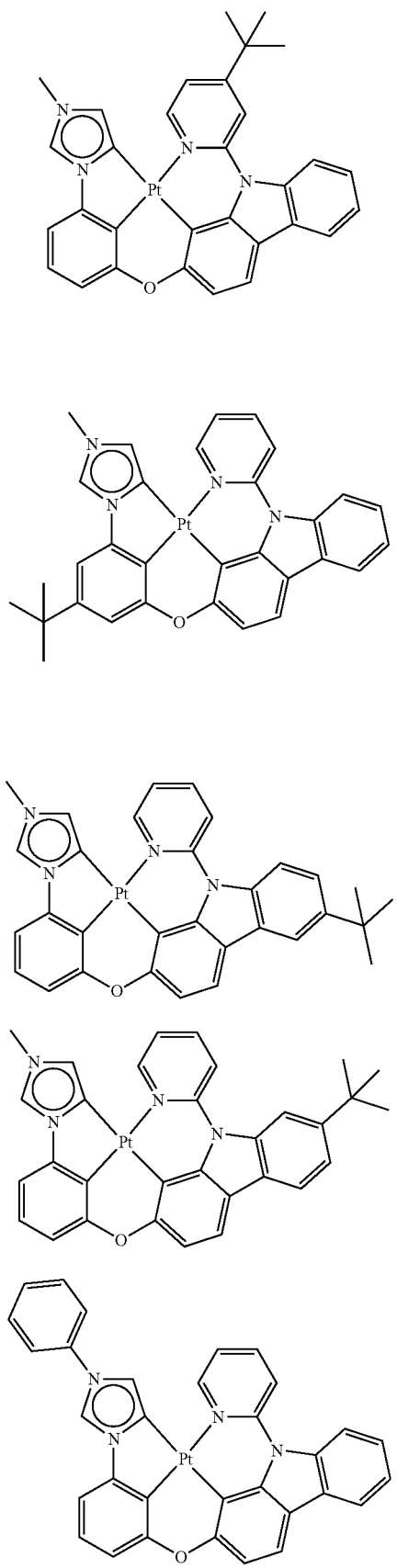
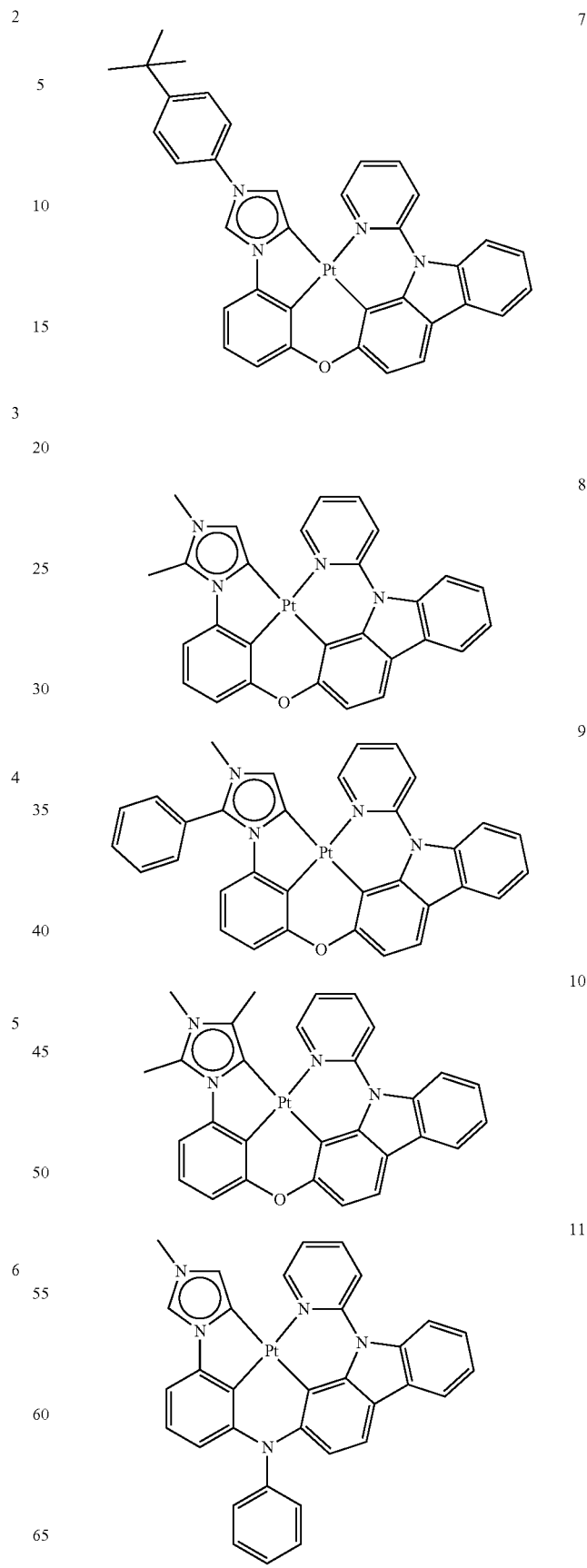

12
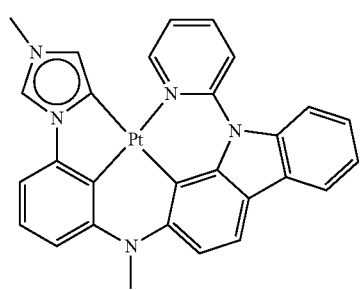
13
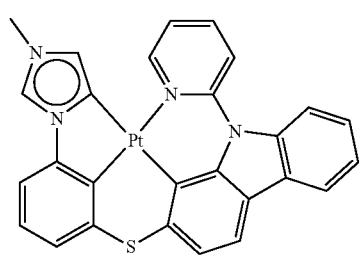
14
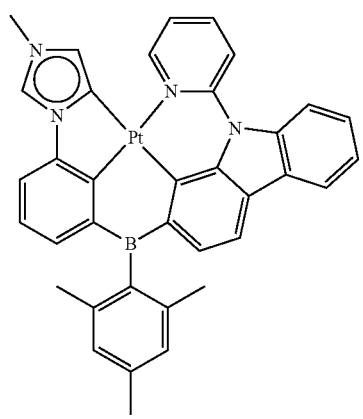
15
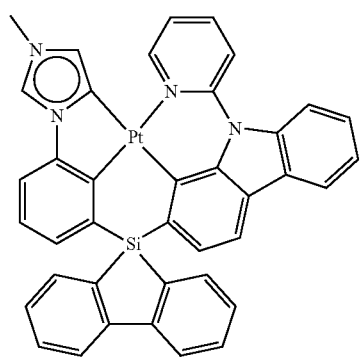
16
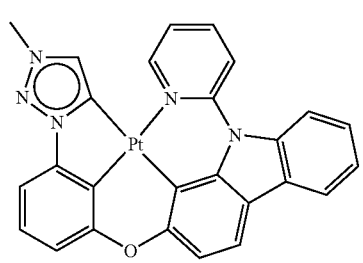
17
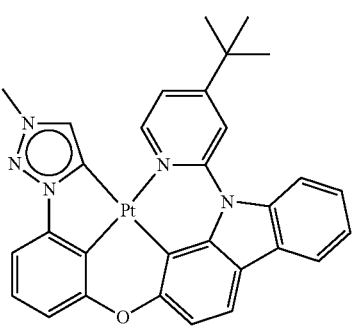
18
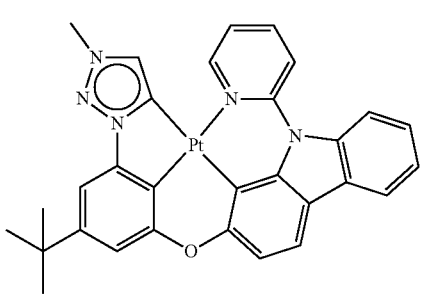
19
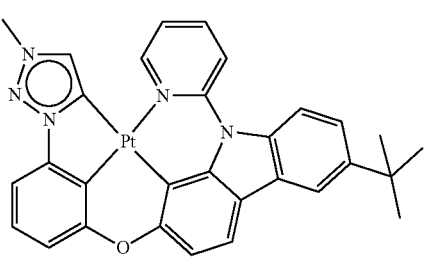
20
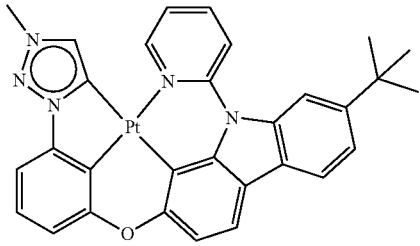
21
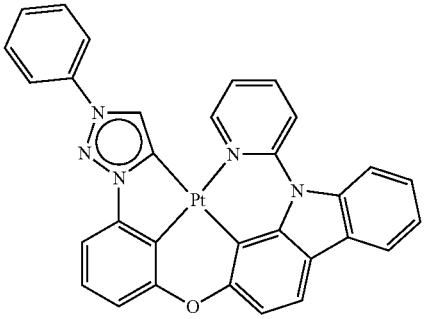

22
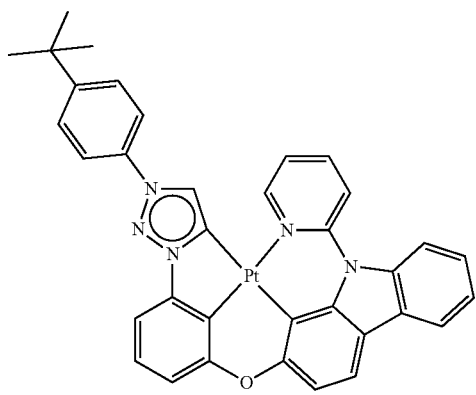
23
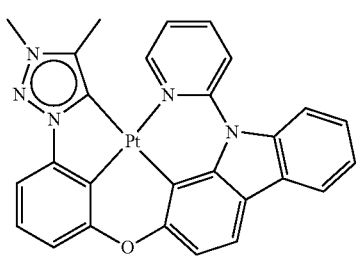
24
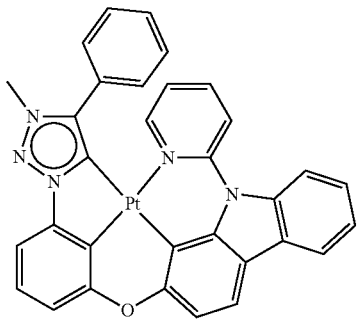
25
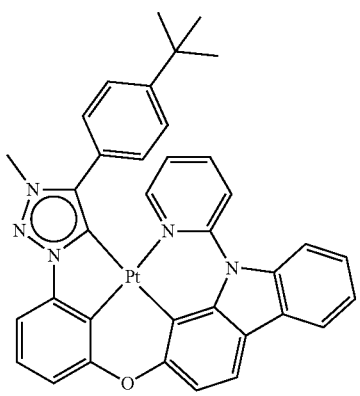
26
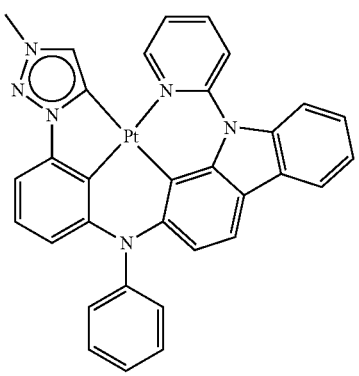
27
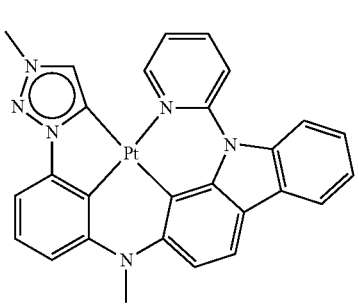
28
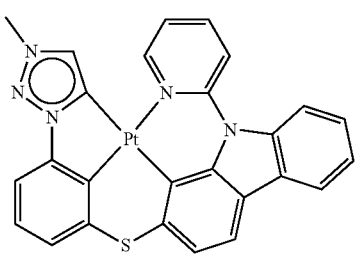
29
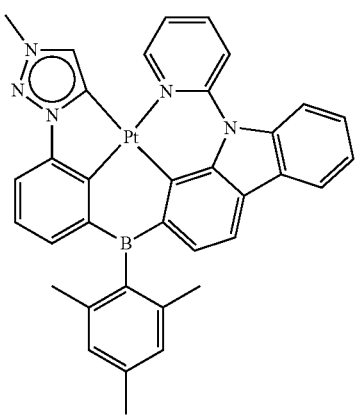

131
-continued
30
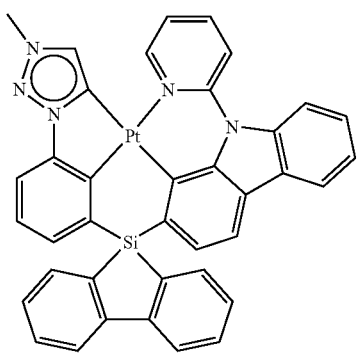
31
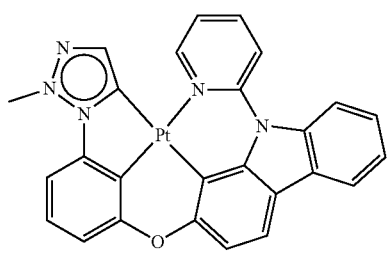
32
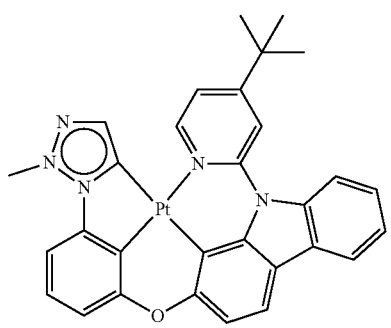
33
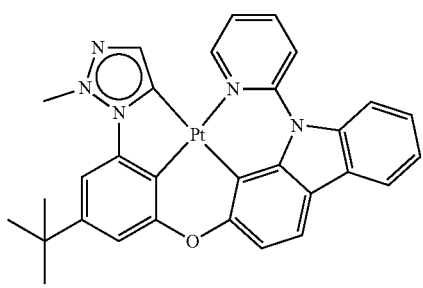
34
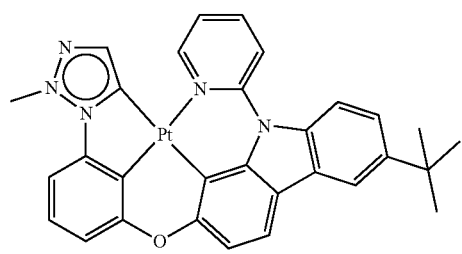
132
-continued
35
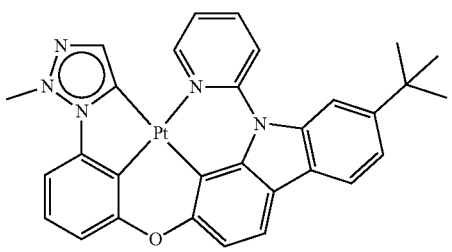
36
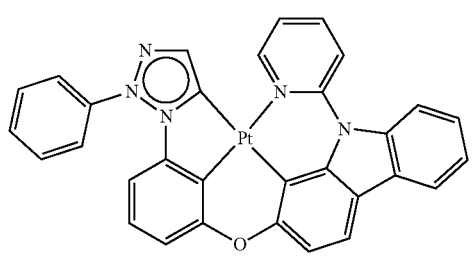
37
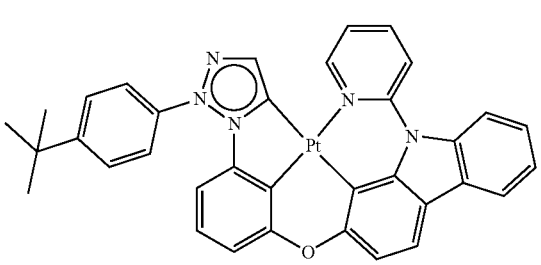
38
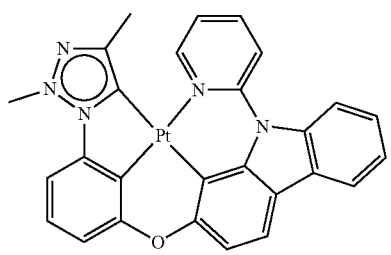
39
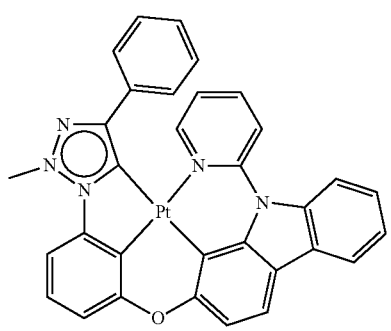

40
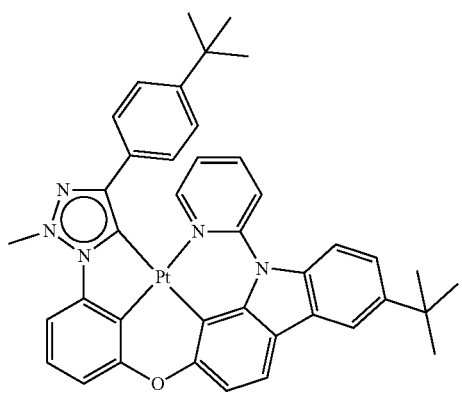
41
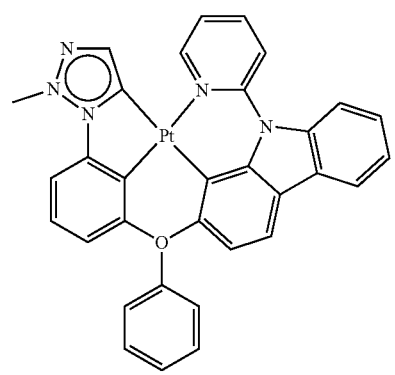
42
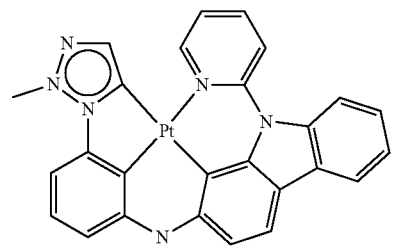
43
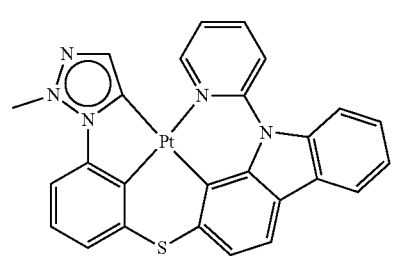
44
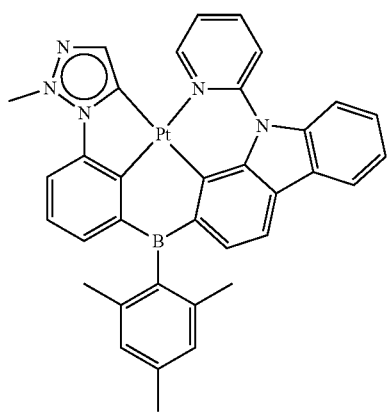
45
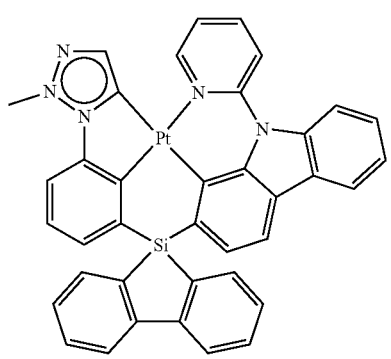
46
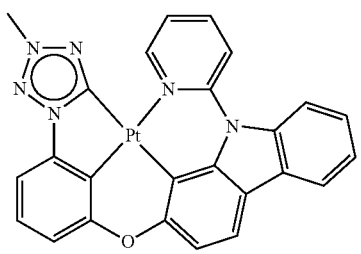
47
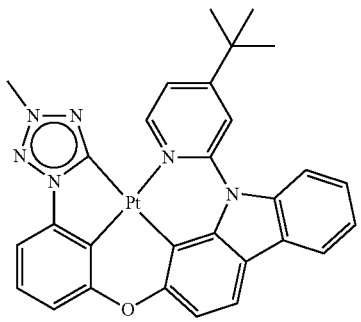
48
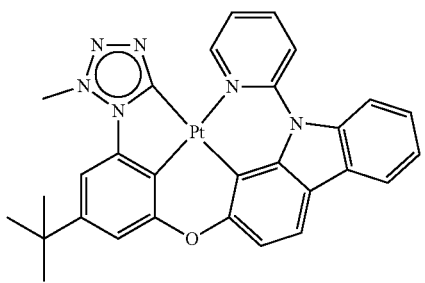

49
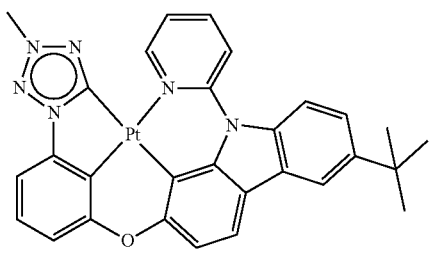
50
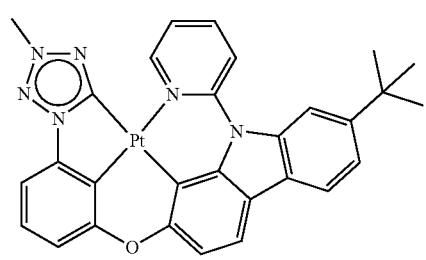
51
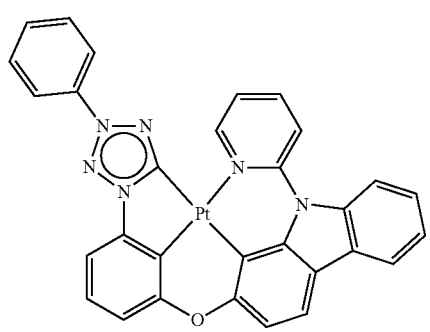
52
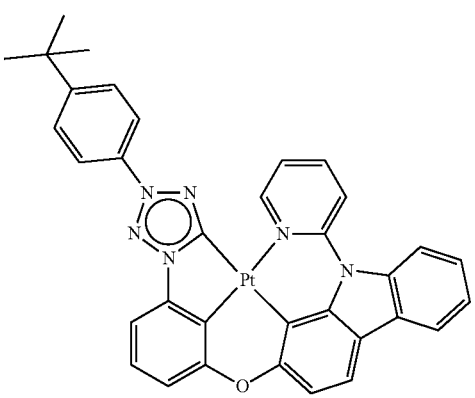
53
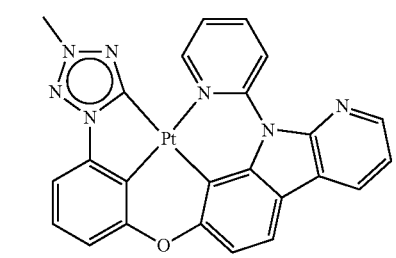
54
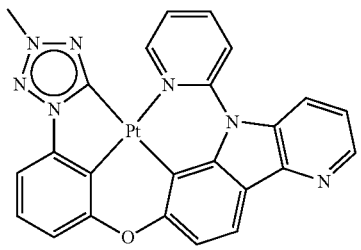
55
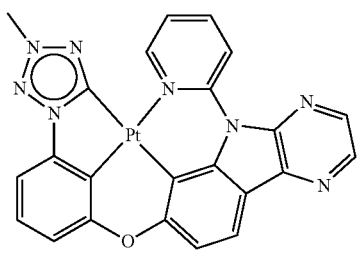
56
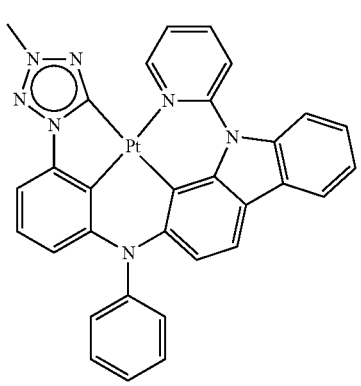
57
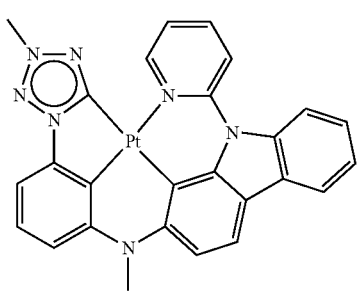
58
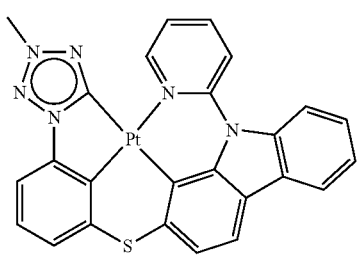

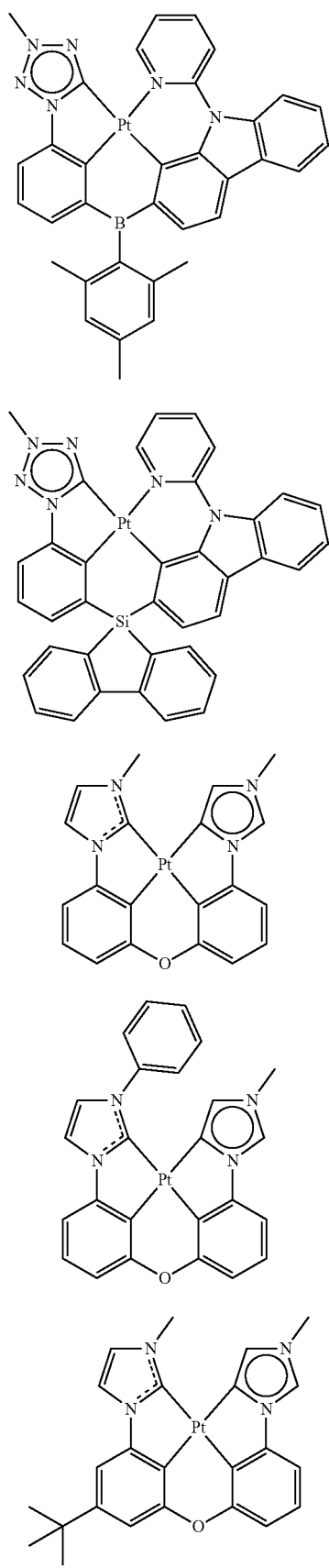
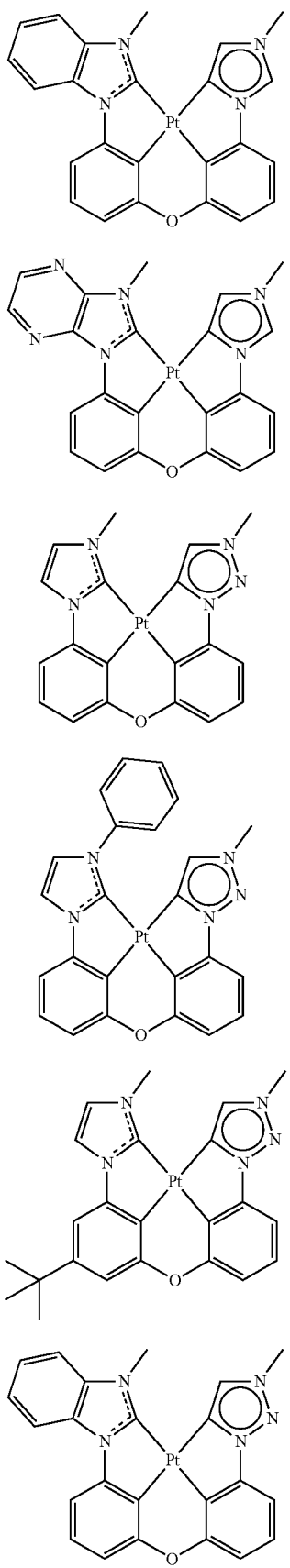

139
-continued
70 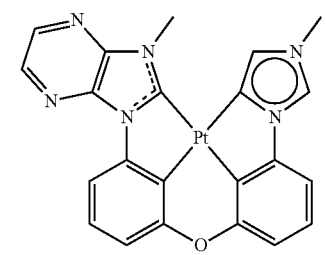
71 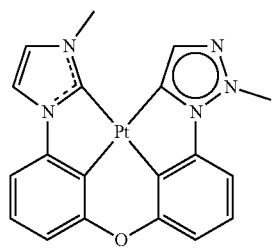
72 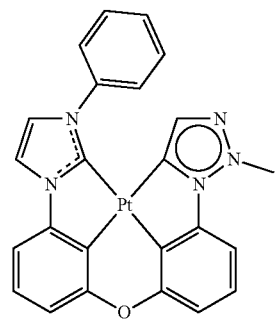
73 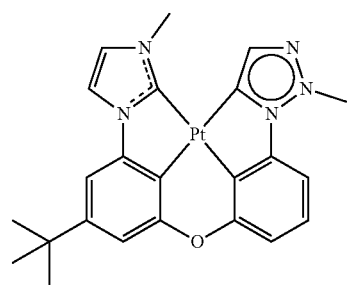
74 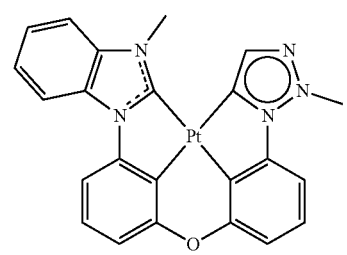
75 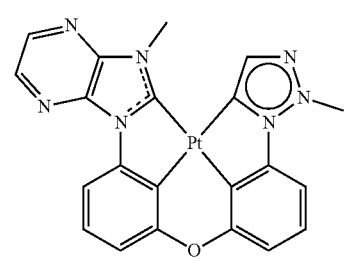
140
-continued
76 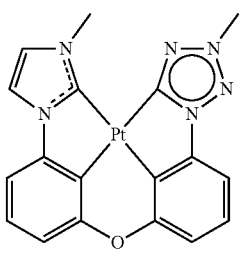
77 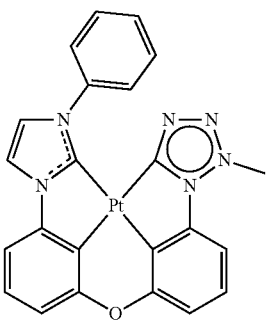
78 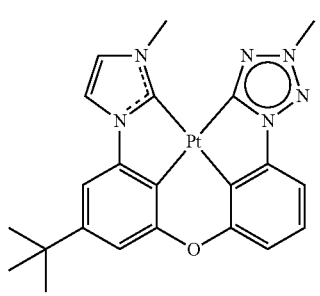
79 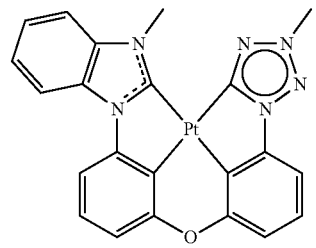
80 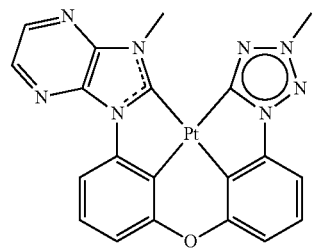
81 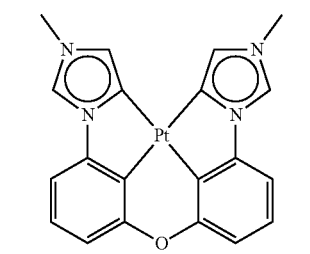

82
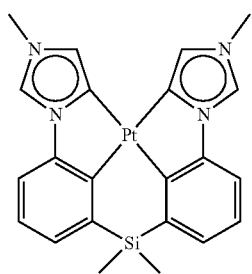
83
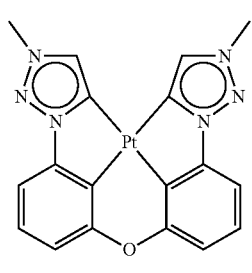
84
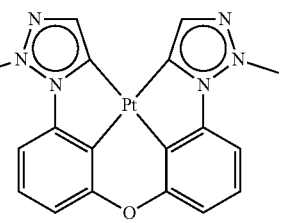
85
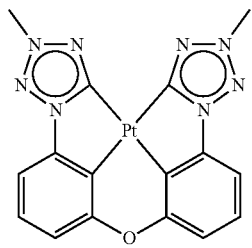
86
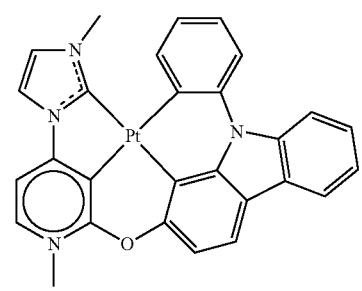
87
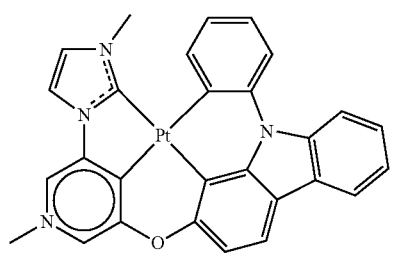
88
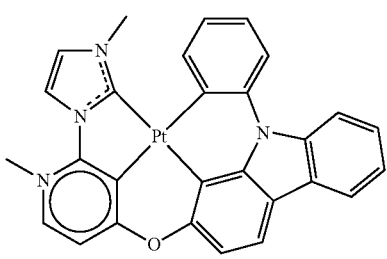
89
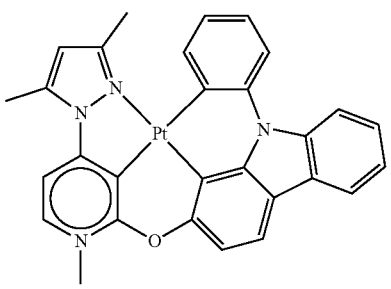
90
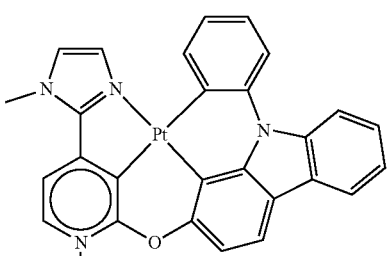
91
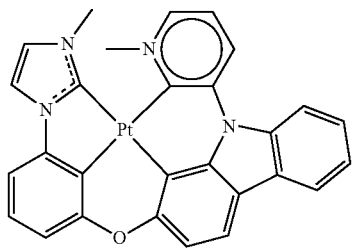
92
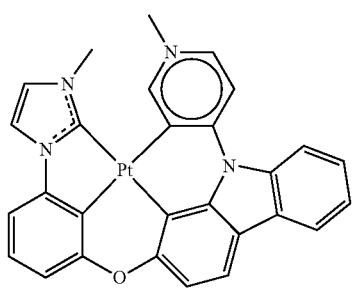

93
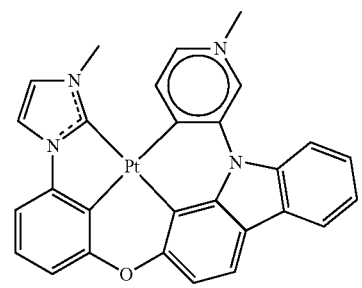
94
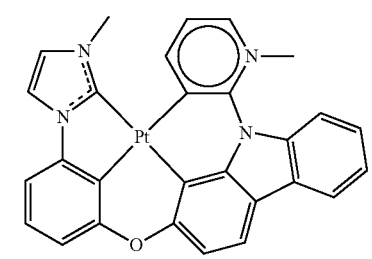
95
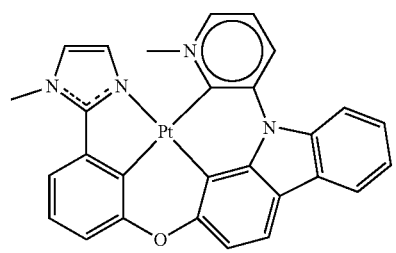
96
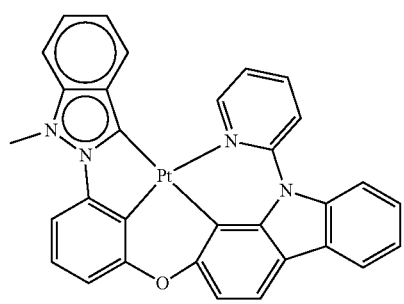
97
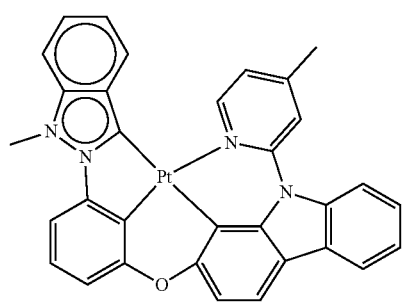
98
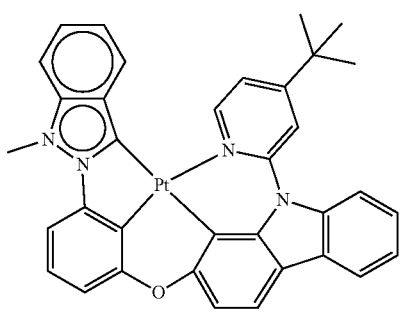
99
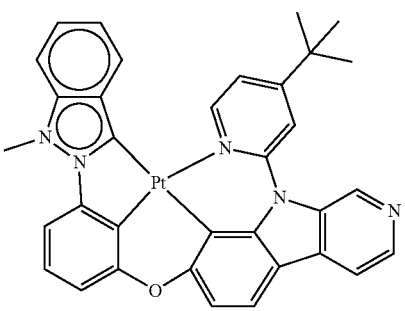
100
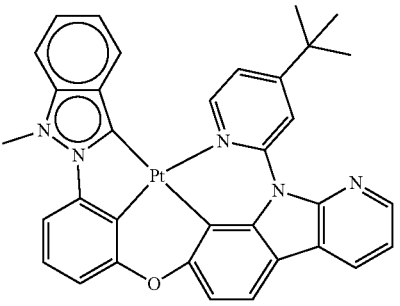
101
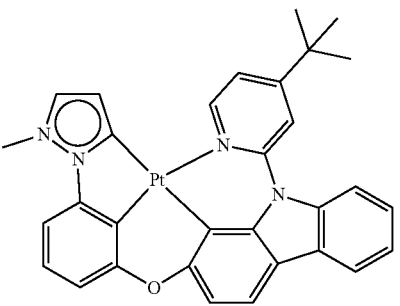
102
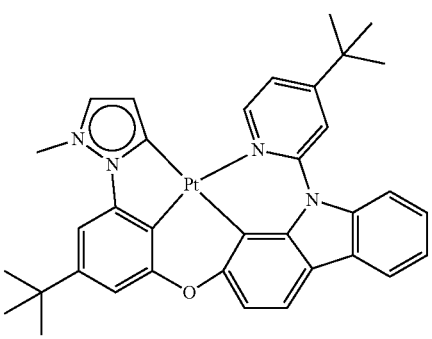

103
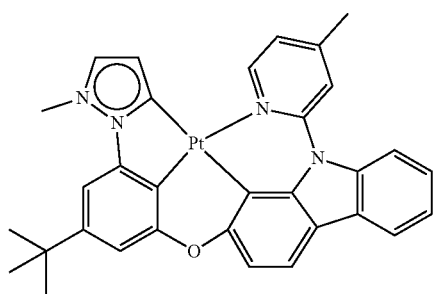
104
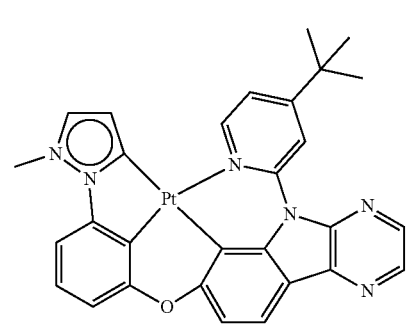
105
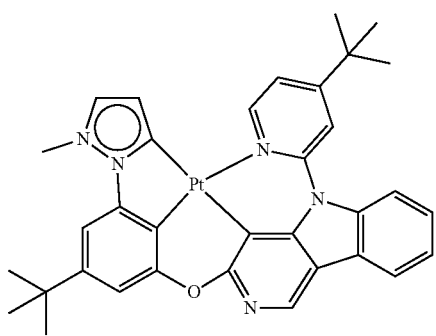
106
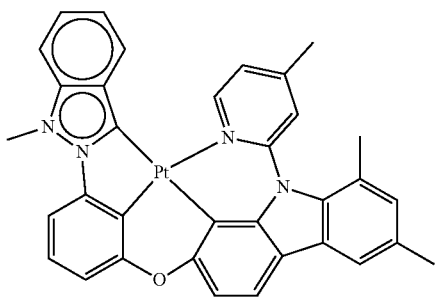
107
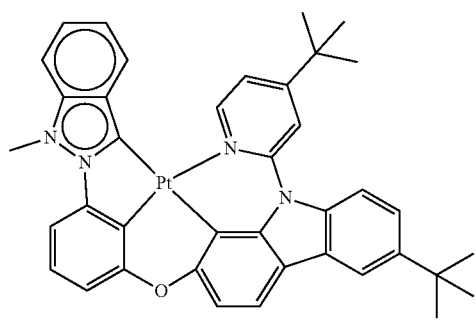
108
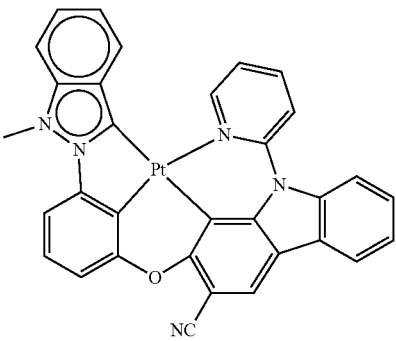
109
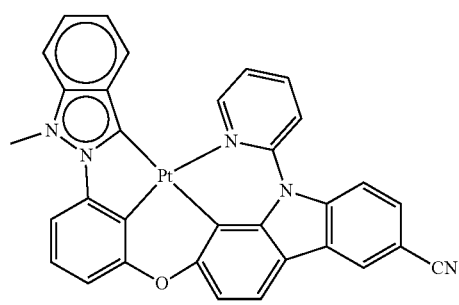
110
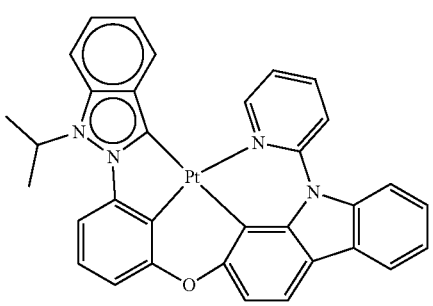
111
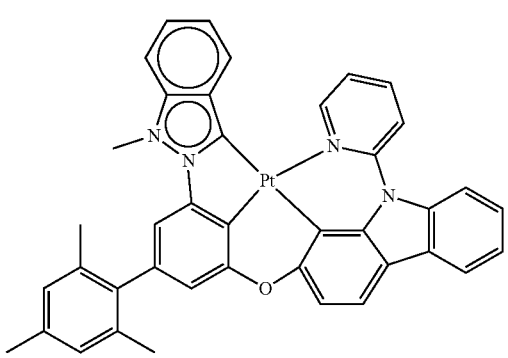
112
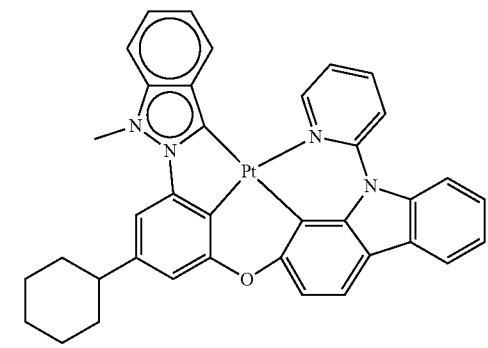

113
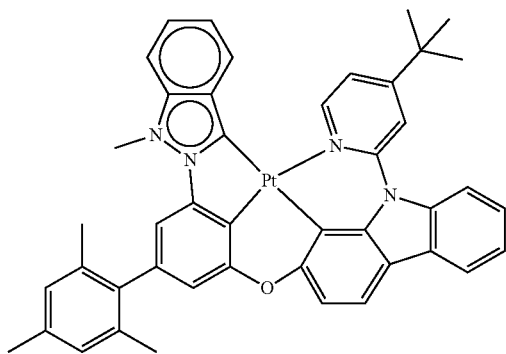
114
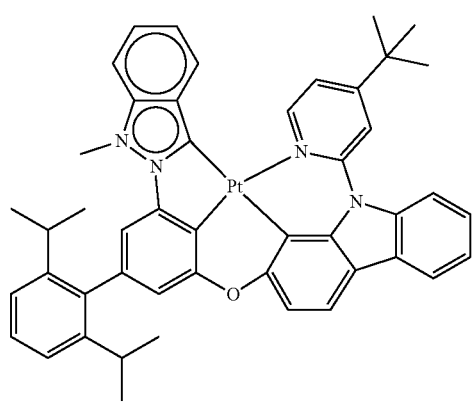
115
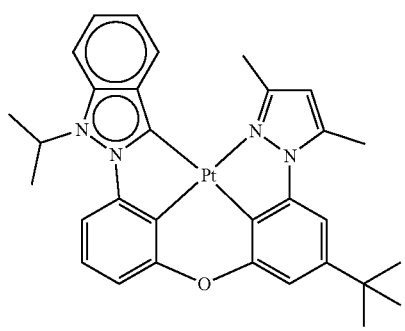
116
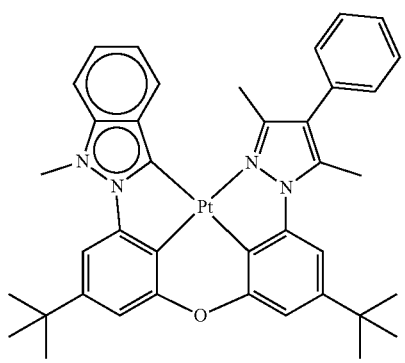
117
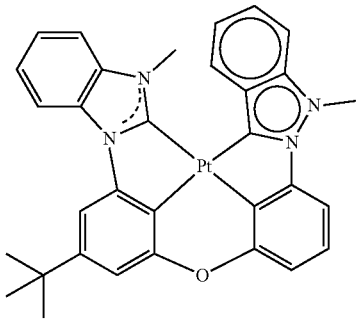
118
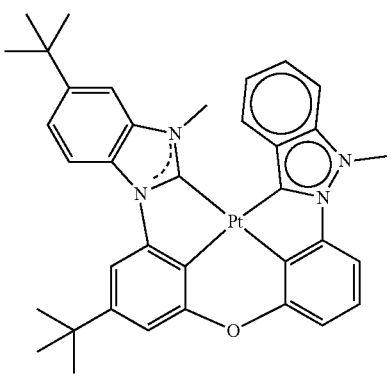
119
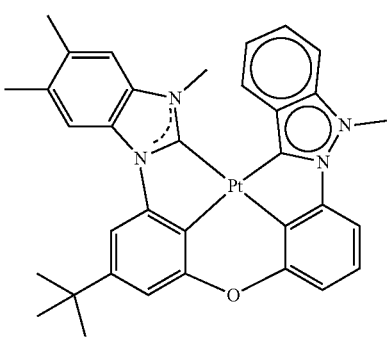
120

Compound Group 2
1-1
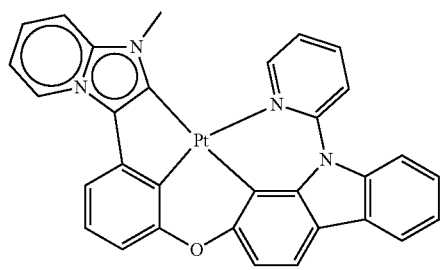
1-2
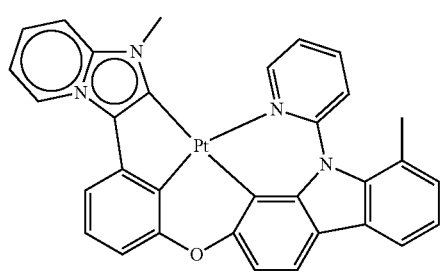
1-3
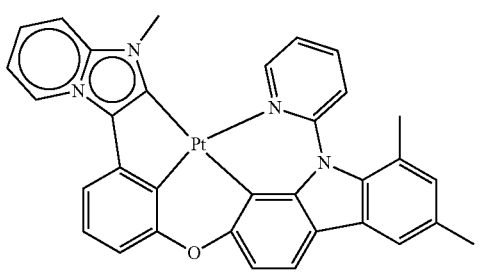
1-4
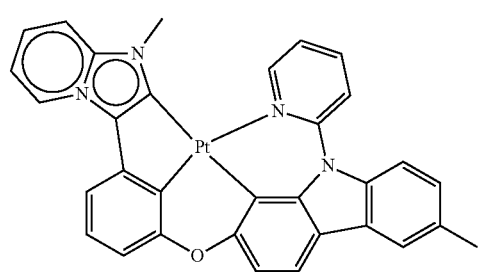
1-5
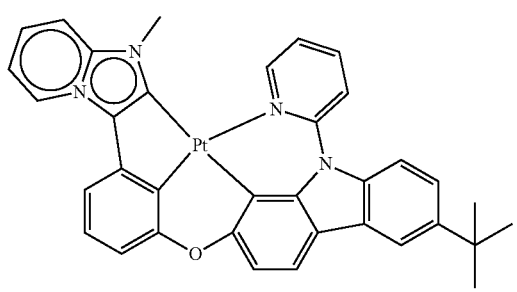
1-6
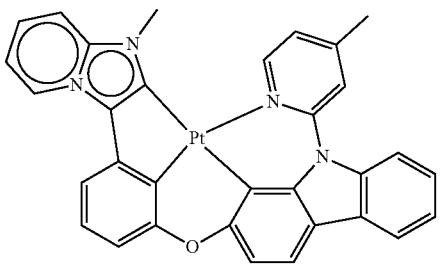
1-7
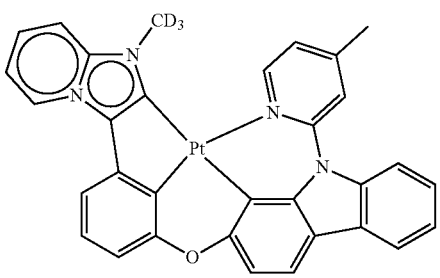
1-8
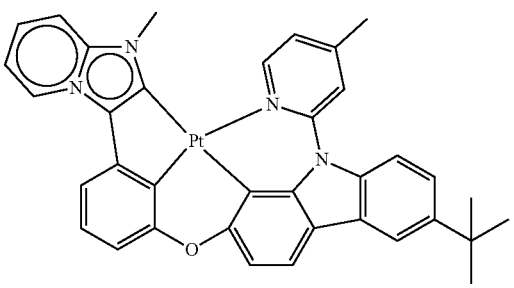
1-9
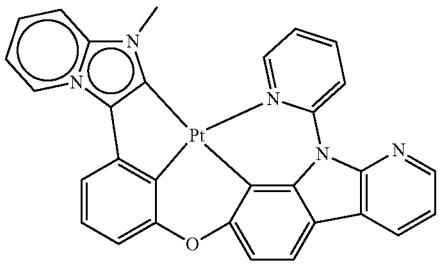
1-10
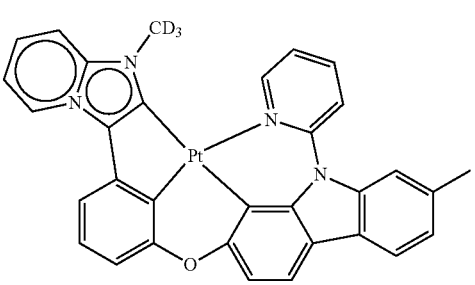

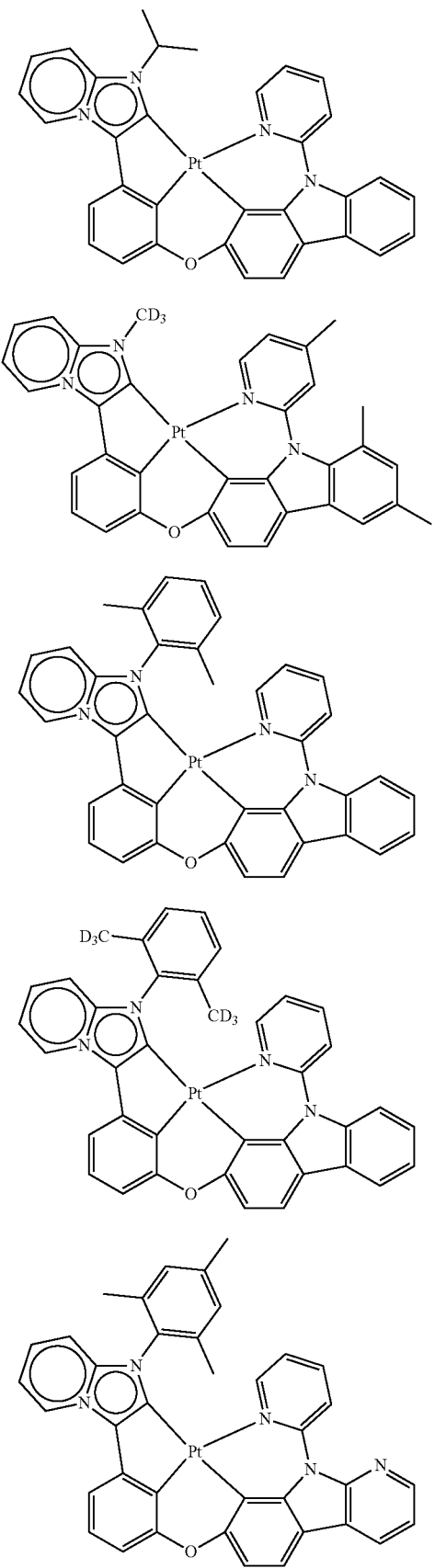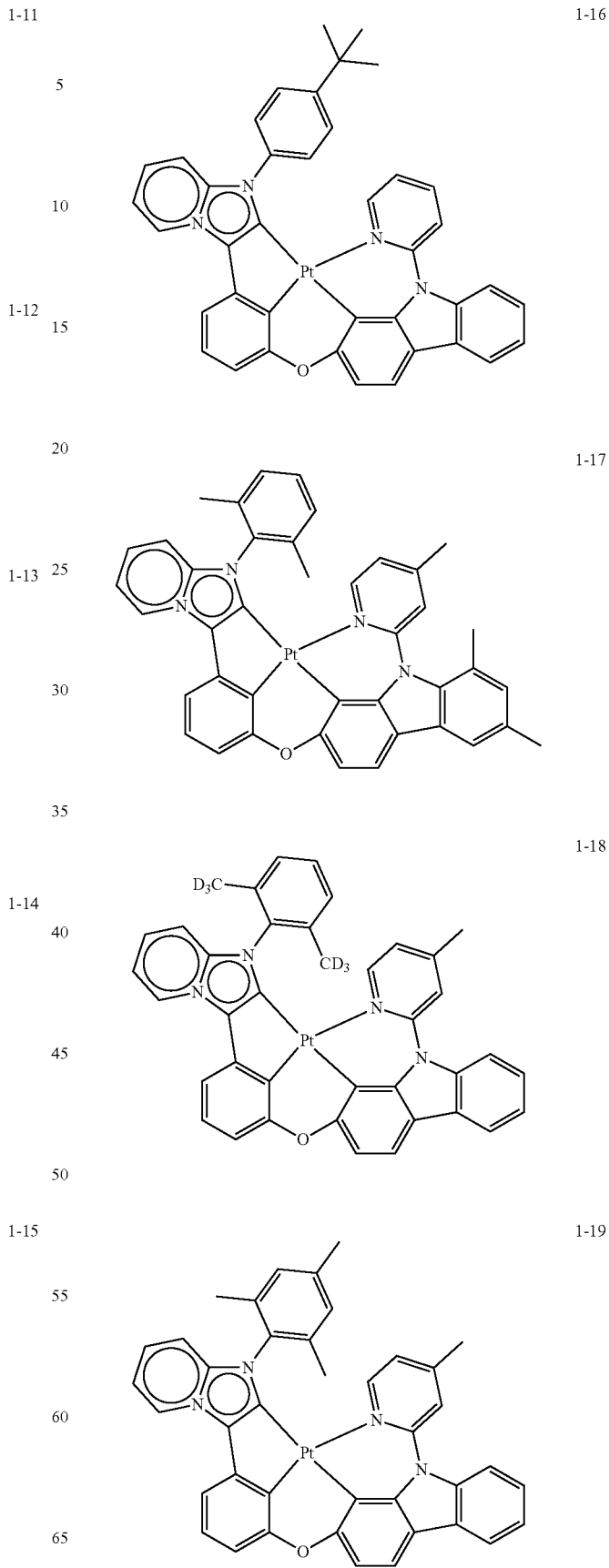

1-20
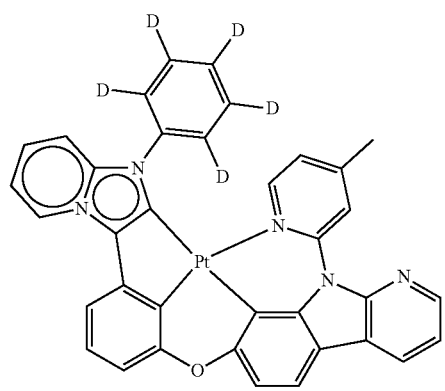
1-21
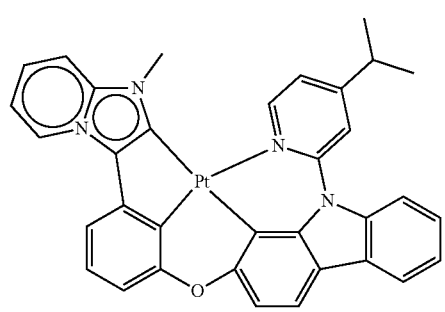
1-22
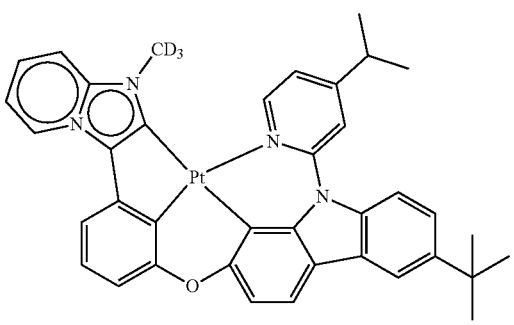
1-23
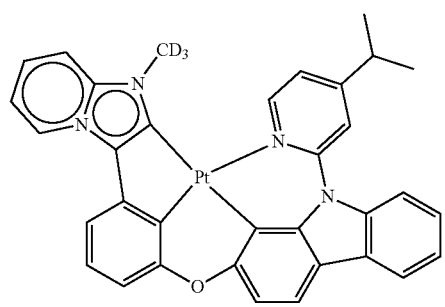
1-24
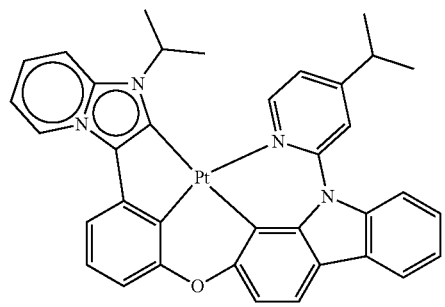
1-25
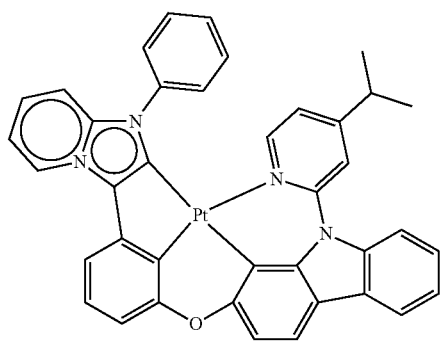
1-26
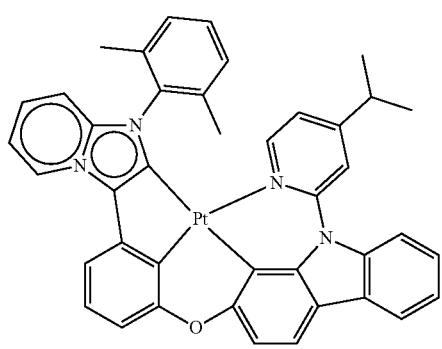
1-27
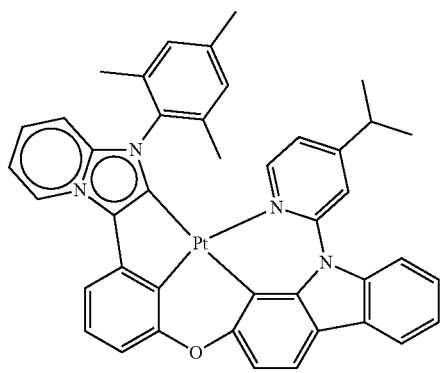
1-28
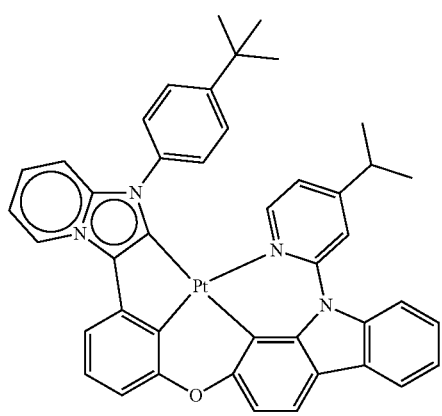

-continued
1-29
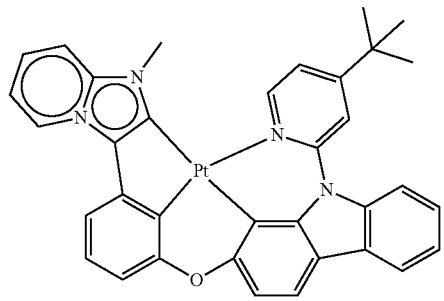
1-30
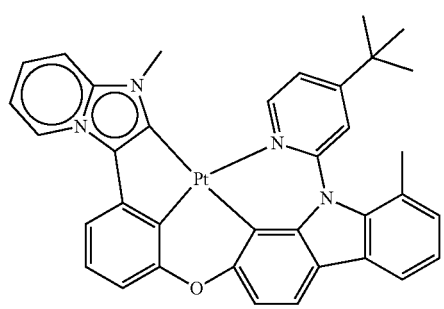
1-31
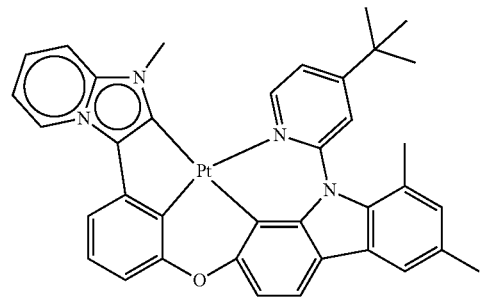
1-32
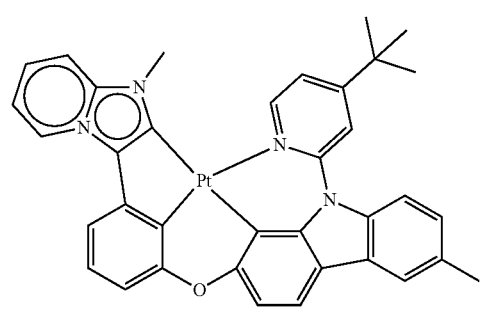
1-33
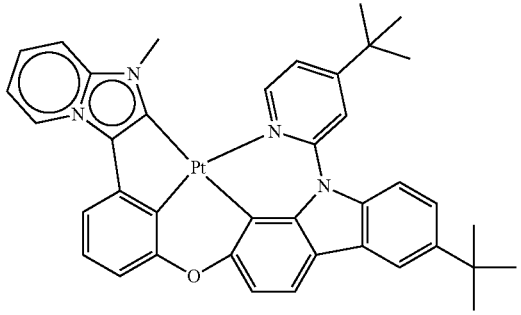
-continued
1-34
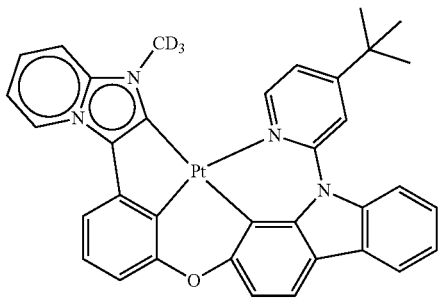
1-35
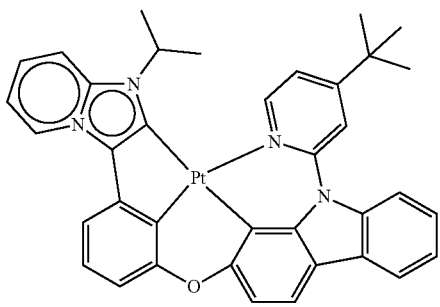
1-36
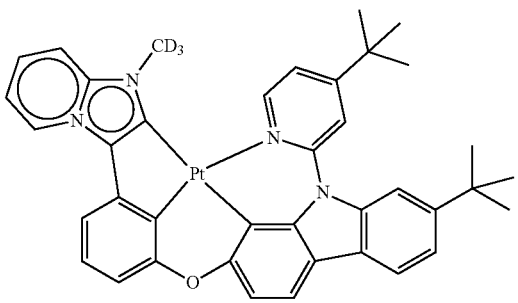
1-37
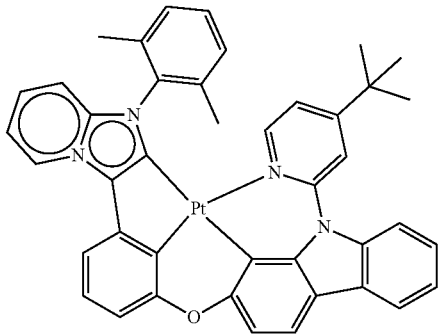
1-38
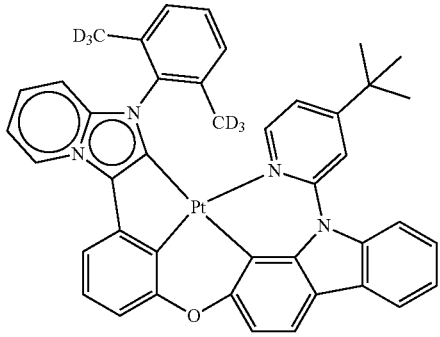

-continued
1-39
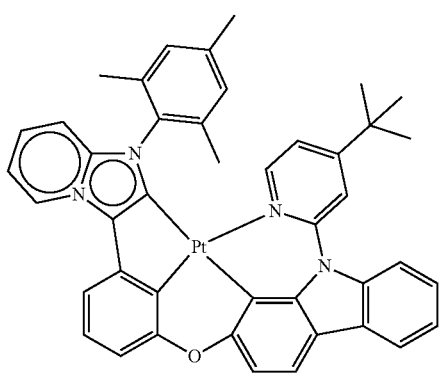
1-40
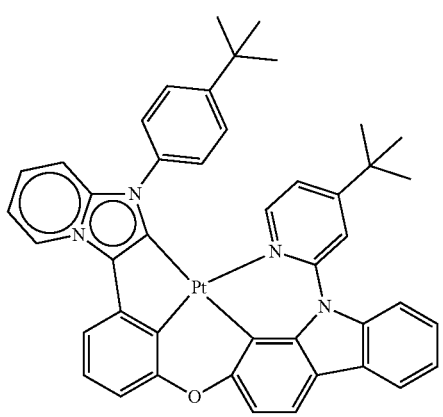
1-41
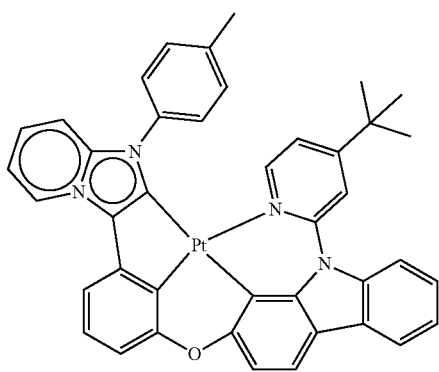
1-42
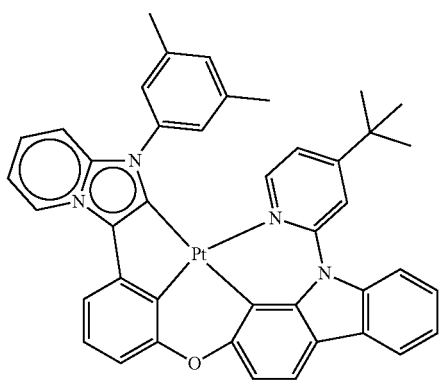
-continued
1-43
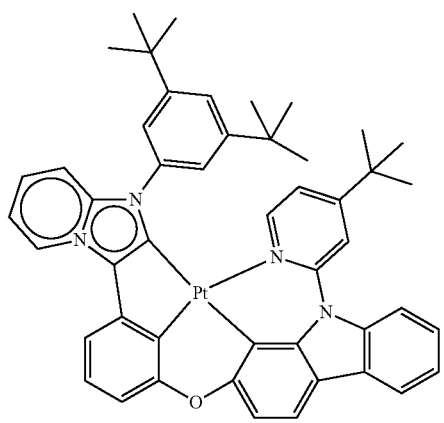
1-44
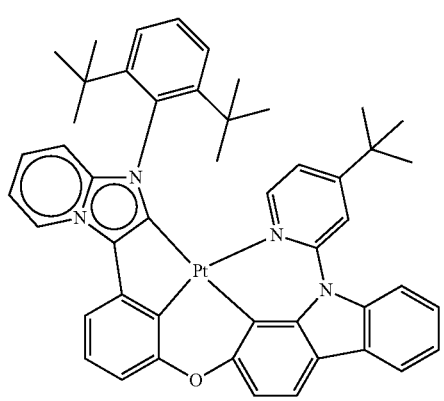
1-45
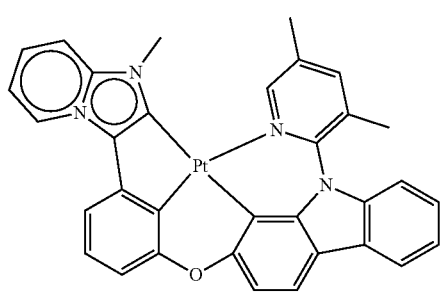
1-46
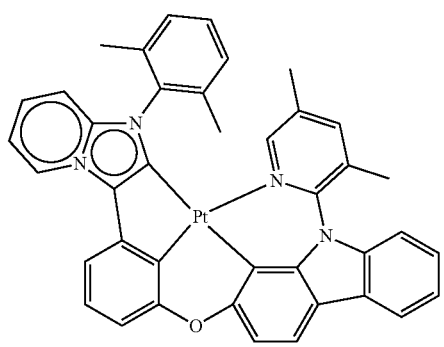

1-47
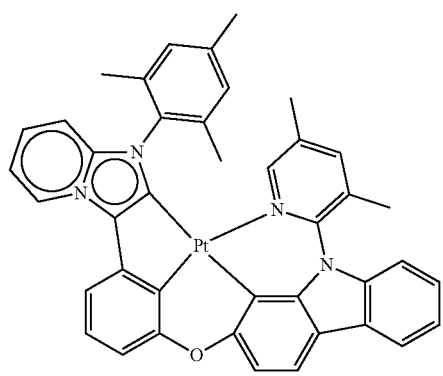
1-48
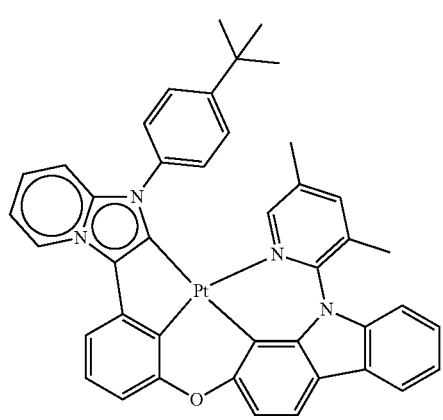
1-49
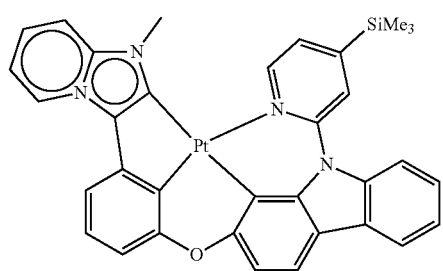
1-50
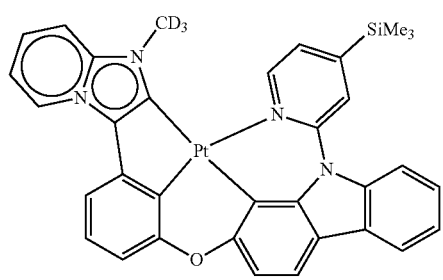
1-51
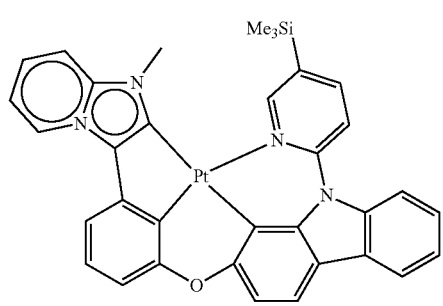
1-52
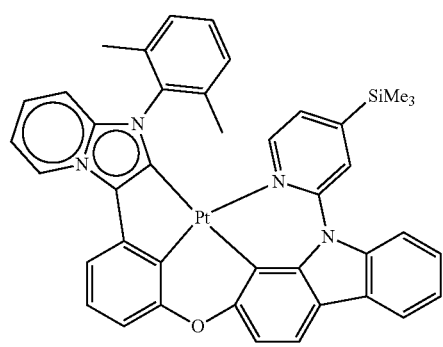
1-53
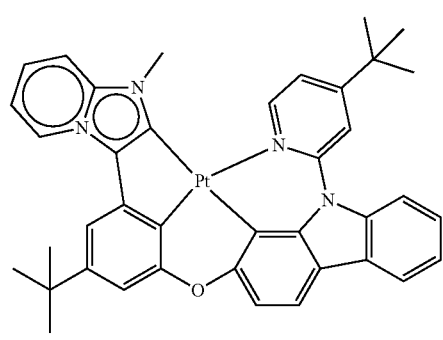
1-54
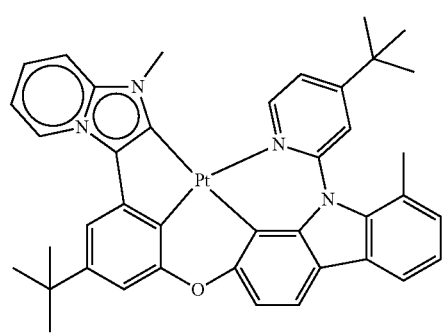
1-55
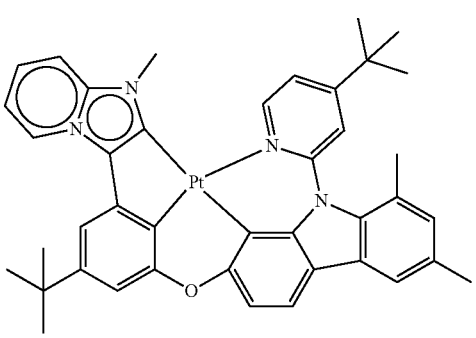

1-56
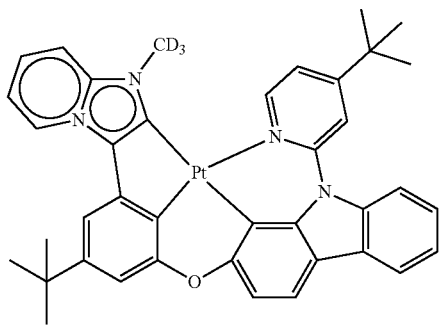
1-57
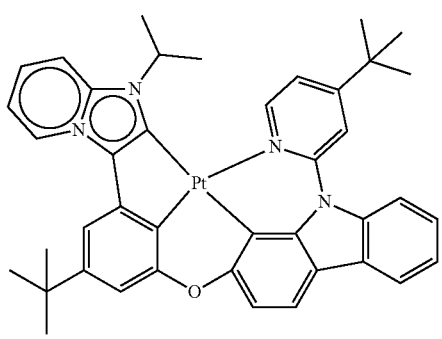
1-58
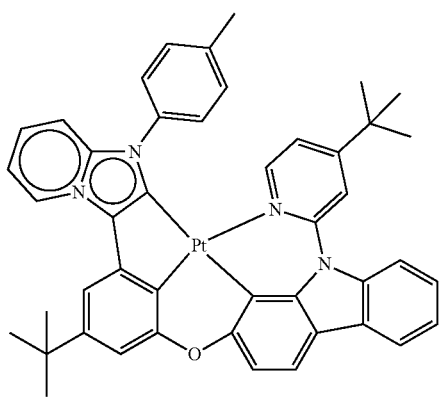
1-59
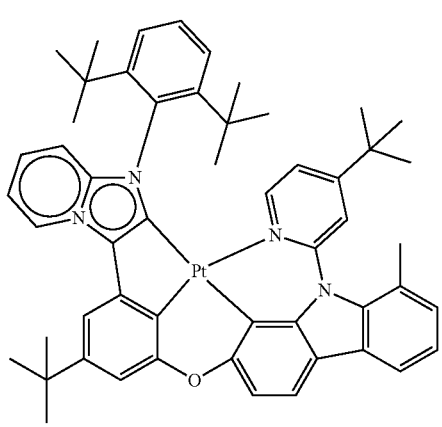
1-60
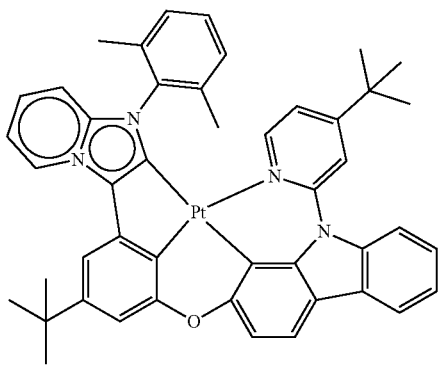
1-61
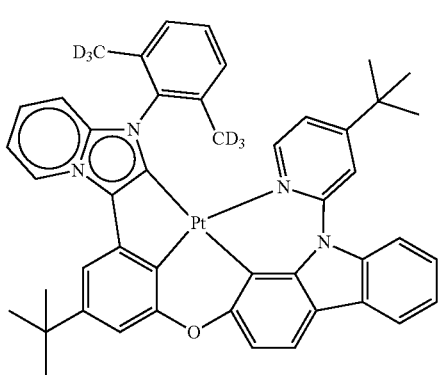
1-62
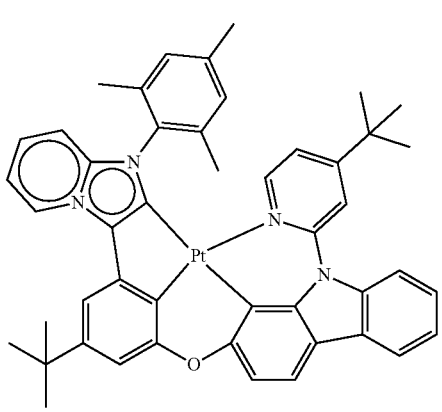
1-63
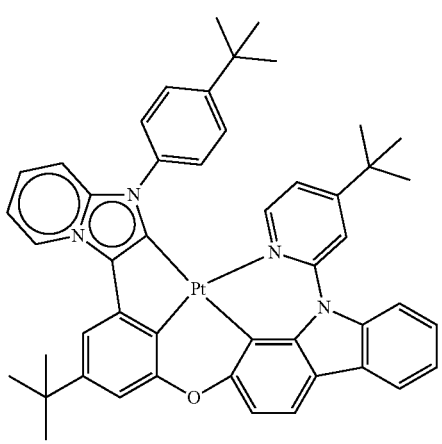

1-64
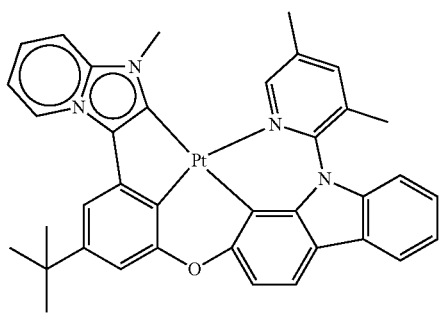
1-65
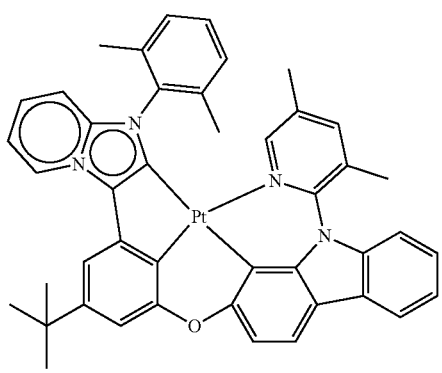
1-66
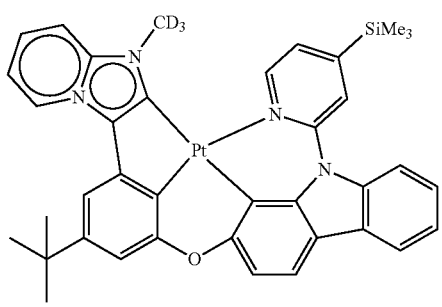
1-67
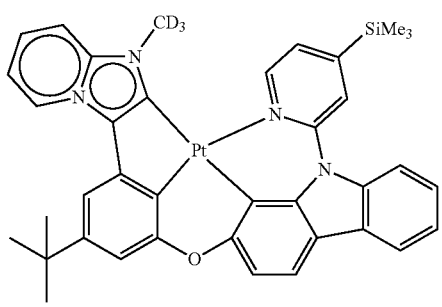
1-68
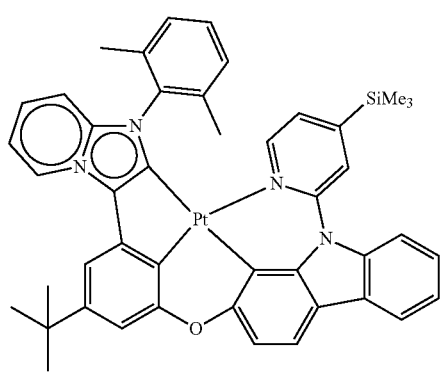
1-69
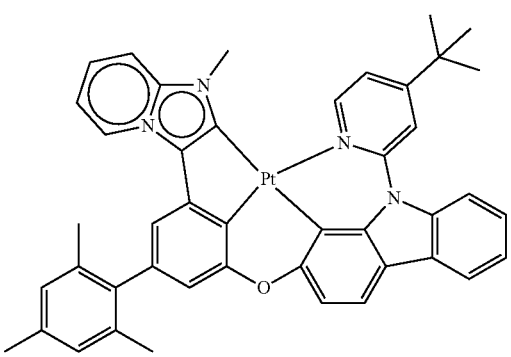
1-70
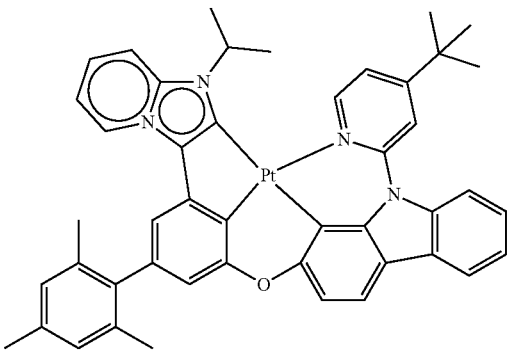

1-72
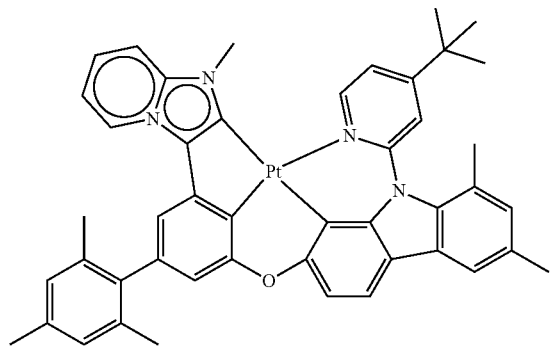
1-73
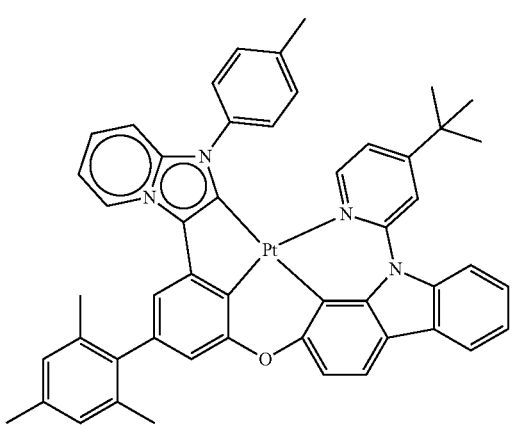
1-74
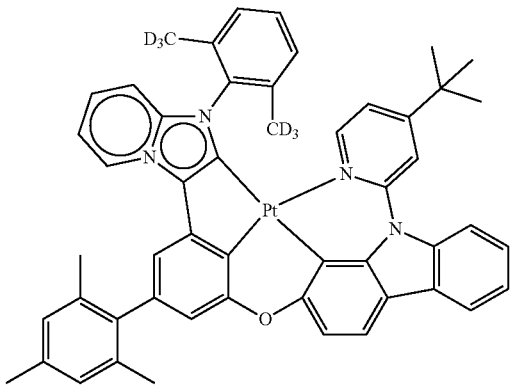
1-75
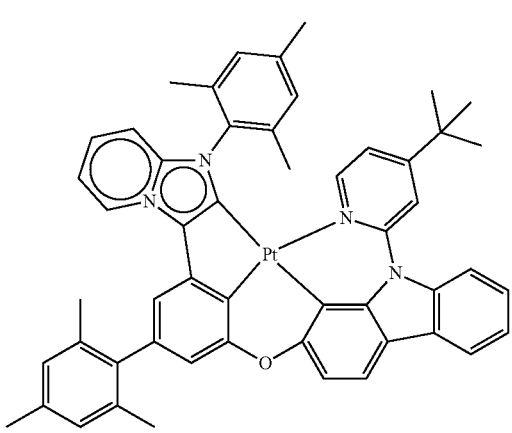
1-76
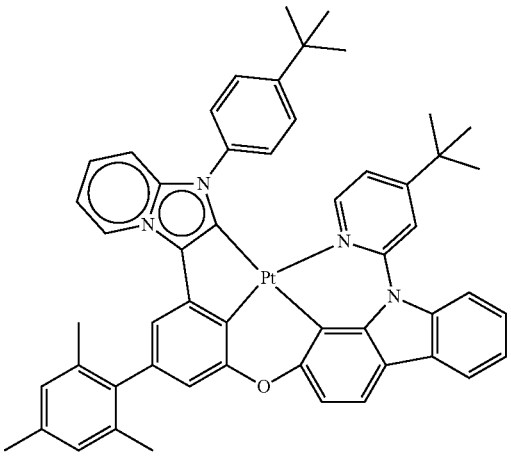
77
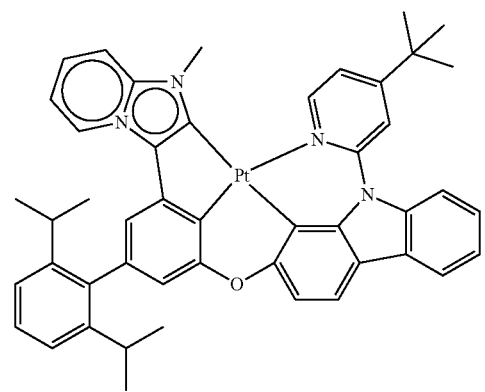
78
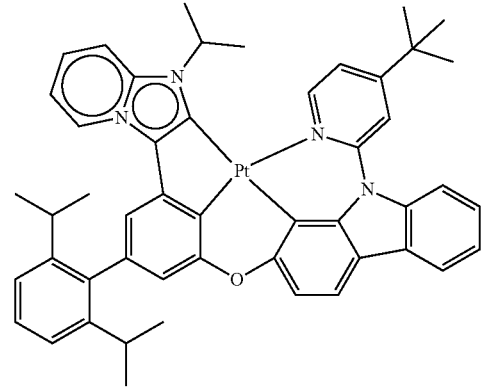
1-79
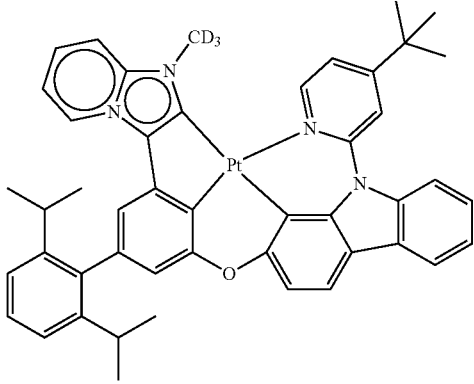

1-80
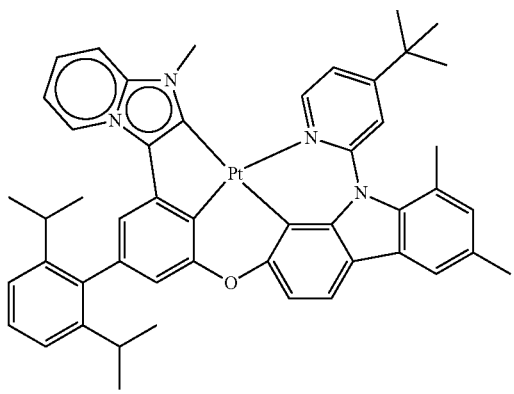
1-83
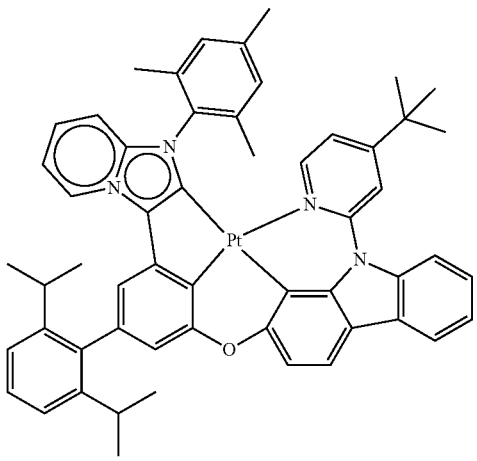
1-81
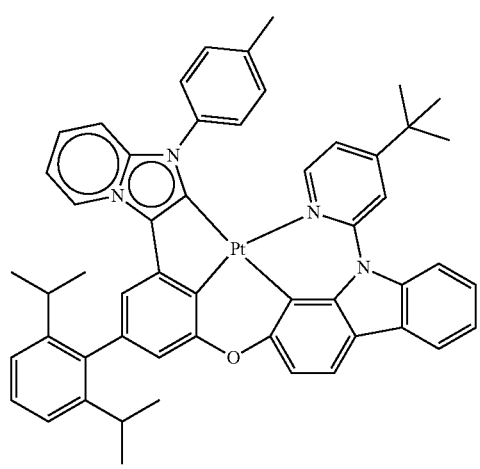
1-84
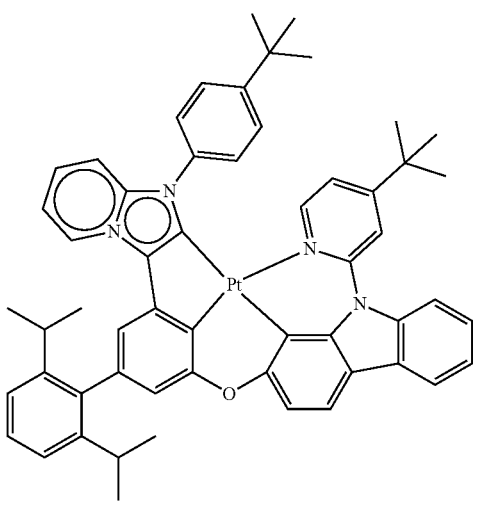
1-82
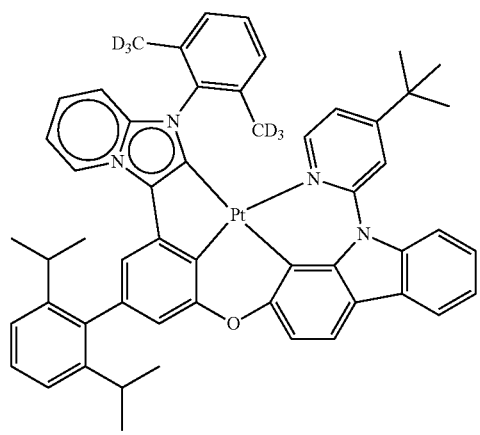
1-85
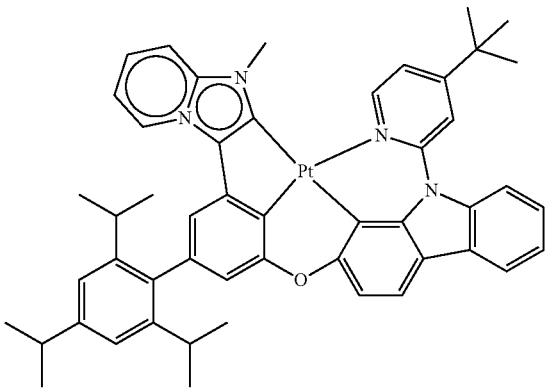

1-86
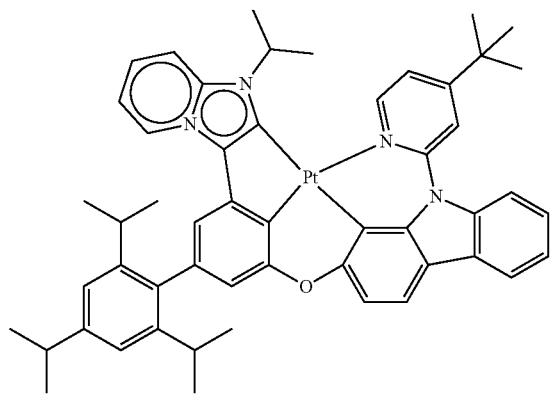
1-87
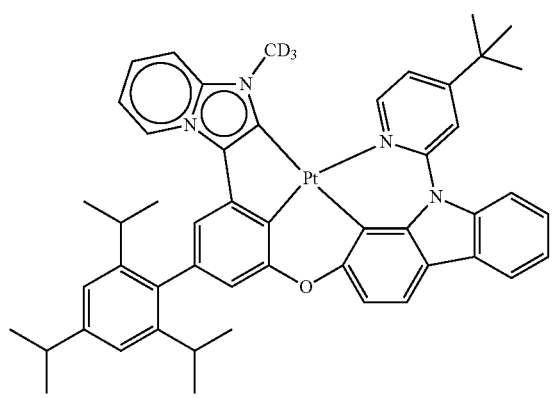
1-88
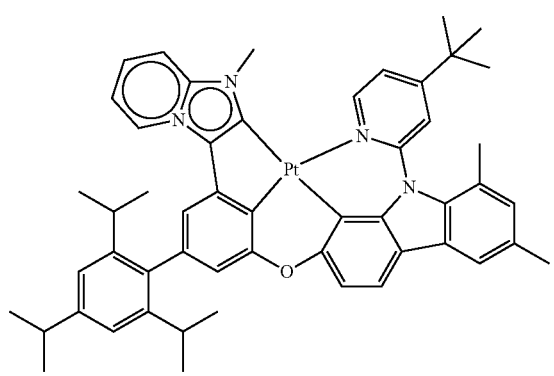
1-89
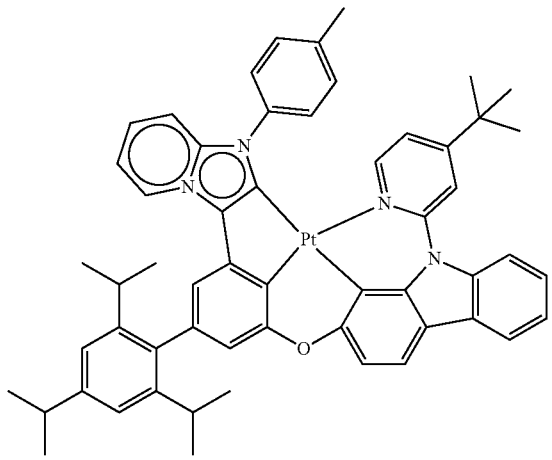
1-90
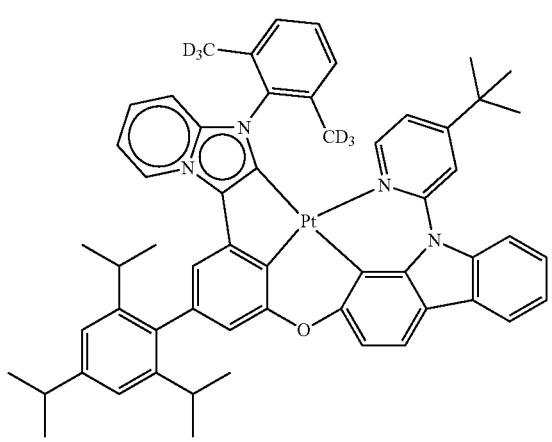
1-91
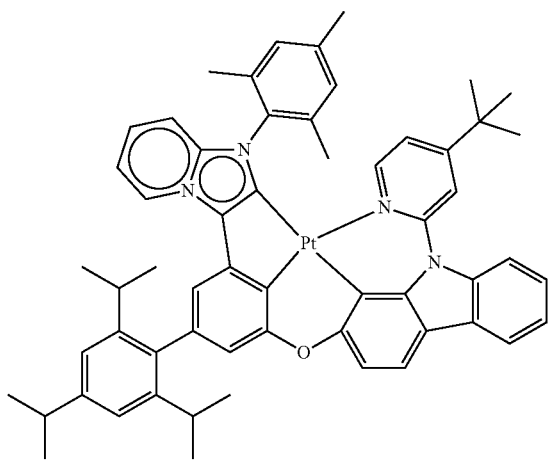

1-92
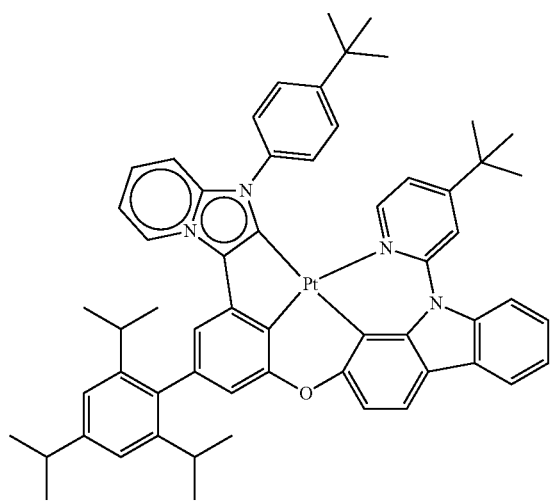
1-93
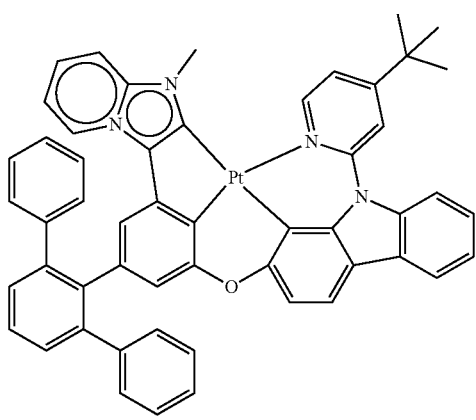
1-94
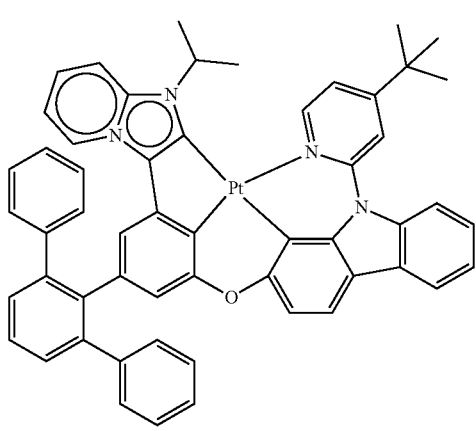
1-95
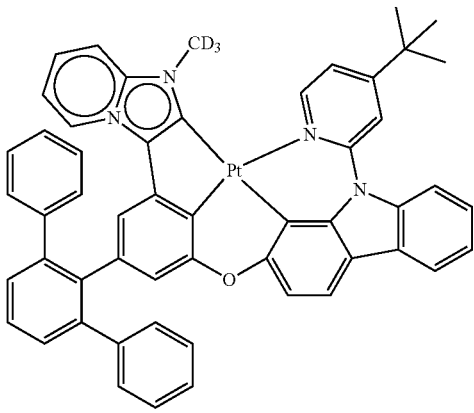
1-96
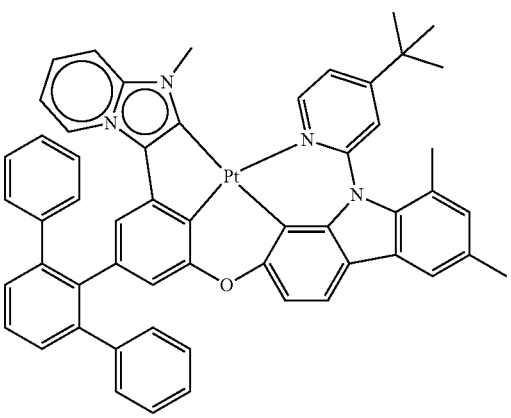
1-97
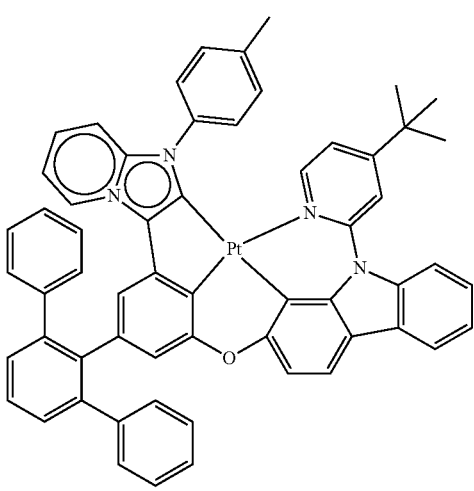

1-98
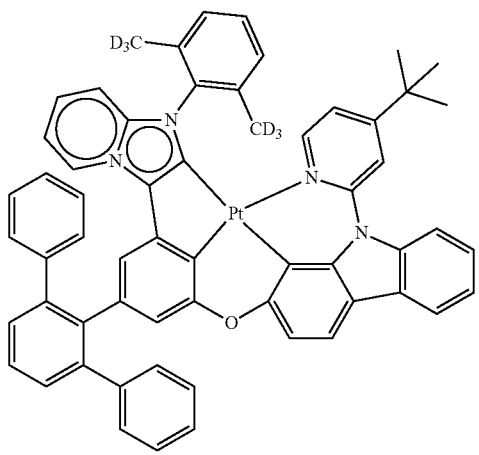
1-99
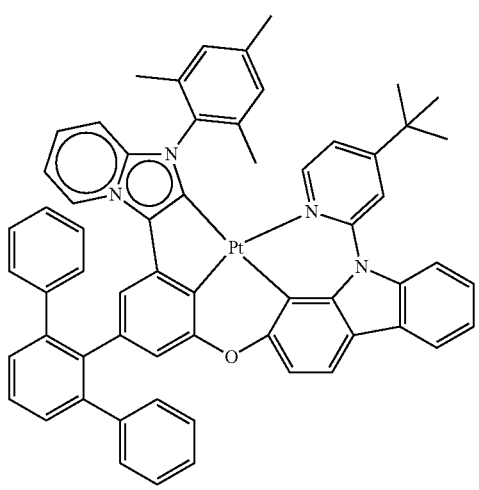
1-100
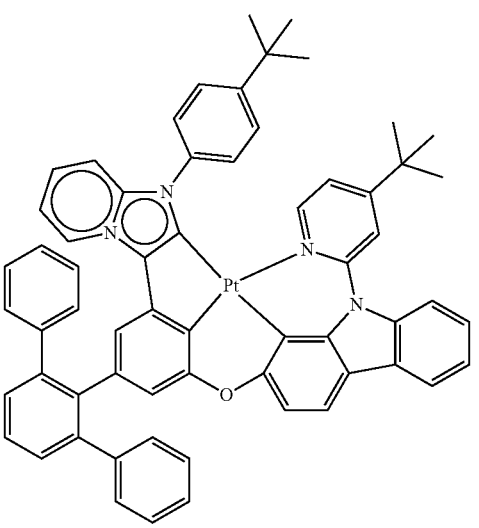
1-101
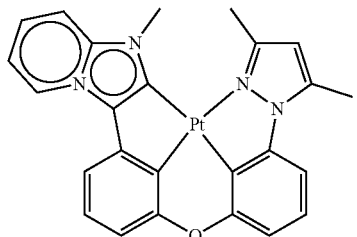
1-102
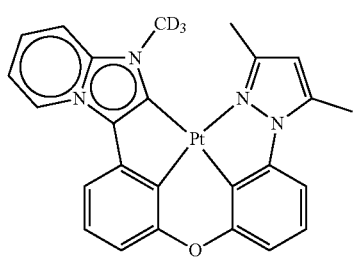
1-103
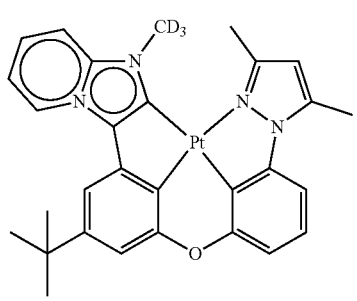
1-104
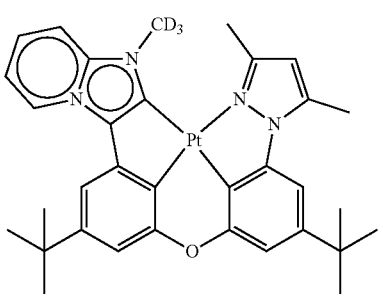
1-105
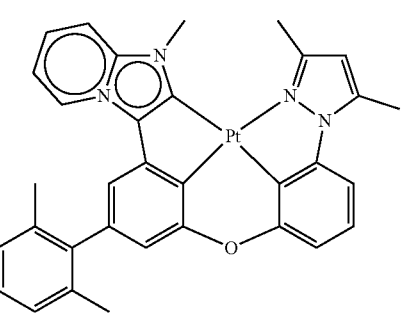

1-106
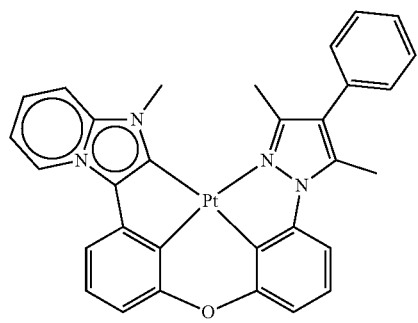
1-107
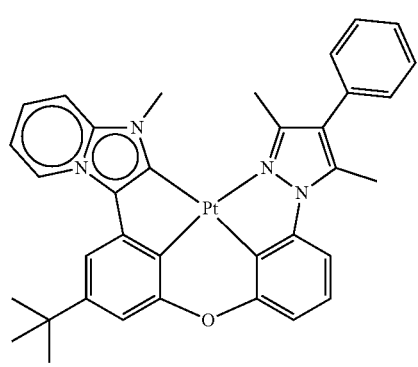
1-108
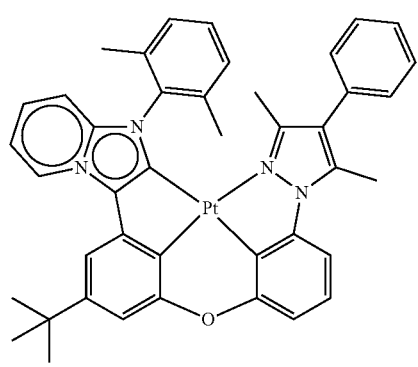
1-109
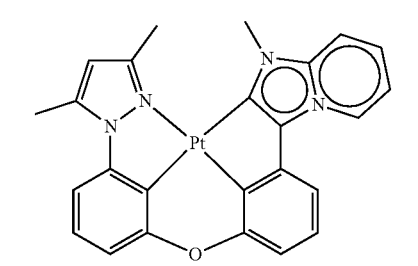
1-110
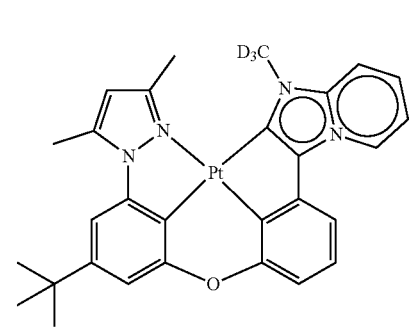
1-111
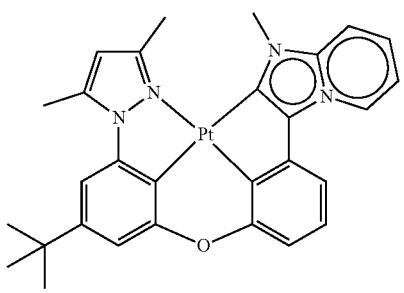
1-112
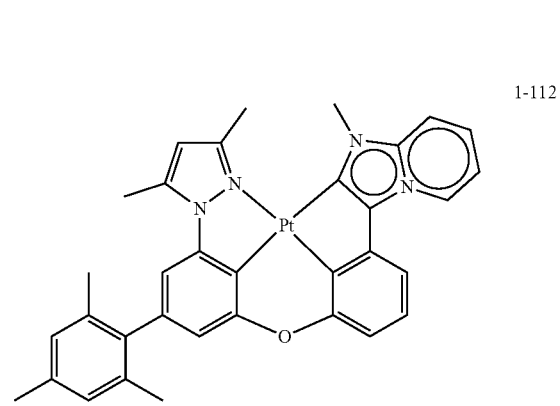
1-113
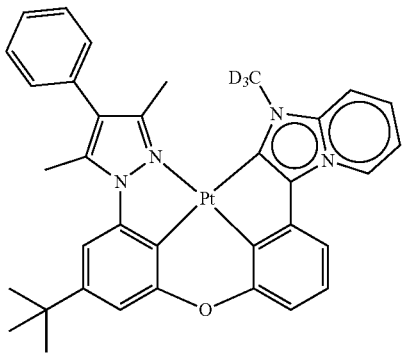
1-114
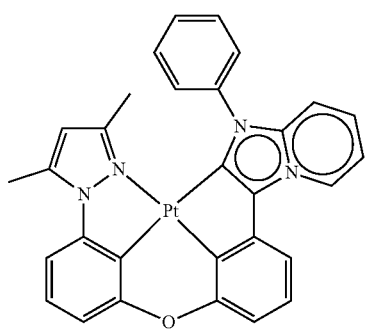

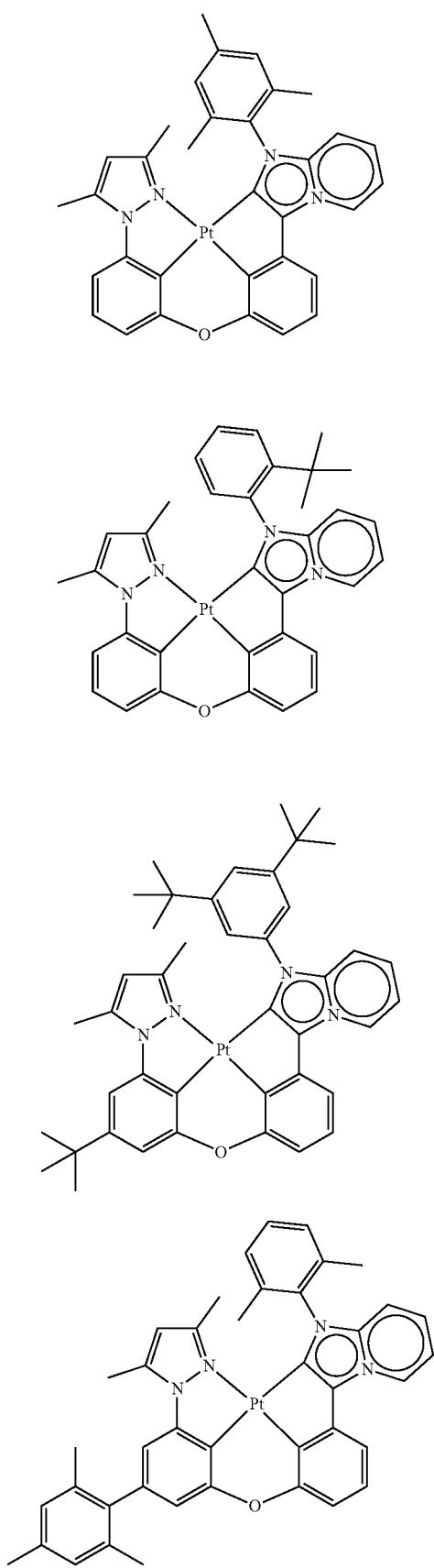
1-115
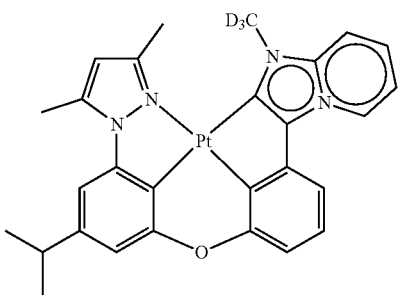
1-116
1-119
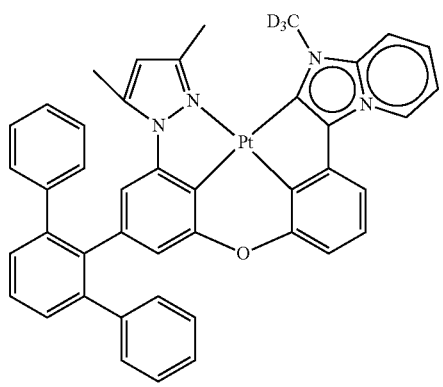
1-120
1-117
1-121
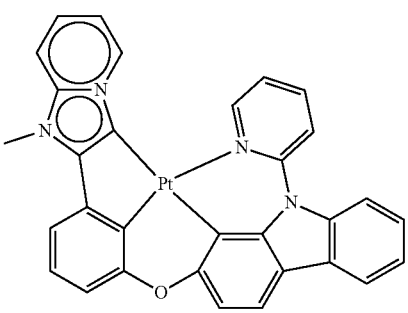
1-122
1-118
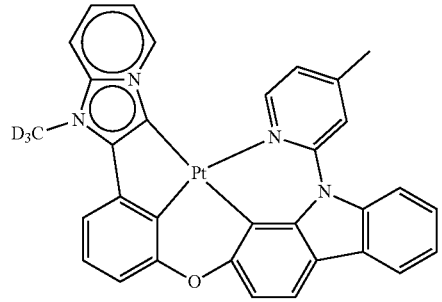
1-123
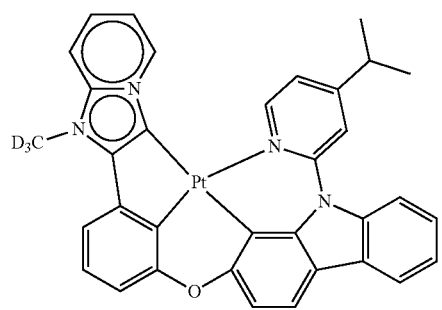

1-124
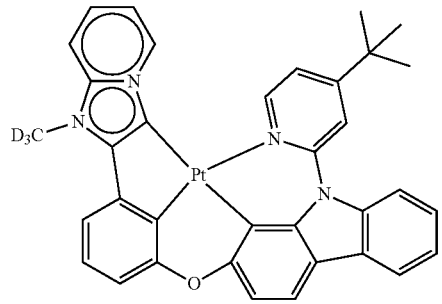
1-125
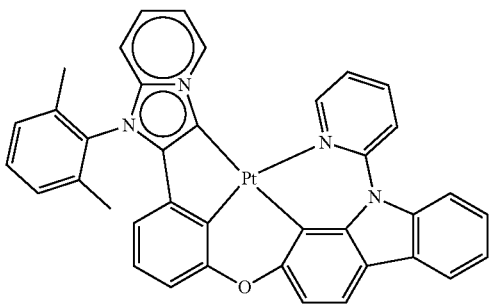
1-126
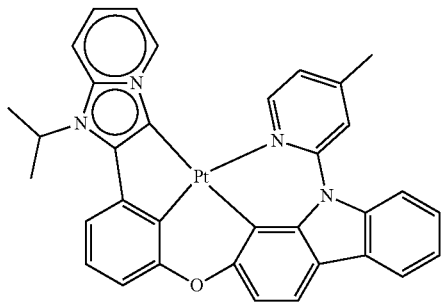
1-127
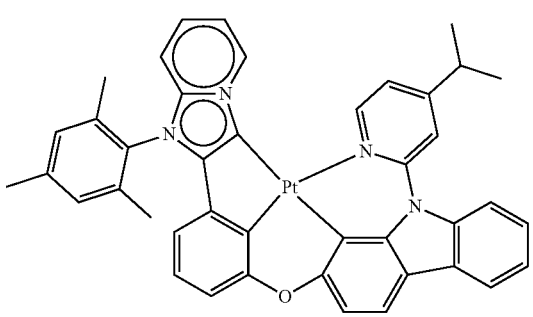
1-128
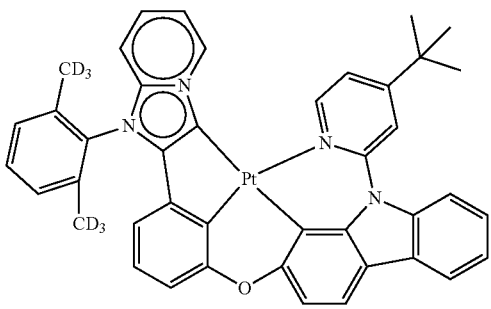
1-129
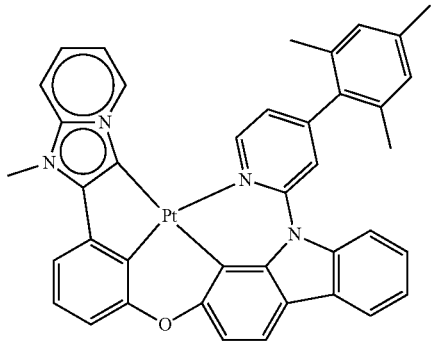
1-130
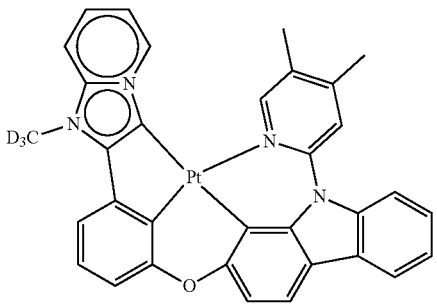
1-131
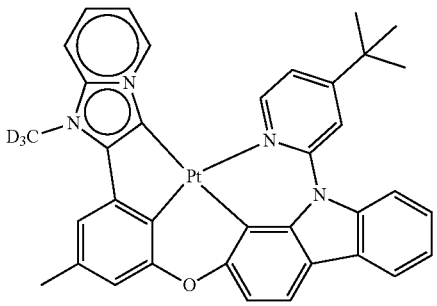
1-132
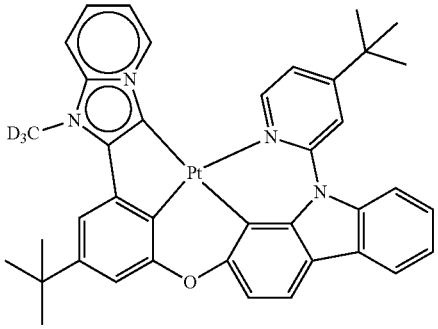

-continued
1-133
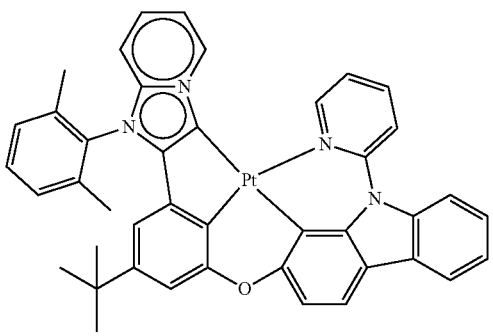
1-134
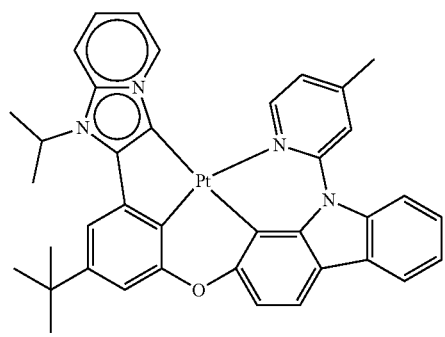
1-135
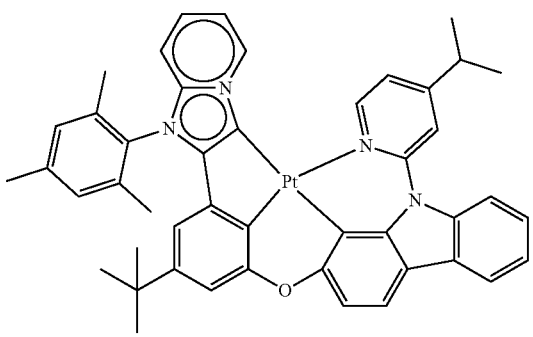
1-137
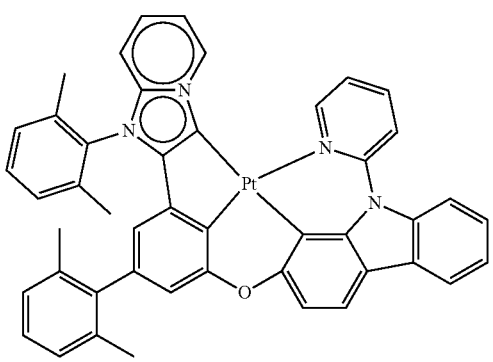
-continued
1-138
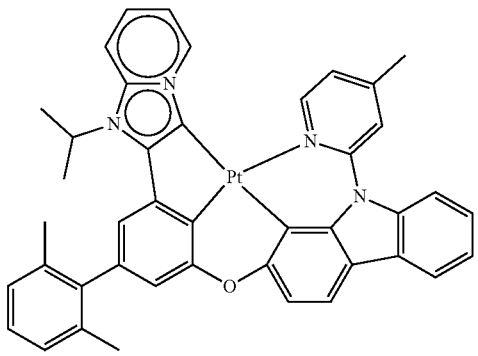
1-136
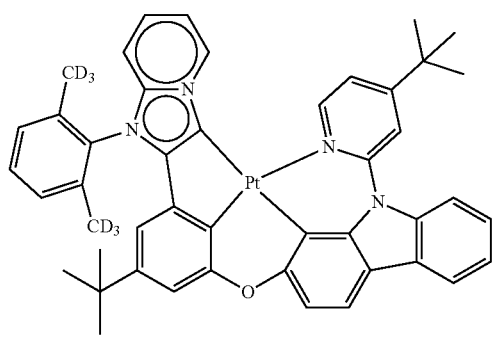
1-139
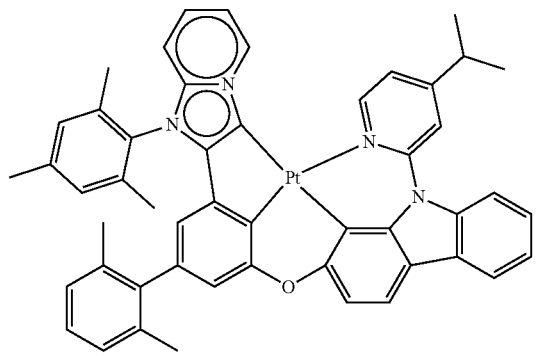
1-140
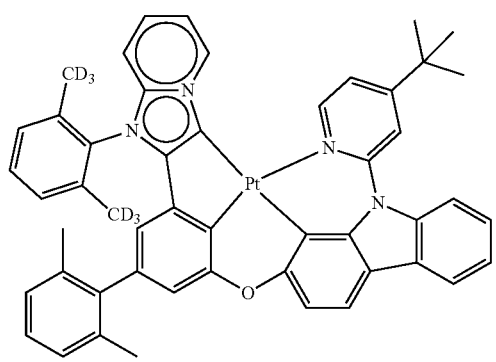

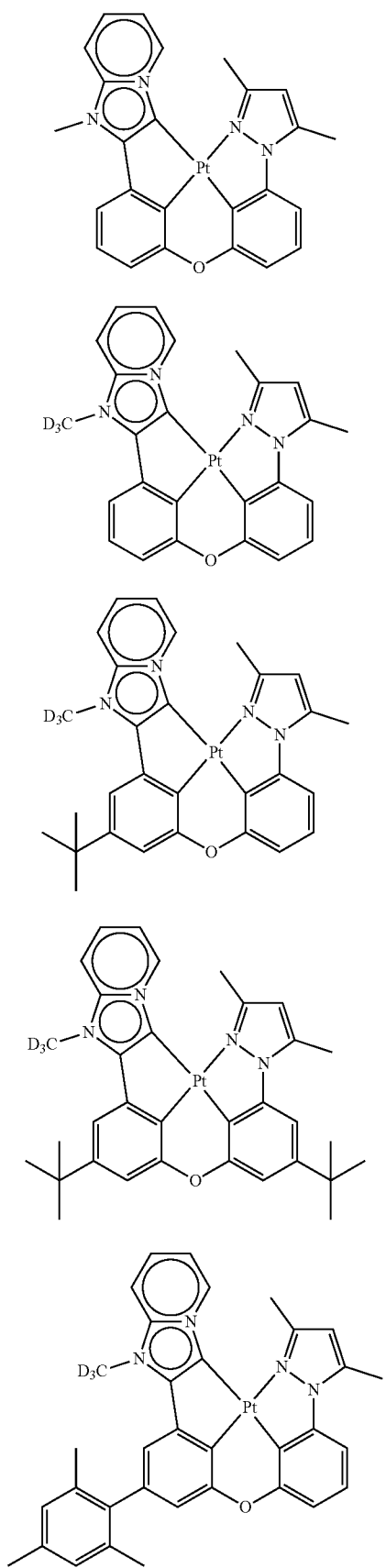
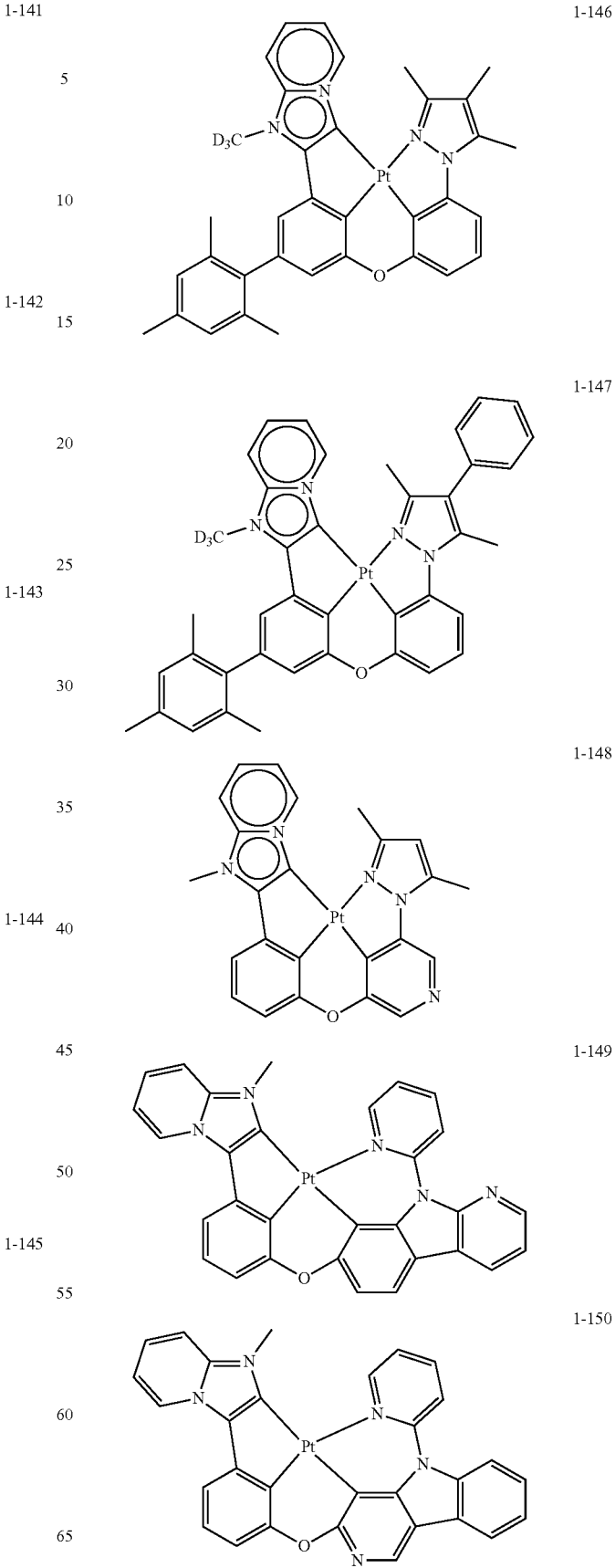

1-151
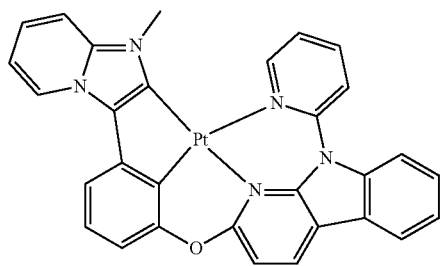
1-152
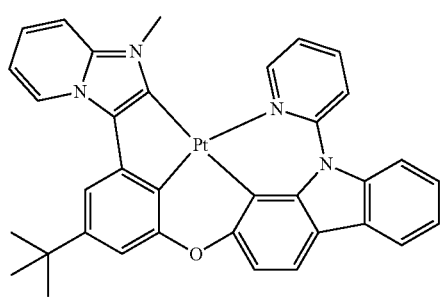
1-153
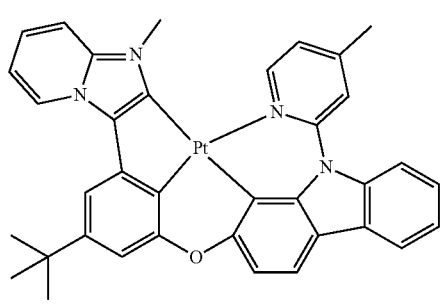
1-154
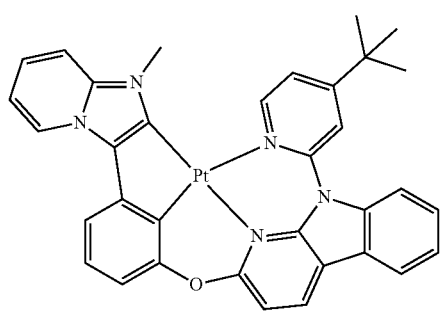
1-155
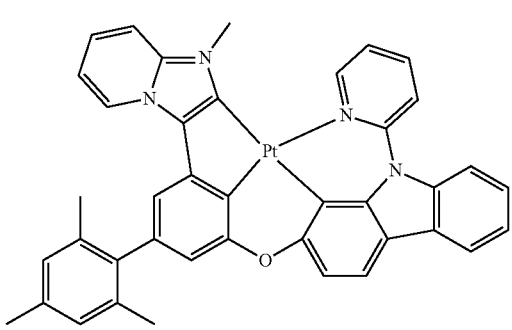
1-156
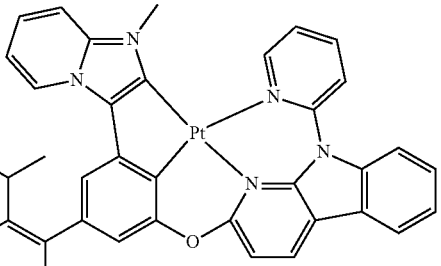
1-1157
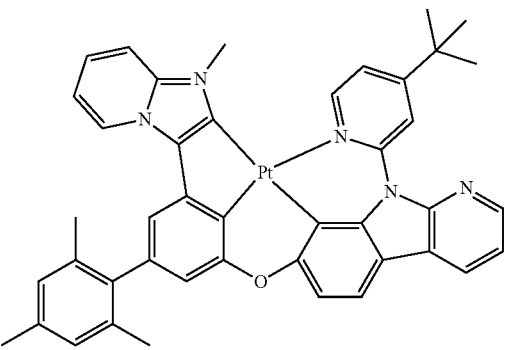
1-158
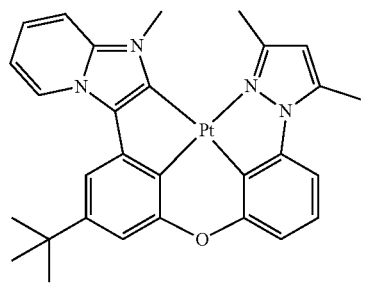
1-159
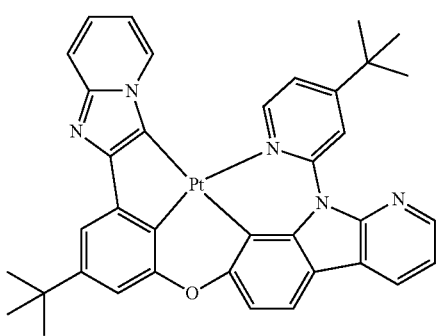

1-160

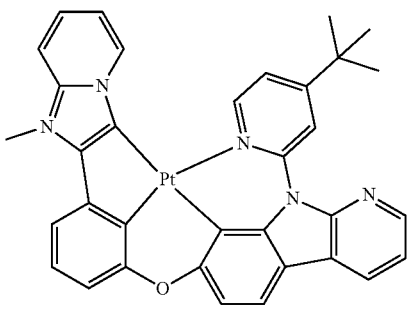

1-161

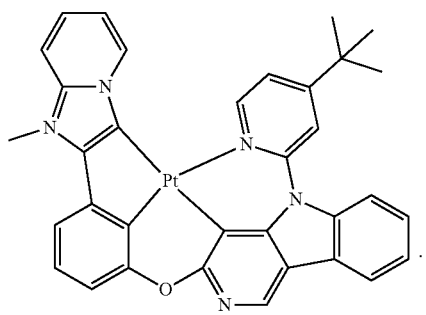

7. An organometallic compound represented by Formula 2:

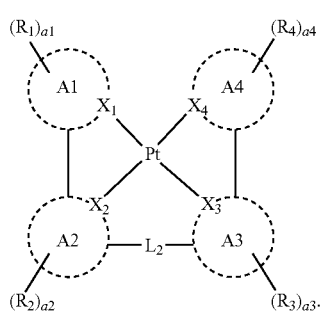

Formula 2 wherein in Formula 2,

A1 to A4 are each independently a substituted or unsubstituted mesoionic carbene group having 1 to 20 ring-forming carbon atoms, a substituted or unsubstituted aryl group having 6 to 30 ring-forming carbon atoms, or a substituted or unsubstituted heteroaryl group having 2 to 30 ring-forming carbon atoms, and at least one of A1 to A4 is a substituted or unsubstituted mesoionic carbene group having 1 to 20 ring-forming carbon atoms, $X_1$ to $X_4$ are each independently a carbon atom or a nitrogen atom, $R_1$ to $R_4$ are each independently a hydrogen atom, a deuterium atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, a1 to a4 are each independently an integer of 0 to 4, $L_2$ is a direct linkage,

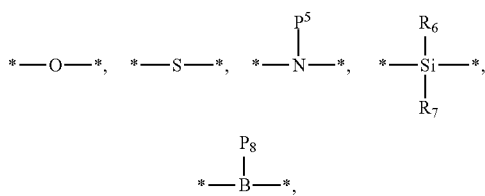

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, $R_5$ to $R_8$ are each independently a substituted or unsubstituted alkyl group having 1 to 20 carbon atoms, a substituted or unsubstituted aryl group having 6 to 30 ring-forming carbon atoms or a substituted or unsubstituted heteroaryl group having 2 to 30 ring-forming carbon atoms, and/or bonded to an adjacent group to form a ring, at least one selected from among A1 and A4 is a mesoionic carbene group represented by any one of 1-1 to 1-6, and A2, A3, and any remaining ligand selected from among A1 and A4 are each independently represented by any one of 2-1 to 2-4:

1-1

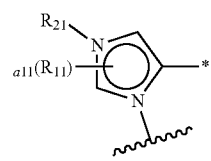

1-2

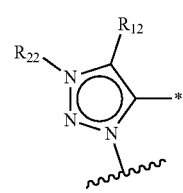

1-3

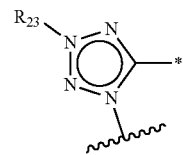

1-4

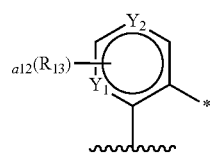

1-5

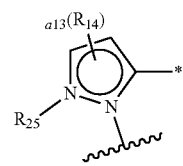

1-6

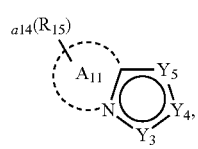

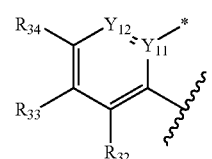   2-1

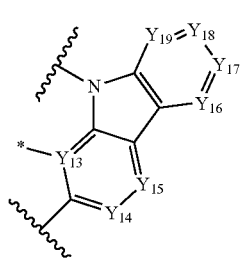   2-2

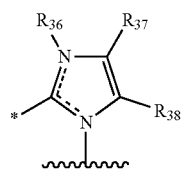   2-3

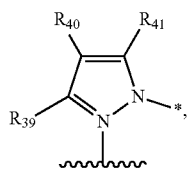   2-4 wherein in 1-1 to 1-6,
any one selected from among $Y_1$ and $Y_2$ is CH and the other is $NR_{24}$,

is a position of binding to a neighboring ligand or a position of binding to $L_2$
-* is a position of binding to Pt,
A11 is a substituted or unsubstituted aryl group having 6 to 30 ring-forming carbon atoms or a substituted or unsubstituted heteroaryl group having 2 to 30 ring-forming carbon atoms,
any one selected from among $Y_3$ and $Y_4$ is

and the other is C-*, $Y_5$ is $NR_{26}$ or

$R_{11}$ to $R_{15}$ are each independently a hydrogen atom, a deuterium atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, $R_{21}$ to $R_{26}$ are each independently a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, a11 to a13 are each independently an integer of 0 to 2, and
a14 is an integer of 0 to 4:
wherein in 2-1 to 2-4,
$Y_{11}$ is a carbon atom or a nitrogen atom,
$Y_{12}$ is $CR_{31}$ or

$Y_{13}$ to $Y_{19}$ are each independently $CR_{35}$ or a nitrogen atom, and
$R_{31}$ to $R_{41}$ are each independently a hydrogen atom, a deuterium atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, and
wherein:
when A1 is the mesoionic carbene group represented by 1-1, A2 is a group represented by 2-1 in which $Y_{11}$ is the carbon atom and $Y_{12}$ is

A3 is represented by 2-1 in which $Y_{11}$ is the carbon atom and $Y_{12}$ is

or is represented by 2-2 in which $Y_{13}$ to $Y_{19}$ are each independently $CR_{35}$, A4 is represented by 2-1 in which $Y_{11}$ is the nitrogen atom and $Y_{12}$ is $CR_{31}$ or is represented by 2-4, then a11 of 1-1 is 0, and when A4 is the mesoionic carbene group represented by 1-1, A3 is a group represented by 2-1 in which $Y_{11}$ is the carbon atom and $Y_{12}$ is

A2 is represented by 2-1 in which $Y_{11}$ is the carbon atom and $Y_{12}$ is

or is represented by 2-2 in which $Y_{13}$ to $Y_{19}$ are each independently $CR_{35}$, A1 is represented by 2-1 in which $Y_{11}$ is the nitrogen atom and $Y_{12}$ is $CR_{31}$ or is represented by 2-4, then a11 of 1-1 is 0.

8. The organometallic compound of claim 7, wherein 1-6 is represented 1-6-1:

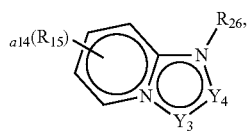

1-6-1 wherein in 1-6-1, $Y_3$, $Y_4$, $R_{15}$, $R_{26}$, and a14 are each independently the same as defined in connection with 1-6.

9. The organometallic compound of claim 7, wherein the organometallic compound represented by Formula 2 is represented by at least one of Formulae 3-1 to 3-7:

Formula 3-1

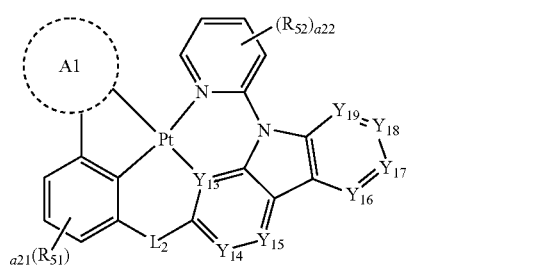

Formula 3-2

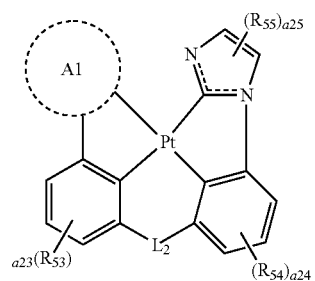

Formula 3-3

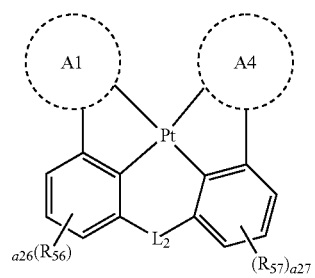

Formula 3-4

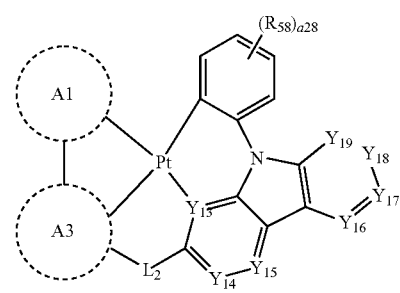

Formula 3-5

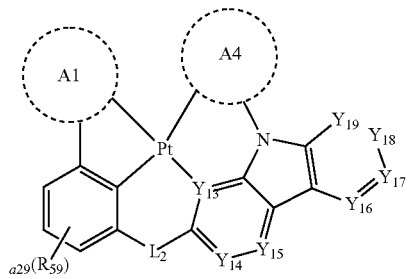

Formula 3-6

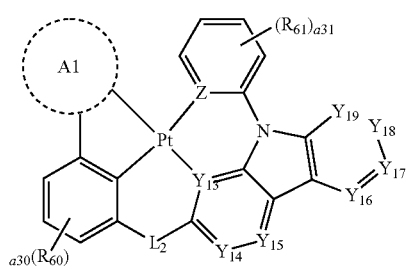

Formula 3-7

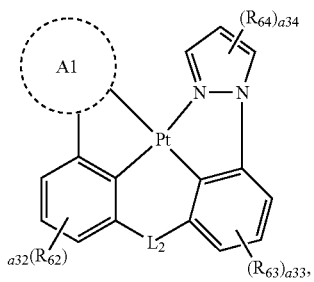

wherein in Formulae 3-1 and 3-2, A1 is represented by any one of 1-1 to 1-5,
in Formulae 3-3 and 3-5, at least one selected from among A1 and A4 is represented by any one of 1-1 to 1-5,
in Formula 3-4, A1 is represented by any one of 1-1 to 1-5,
in Formulae 3-6 and 3-7, A1 is represented by 1-6,
in Formulae 3-1 to 3-6,
$R_{51}$ to $R_{64}$ are each independently a hydrogen atom, a deuterium atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring,
Z is a carbon atom or a nitrogen atom,
a21, a23, a24, a26, a27, a29, a30, a32, a33, and a34 are each independently an integer of 0 to 3,
a22, a28, and a31 are each independently an integer of 0 to 4,
a25 is an integer of 0 to 2, and
$Y_{13}$ to $Y_{19}$, and $L_2$ are each independently the same as defined in connection with 2-2, and
wherein:
in Formula 3-1, when A1 is represented by 1-1, $Y_{13}$ to $Y_{19}$ are each independently $CR_{35}$, then a11 of 1-1 is 0,
in Formula 3-3, when one selected from A1 and A4 is represented by 1-1, an other one selected from among A1 and A4 is represented by 2-1 in which $Y_{11}$ is the nitrogen atom and $Y_{12}$ is $CR_{31}$ or is represented by 2-4, then a11 of 1-1 is 0, and
in Formula 3-5, when one selected from among A1 and A4 is represented by 1-1, an other one selected from among A1 and A4 is represented by 2-1 in which $Y_{11}$ is the nitrogen atom and $Y_{12}$ is $CR_{31}$ or is represented by 2-4, then a11 of 1-1 is 0.

10. The organometallic compound of claim 7, wherein the organometallic compound represented by Formula 1 is any one of the compounds represented by Compound Group 1 and Compound Group 2:

Compound Group 1

1

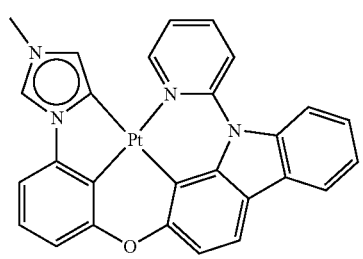

2

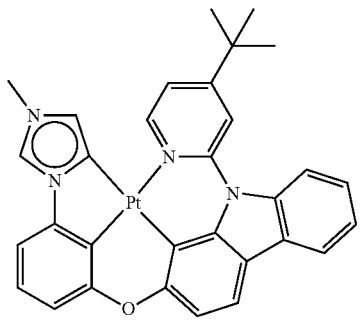

3

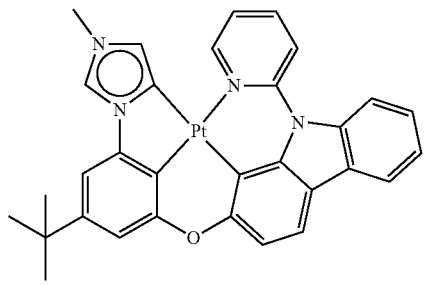

4

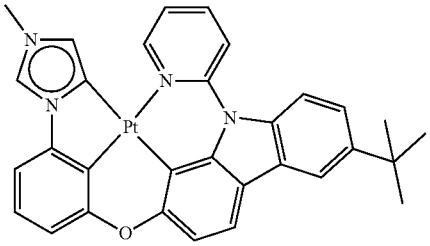

5

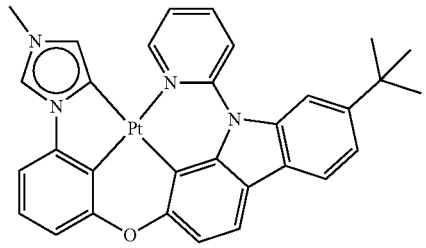

6

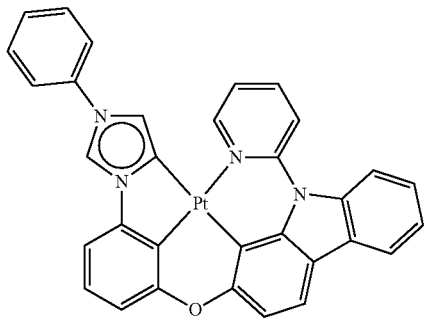

-continued
7
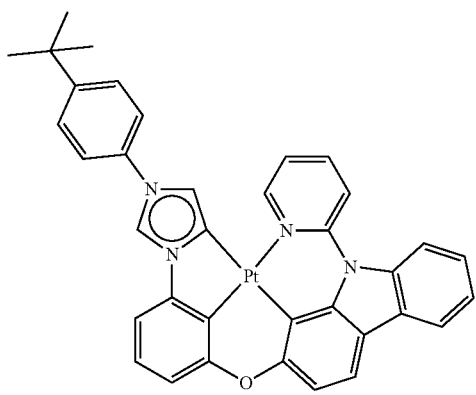
8
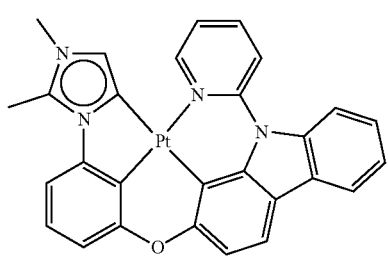
9
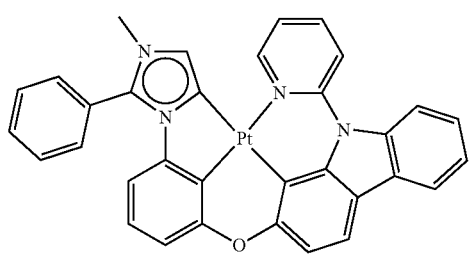
10
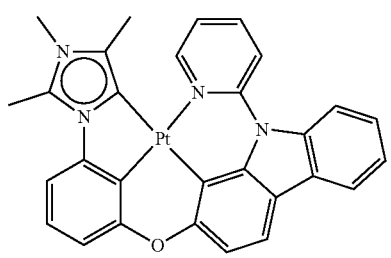
11
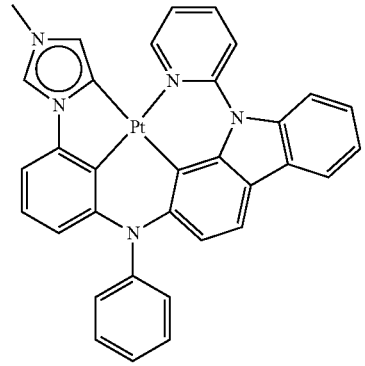
-continued
12
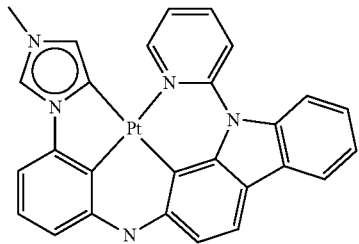
13
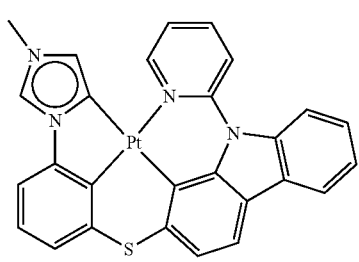
14
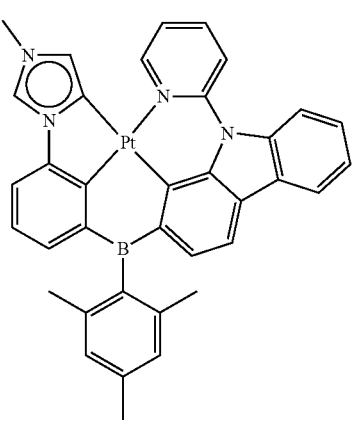
15
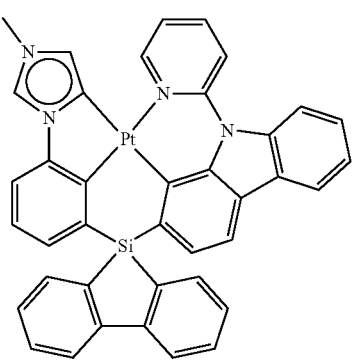
16
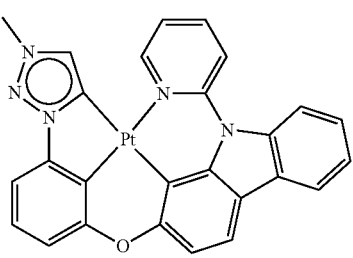

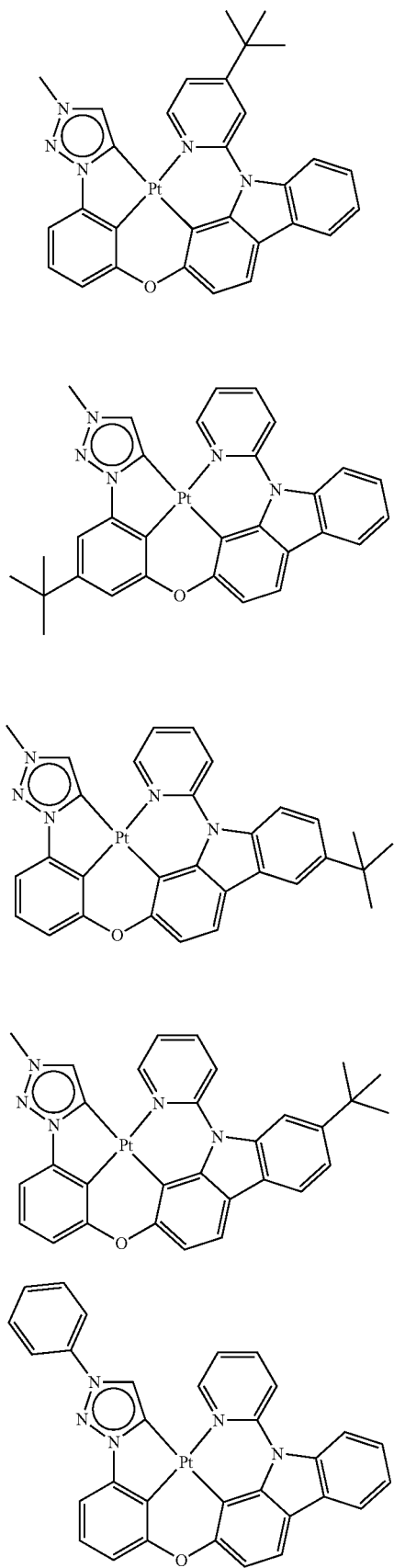
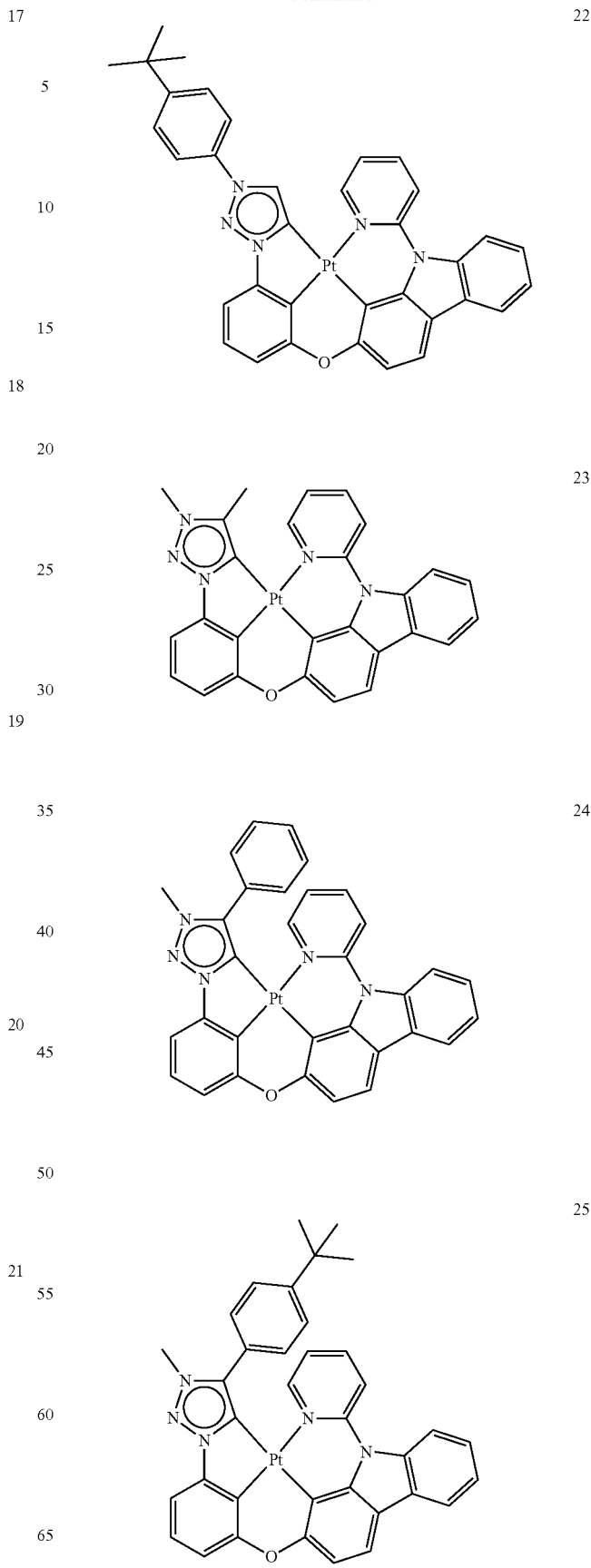

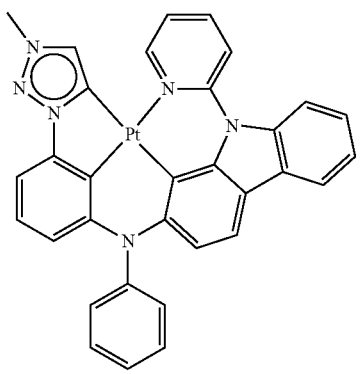
26
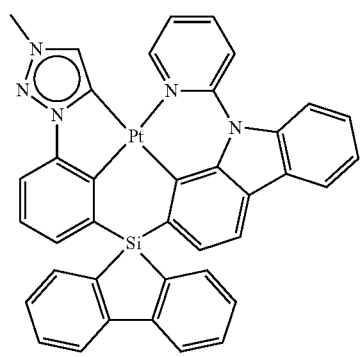
30
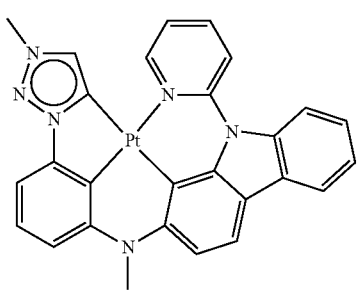
27
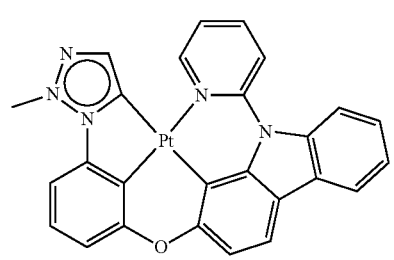
31
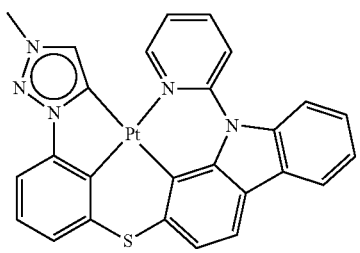
28
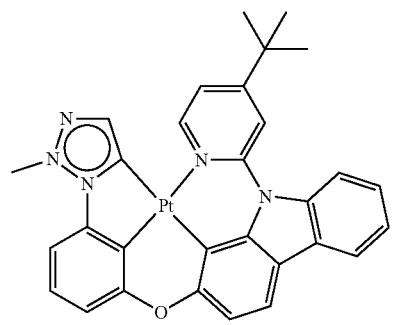
32
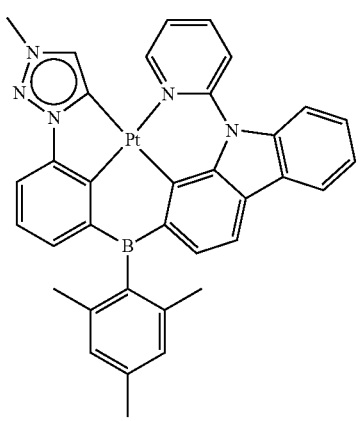
29
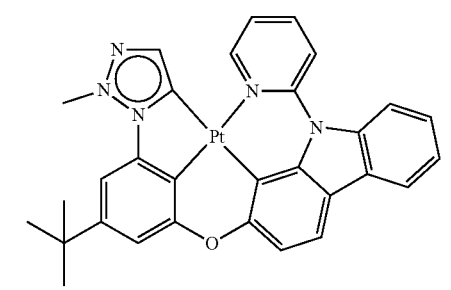
33
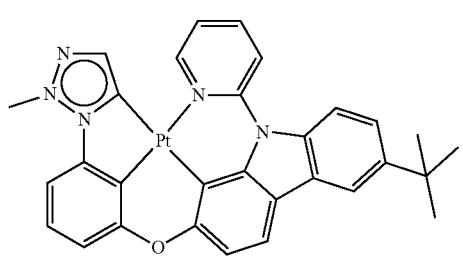
34

35
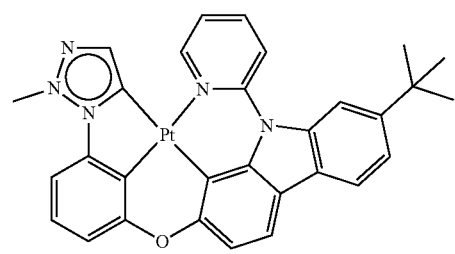
36
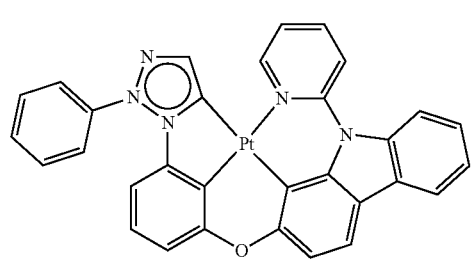
37
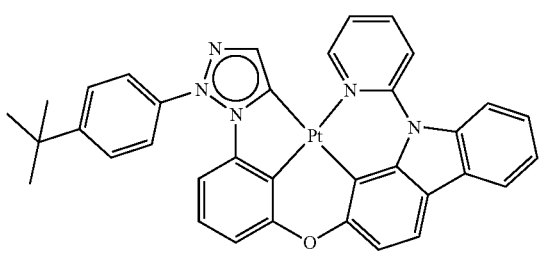
38
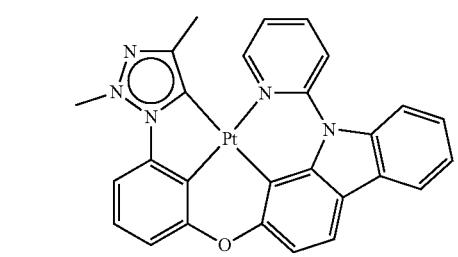
39
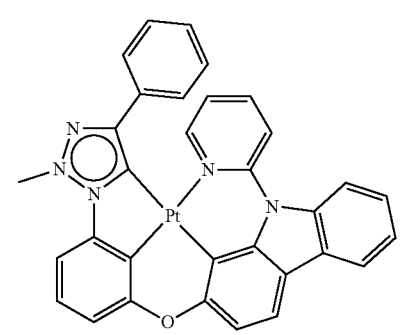
40
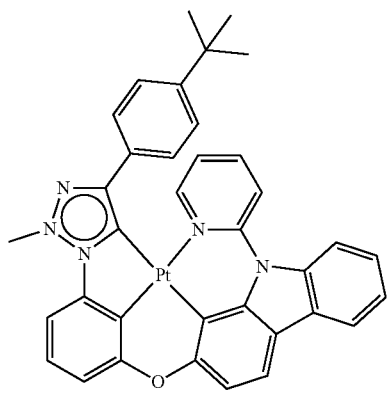
41
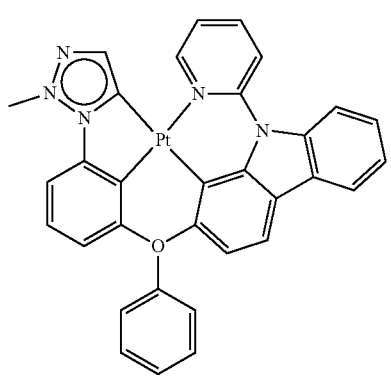
42
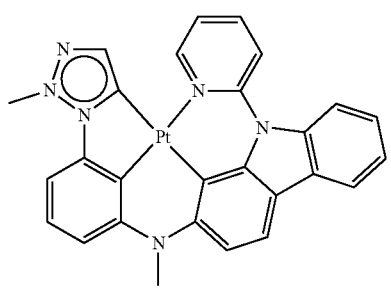
43
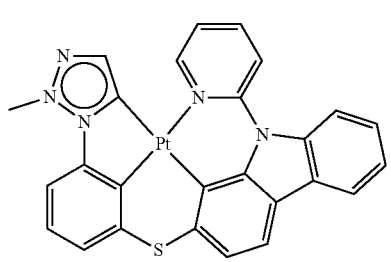

44
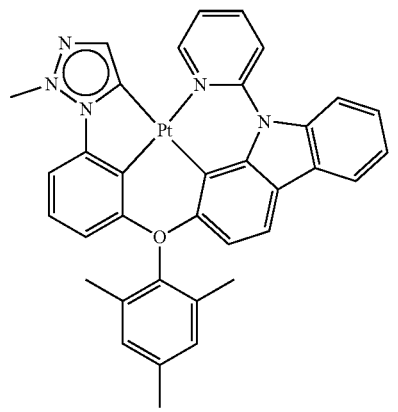
45
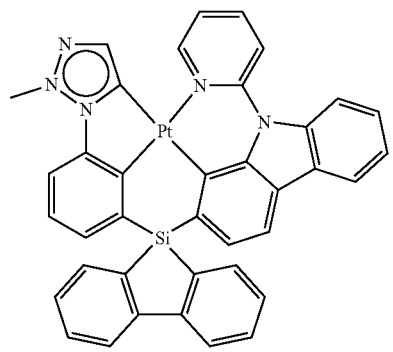
46
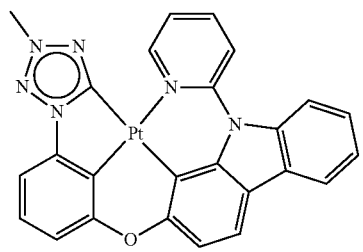
47
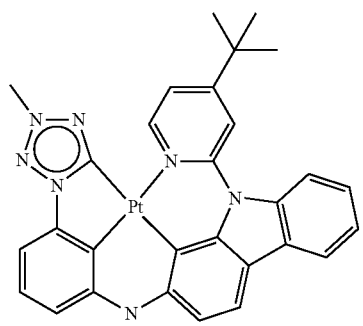
48
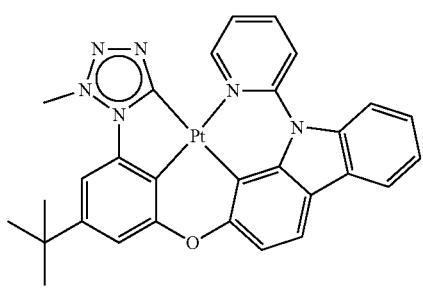
49
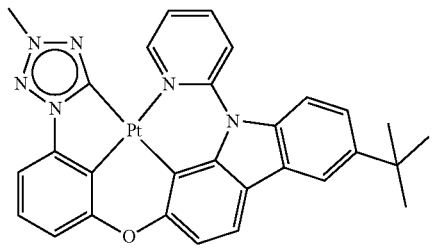
50
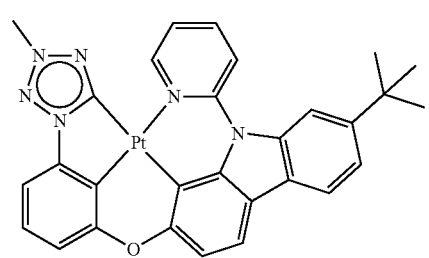
51
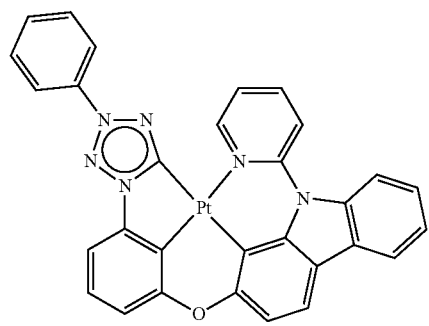
52
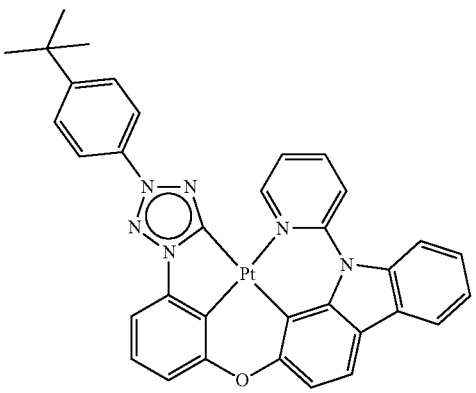
53
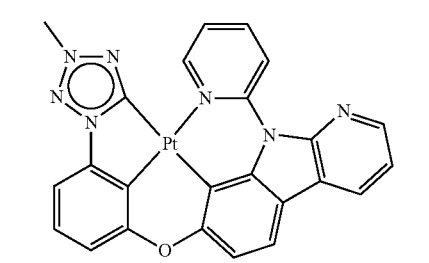

54
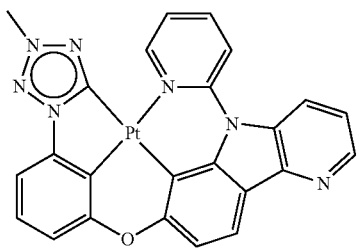
55
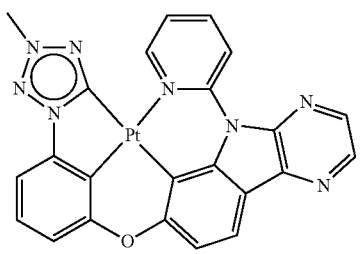
56
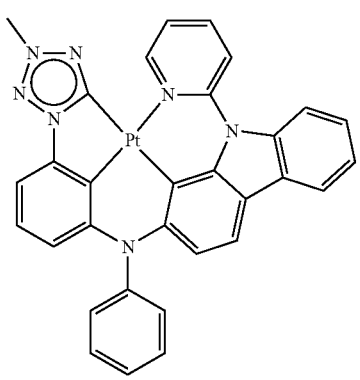
57
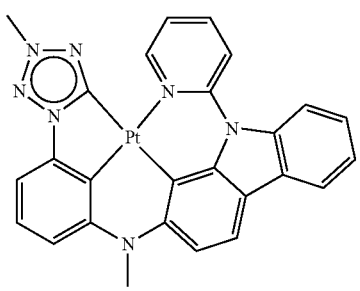
58
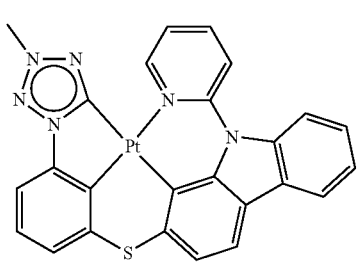
59
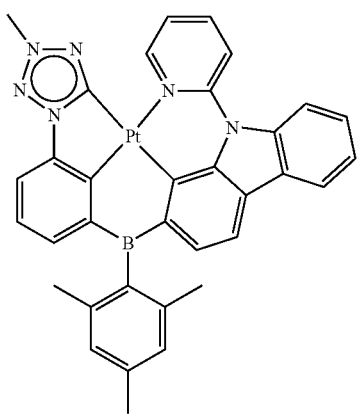
60
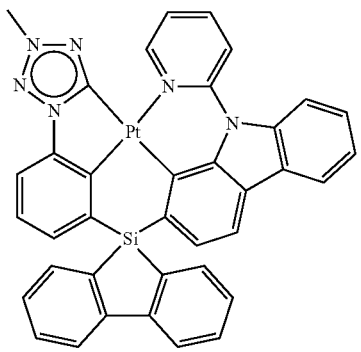
61
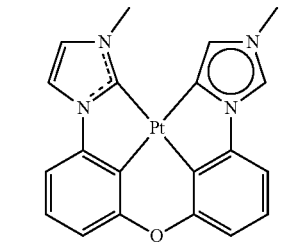
62
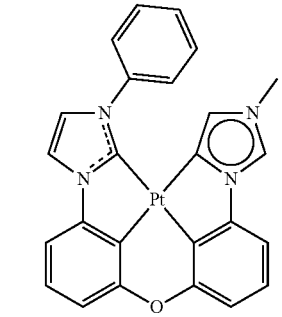
63
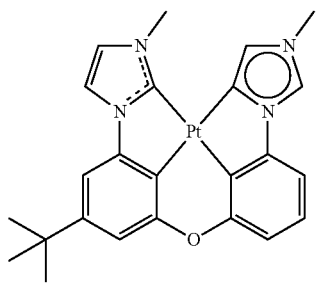

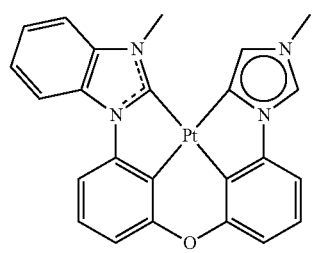
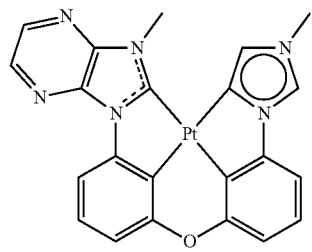
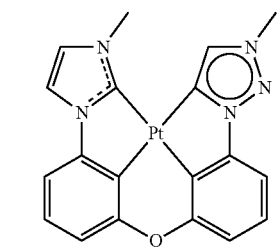
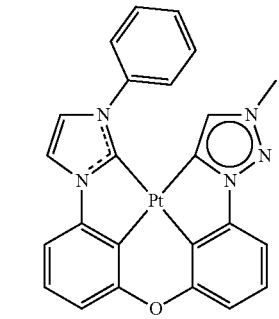
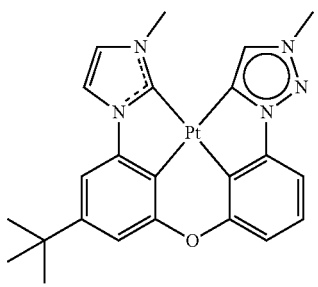
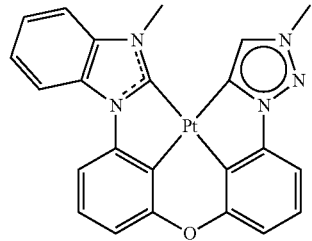
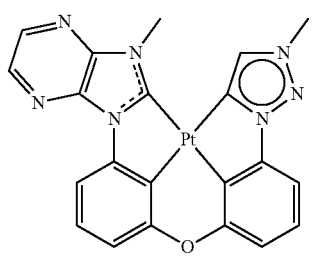
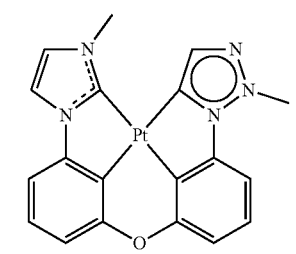
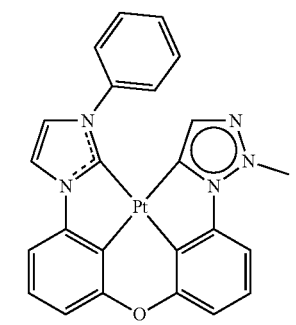
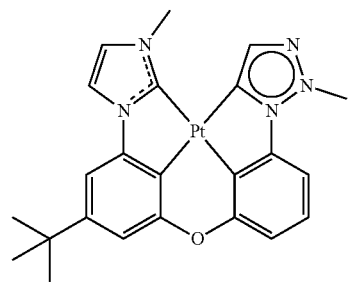
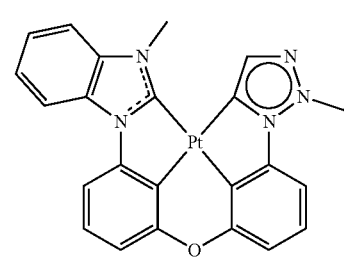
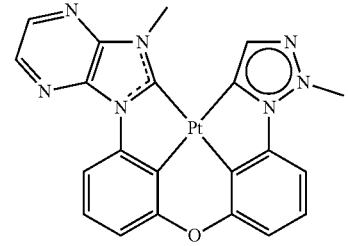

76
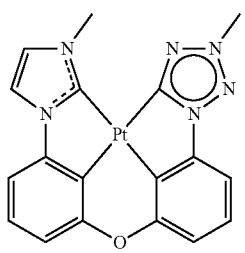
77
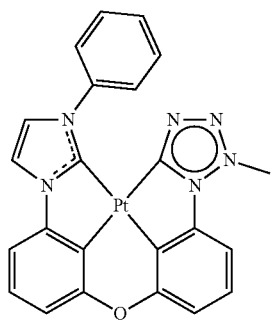
78
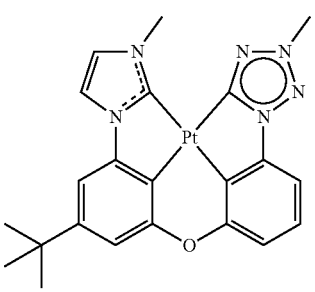
79
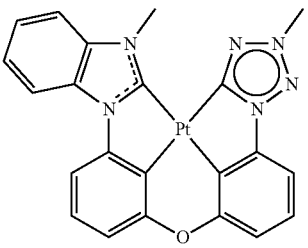
80
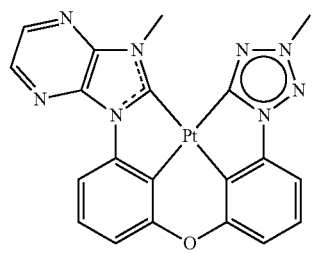
81
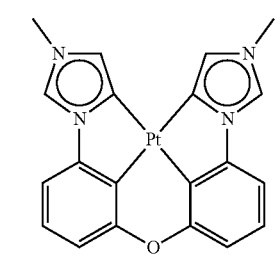
82
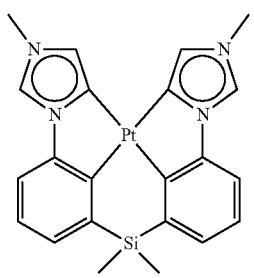
83
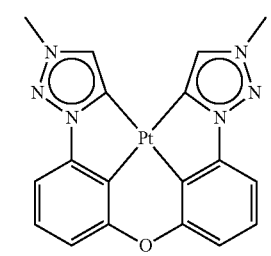
84
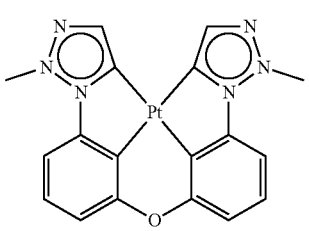
85
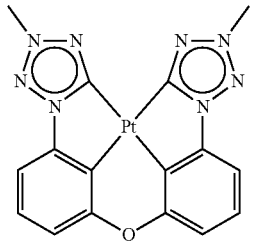
86
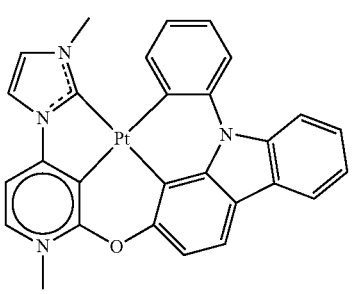
87
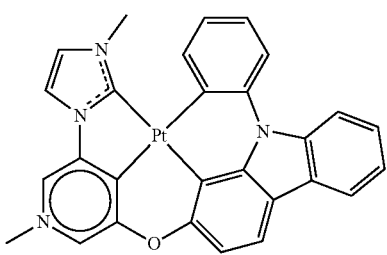

211
-continued
88
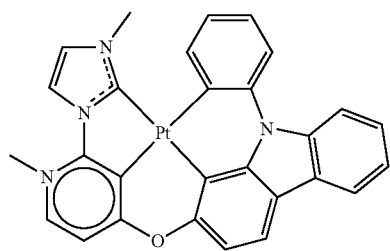
89
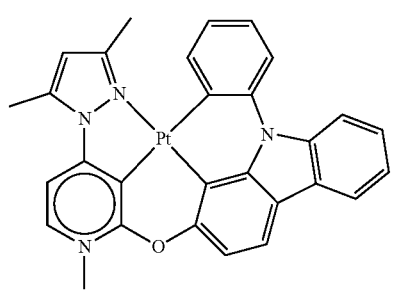
90
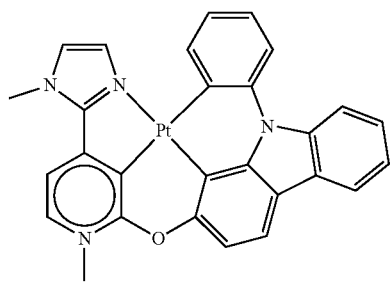
91
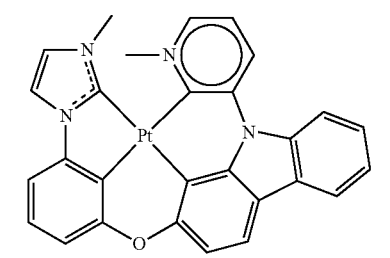
92
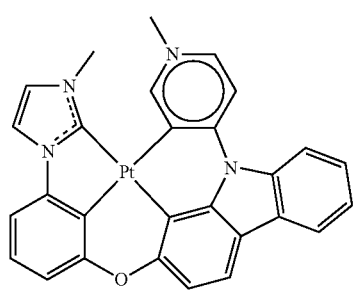
212
-continued
93
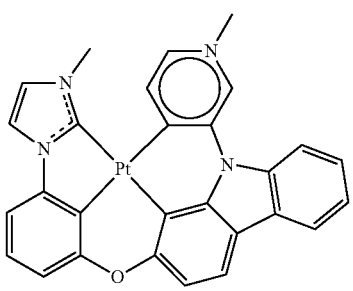
94
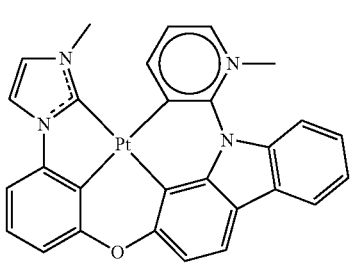
95
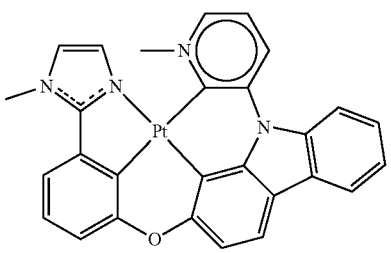
96
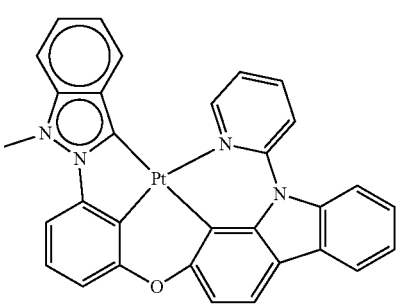
97
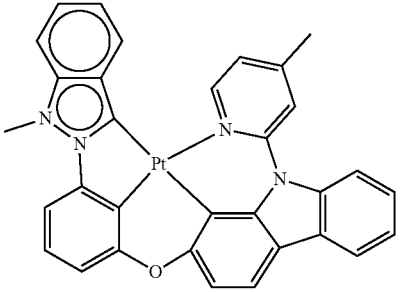

98
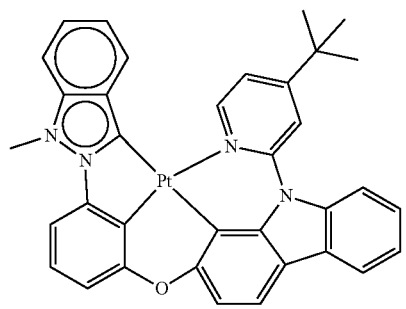
99
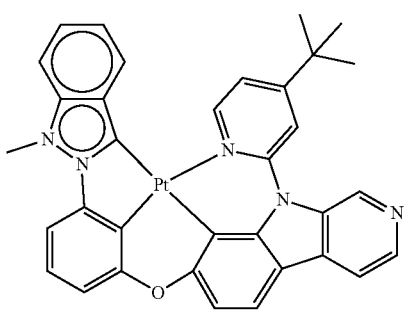
100
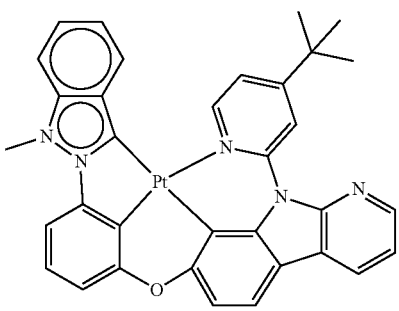
101
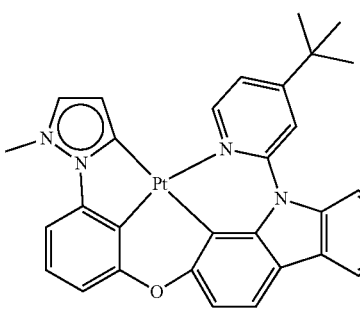
102
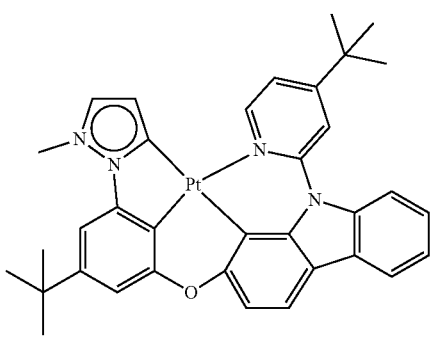
103
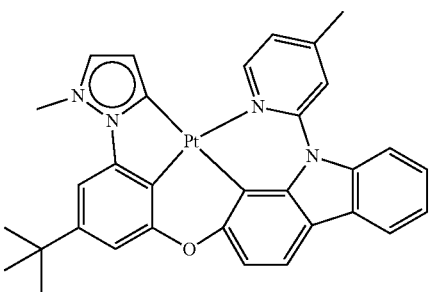
104
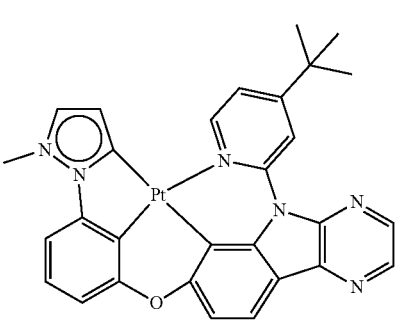
105
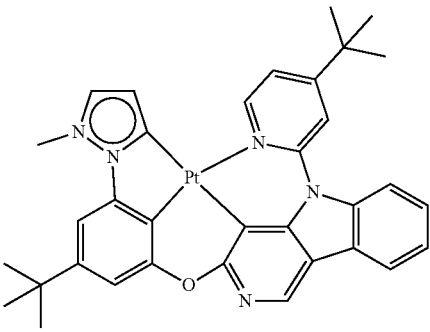
106
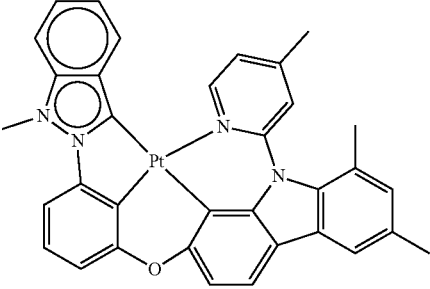
107
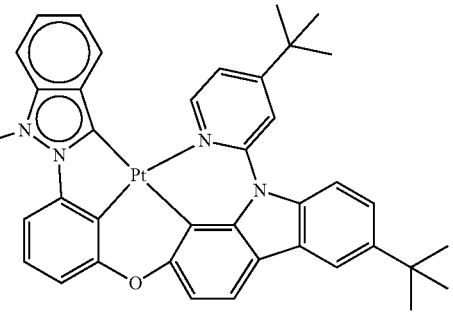

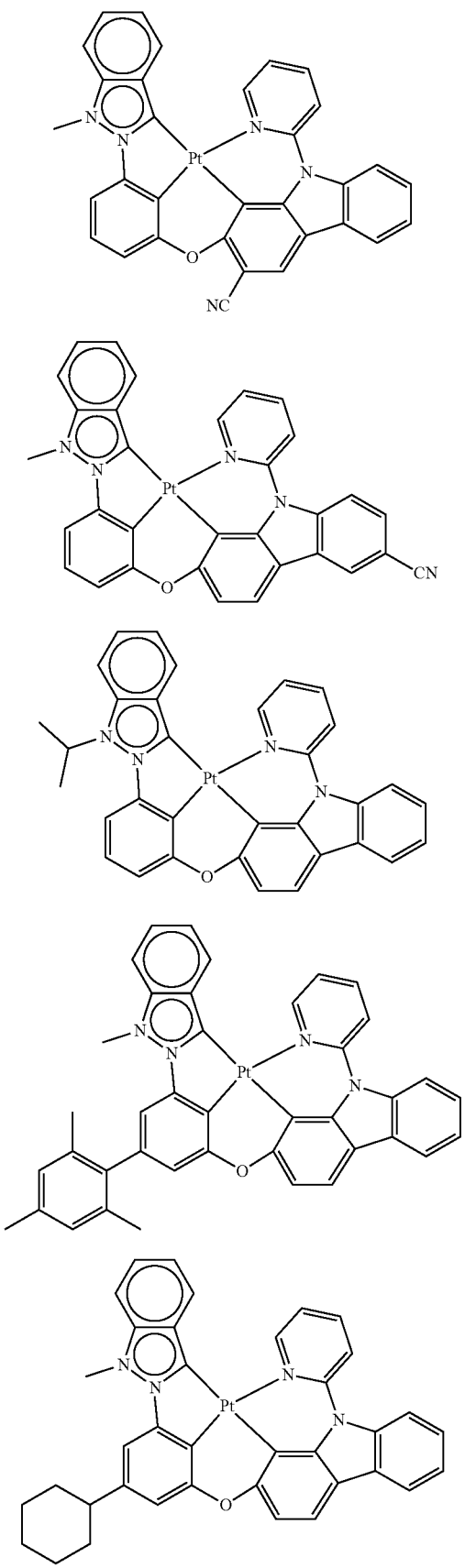
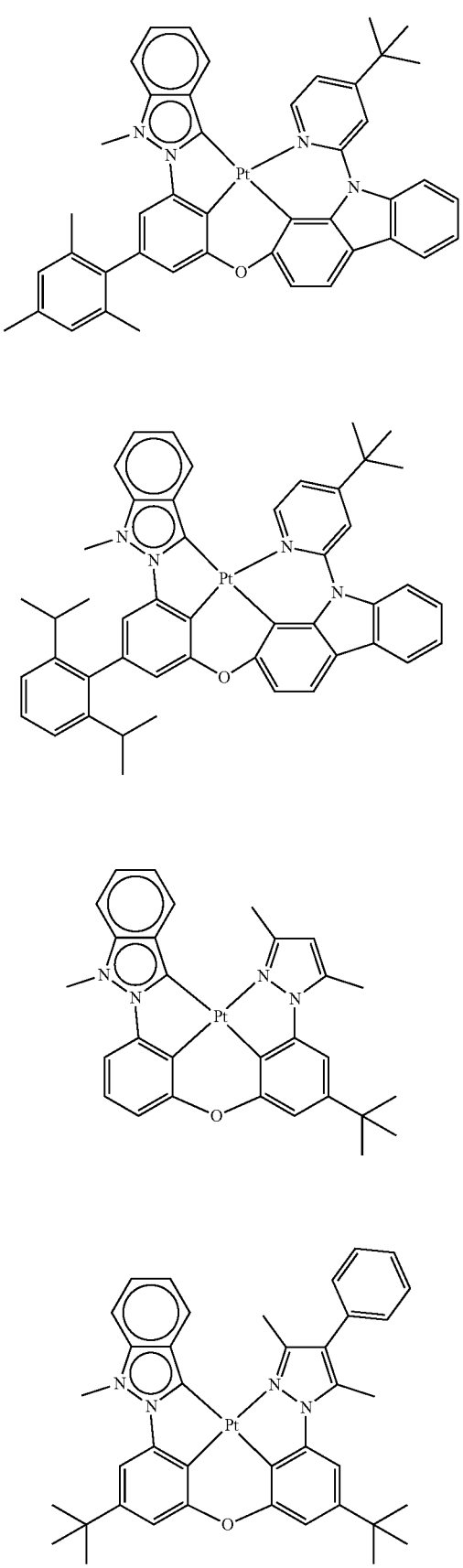

117
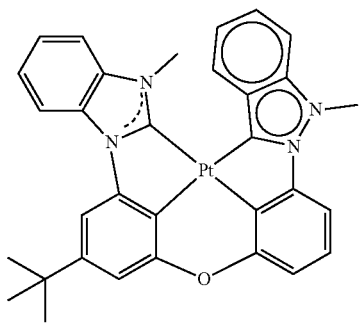
118
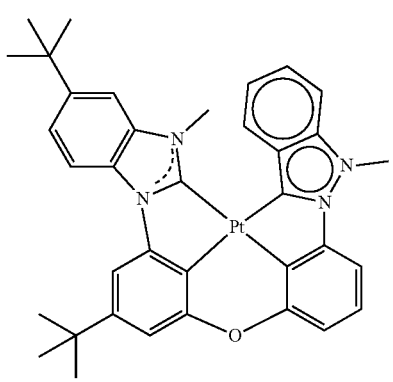
119
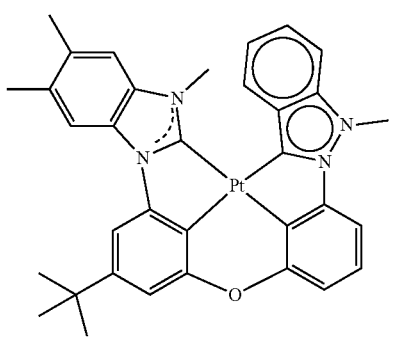
120
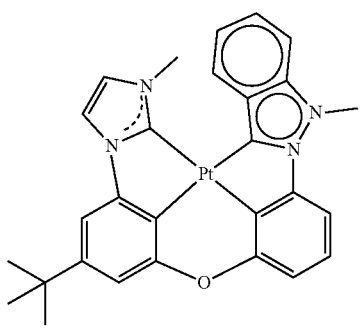
Compound Group 2
1-1
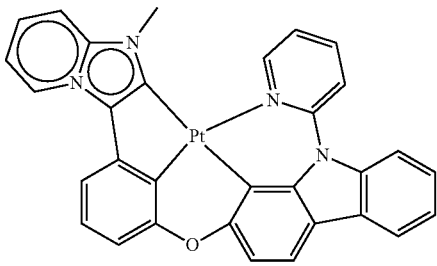
1-2
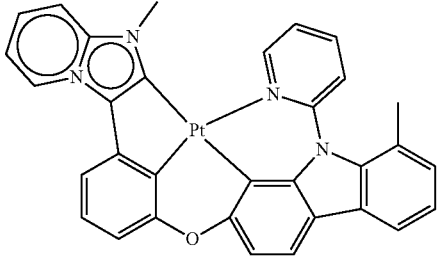
1-3
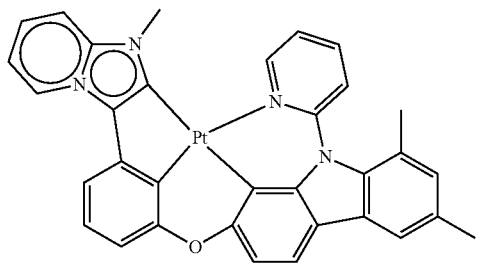
1-4
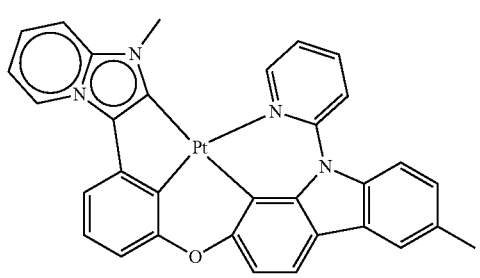
1-5
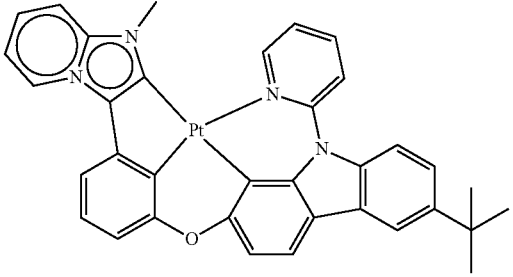

1-6
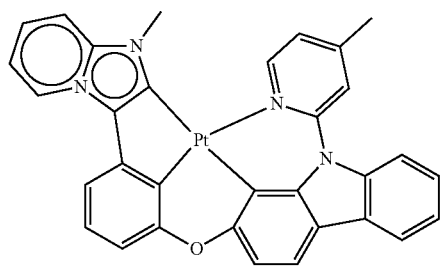
1-7
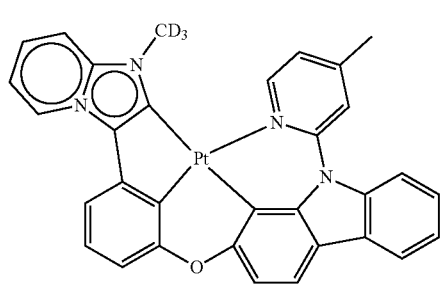
1-8
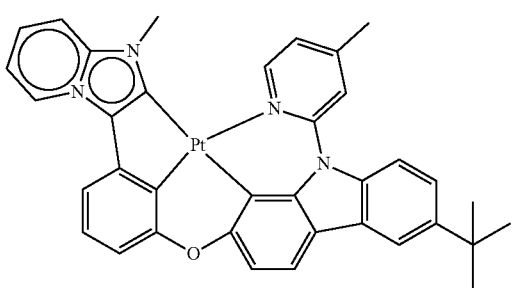
1-9
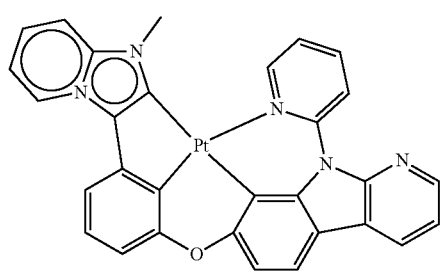
1-10
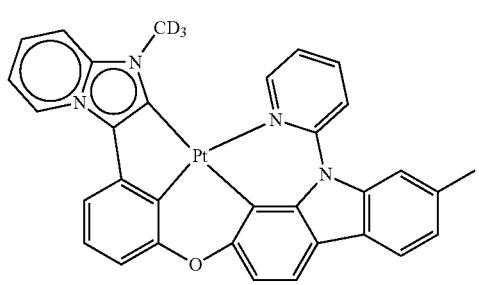
1-11
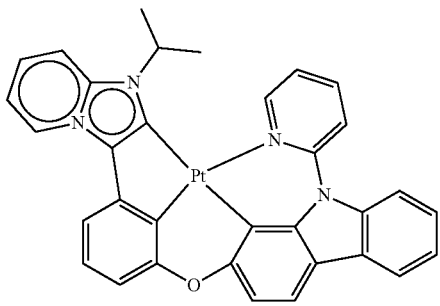
1-12
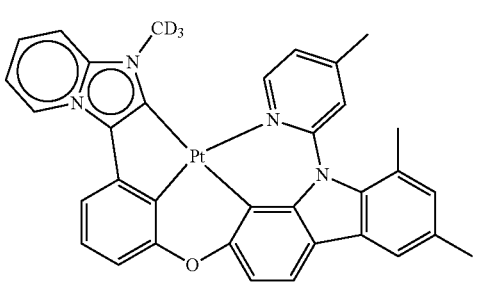
1-13
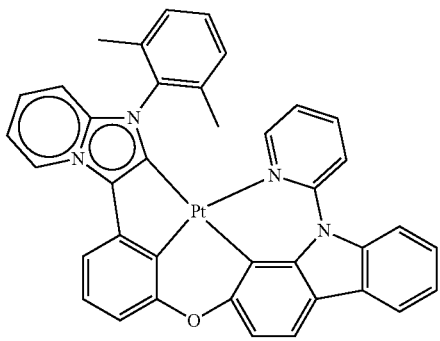
1-14
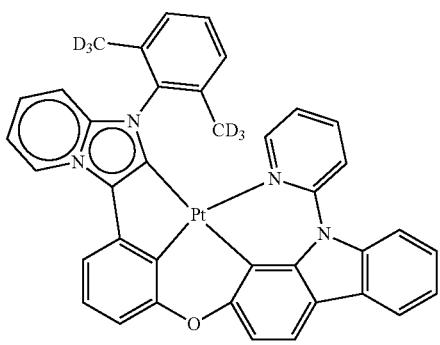
1-15
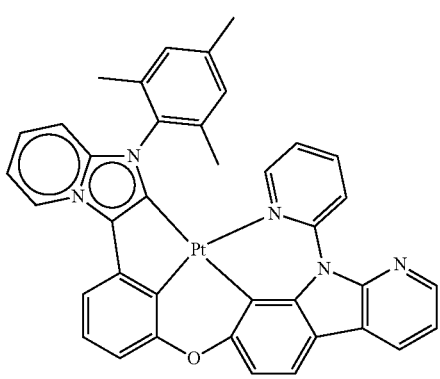

-continued
1-16
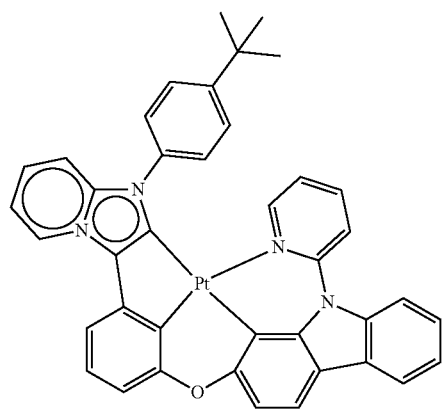
1-17
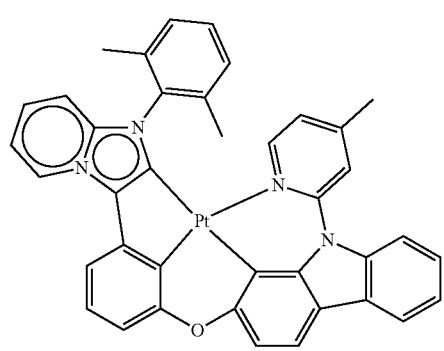
1-18
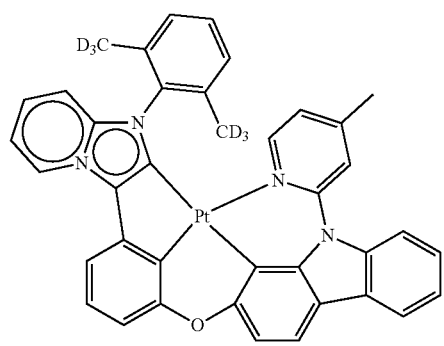
1-19
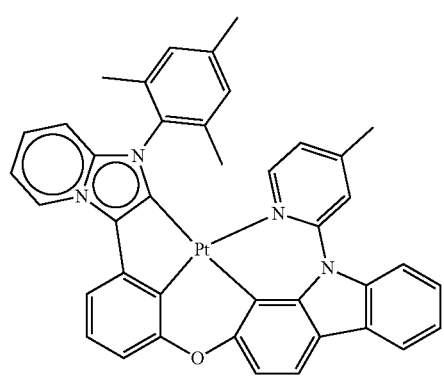
-continued
1-20
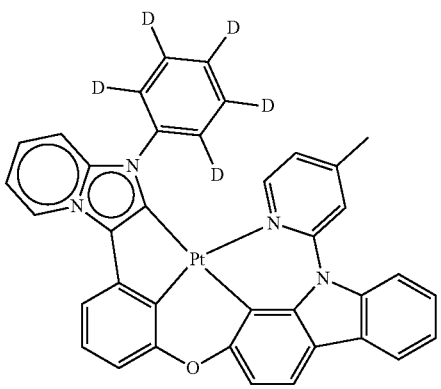
1-21
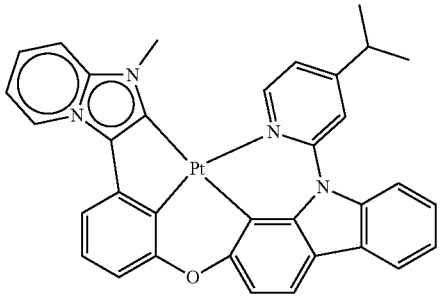
1-22
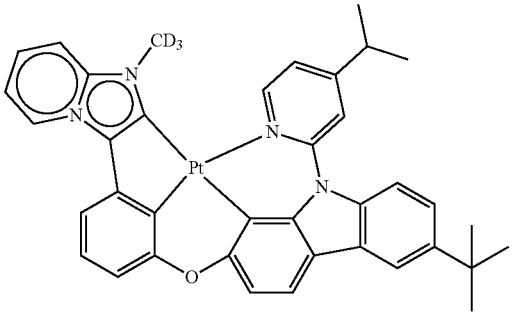
1-23
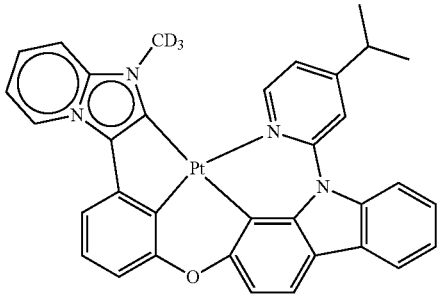
1-24
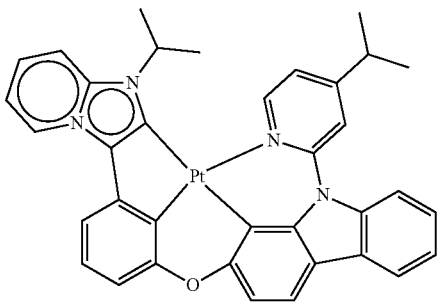

-continued
1-25
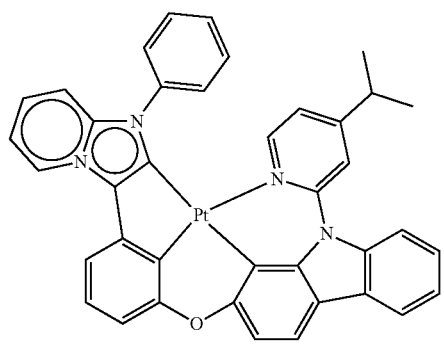
1-26
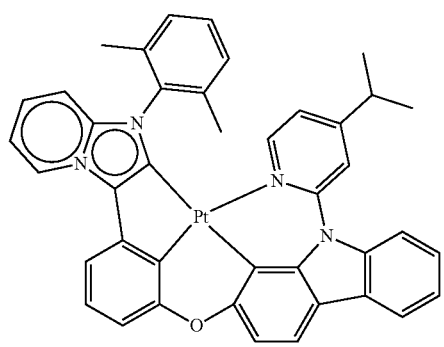
1-27
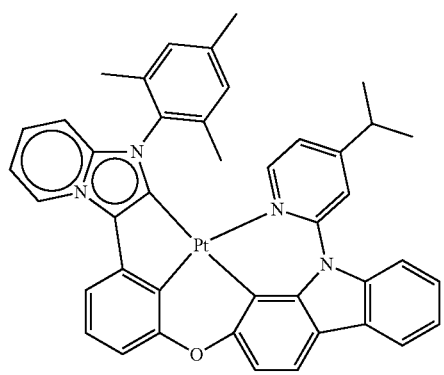
1-28
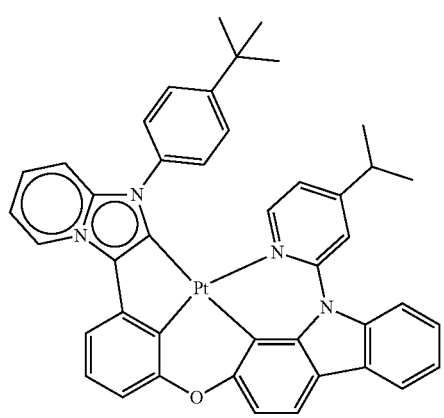
-continued
1-29
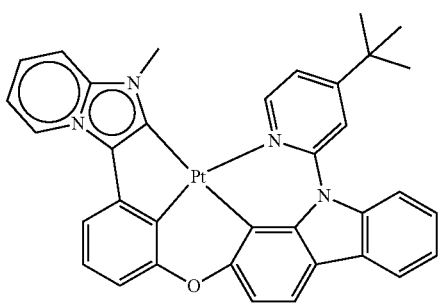
1-30
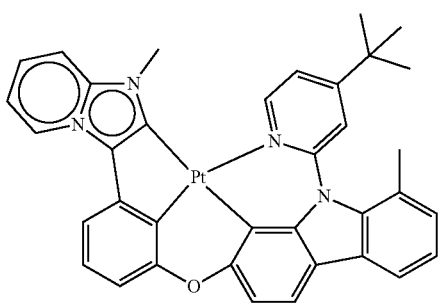
1-31
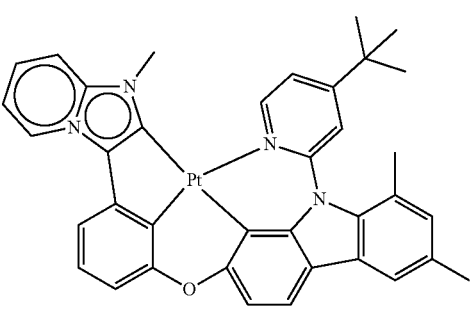
1-32
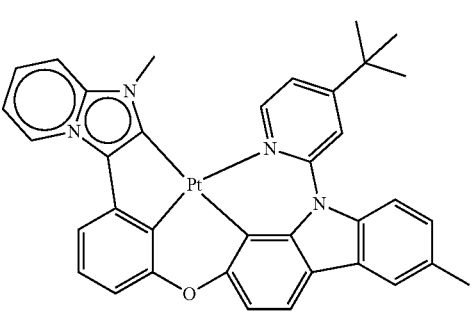
1-33
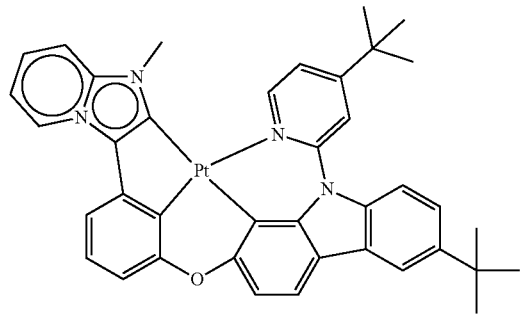

1-34
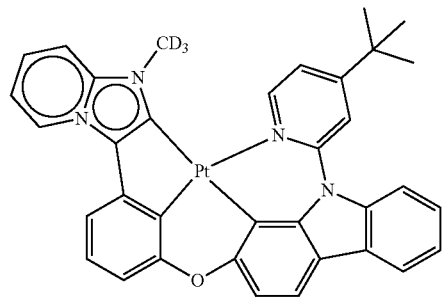
1-35
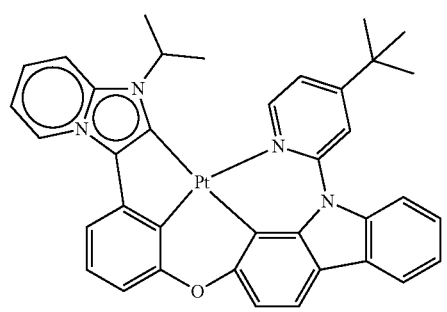
1-36
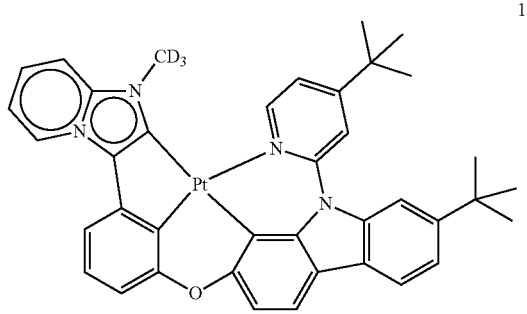
1-37
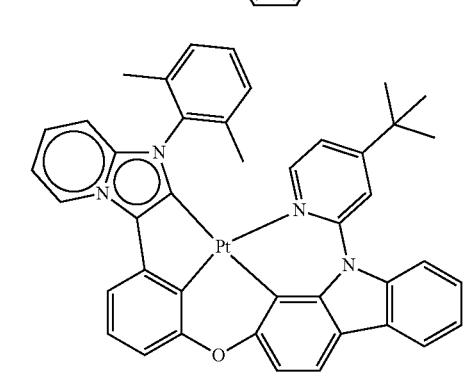
1-38
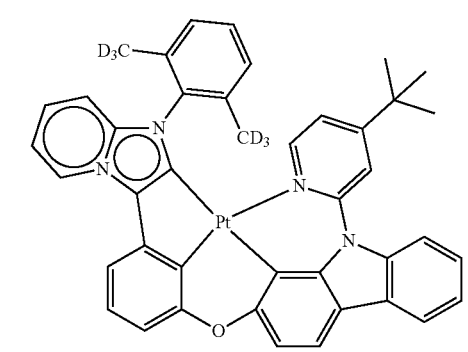
1-39
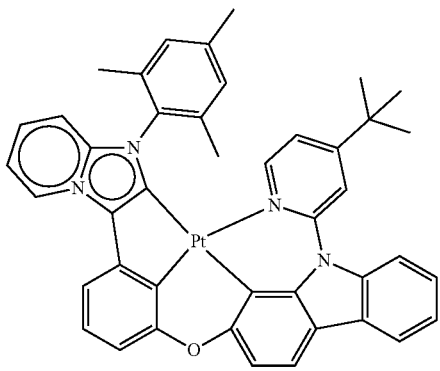
1-40
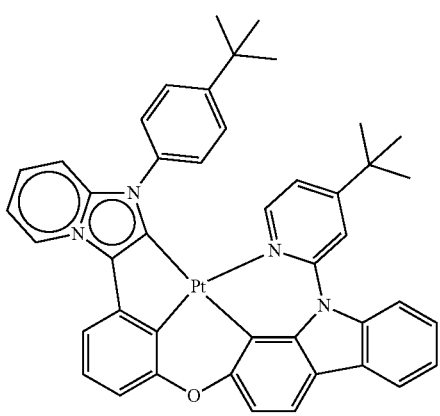
1-41
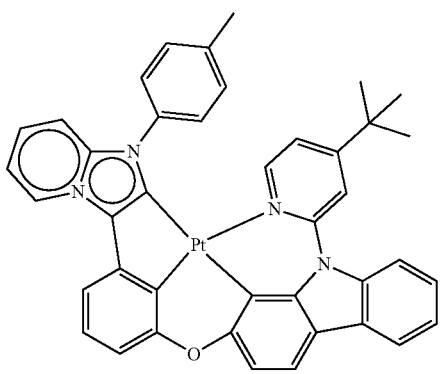
1-42
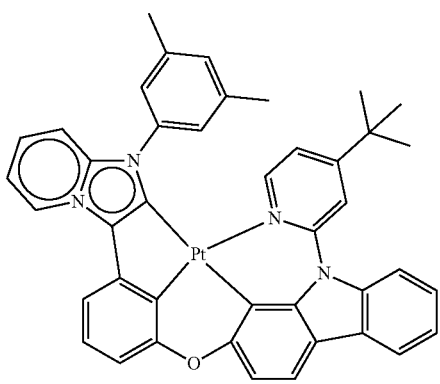

1-43
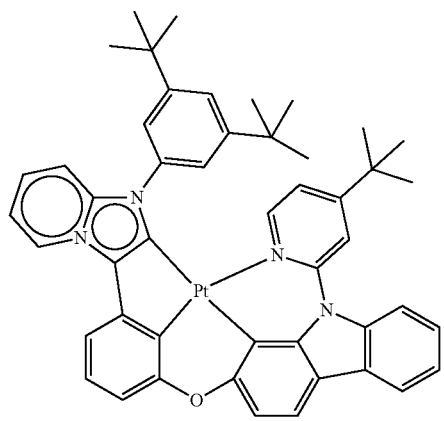
1-44
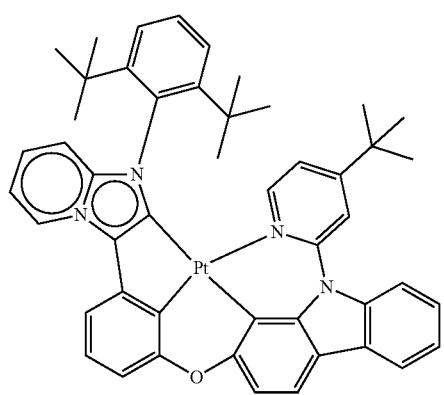
1-45
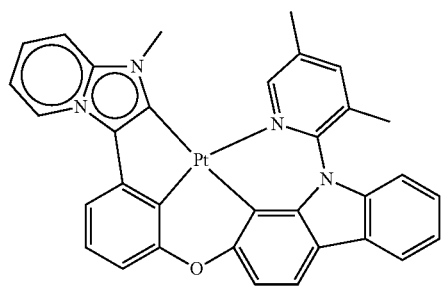
1-46
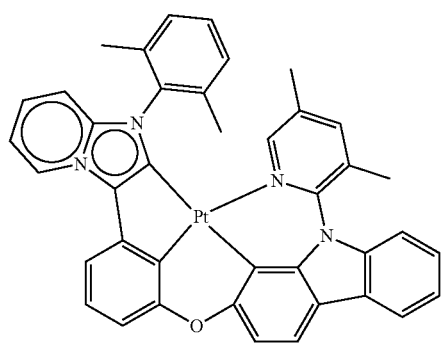
1-47
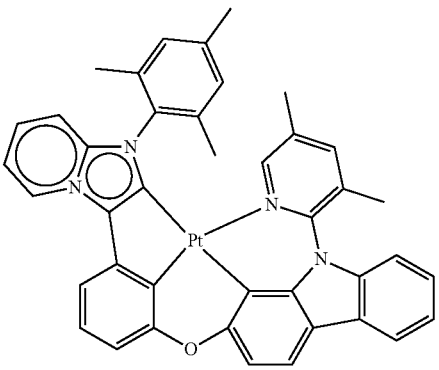
1-48
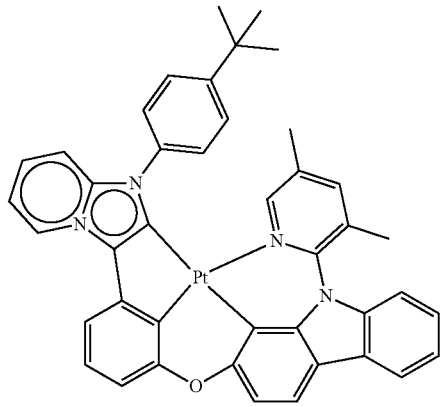
1-49
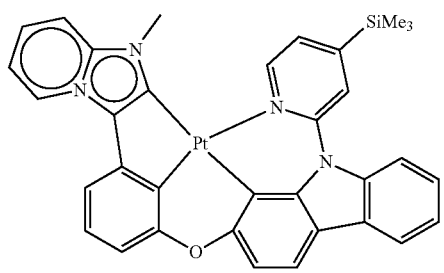
1-50
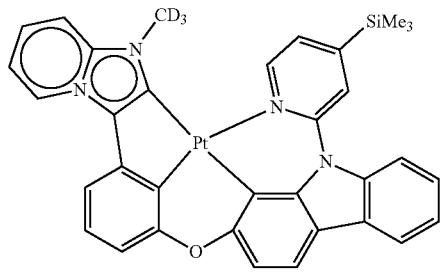
1-51
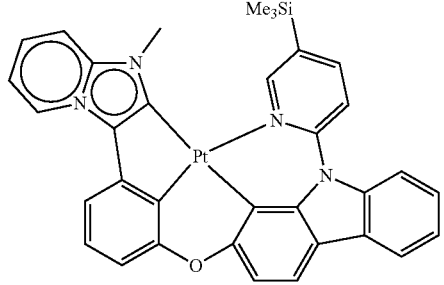

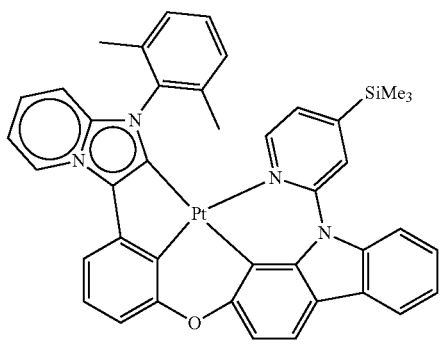
1-52
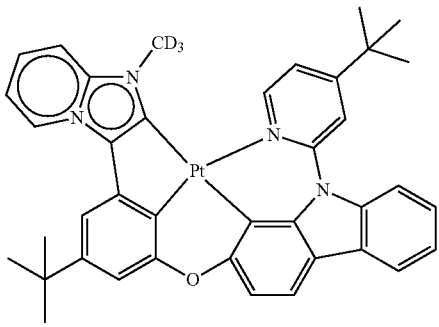
1-56
1-53
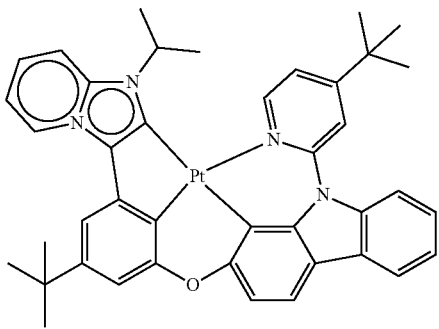
1-57
1-54
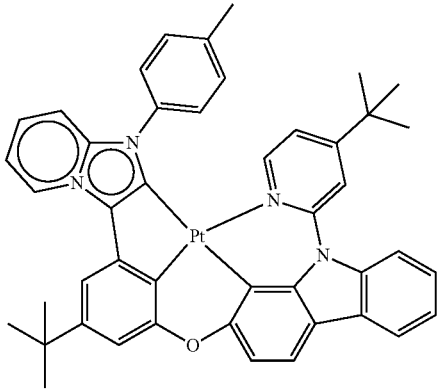
1-58
1-55
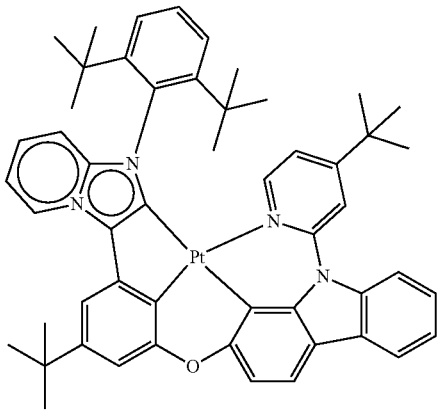
1-59

-continued
1-60
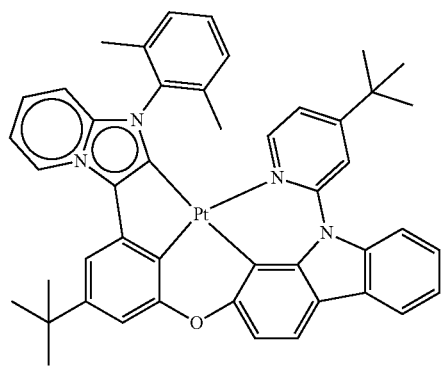
1-61
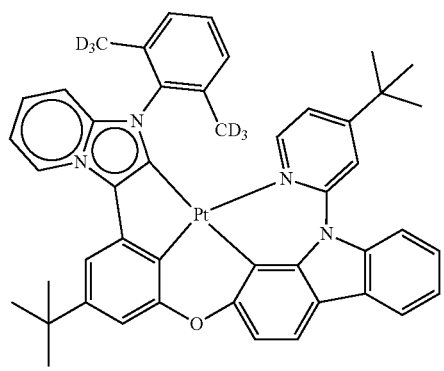
1-62
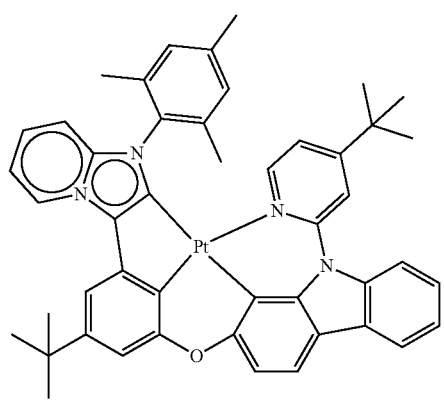
1-63
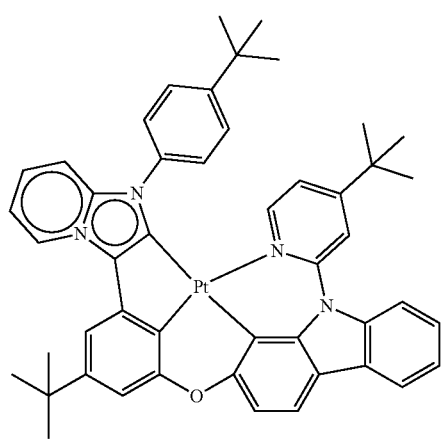
-continued
1-64
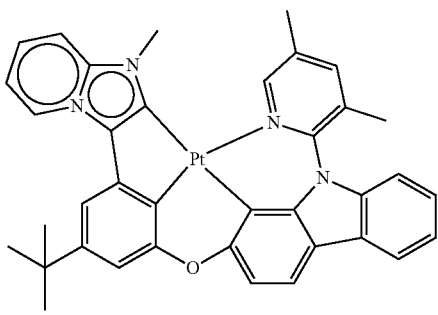
1-65
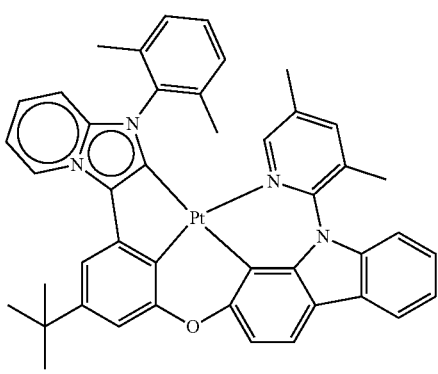
1-66
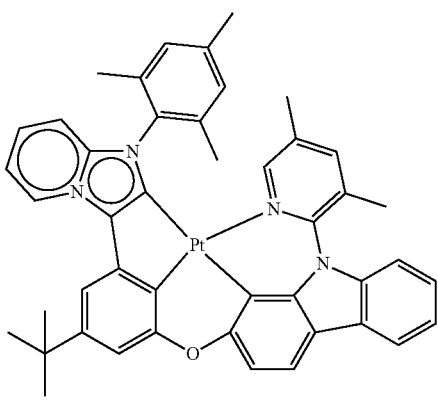
1-67
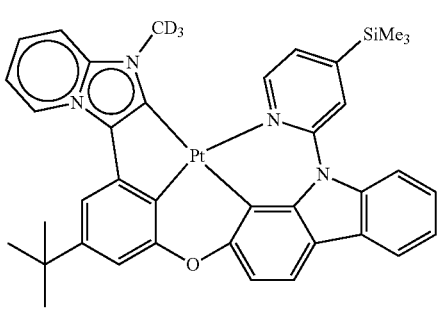

1-68
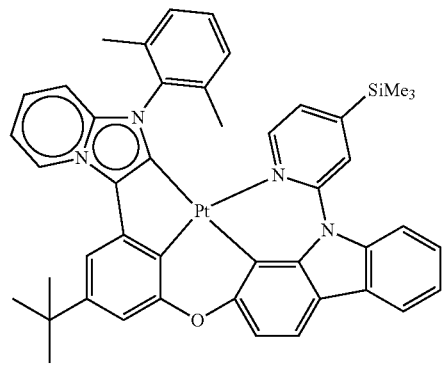
1-72
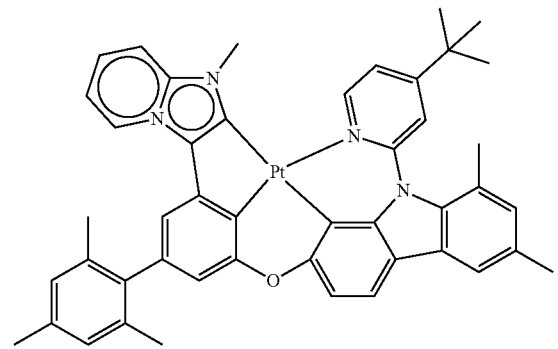
1-69
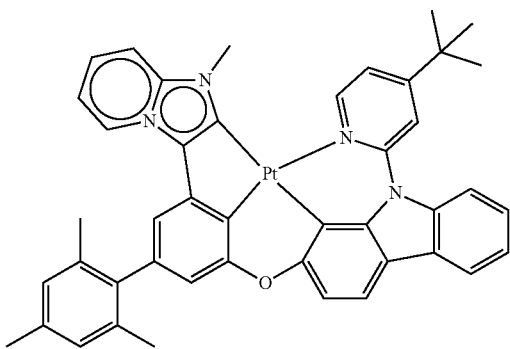
1-73
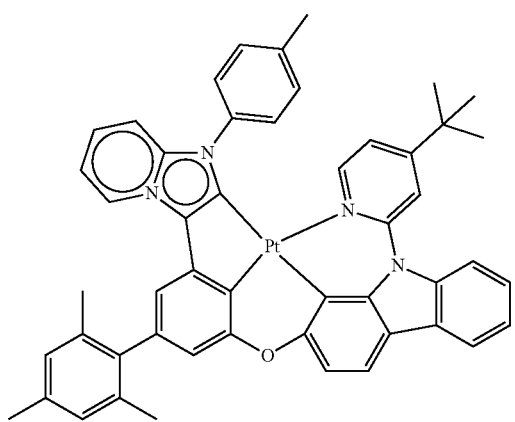
1-70
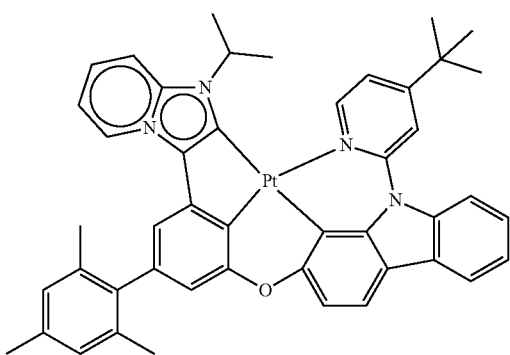
1-74
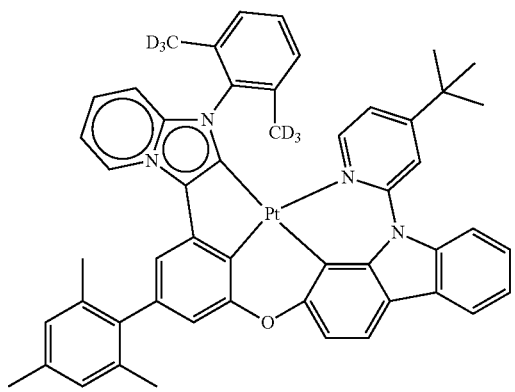
171
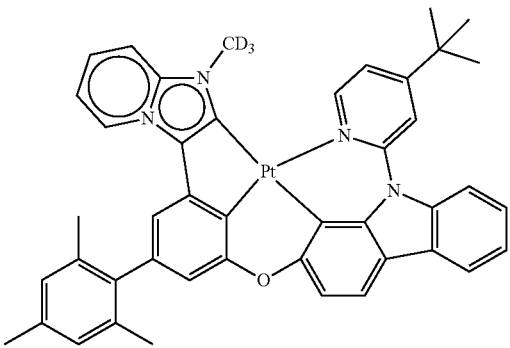
1-75
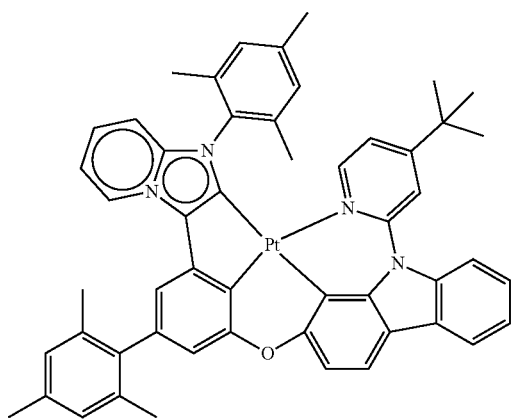

1-76
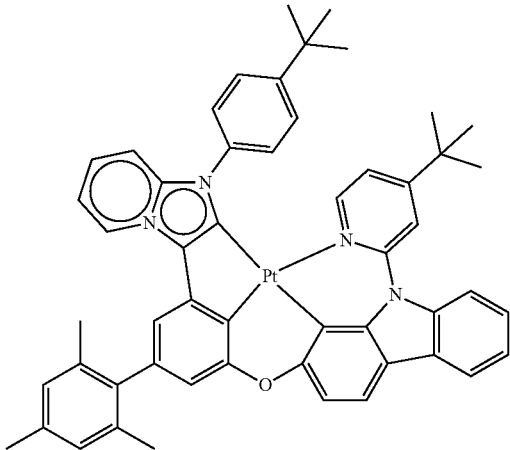
77
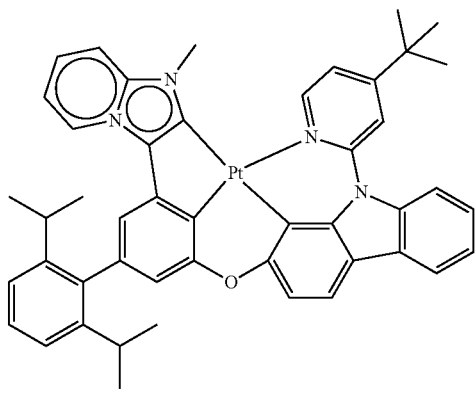
78
1-79
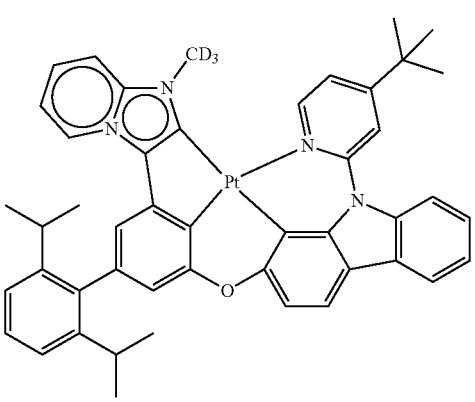
1-80
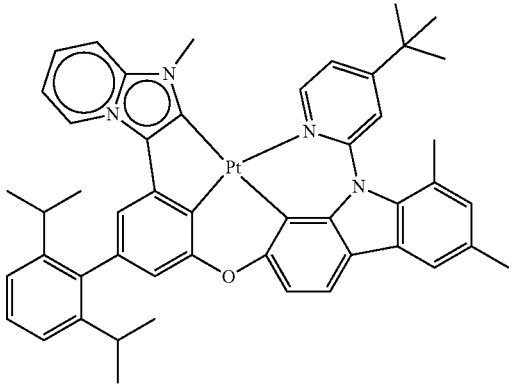
1-81
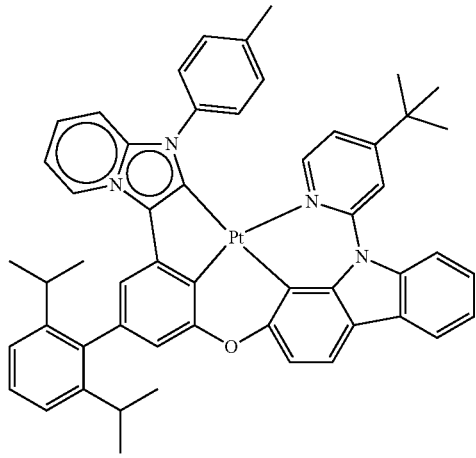
1-82
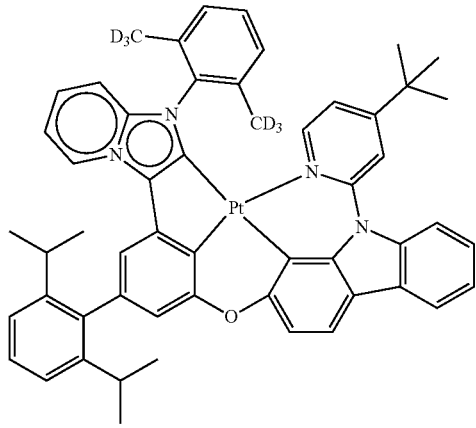

1-83
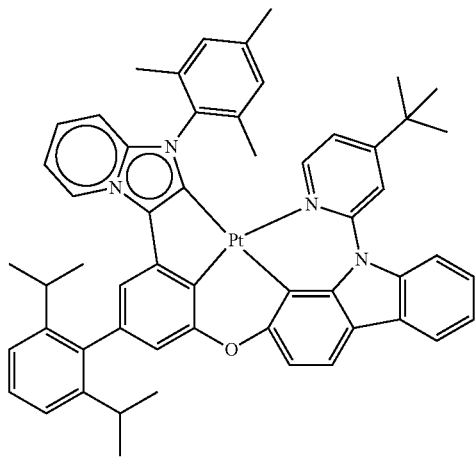
1-84
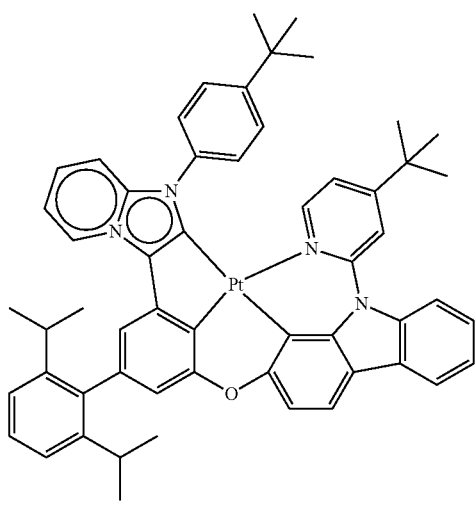
1-85
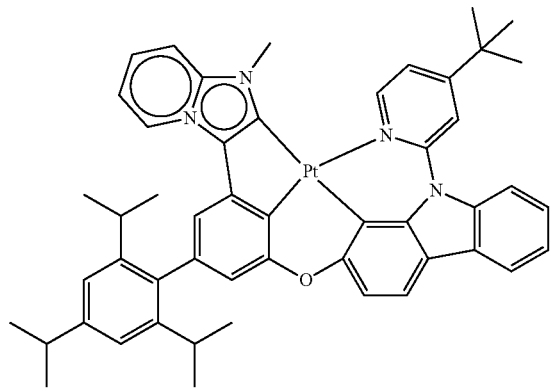
1-86
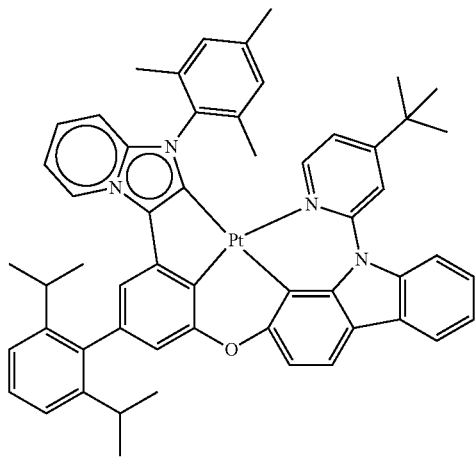
1-87
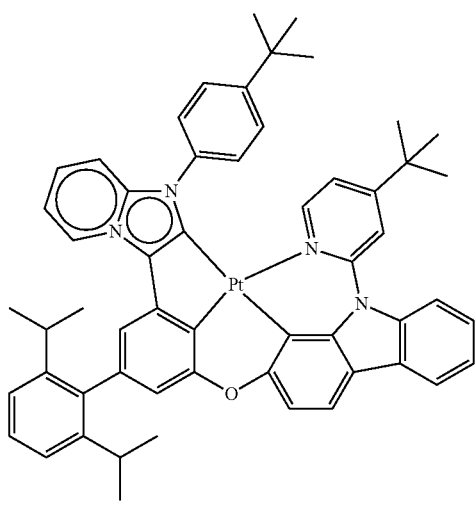
1-88
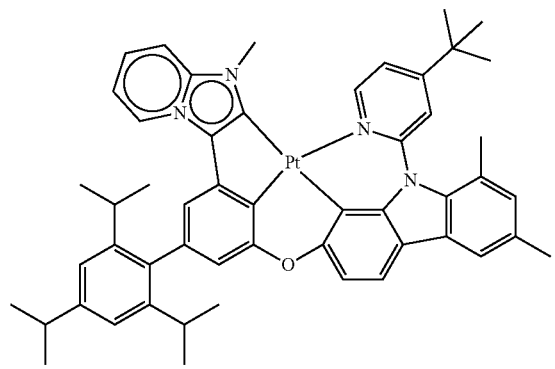

-continued
1-89
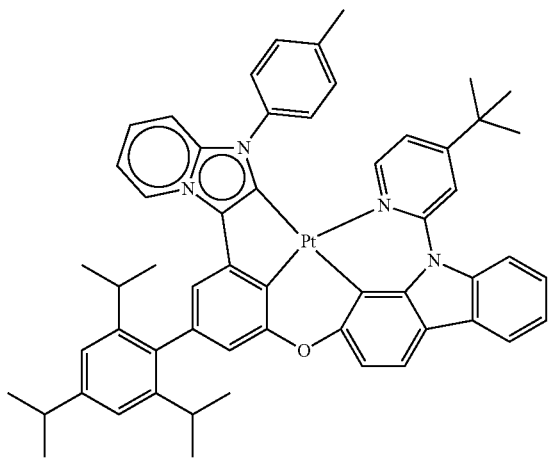
1-90
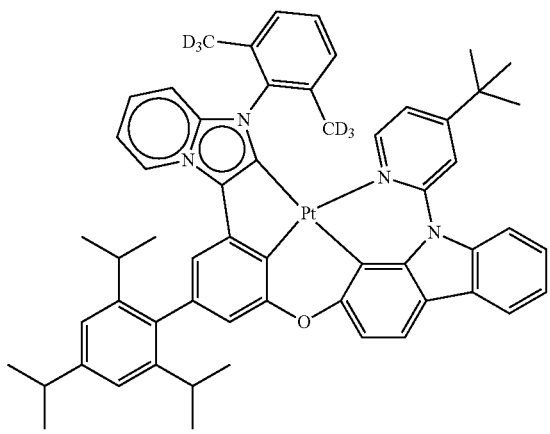
1-91
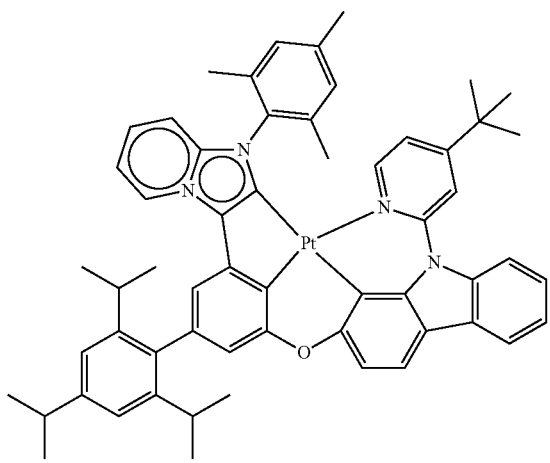
-continued
1-92
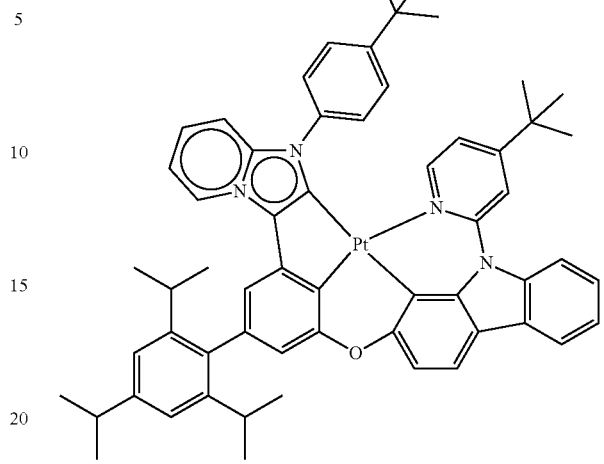
1-93
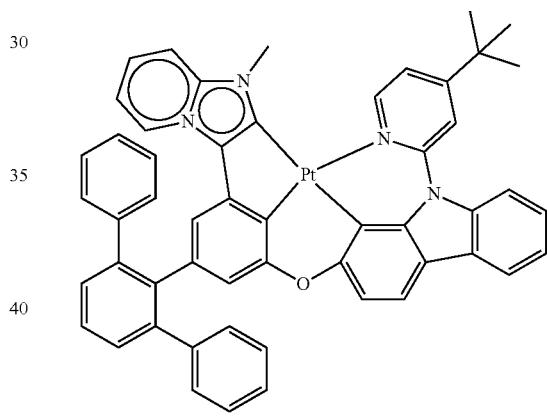
1-94
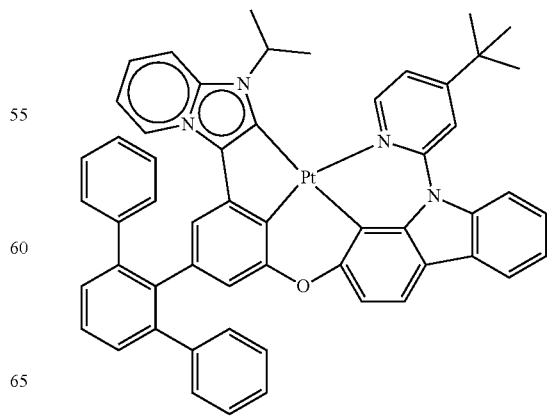

1-95
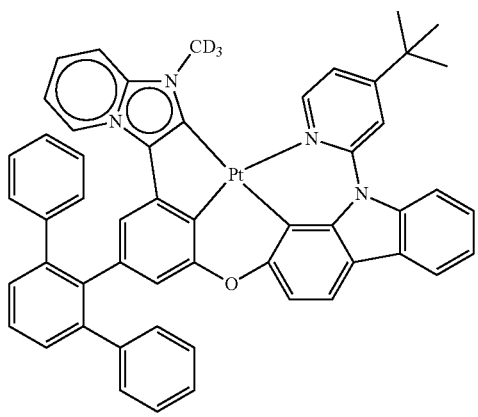
1-96
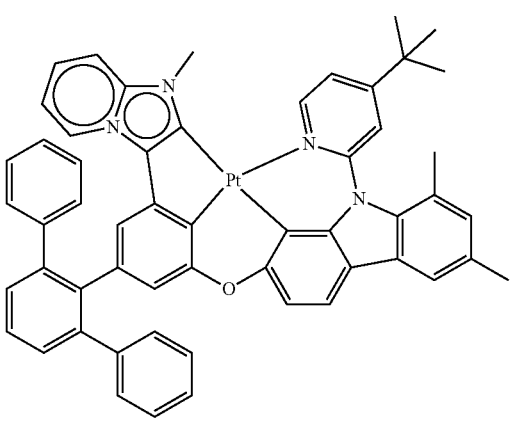
1-97
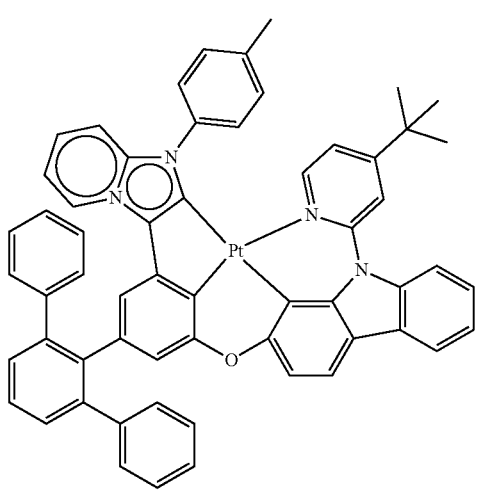
1-98
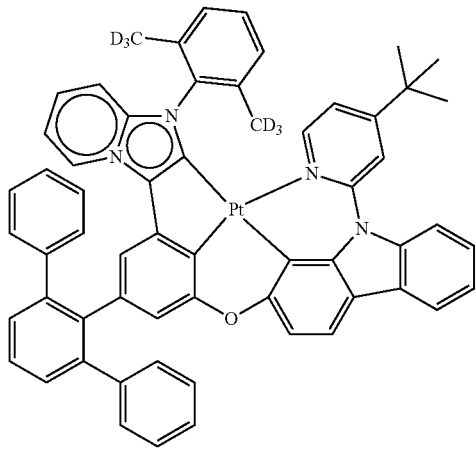
1-99
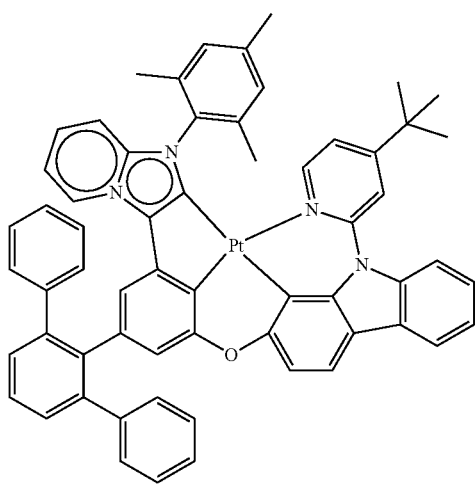
1-100
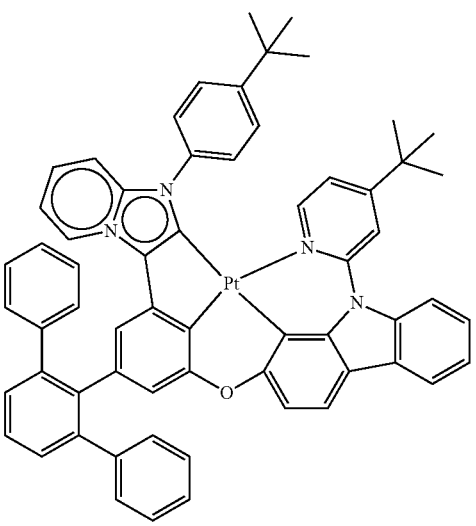

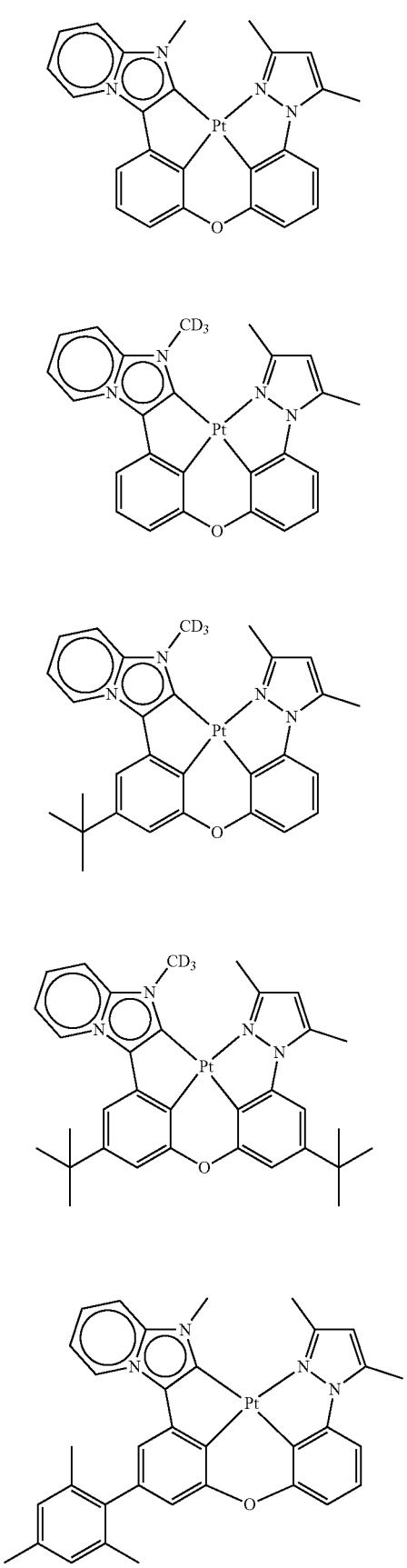

1-111
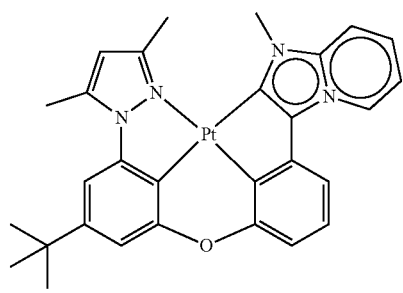
1-112
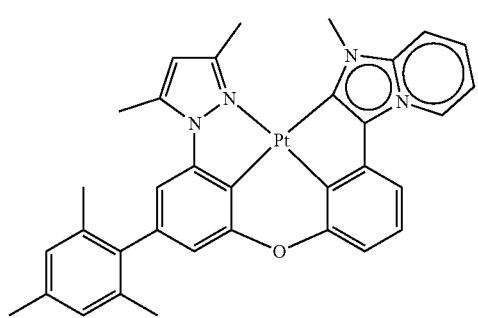
1-113
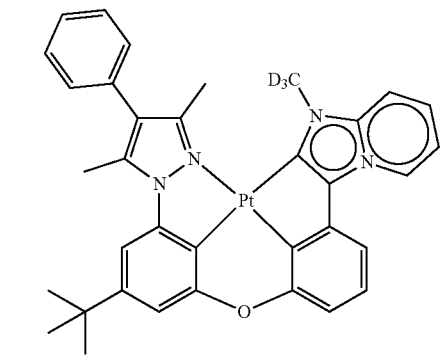
1-114
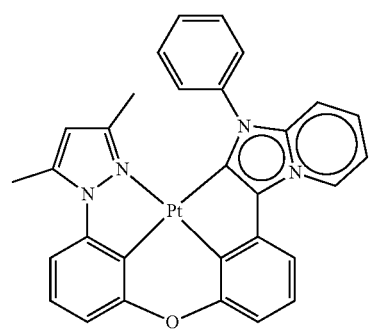
1-115
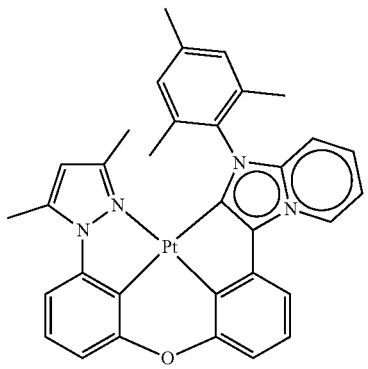
1-116
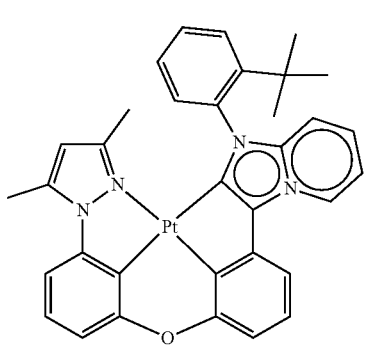
1-117
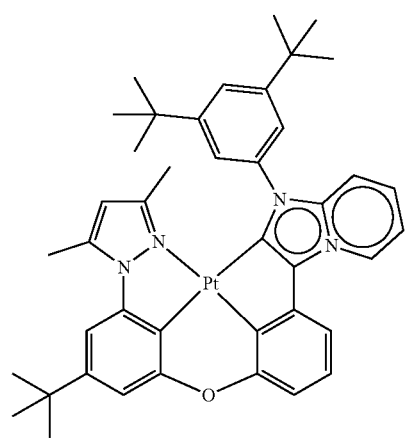
1-118
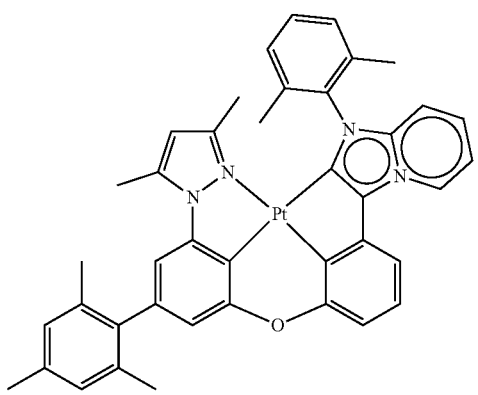

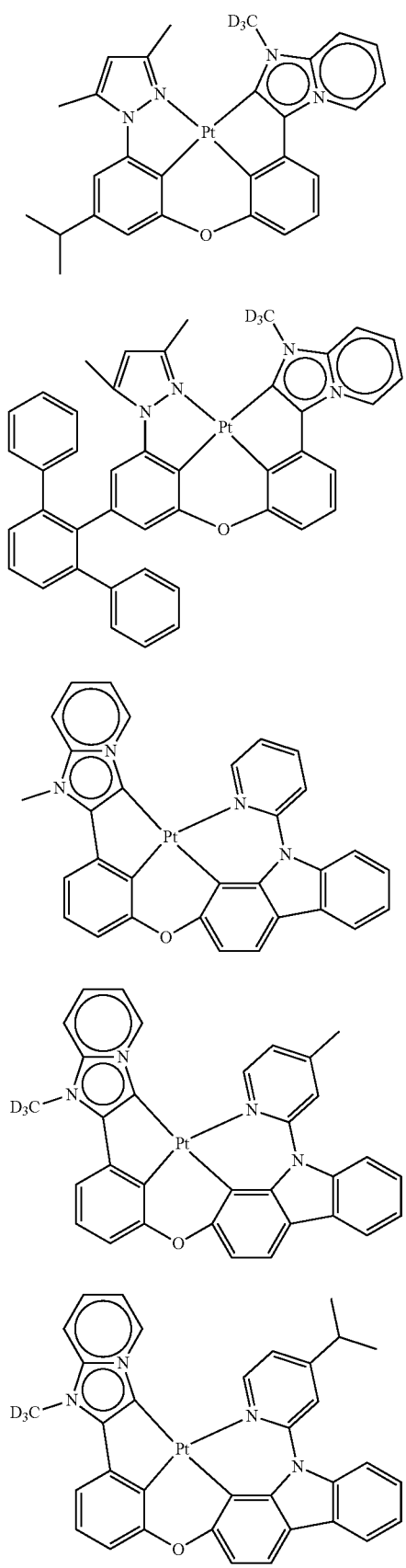
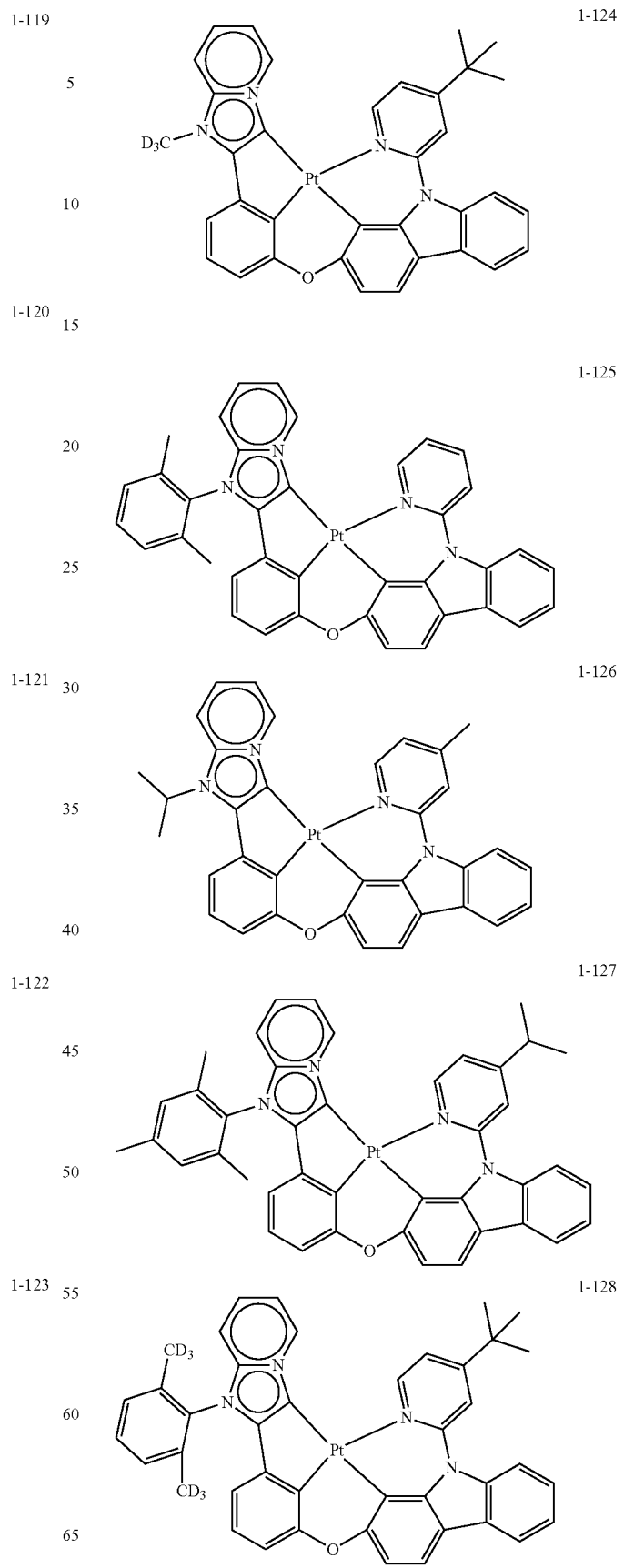

1-129
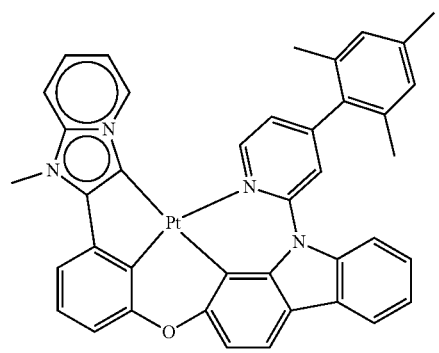
1-130
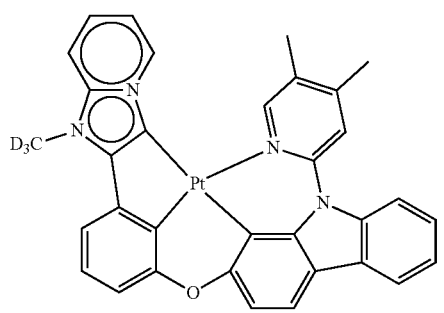
1-131
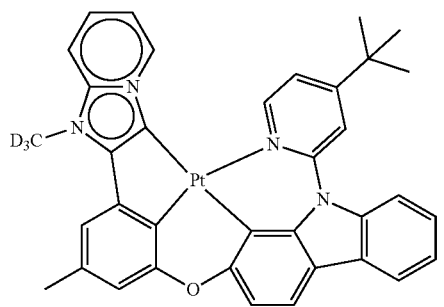
1-132
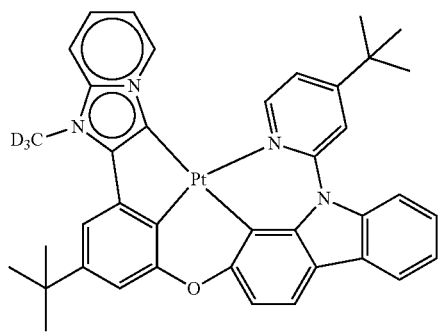
1-133
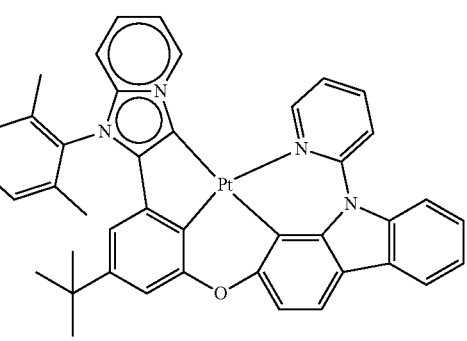
1-134
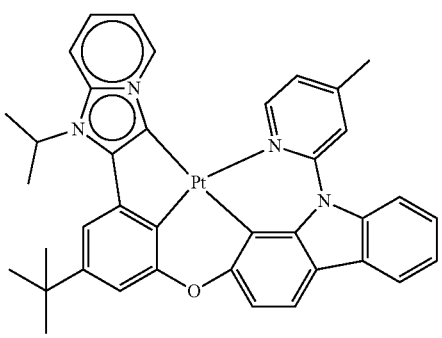
1-135
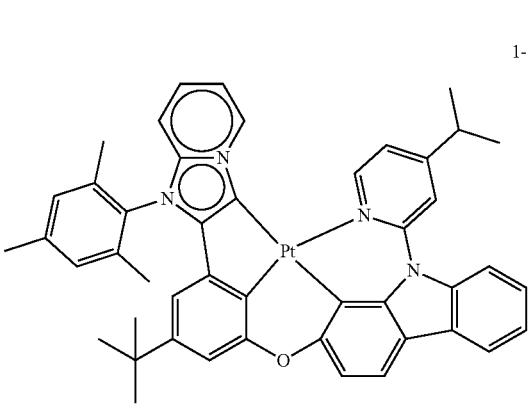
1-137
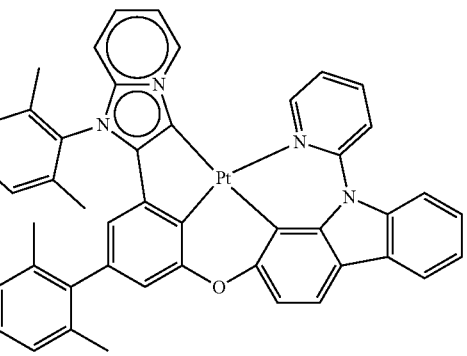
1-138
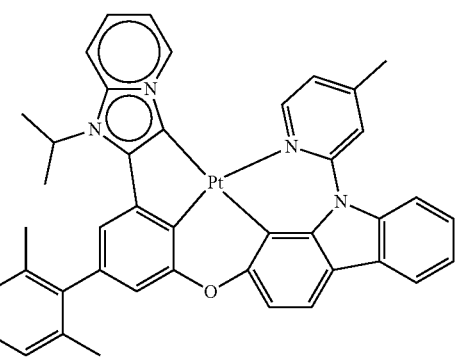

-continued
1-136
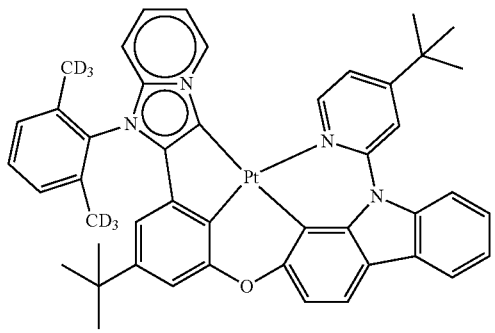
1-139
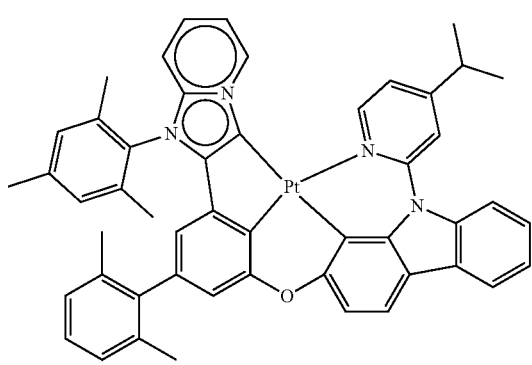
1-140
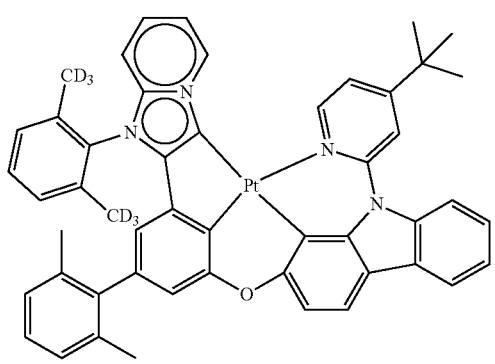
1-141
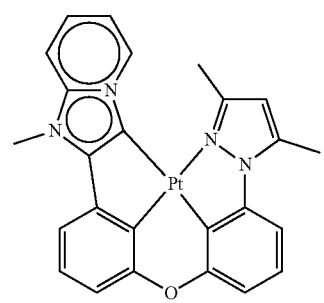
-continued
1-142
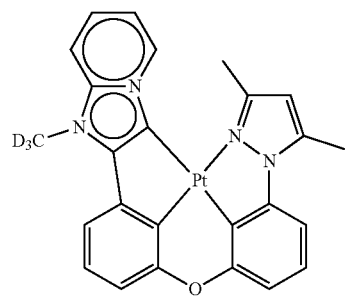
1-143
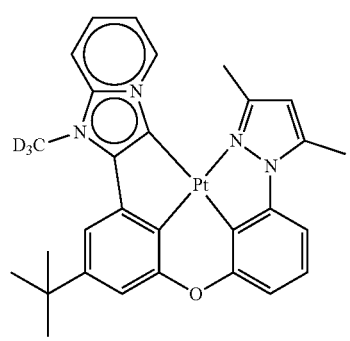
1-144
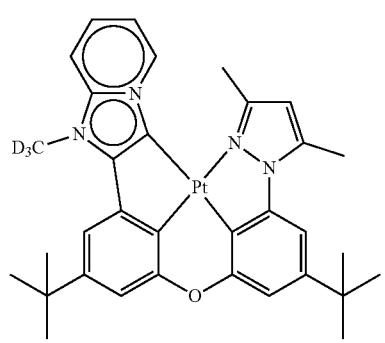
1-145
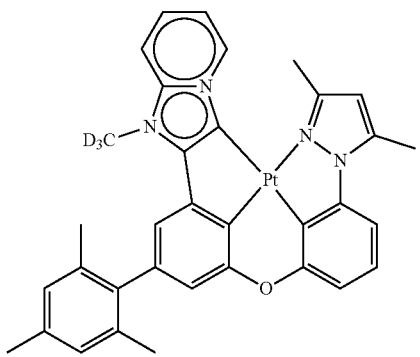

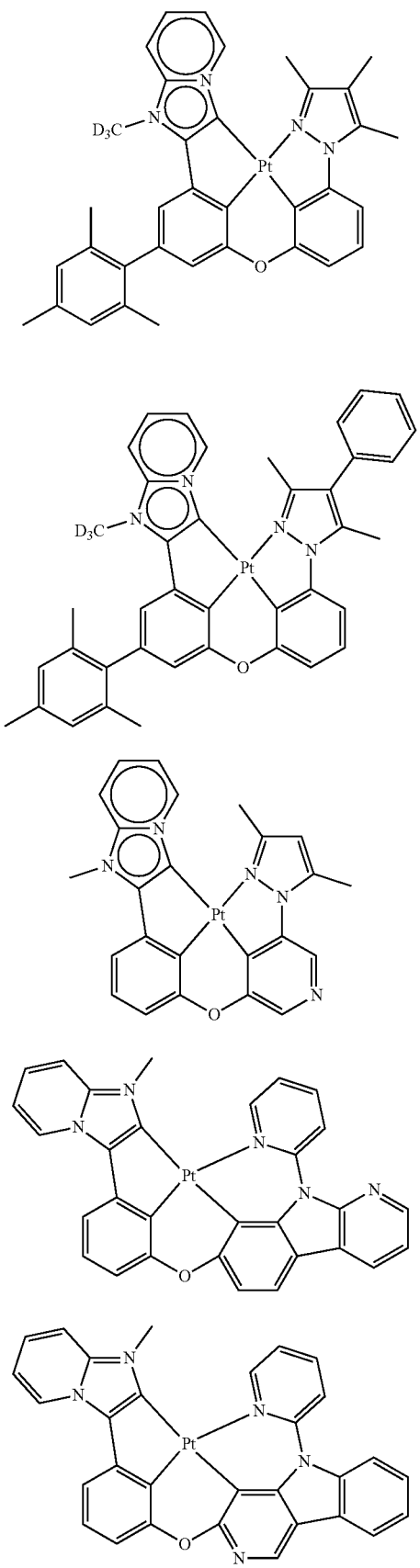
1-146
1-147
1-148
1-149
1-150
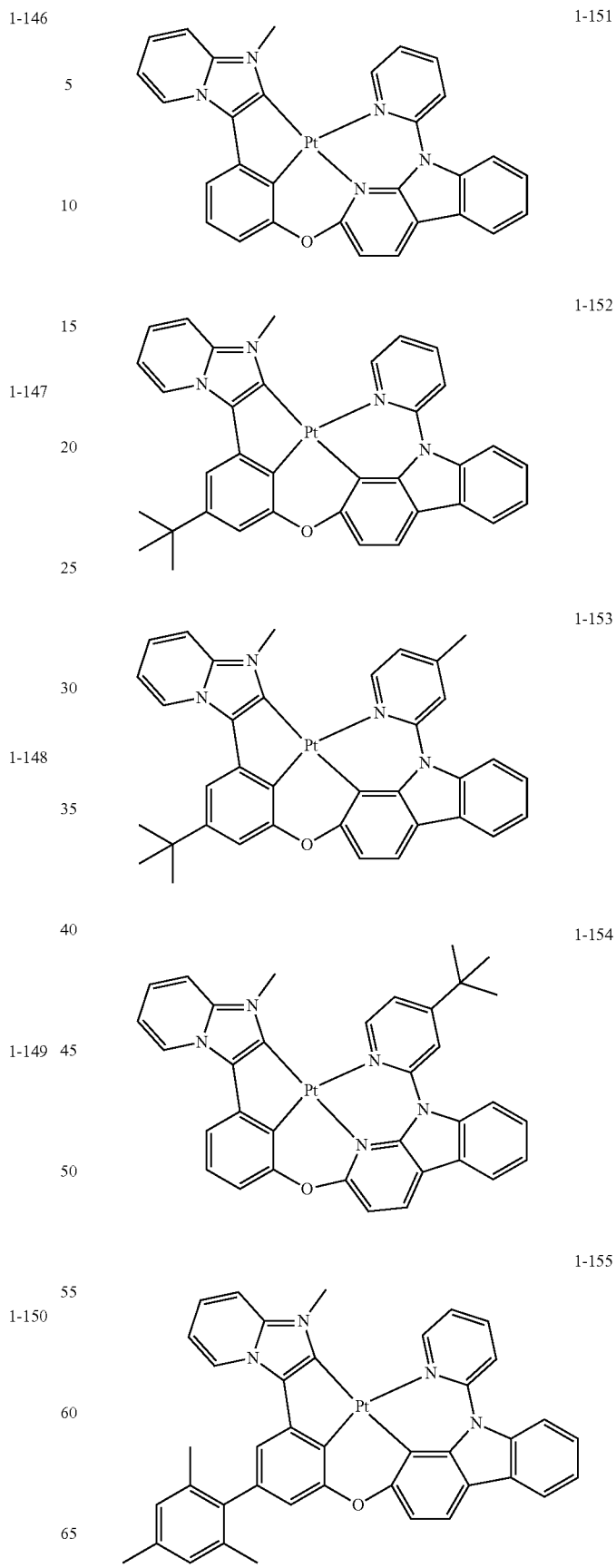
1-151
1-152
1-153
1-154
1-155

1-156
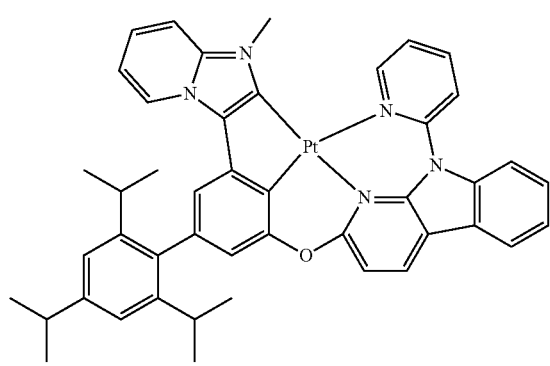
1-157
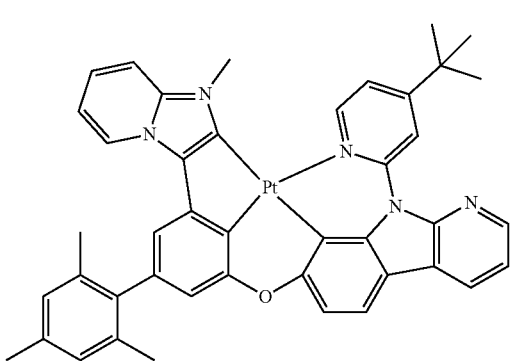
1-158
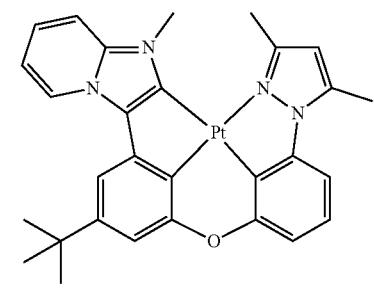
1-159
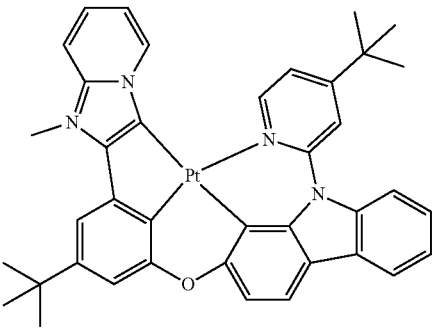
1-160
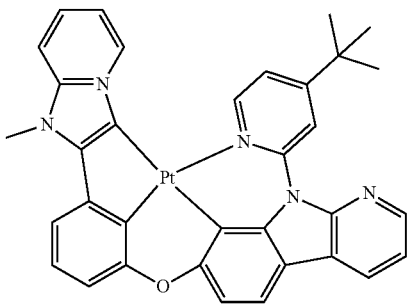
1-161
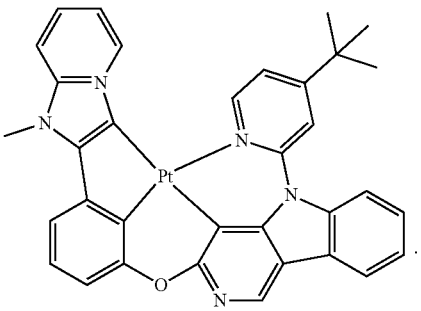
* * * * *